United States Patent [19]
Izuhara et al.

[11] Patent Number: 5,525,987
[45] Date of Patent: Jun. 11, 1996

[54] ANALOG TO DIGITAL CONVERTER CIRCUIT

[75] Inventors: Kunihiko Izuhara; Norio Shoji, both of Kanagawa, Japan

[73] Assignee: Sony Corporation, Tokyo, Japan

[21] Appl. No.: 190,680

[22] Filed: Feb. 2, 1994

[30] Foreign Application Priority Data

| Feb. 1, 1993 | [JP] | Japan | 5-014903 |
| Feb. 23, 1993 | [JP] | Japan | 5-033240 |
| Feb. 24, 1993 | [JP] | Japan | 5-035758 |
| Feb. 24, 1993 | [JP] | Japan | 5-035759 |
| Feb. 24, 1993 | [JP] | Japan | 5-035760 |
| Mar. 5, 1993 | [JP] | Japan | 5-045481 |
| Mar. 26, 1993 | [JP] | Japan | 5-068889 |

[51] Int. Cl.[6] .................................. H03M 1/16
[52] U.S. Cl. .......................... 341/156; 341/155
[58] Field of Search ....................... 341/155, 156, 341/158, 159, 162, 165

[56] References Cited

U.S. PATENT DOCUMENTS 4,016,557  4/1977  Zitelli et al. .................. 341/155

*Primary Examiner*—Brian K. Young
*Attorney, Agent, or Firm*—Hill, Steadman & Simpson

[57] ABSTRACT

An analog/digital converter circuit including a plurality of reference resistance elements dividing a voltage between two reference potentials to provide a plurality of reference voltages; a plurality of switching blocks which are activated by an upper data conversion output signal in units of rows and compare the respective reference voltages with an input signal to be converted to provide a differential output; an upper data encoder which compares the reference voltage supplied to a switching block positioned at a specific position of the switching block matrix with the input signal to provide a plurality of conversion codes of the upper significant bits; a lower data comparator circuit having first and second comparators with weights N.

39 Claims, 43 Drawing Sheets

| FIG. 4A | FIG. 4B |

FIG. 5 (PRIOR ART)

| COMPARATOR OUTPUT | | | | LINE OUTPUT | | |
|---|---|---|---|---|---|---|
| $A_{U5}$ | $A_{U6}$ | $A_{U7}$ | $A_{U8}$ | $LN_5$ | $LN_6$ | $LN_7$ |
| 1 | 0 | 0 | 0 | 11 | 11 | 10 |
| 0 | 1 | 0 | 0 | 01 | 10 | 11 |
| 0 | 0 | 1 | 0 | 10 | 01 | 00 |
| 0 | 0 | 0 | 1 | 00 | 00 | 01 |

FIG. 6 (PRIOR ART)

| LOWER COMPARATOR OUTPUT | | | | | | | | LOWER CODE | SELECTED LINE | | |
|---|---|---|---|---|---|---|---|---|---|---|---|
| $A_{DA1}$ | $A_{DA2}$ | $A_{DA3}$ | $A_{DA4}$ | $A_{DA5}$ | $A_{DA6}$ | $A_{DA7}$ | $A_{DA8}$ | $D_3, D_4$ | $LN_2$ | $LN_3$ | $LN_4$ |
| 1 | 0 | 0 | 0 | 0 | 0 | 0 | 0 | 01 | 1 | 0 | 0 |
| 0 | 1 | 0 | 0 | 0 | 0 | 0 | 0 | 00 | 1 | 0 | 0 |
| 0 | 0 | 1 | 0 | 0 | 0 | 0 | 0 | 11 | 0 | 1 | 0 |
| 0 | 0 | 0 | 1 | 0 | 0 | 0 | 0 | 10 | 0 | 1 | 0 |
| 0 | 0 | 0 | 0 | 1 | 0 | 0 | 0 | 01 | 0 | 1 | 0 |
| 0 | 0 | 0 | 0 | 0 | 1 | 0 | 0 | 00 | 0 | 1 | 0 |
| 0 | 0 | 0 | 0 | 0 | 0 | 1 | 0 | 11 | 0 | 0 | 1 |
| 0 | 0 | 0 | 0 | 0 | 0 | 0 | 1 | 10 | 0 | 0 | 1 |

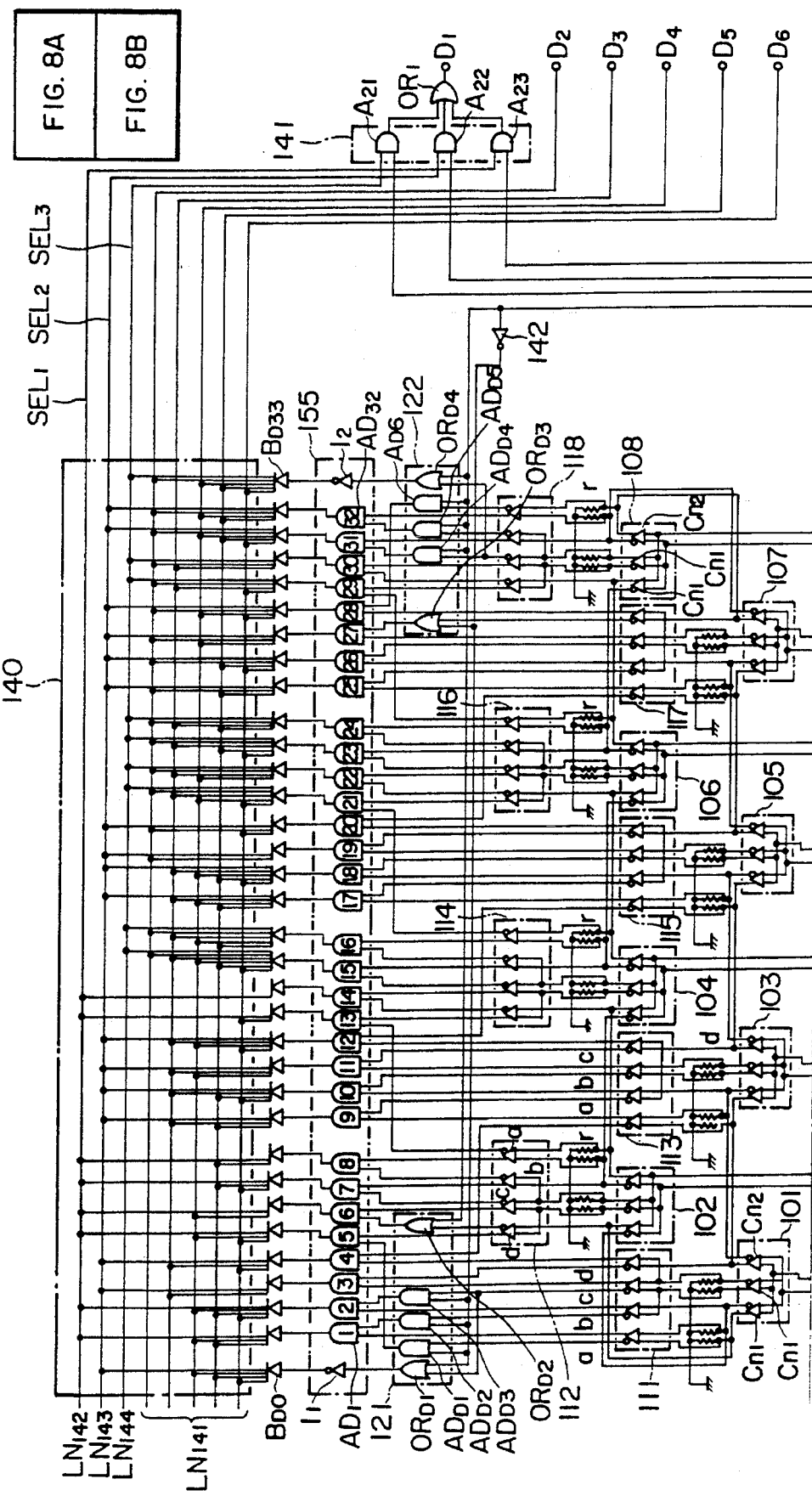

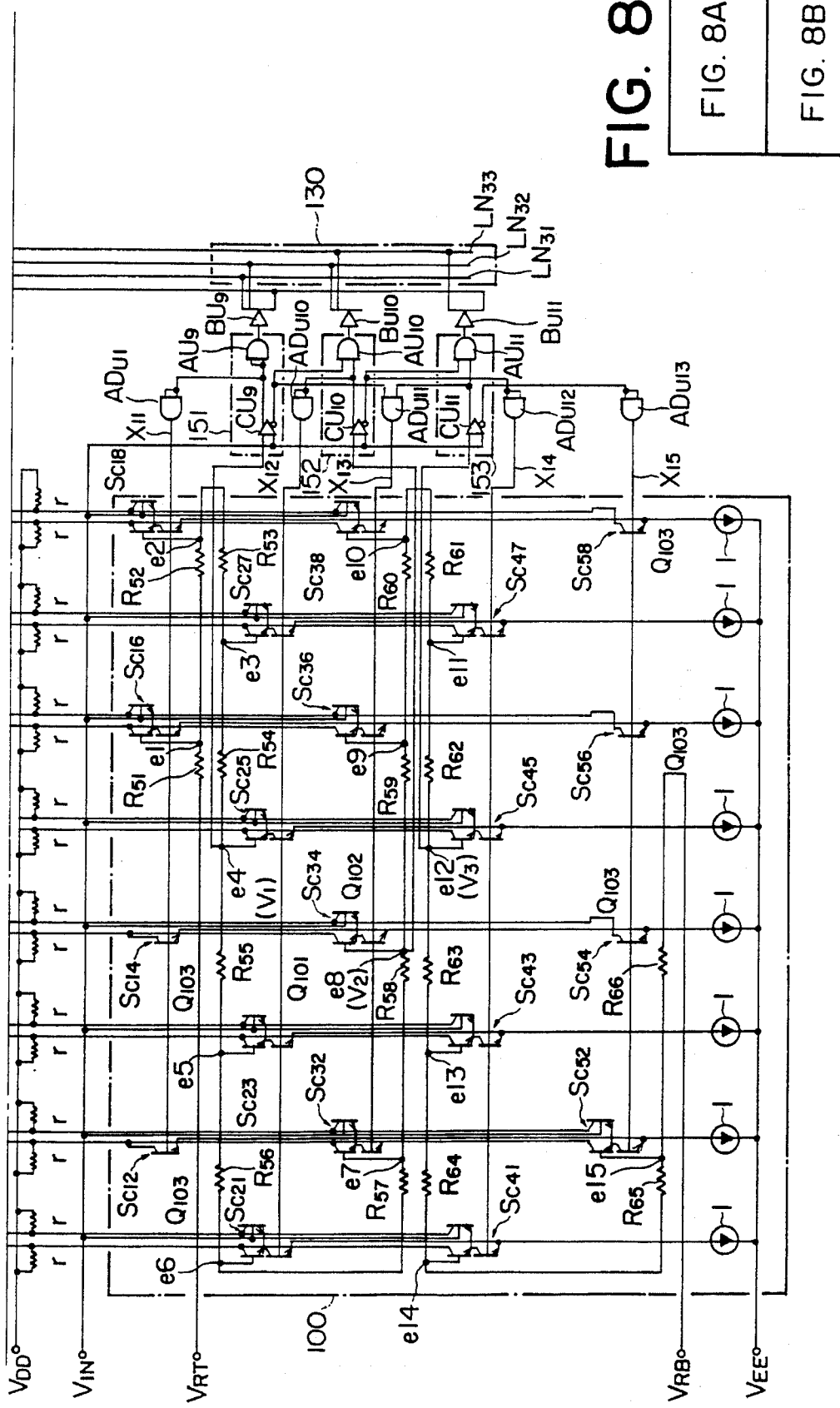

FIG. 12

| AND GATES OF WHICH OUTPUT BECOME 「1」 | CONVERTED CODE | | | | | SELECTED LINE | | |
|---|---|---|---|---|---|---|---|---|
| | $D_2$ | $D_3$ | $D_4$ | $D_5$ | $D_6$ | $LN_{142}$ | $LN_{143}$ | $LN_{144}$ |
| $I_1$ ($AD_0$) | 0 | 0 | 1 | 1 | 1 | 0 | 1 | 0 |
| $AD_1$ | 0 | 0 | 1 | 1 | 0 | 1 | 0 | 0 |
| $AD_2$ | 0 | 0 | 1 | 1 | 1 | 1 | 0 | 0 |
| $AD_3$ | 0 | 1 | 0 | 0 | 0 | 0 | 1 | 0 |
| $AD_4$ | 0 | 1 | 0 | 0 | 1 | 0 | 1 | 0 |
| $AD_5$ | 0 | 0 | 1 | 0 | 1 | 1 | 0 | 0 |
| $AD_6$ | 0 | 0 | 1 | 0 | 0 | 1 | 0 | 0 |
| $AD_7$ | 0 | 0 | 0 | 1 | 1 | 1 | 0 | 0 |
| $AD_8$ | 0 | 0 | 0 | 1 | 0 | 1 | 0 | 0 |
| $AD_9$ | 0 | 1 | 0 | 1 | 0 | 0 | 1 | 0 |
| $AD_{10}$ | 0 | 1 | 0 | 1 | 1 | 0 | 1 | 0 |
| $AD_{11}$ | 0 | 1 | 1 | 0 | 0 | 0 | 1 | 0 |
| $AD_{12}$ | 0 | 1 | 1 | 0 | 1 | 0 | 1 | 0 |
| $AD_{13}$ | 0 | 0 | 0 | 0 | 1 | 1 | 0 | 0 |
| $AD_{14}$ | 0 | 0 | 0 | 0 | 0 | 1 | 0 | 0 |
| $AD_{15}$ | 1 | 1 | 1 | 1 | 1 | 0 | 0 | 1 |
| $AD_{16}$ | 1 | 1 | 1 | 1 | 0 | 0 | 0 | 1 |
| $AD_{17}$ | 0 | 1 | 1 | 1 | 0 | 0 | 1 | 0 |
| $AD_{18}$ | 0 | 1 | 1 | 1 | 1 | 0 | 1 | 0 |
| $AD_{19}$ | 1 | 0 | 0 | 0 | 0 | 0 | 1 | 0 |
| $AD_{20}$ | 1 | 0 | 0 | 0 | 1 | 0 | 1 | 0 |
| $AD_{21}$ | 1 | 1 | 1 | 0 | 1 | 0 | 0 | 1 |
| $AD_{22}$ | 1 | 1 | 1 | 0 | 0 | 0 | 0 | 1 |
| $AD_{23}$ | 1 | 1 | 0 | 1 | 1 | 0 | 0 | 1 |
| $AD_{24}$ | 1 | 1 | 0 | 1 | 0 | 0 | 0 | 1 |
| $AD_{25}$ | 1 | 0 | 0 | 1 | 0 | 0 | 1 | 0 |
| $AD_{26}$ | 1 | 0 | 0 | 1 | 1 | 0 | 1 | 0 |
| $AD_{27}$ | 1 | 0 | 1 | 0 | 0 | 0 | 1 | 0 |
| $AD_{28}$ | 1 | 0 | 1 | 0 | 1 | 0 | 1 | 0 |
| $AD_{29}$ | 1 | 1 | 0 | 0 | 1 | 0 | 0 | 1 |
| $AD_{30}$ | 1 | 1 | 0 | 0 | 0 | 0 | 0 | 1 |
| $AD_{31}$ | 1 | 0 | 1 | 1 | 1 | 0 | 1 | 0 |
| $AD_{32}$ | 1 | 0 | 1 | 1 | 0 | 0 | 1 | 0 |
| $I_2$ ($AD_{33}$) | 1 | 0 | 1 | 1 | 1 | 0 | 0 | 1 |

FIG. 15

UPPER DATA CONVERSION

| INPUT VOLTAGE | COMPARATOR OUTPUTS | | | AND GATES OUTPUTS | | | OUTPUT CODE | |
|---|---|---|---|---|---|---|---|---|
| $V_{IN}$ | $C_{U15}$ | $C_{U16}$ | $C_{U17}$ | $A_{U15}$ | $A_{U16}$ | $A_{U17}$ | $D_0$ | $D_1$ |
| $V_{52}<$ | 1 | 1 | 1 | 0 | 0 | 1 | 1 | 1 |
| $V_{48} \sim V_{52}$ | 1 | 1 | 0 | 0 | 1 | 0 | 1 | 0 |
| $V_{44} \sim V_{48}$ | 1 | 0 | 0 | 1 | 0 | 0 | 0 | 1 |
| $< V_{44}$ | 0 | 0 | 0 | 0 | 0 | 0 | 0 | 0 |

FIG. 16

LOWER DATA CONVERSION

| INPUT VOLTAGE | SWITCHING BLOCK OUTPUTS | | | DETERMINATION CIRCUIT OUTPUTS | | | AND GATES OUTPUTS | | | OUTPUT CODE | |
|---|---|---|---|---|---|---|---|---|---|---|---|
| $V_{IN}$ | $S_{102}$ $S_{97}$ $S_{96}$ $S_{91}$ | $S_{101}$ $S_{98}$ $S_{95}$ $S_{92}$ | $S_{100}$ $S_{99}$ $S_{94}$ $S_{93}$ | $EOD_1$ | $EOD_2$ | $EOD_3$ | $AD_{51}$ | $AD_{52}$ | $AD_{53}$ | $D_2$ | $D_3$ |
| $V_{43} \sim V_{44}$ | 0 0 0 1 | 0 0 0 1 | 0 0 0 1 | 1 | 1 | 1 | 0 | 0 | 1 | 1 | 1 |
| $V_{42} \sim V_{43}$ | 0 0 0 1 | 0 0 0 1 | 0 0 0 0 | 1 | 1 | 0 | 0 | 1 | 0 | 1 | 0 |
| $V_{41} \sim V_{42}$ | 0 0 0 1 | 0 0 0 0 | 0 0 0 0 | 1 | 0 | 0 | 1 | 0 | 0 | 0 | 1 |
| $< V_{41}$ | 0 0 0 0 | 0 0 0 0 | 0 0 0 0 | 0 | 0 | 0 | 0 | 0 | 0 | 0 | 0 |

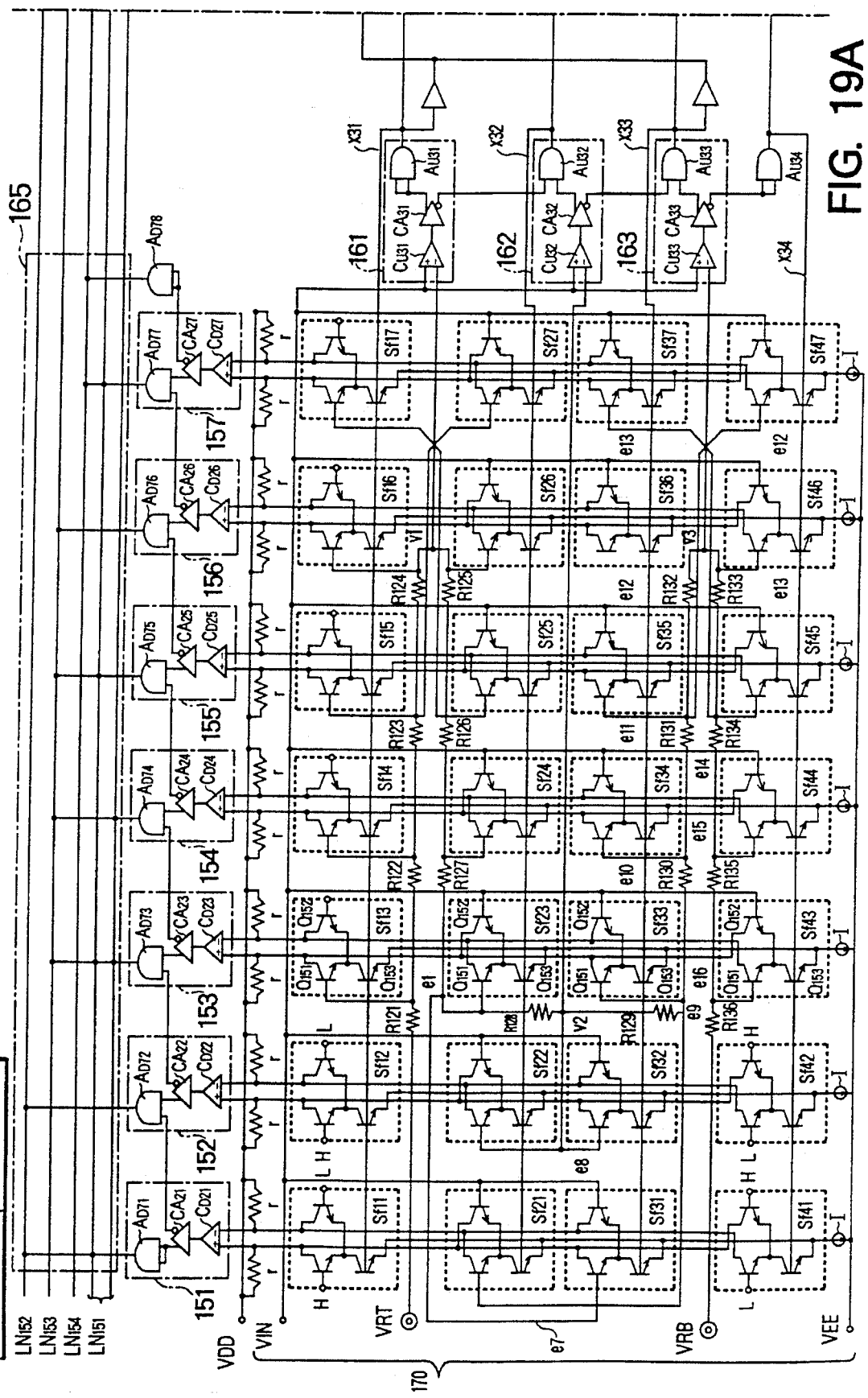

| COMPARATOR OUTPUT | | | | LINE OUTPUT (REDUNDANCY MODE) | | |
|---|---|---|---|---|---|---|
| $A_{U31}$ | $A_{U32}$ | $A_{U33}$ | $A_{U34}$ | $LN_{156}$ (REDUNDANT L) | $LN_{157}$ (NON-REDUNDANT) | $LN_{158}$ (REDUNDANT R) |
| 1 | 0 | 0 | 0 | 10 | 11 | 11 |
| 0 | 1 | 0 | 0 | 01 | 10 | 11 |
| 0 | 0 | 1 | 0 | 00 | 01 | 10 |
| 0 | 0 | 0 | 1 | 00 | 00 | 01 |

FIG. 21

| LOWER COMPARATOR OUTPUT | | | | | | | | LOWER DATA | SELECTED SIGNAL | | |
|---|---|---|---|---|---|---|---|---|---|---|---|
| $A_{D71}$ | $A_{D72}$ | $A_{D73}$ | $A_{D74}$ | $A_{D75}$ | $A_{D76}$ | $A_{D77}$ | $A_{D78}$ | $BD_{63}, BD_{64}$ | $SEL_{11}$ | $SEL_{12}$ | $SEL_{13}$ |
| 1 | 0 | 0 | 0 | 0 | 0 | 0 | 0 | 01 | 1 | 0 | 0 |
| 0 | 1 | 0 | 0 | 0 | 0 | 0 | 0 | 00 | 1 | 0 | 0 |
| 0 | 0 | 1 | 0 | 0 | 0 | 0 | 0 | 11 | 0 | 1 | 0 |
| 0 | 0 | 0 | 1 | 0 | 0 | 0 | 0 | 10 | 0 | 1 | 0 |
| 0 | 0 | 0 | 0 | 1 | 0 | 0 | 0 | 01 | 0 | 1 | 0 |
| 0 | 0 | 0 | 0 | 0 | 1 | 0 | 0 | 00 | 0 | 1 | 0 |
| 0 | 0 | 0 | 0 | 0 | 0 | 1 | 0 | 11 | 0 | 0 | 1 |
| 0 | 0 | 0 | 0 | 0 | 0 | 0 | 1 | 10 | 0 | 0 | 1 |

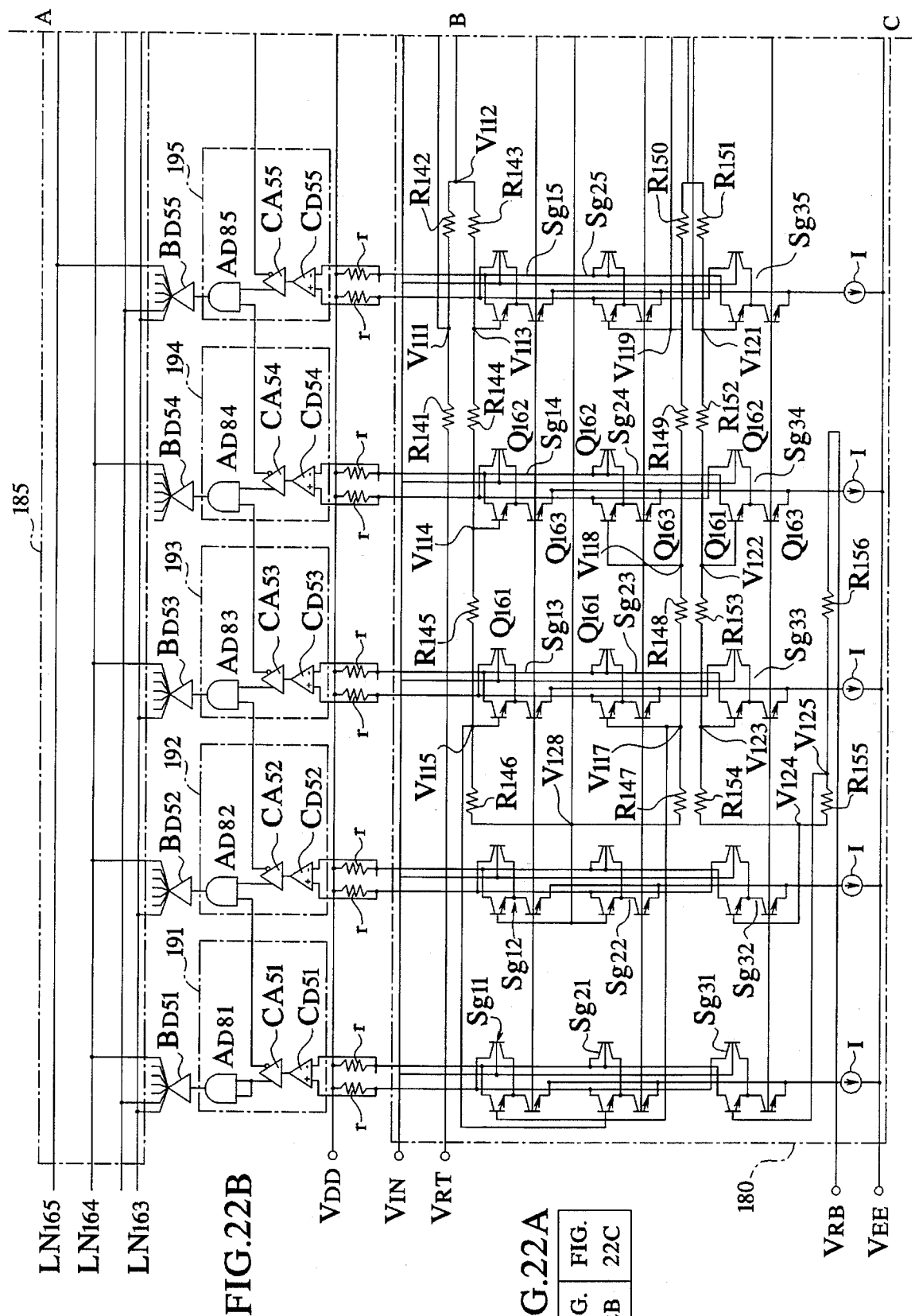

FIG. 23

| COMPARATOR OUTPUT | | | LINE OUTPUT | |
|---|---|---|---|---|
| $A_{U41}$ | $A_{U42}$ | $A_{U43}$ | $LN_{161}$ | $LN_{162}$ |
| 1 | 0 | 0 | 10 | 11 |
| 0 | 1 | 0 | 10 | 01 |
| 0 | 0 | 1 | 00 | 01 |

FIG. 24

| | $A_{D81}$ | $A_{D82}$ | $A_{D83}$ | $A_{D84}$ | $A_{D85}$ | $A_{D86}$ | $A_{D87}$ | $A_{D88}$ |
|---|---|---|---|---|---|---|---|---|
| $A_H$ | 1111 | 1110 | 1101 | 1100 | 1111 | 1110 | 1101 | 1100 |
| $A_{U41}$ | 1000 | 1001 | 1010 | 1011 | 1100 | 1101 | 1110 | 1111 |
| $A_{U42}$ | 1011 | 1010 | 1001 | 1000 | 0111 | 0110 | 0101 | 0100 |
| $A_{U43}$ | 0000 | 0001 | 0010 | 0011 | 0100 | 0101 | 0110 | 0111 |
| $A_L$ | 0011 | 0010 | 0001 | 0000 | 0011 | 0010 | 0001 | 0000 |

↑C

LEFT REDUNDANCY | NON REDUNDANCY | RIGHT REDUNDANCY

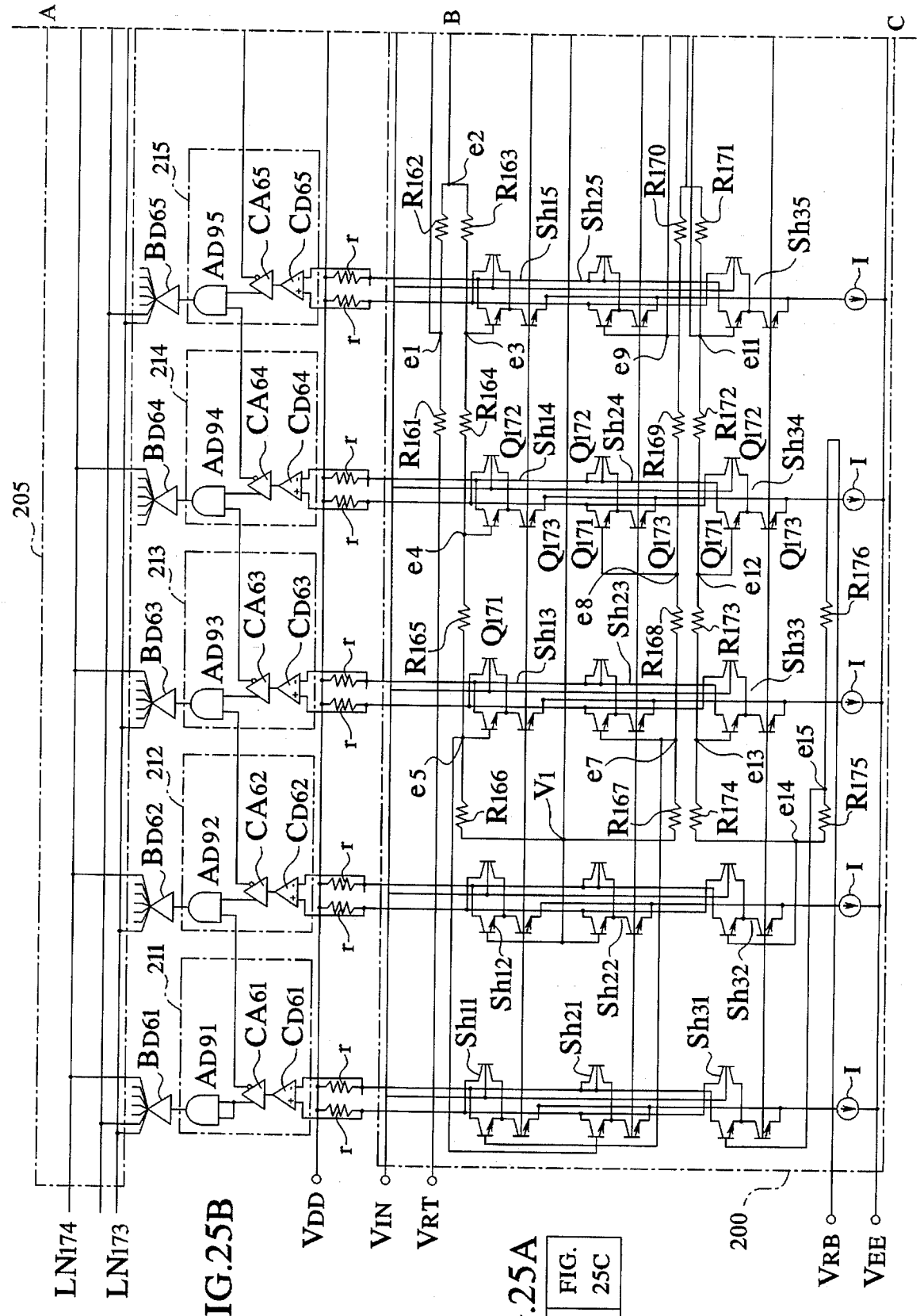

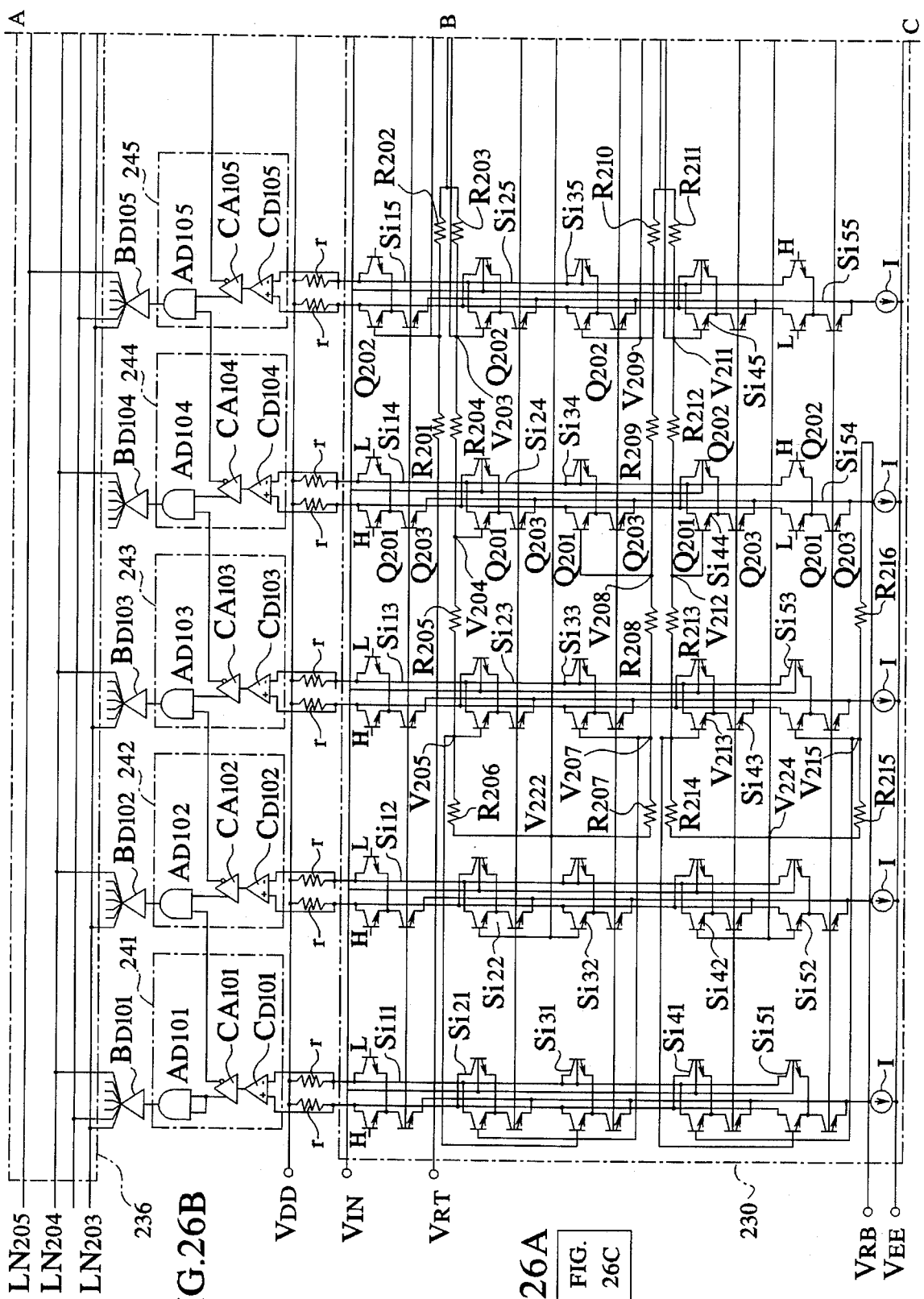

FIG. 27

| COMPARATOR OUTPUT | | | | | LINE OUTPUT | |
|---|---|---|---|---|---|---|
| AU101 | AU102 | AU103 | AU104 | AU105 | LN201 | LN202 |
| 1 | 0 | 0 | 0 | 0 | 1 | 1 |
| 0 | 1 | 0 | 0 | 0 | 1 | 1 |
| 0 | 0 | 1 | 0 | 0 | 1 | 0 |
| 0 | 0 | 0 | 1 | 0 | 0 | 0 |
| 0 | 0 | 0 | 0 | 1 | 0 | 0 |

FIG. 28

| | AD101 | AD102 | AD103 | AD104 | AD105 | AD106 | AD107 | AD108 |
|---|---|---|---|---|---|---|---|---|
| AU101 | 1111 | 1110 | 1101 | 1100 | 1111 | 1110 | 1101 | 1100 |
| AU102 | 1000 | 1001 | 1010 | 1011 | 1100 | 1101 | 1110 | 1111 |
| AU103 | 1011 | 1010 | 1001 | 1000 | 0111 | 0110 | 0101 | 0100 |
| AU104 | 0000 | 0001 | 0010 | 0011 | 0100 | 0101 | 0110 | 0111 |
| AU105 | 0011 | 0010 | 0001 | 0000 | 0011 | 0010 | 0001 | 0000 |

↑C

LEFT REDUNDANCY | NON REDUNDANCY | RIGHT REDUNDANCY

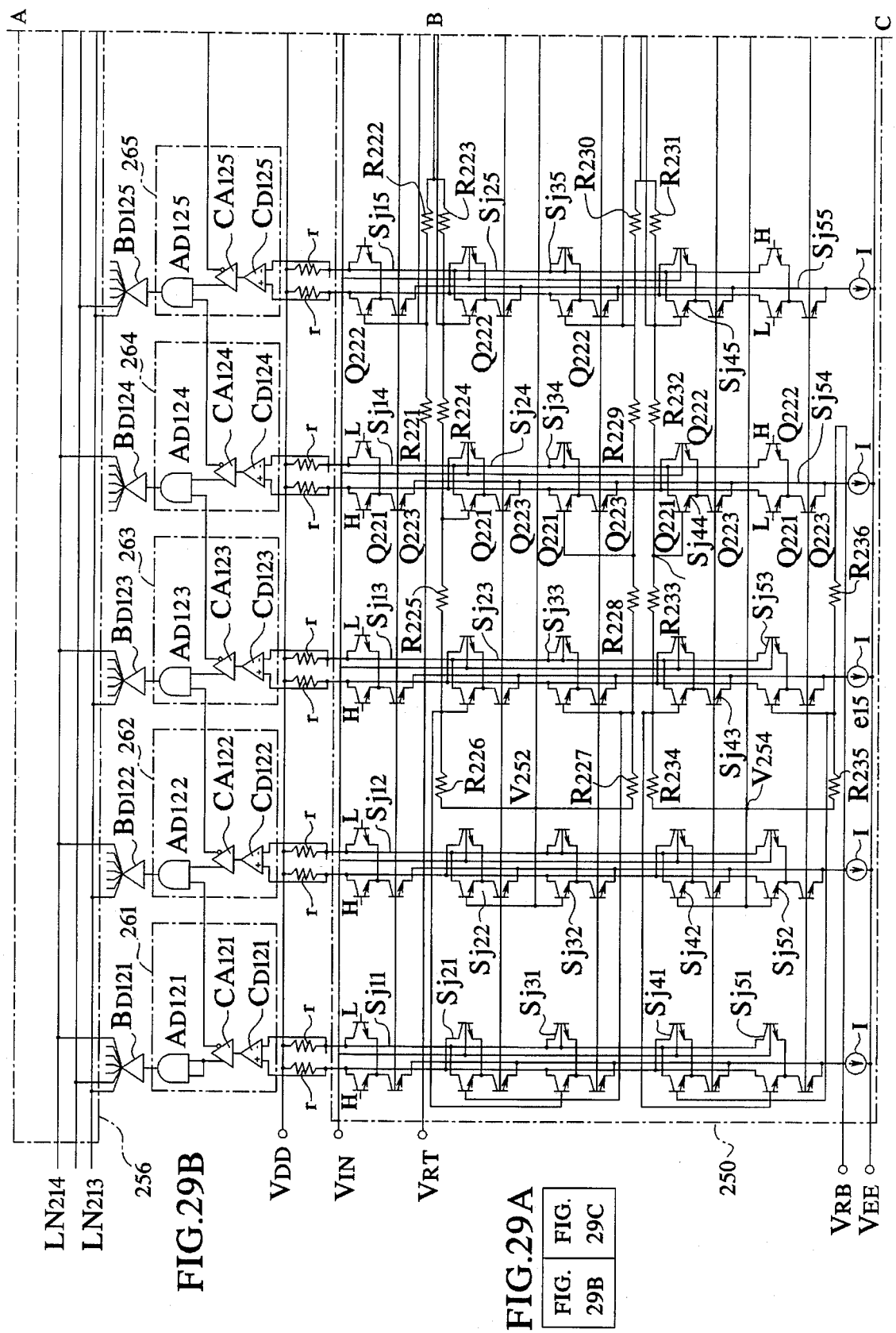

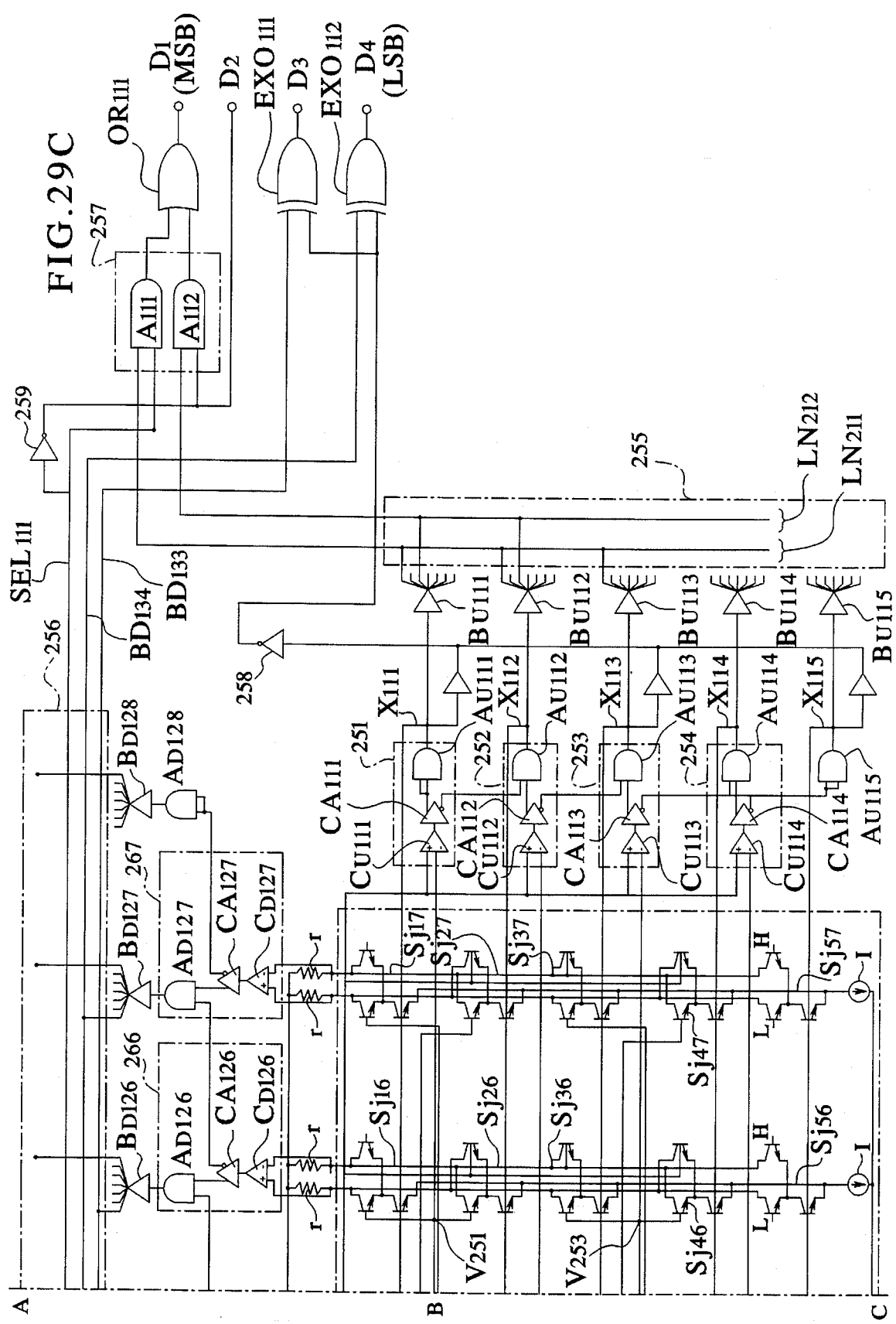

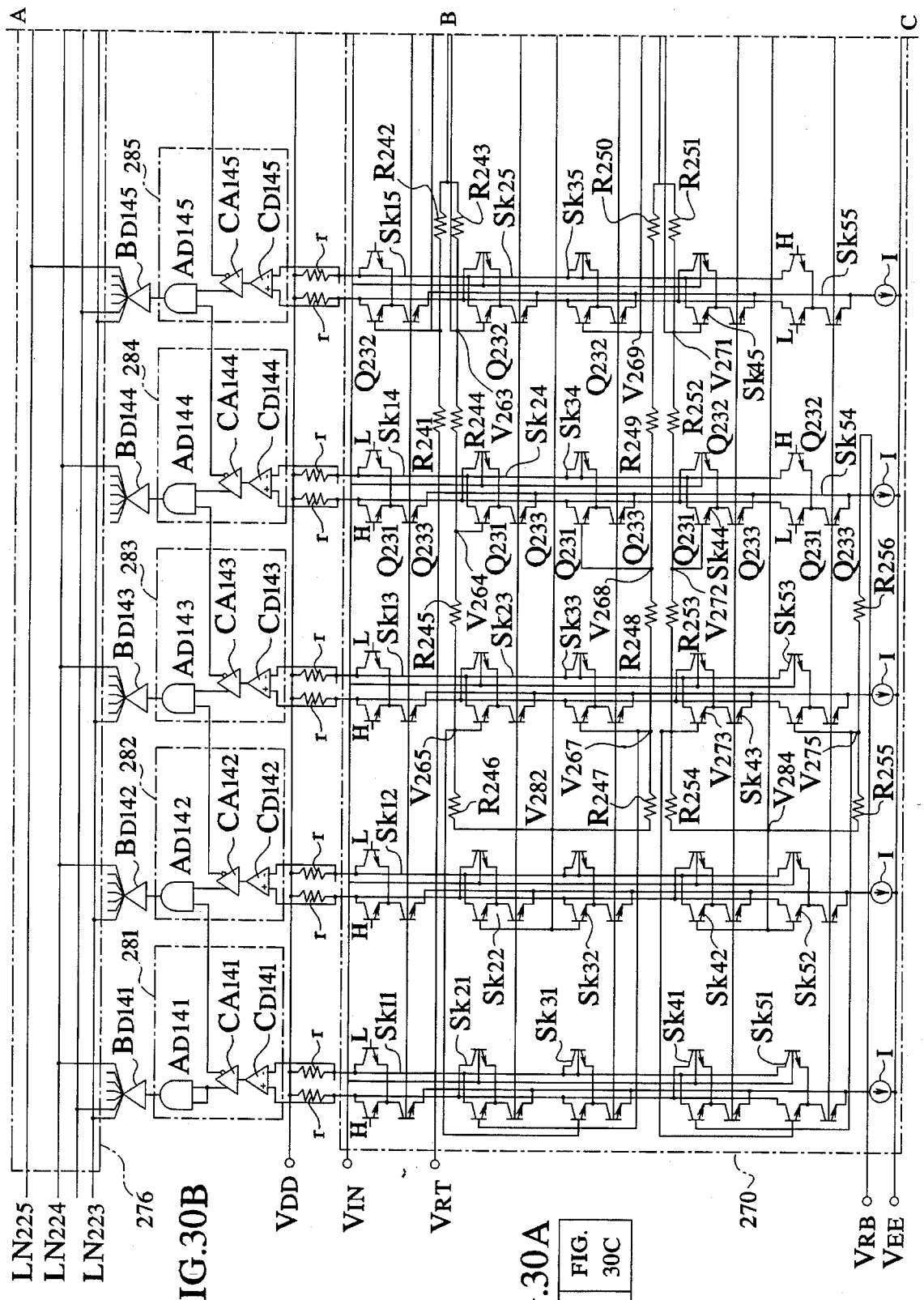

FIG. 31

| COMPARATOR OUTPUT | | | | | LINE OUTPUT | |
|---|---|---|---|---|---|---|
| $AU_{131}$ | $AU_{132}$ | $AU_{133}$ | $AU_{134}$ | $AU_{135}$ | $LN_{221}$ | $LN_{222}$ |
| 1 | 0 | 0 | 0 | 0 | 11 | 11 |
| 0 | 1 | 0 | 0 | 0 | 10 | 11 |
| 0 | 0 | 1 | 0 | 0 | 10 | 01 |
| 0 | 0 | 0 | 1 | 0 | 00 | 01 |
| 0 | 0 | 0 | 0 | 1 | 00 | 00 |

FIG. 32

| | $AD_{141}$ | $AD_{142}$ | $AD_{143}$ | $AD_{144}$ | $AD_{145}$ | $AD_{146}$ | $AD_{147}$ | $AD_{148}$ |
|---|---|---|---|---|---|---|---|---|
| $AU_{131}$ | 1111 | 1110 | 1101 | 1100 | 1111 | 1110 | 1101 | 1100 |
| $AU_{132}$ | 1000 | 1001 | 1010 | 1011 | 1100 | 1101 | 1110 | 1111 |
| $AU_{133}$ | 1011 | 1010 | 1001 | 1000 | 0111 | 0110 | 0101 | 0100 |
| $AU_{134}$ | 0000 | 0001 | 0010 | 0011 | 0100 | 0101 | 0110 | 0111 |
| $AU_{135}$ | 0011 | 0010 | 0001 | 0000 | 0011 | 0010 | 0001 | 0000 |

LEFT REDUNDANCY — NON REDUNDANCY (C) — RIGHT REDUNDANCY

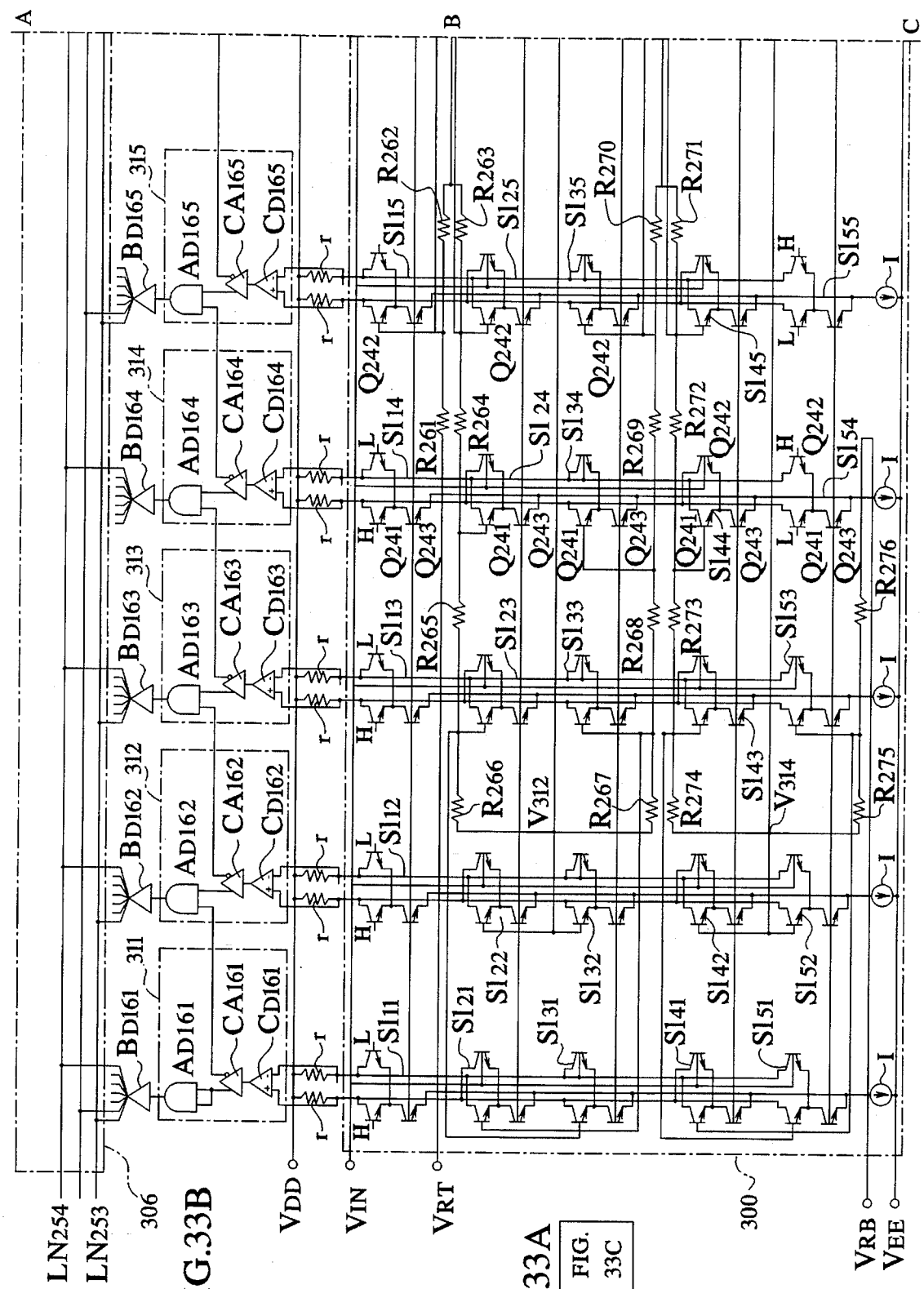

FIG. 35

| COMPARATOR OUTPUT | | | LINE OUTPUT | |
|---|---|---|---|---|
| $A_{U171}$ | $A_{U172}$ | $A_{U173}$ | $LN_{271}$ | $LN_{272}$ |
| 1 | 0 | 0 | 10 | 11 |
| 0 | 1 | 0 | 10 | 01 |
| 0 | 0 | 1 | 00 | 01 |

FIG. 36

| | | $A_{D181}$ | $A_{D182}$ | $A_{D183}$ | $A_{D184}$ | $A_{D185}$ | $A_{D186}$ | $A_{D187}$ | $A_{D188}$ |
|---|---|---|---|---|---|---|---|---|---|
| $A_{U173}$ | | | 1111 | | 1110 | | 1101 | | 1100 |
| | $A_{U172}$ | 1000 | | 1001 | | 1010 | | 1011 | |
| $A_{U171}$ | | | 0111 | | 0110 | | 0101 | | 0100 |
| | | 0000 | | 0001 | | 0010 | | 0011 | |

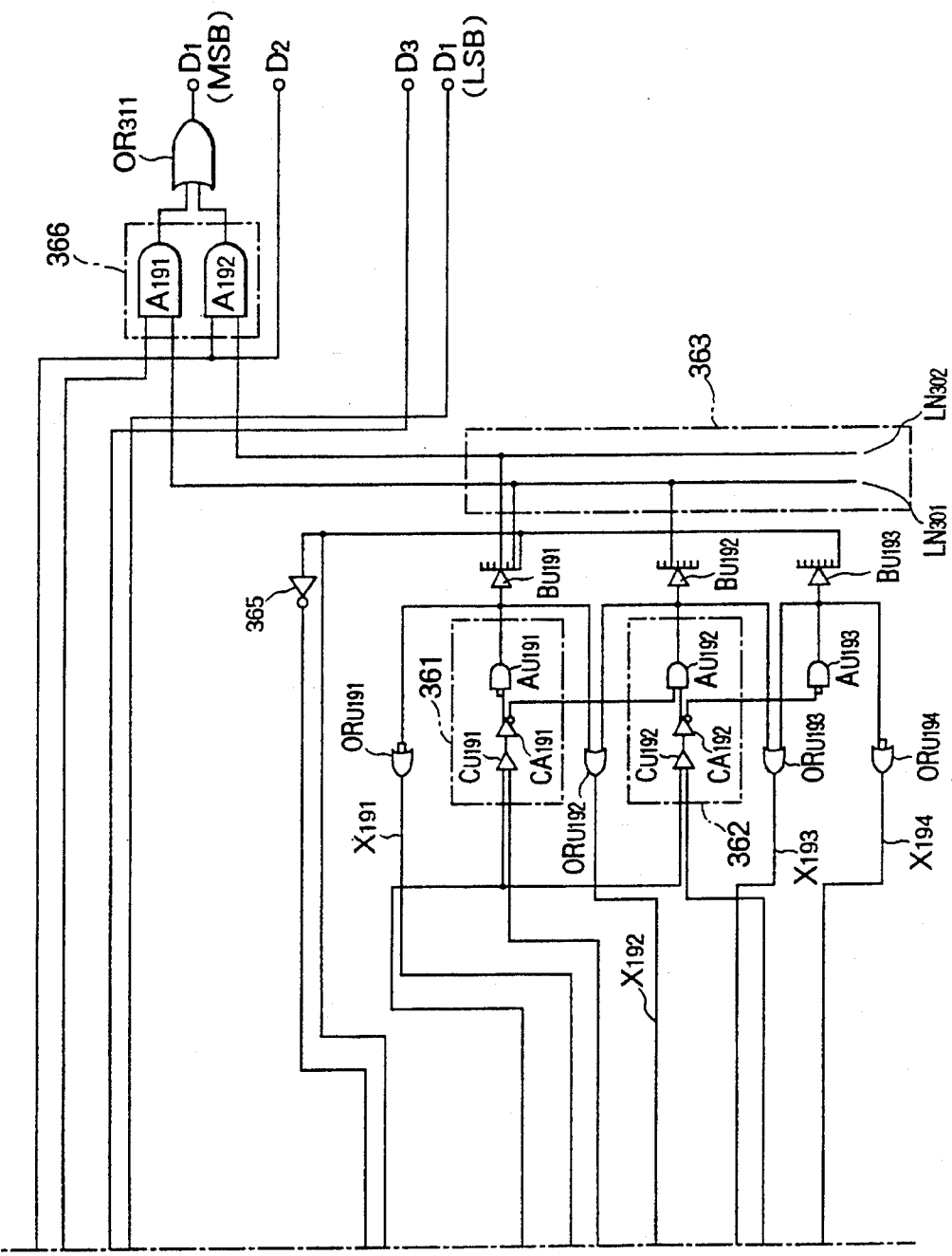

ANALOG TO DIGITAL CONVERTER CIRCUIT

BACKGROUND OF THE INVENTION

1. Field of the Invention

The present invention relates to an analog/digital converter circuit (hereinafter abbreviated as an A/D converter circuit) for converting an analog signal to a digital signal, and more particularly the present invention relates to a serial/parallel type A/D converter circuit for converting an analog signal to a digital signal with two stages that form an upper data part and a lower data part.

2. Description of the Related Art

Various types of analog-to-digital conversion systems have been proposed, in one such system known as a parallel-type (flash-type) A/D converter the circuit quantizes the amplitude of the analog signal and converts the quantized signal to a digital code.

In such a parallel-type A/D converter circuit, high speed operation is possible, however when the number of the conversion bits is n, at least ($2^n-1$) comparators are necessary for implementation of the circuit. A total of 255 comparators are necessary to obtain an 8-bit conversion code, and it is necessary to form several tens of thousands active elements by integration into a circuit in order to obtain a digital code having higher resolution.

For this reason, a parallel-type A/D converter circuit has the advantage that high speed processing is possible, but it is undesirable due to increases in which is required power consumption and the large surface area for the chip.

Therefore, a so-called serial/parallel type A/D converter circuit has been proposed in which, for conversion of the analog signal to n bits of resolution. In this circuit first the analog signal is digitized by rough quantization, so that an "a" bit conversion code including the most significant bit (MSB) is obtained, and in order to reduce the error of this upper data conversion code, that is, the quantization noise, the upper data quantization range is finely divided and digitized, so that the lower data [b (n–a)] bit conversion code including the lower significant bit (LSB) is obtained.

FIG. 1 is a structural view showing an outline of one such serial/parallel type A/D converter circuit which illustrates the circuit configuration for converting an analog signal to a 4-bit digital code.

In FIG. 1, $R_1$ to $R_{16}$ denote reference resistance elements serially connected between terminals of reference voltages $V_{RT}$ to $V_{RB}$ (0 to $-2$ V); $C_{u1}$ to $C_{u3}$ denote upper data comparators which have one input terminal connected to an input line of an input analog signal $V_{IN}$ to be converted and the other input terminal connected to the input line of the reference voltages ($V_4$, $V_8$, $V_{12}$) of the rough quantization level divided by reference resistance elements $R_1$ to $R_{16}$; $B_{u1}$ to $B_{u3}$ denote buffers for obtaining the complementary outputs of the outputs of upper data comparators $C_{u1}$ to $C_{u3}$; $A_{u1}$ to $A_{u4}$ denote AND gates; $S_{a1}$ to $S_{a12}$ denote switching blocks arranged in the form of a matrix comprising four rows and three columns; $C_{d1}$ to $C_{d3}$ denote lower data comparators with one input terminal connected to the input line of the analog signal $V_{IN}$ and the other side input terminal connected to the output terminals of the switching blocks $S_{a1}$ to $S_{a12}$; $E_{u1}$ denotes an upper data encoder which encodes the result of differentiation of binary signals output from the upper data comparators $C_{u1}$ to $C_{u3}$ and converts the same to for example a 2-bit binary code (or complementary code of 2); and $E_{d1}$ denotes a lower data encoder which converts the result of differentiation of the binary signals output from the lower data comparators $C_{d1}$ to $C_{d3}$ to a 2-bit binary code; respectively.

The switching blocks $S_{a1}$ to $S_{a12}$ are controlled to turn on or off in accordance with the data "1" and "0" of the output level of the AND gates $A_{u1}$ to $A_{u4}$.

For example, when a signal of the "1" level is output from the AND gate $A_{u1}$, control is performed so that the switching blocks $S_{a1}$ to $S_{a3}$ become an ON state; when the signal of the "1" level is output from the AND gate $A_{u2}$, control is performed so that the switching blocks $S_{a4}$ to $S_{a6}$ become an ON state; when the signal of the "1" level is output from the AND gate $A_{u3}$, control is performed so that the switching blocks $S_{a7}$ to $S_{a9}$ become an ON state; and when the signal of the "1" level is output from the AND gate $A_{u4}$, control is performed so that the switching blocks $S_{a10}$ to $S_{a12}$ become an ON state;

In the serial/parallel type A/D converter circuit having such a structure, as shown in for example FIG. 2, the input analog signal $V_{IN}$ is sampled at the using point of the sampling pulse $P_S$, and the sampling voltage $V_S$ thereof is supplied to the upper data encoder $E_{u1}$ and the lower data encoder $E_{d1}$.

At the upper data encoder $E_{u1}$, when the sampling voltage $V_S$ is supplied, the binary signal outputs of the upper data comparators $C_{u1}$ to $C_{u3}$ are converted to the code signals $D_0$ and $D_1$ of the upper significant 2 bits at the point of time $T_H$ of trailing edge (point of time lagged by $\tau_A$) of the clock signal CLK and output.

At the lower data encoder $E_{d1}$, when the sampling voltage $V_S$ is supplied, the binary signal outputs of the lower data comparators $C_{d1}$ to $C_{d3}$ are converted to the code signals $D_2$ and $D_3$ of the lower significant 2 bits at the point of time $T_L$ of trailing (point of time lagged by $\tau_B$) of the clock signal CLK, Explaining this more concretely, reference voltages $V_4$, $V_8$, and $V_{12}$ of the rough quantization level, divided by the reference resistance elements $R_1$ to $R_{16}$ and the input analog signal $V_{IN}$ are compared by the upper data comparators $C_{u1}$ to $C_{u3}$.

As a result of this comparison, for example, when $V_4 < V_{IN} < V_8$, the output of the upper data comparator $C_{u3}$ becomes the high level at a high potential ("1"), and the outputs of the upper data comparators $C_{u2}$ and $C_{u3}$ become the low level at a low potential ("0").

Thus, at the output of the AND gates $A_{u1}$ to $A_{u4}$, only the output of the AND gate $A_{u2}$ becomes "1", and the outputs of the other AND gates $A_{u1}$, $A_{u3}$, and $A_{u4}$ become "0".

As a result, the code [01] is output as the upper significant 2 bits of the conversion code from the upper data encoder $E_{u1}$.

Next, in a state where the upper significant 2 bits of the conversion code are latched, the signal of the "1" level output from the AND gate $A_{u2}$ is input to the switching blocks $S_{a4}$ to $S_{a6}$. By this, the switching blocks $S_{a4}$ to $S_{a6}$ become an ON state.

Along with the switching blocks $S_{a4}$ to $S_{a6}$ becoming the ON state, the sampled analog signal $V_{IN}$ existing at the level represented as $V_4 < V_{IN} < V_8$ is further divided by the resistance elements $R_4$ to $R_6$, and regulated reference voltages $V_5$, $V_6$, and $V_7$ are input via the switching blocks $S_{a4}$, $S_{a5}$, and $S_{a6}$ to the other input terminals of the lower data comparators $C_{d3}$, $C_{d2}$, and $C_{d1}$, respectively.

In the lower data comparators $C_{d3}$, $C_{d2}$, and $C_{d1}$, the input reference voltages $V_5$, $V_6$, and $V_7$ are compared with the analog signal $V_{IN}$ which is input to the one side input terminals of the same and the result of comparison is output to the lower data encoder $E_{d1}$.

As a result of this comparison, when for example $V_6 < V_{IN} < V_7$, the lower significant 2 bits of the conversion code [10] are output from the lower data encoder $E_{d1}$.

As a result of the above, a 4-bit conversion code [0110] of the analog signal $V_{IN}$ will be output from the upper data and lower data encoders $E_{u1}$ and $E_{u2}$.

This serial/parallel type A/D converter circuit outputs the conversion code while dividing the same to upper significant and lower significant 2 bits and therefore can reduce the number of comparators required when performing the A/D conversion of 4 bits to 6.

Also, when for example A/D conversion of 8 bits is to be carried out, as mentioned above, in the parallel type A/D converter circuit, 255 comparators are necessary, but this serial/parallel type A/D converter circuit has an advantage in that only $(2^4-1) \times 2 = 30$ comparators are sufficient to provide four upper significant bits and lower significant bits, respectively.

However, since the code conversion is carried out by two stages, during this time, it is necessary to provide a sample and hold circuit so that the input signal voltage is not changed, but is held at a fixed value, consequently leading to inducing complication of the circuit control etc.

In the above-mentioned A/D converter circuit, when increased resolution thereof is desired, a large number of taps from a voltage-division resistance element group becomes necessary, and finer processing of the semiconductor material becomes necessary. The reference voltage value of adjoining comparators becomes smaller if miniaturization is further increased, whereby a so-called offset voltage of the comparator becomes equivalent to the difference, thereby producing problems such as the loss of the comparator characteristics.

Therefore, as a means solving this problem and improving the resolution, a comparator circuit adopting a so-called interpolation construction has been proposed.

FIG. 3 is a schematic circuit diagram showing a conventional comparator circuit adopting this interpolation construction. In FIG. 3, comparators 24 and 25 denote complementary output type comparators; $v_{in}$ denotes an input analog signal; and $v_{r1}$, $v_{r2}$ ($v_{r1} < v_{r2}$) denote reference voltages; respectively.

In this comparator circuit, an imaginary voltage at an intermediate point between two reference voltages $v_{r1}$ and $v_{r2}$ is obtained from the positive output of the comparator 24 and the negative output of the comparator 25, and the result of comparison of this imaginary voltage with the input analog signal $v_{in}$ is successively obtained.

This structure has an advantage in that the error resulting from of, for example, the processing precision can be easily absorbed in comparison with a case where a large number of independent taps are adopted as mentioned above. This design however, can merely perform an equal weight between two reference voltages $v_{r1}$ and $v_{r2}$, and only can obtain an excessive result of comparison with the voltage at an intermediate point between two reference voltages. This design cannot freely obtain an imaginary voltage or a plurality of imaginary voltages.

Accordingly, there are problems in that the resolution of the above-mentioned conventional A/D converter circuit can be raised to only twice its level and improvement exceeding this is difficult, and furthermore, the application range is restricted.

A detailed description will be further made particularly of another design in the related art, which is a modification of the lower data encoder.

FIGS. 4A and 4B illustrate a circuit diagram showing an example of the structure of a conventional A/D converter circuit and shows a circuit structure for converting an analog signal $V_{IN}$ to a 4-bit digital code.

In FIG. 4A, reference numeral 30 denotes a matrix circuit; 61 to 60 denote upper data comparators; 63 denotes an upper data encoder; 31 to 37 denote lower data comparators; 40 denotes a lower data encoder; 64 an inverted gate; 65 an inhibit gate; 66 a selection gate; and 67 an inverter; respectively.

The matrix circuit 30 is comprised of 28 switching blocks $S_{b11}$ to $S_{b17}$, $S_{21}$ to $S_{b27}$, $S_{b31}$ to $S_{b37}$, and $S_{b41}$ to $S_{b47}$ arranged in the form of a matrix comprising 4 rows and 7 columns.

The switching blocks $S_{b11}$ to $S_{b17}$, $S_{b21}$ to $S_{b27}$, $S_{b31}$ to $S_{b37}$ and $S_{b41}$ to $S_{b47}$ are comprised of differential-type amplifiers comprising npn-type transistors $Q_1$, $Q_2$, and $Q_3$.

Except for parts, reference voltages obtained by dividing the reference voltages $V_{RT}$–$V_{RB}$ by the reference resistance elements $R_{31}$ to $R_{46}$ are supplied to the base of one transistor $Q_1$ constituting a so-called differential pair, and the analog signal $V_{IN}$ to be converted to the digital code is supplied to the base of the other transistor $Q_2$, respectively.

Also, emitters of the transistors $Q_1$ and $Q_2$ are connected to each other, and the middle point of connection thereof is connected to the current source I via the transistor $Q_3$ which is switched by the control signal mentioned later.

Also, a power source voltage $V_{DD}$ is supplied to the collectors of the transistors $Q_1$ and $Q_2$ via the resistor r. The output terminals thereof are connected to the inputs to the comparators $C_{D1}$ to $C_{D7}$ of seven lower data comparators 31 to 37, respectively. Joint use is made of the first stage amplifiers of the lower data comparators 31 to 47.

In the figure, switching blocks $S_{b11}$, $S_{b12}$, $S_{b16}$, $S_{b17}$, $S_{b21}$, $S_{b22}$, $S_{b26}$, $S_{b27}$, $S_{b31}$, $S_{b32}$, $S_{b36}$, $S_{b37}$, $S_{b41}$, $S_{b42}$, $S_{b46}$, and $S_{b47}$ further output 2LSB redundant bits with respect to 2-bit lower data conversion code. Particularly, among them, $S_{b11}$, $S_{b12}$, $S_{b41}$, and $S_{b42}$ are given fixed input signals so that a constant binary signal "H" or "L" is output when activation is made by the control signal.

Also, particularly, a system is devised so that the collectors of the transistors $Q_1$ and $Q_2$ at the second row and fourth row of the switching block are connected to the line in an opposite direction to the collector outputs of the transistors $Q_1$ and $Q_2$ at the first row and the third row of the switching block, whereby the lines of the serially connected reference resistance elements $R_1$ to $R_{16}$ applied with the reference potentials (voltages) $V_{RT}$–$V_{RB}$ can be formed by folding-back.

Each of the three upper data comparators 61, 62, and 63 is provided with the comparators $C_{U5}$ to $C_{U7}$, complementary-type output amplifiers CA, and AND gates $A_{u5}$ to $A_{u8}$, respectively.

An analog signal $V_{IN}$ is supplied to one side inputs of the respective comparators $C_U$ of the upper data comparators 61 to 63, and reference voltages $V_1$, $V_2$, and $V_3$ obtained by dividing the reference potentials $V_{RT}$ to $V_{RB}$ by the rough quantization are supplied to the other side inputs.

The outputs of the respective comparators $C_U$ of the upper data comparators 61 to 63 become the level of "H" or "L"

corresponding to the level of the sampled analog signal and are set so that only one of the respective AND gates $A_U$ outputs the "1" level.

The output signals of the respective AND gates $A_U$ are wired-connected and converted to a binary code via the upper data encoder 60. In the selection gate 66 mentioned later, correction is applied to the upper significant two bits of the codes $D_1$ and $D_2$.

Also the lower data comparators 31 to 37 are formed in the same way as the upper data comparators 61 to 63. Particularly, the lower data comparators 33, 34, and 35 further finely digitize the inside of the quantization level selected by the upper data comparator and output the lower significant 2 bits of the codes $D_3$ and $D_4$ via the lower data encoder 40.

Further, this A/D converter circuit is designed so that comparators 31, 32, 36, and 37 produce the redundant code of 2LSB which are provided on the left and right of this lower data comparator, and the code conversion operation is carried out also for the analog signal $V_{IN}$ out of the conversion range of the lower data comparator, specified by the upper data comparators 61 to 63.

In such a structure, for example when the sampling voltage $V_S$ of the sampled analog signal is represented as $V_{RB} < V_S < V_3$, the outputs of comparators $C_U$ of the upper data comparators 61, 62, and 63 become all "L", so that the binary signal output, is "0" which output from the AND gates $A_{u5}$ to $A_{u7}$, and "1" is output from $A_{u8}$, respectively.

As a result, a binary signal [0001] is input to the upper data encoder 63, and by a so-called wired-OR circuit, [00] is output to the first two lines [$LN_5$]; [00] is output also to the next two lines [$LN_6$], and [01] is output to the next two lines [$LN_7$].

When the sampling voltage $V_S$ is represented as $V_3 < V_S < V_2$, similarly the binary signal of "0" is output from the upper data side AND gates $A_{U5}$, $A_{U6}$, and $A_{U8}$, and the binary signal "1" is output from the gate $A_{U7}$, respectively.

As a result, a binary signal such as [0010] is input to the upper data encoder 63, so that [00] is output from the line [$LN_5$]; [01] is output from the line [$LN_6$]; and [10] is output from the line [$LN_7$].

Below, the relationship between the input and output of the upper data encoder 60 including the case where $V_2 < V_S < V_1$ and $V_1 < V_S < V_{RT}$ is as shown in FIG. 5.

In parallel to this, the transistors $Q_3$ of the respective switching blocks connected to the control lines ($x_5$, $x_6$, $x_7$, and $x_8$) at which the binary output signal has become "1", among the respective AND gates $A_{U(5, 6, 7, 8)}$, is set to ON, and further the fine digitization of the quantization level is executed.

For example, when only the output of the AND gate $A_{U7}$ becomes a "1" level, the transistors $Q_3$ of the switching blocks $S_{b31}$ to $S_{b37}$ turn ON, so that the reference voltage divided by the reference resistance elements $R_{37}$ to $R_{43}$ and the sampling voltage $V_S$ are differentially amplified at the switching blocks $S_{b31}$ to $S_{b37}$ and compared by the lower data comparators 31 to 37.

Similarly, the switching blocks $S_{b21}$ to $S_{b27}$ are activated when the output of the AND gate $A_{U6}$ is at the "1" level, a differential amplification operation is carried out, and the comparison by the lower data comparators 31 to 37 is carried out.

In this way, in the lower data code, the sampled voltage $V_S$ and the reference voltage divided by the reference resistance element of that row are compared in units of rows of the switching block, the binary signals are output from the AND gates $A_{D1}$ to $A_{D7}$ and $A_{D8}$ of the lower data comparators 31 to 37 as shown in FIG. 6, and these binary signals are encoded at the lower data encoder 40, whereby the lower significant 2 bits of the conversion codes $D_3$ and $D_4$ are output from the lower data code line [$LN_1$].

Moreover, the output levels of the selection lines $LN_2$, $LN_3$, and $LN_4$ are changed as shown in FIG. 6.

Then, as indicated below by a, b, and c, when a signal of the "1" level is output to either of these selection lines $LN_2$, $LN_3$, and $LN_4$, the upper significant 2 bits of the conversion codes $D_1$ and $D_2$ from the lines $LN_5$, $LN_6$, and $LN_7$ in the upper data encoder 30 are selectively output via the OR gates $OR_1$ and $OR_2$.

(a) When the conversion code with which "1" is produced in the selection line $LN_3$ (0 line), that is, the lower significant 2 bits of the conversion codes $D_3$ and $D_4$ become [00], [10], and [11] corresponding to the upper data conversion codes, the outputs of the AND gates $A_1$ and $A_2$ constituting the inhibit gate 65 become "0", and therefore the outputs of the AND gates $A_1$, $A_3$, $A_4$, and $A_6$ existing inside the selection gate 66 become "0".

As a result, the upper data $D_1$ and $D_2$ codes of the line [$LN_6$] output from the upper data encoder 63 are output as they are via the AND gates $A_2$ and $A_5$ of the selection gate 66 and the OR gates $OR_1$ and $OR_2$.

This case of (a) indicates a case where the level of the analog signal when performing the conversion of the upper significant 2 bits is not changed from the analog signal when performing the conversion of the lower significant 2 bits, and the correction is not carried out.

(b) Where the selection line $LN_2$ is "1" and the AND gate $A_{U5}$ or $A_{U7}$ is "1", and where the selection line $LN_4$ is "1" and the AND gate $A_{U8}$ or $A_{U6}$ is "1", the AND gate $A_1$ constituting the inhibit gate 65 is opened. As a result, the upper significant 2 bits of the codes $D_1$ and $D_2$ of the line $LN_5$ input to the AND gates $A_1$ and $A_4$ are output via the OR gates $OR_1$ and $OR_2$.

This case of (b) performs the correction where the level of the analog signal when digitizing the upper significant 2 bits $D_1$ and $D_2$ is higher than the analog signal when digitizing the lower significant 2 bits $D_3$ and $D_4$.

For example, as shown in FIG. 7, when the truth value of the sampling value $V_S$ of the analog signal is $V_A$, and when the conversion code of the upper significant 2 bits is erroneously output at [10] and output at a correct lower significant 2 bits of the conversion code [11] from the lower data comparator, "1" is subtracted from the upper significant 2 bits of the conversion code [10], and corrected to [01], thereby obtaining a correct code output [0111].

Namely, this case means that the control line erroneously selects the line of the switching block, but since the lower data comparator 46 on the right side detecting the redundant bit outputs [00], the upper significant 2 bits of the conversion code will be corrected.

(c) Where the selection line $LN_4$ is "1" and the AND gate $A_{U5}$ or $A_{U7}$ is "1", and where the selection line $LN_2$ is "1" and the AND gate $A_{U8}$ or $A_{U6}$ is "1", the output of the AND gate $A_2$ constituting the inhibit gate 65 becomes "1", and the AND gates $A_3$ and $A_6$ of the selection gate 66 are opened.

As a result, the upper significant 2 bits of the codes $D_1$ and $D_2$ of the line $LN_7$ input to these AND gates $A_3$ and $A_6$ are output via the OR gates $OR_1$ and $OR_2$, and "+1" is added to the upper significant 2 bits of the codes.

Namely, in this case of (c), where the sampling level of the analog signal when digitizing the upper significant 2 bits of $D_1$ and $D_2$ is lower than the quantization level range at that time, a correction is applied.

For example, when the truth value of the analog signal $V_{IN}$ exists at the point of $V_B$, when the upper significant 2 bits become [00], if the numerical value of the lower significant 2 bits is output as [00], "+1" is added to the upper significant 2 bits [00], to obtain [01], and the [0100] corresponding to the sampling voltage $v_B$ of the correct analog signal is output.

This A/D converter circuit adds a comparator for detecting the redundant bit to the lower data comparator as described above, outputs, when the lower data conversion code out of the range of the upper data conversion code (region indicated by a hatching in FIG. 7), a signal of the "1" level to the selection line $LN_2$ or $LN_4$, and performs the correction of the upper data conversion code, and therefore has an advantage that a correct conversion code detected at the point of time of lower data can be obtained by high speed sampling even when the settling characteristic of the sampling circuit is poor.

As mentioned above, in the conventional circuit, for correcting the upper data code, a correction is carried out based on the concept of adding "1" and subtracting "1".

For this reason, it is constituted so that, in the upper data, normal data and lower redundant data (data obtained by subtracting "1" from the normal data) and the upper redundant data (data obtained by adding "1" to the normal data) are settled into respective groups, and one is selected from among the three groups by a selection signal from the lower data encoder.

Nevertheless, there alternately exists a column in which the right part of the resistance column becomes the lower redundancy and a column in which it becomes the upper redundancy. Accordingly, there is a case where the lower data encoder connected to the right part of the resistance column selects the lower redundant data and a case where it selects the upper redundant data.

Accordingly, the data to be selected differs for each column, and therefore the inverted gate 64 and inhibit gate 65 were necessary for controlling this.

However, the selection signal from the lower data encoder 50 ($LN_2$, $LN_3$, and $LN_4$ in the diagram) passes through the inverted gate 64 and the inhibit gate 65, and then is transferred to the selection gate 66, and therefore the selection signal is input to the selection gate 66 with a time lag relative to the upper data output from the upper data encoder 63.

For this reason, a delay due to the existence of the inverted gate 64 and the inhibit gate 65 occurs in the output processing of the conversion code, consequently leading to a problem that the conversion time of the A/D converter circuit is increased.

Moreover, there also exists a problem in that increases of the chip area and power consumption are induced since an excessive quantity of inverted gates and inhibit gates become necessary.

Further, there also exists another problem in that, in addition to the necessity of an excessive quantity of inverted gates and inhibit gates, three selection signals become necessary, and three sets of upper data codes to be selected become necessary too, and also the number of input gates in the selection gate is increased, and therefore resulting in increases of the chip area and power consumption.

Further, so as to obtain the upper significant "a" bits, ($2^a-1$) upper data comparators are necessary, and $2^a$ rows become necessary too also for a row of the switching block. This is one of the causes of an increase of the chip area and the power consumption.

SUMMARY OF THE INVENTION

An object of the present invention is to provide an A/D converter circuit which provides greatly improved resolution.

Another object of the present invention is to provide an A/D converter circuit in which prevents an increase of the power consumption and chip area, but also one in which it is not necessary to provide a sampling and holding circuit, and thus the complication of the circuit control etc. can be prevented.

Still another object of the present invention is to provide an A/D converter circuit with which the increase of speed of the conversion processing, reduction of the surface area of the chip, and reduction of the power consumption can be achieved.

According to the present invention, there is provided an analog/digital converter circuit including: a plurality of reference resistance elements connected in series between two reference potentials; a plurality of switching blocks, arranged in the form of a matrix and activated by an upper data conversion output signal in units of rows, comparing the respective reference voltages divided by the reference resistance elements with an input signal to be converted, and detecting the presence/absence of lower significant bit data and redundant bit data, thereby providing a differential output; an upper data encoder comparing the reference voltage supplied to a switching block positioned at a specific position of the switching block matrix with the input signal to be converted, and providing a plurality of conversion codes of the upper significant bits in accordance with the result of this comparison; a lower data comparator circuit including first and second comparators with weights of outputs set to N and which provides the complementary output; a third comparator with a weight of output set to $n_1$ and which provides the complementary output; a fourth comparator with a weight of output set to $n_2$ (note, $n_1+n_2=N$) and which provides the complementary output; a first adder which adds one output of said third comparator and one output of said fourth comparator; and a second adder which adds the other output of third comparator and the other output of fourth comparator, wherein a differential output of one row of the switching block being connected to the inputs of the first comparator and third comparator, and the differential output of the other row of the switching block being connected to the inputs of the second comparator and said fourth comparator; a lower data encoder, providing a predetermined lower data conversion code for the complementary outputs of the respective comparators of the lower data comparator in accordance with the presence/absence of the lower significant bit data and redundant bit data, and generating a selection signal for selecting one conversion code from among the conversion codes of the upper significant bits of the upper data encoder; and a selection gate selectively outputting one conversion code from among a plurality of conversion codes of the upper significant bits output from the upper data encoder based on the selection signal output from the lower data encoder.

Preferably, the lower data comparator circuit may include a ring comparator comprising a plurality of comparator circuit, each including a first comparator or second comparator and a third comparator and fourth comparator corresponding to respective row of the switching blocks, inputs of the respective comparators being connected to the differential outputs of the switching blocks of the corresponding row and the outputs of the third and fourth comparators of each comparator circuit being connected to the output of the third comparator or fourth comparator of the other comparator circuit. Also, the lower data comparator circuit may include a suppression circuit which cuts a predetermined position of the ring comparator in accordance with the upper data conversion output signal, and suppresses the unnecessary input of the output of the comparator to the lower data comparator.

Specifically, the weights of outputs of third and fourth comparators are set as $n_1=n_2=N/2$.

Also, according to the present invention, there is provided an analog/digital converter circuit including: a plurality of switching blocks, arranged in the form of a matrix, comparing the respective reference voltages provided by dividing said reference potential by serially connected a plurality of ($\underline{n}$) resistance elements with an input signal to be converted; an upper data comparator comparing the reference voltage applied to the specific position of switching block in the row direction with the input signal to be converted, thereby providing the conversion code of the upper significant bit; a determining circuit determining whether the number of the switching blocks obtaining a comparison result that the level of the input signal to be converted is larger than the reference voltage level is even or odd; and a lower data encoder providing the conversion code of a lower significant bit in accordance with the result of determination of the determining circuit.

Preferably, the respective switching blocks are constituted by differential type amplifiers, each having a pair of transistors the base of which being supplied with the input signal to be converted and the divided reference voltage; and the determining circuit is constituted in that the transistor output to which the input signal is supplied and the transistor output to which the reference voltage is supplied are alternately connected for each row and are connected to a load element.

Also, preferably, the determining circuit includes a means which performs the exclusive-OR of the adjoining switching blocks for each row and outputs the total sum thereof to the lower data encoder. The determining circuit may have a plurality of exclusive-OR gates performing the exclusive-OR of the outputs of the adjoining switching blocks and constituted so that the outputs of the respective exclusive-OR gates are connected.

Preferably, the plurality of $\underline{n}$ reference resistance elements are arranged in a plurality of rows by folding-back so that the direction of application of the reference voltage becomes reverse for each predetermined number of reference resistance elements. Also, provision is made of an inverted gate which inverts, when a direction of application of voltage of a predetermined row is used as a reference, the obtained lower significant data conversion code obtained based on the reference voltage by the reference resistance elements of the row in the direction of application which is reverse to the former and outputs the same.

According to the present invention, there is further provided an analog/digital converter circuit including: a plurality of reference resistance elements connected in series between two reference potentials; a plurality of switching blocks, arranged in the form of a matrix and activated by an upper data conversion output signal for each row, comparing the respective reference voltages divided by said reference resistance elements with an input signal to be converted, and detecting the presence/absence of the lower significant bit data and redundant bit data for each predetermined row; an upper data encoder, comparing the reference voltage at a specific portion in the row direction of the switching block with the input signal to be converted, and providing the conversion code of the upper significant bit in accordance with a redundant mode or non-redundant mode which are set in advance in accordance with the result of this comparison; a lower data encoder, providing the conversion code of the lower significant bit and the conversion code of the redundant bit out of the conversion range specified by the upper data encoder from the outputs of the respective switching blocks in accordance with the presence/absence of the lower significant bit data and the redundant bit data, and generating a selection signal in accordance with the redundant mode or non-redundant mode in accordance with the presence/absence of the redundant bit data; and a selection gate selectively outputting the conversion code of the upper significant bit in accordance with the redundant mode or non-redundant mode from among the conversion codes of the upper significant bit in accordance with the redundant mode or non-redundant mode output from the upper data encoder based on the selection signal in accordance with the mode output from the lower data encoder.

According to the present invention, there is provided an analog/digital converter circuit including: a plurality of reference resistance elements connected in series between two reference potentials; a plurality of switching blocks, arranged in the form of a matrix and activated by the upper data conversion output signal for each row, comparing the respective reference voltages divided by reference resistance elements with an input signal to be converted, and detecting the presence/absence of the lower significant bit data and redundant bit data; at least one data change point detection circuit comparing the reference voltage generated between mutually adjoining rows excluding at least the uppermost row or lowermost row of switching block matrix with the input signal to be converted, and detecting the change point of data; an upper data encoder providing the conversion code of the upper significant bit in accordance with 2 modes set in advance in accordance with the result of detection of the data change point detection circuit; a lower data encoder dividing the outputs of the respective switching blocks in units of rows into two groups in accordance with said 2 modes, providing the predetermined lower data conversion code in accordance with the presence/absence of the lower significant bit data and redundant bit data for each of the respective divided groups, and generating a selection signal for selecting one selection code from among the two upper significant bits of conversion codes of the upper data encoder; and a selection gate selectively outputting one conversion code selected from among two upper significant bits of conversion codes output from the upper data encoder based on the selection signal output from the lower data encoder.

According to the present invention, there is provided an analog/digital converter circuit including: a plurality of reference resistance elements connected in series between two reference potentials; a plurality of switching blocks, arranged in the form of a matrix and activated by the upper data conversion output signal for each row, comparing the respective reference voltages divided by the reference resistance elements with an input signal to be converted, and detecting the presence/absence of the lower significant bit data and redundant bit data; an upper data encoder, comparing the reference voltage applied to the specific position of the switching block in the row direction with the input signal to be converted, and providing the two conversion codes of the upper significant bit excluding the predetermined bits among the upper significant bits in accordance with the 2 modes set in advance in accordance with the result of this comparison; a lower data encoder, dividing the outputs of said respective switching blocks in units of 5 columns into two groups in accordance with said 2 modes, providing the predetermined lower data conversion code in accordance with the lower significant bit data and the presence/absence of the redundant bit data for each of divided groups, and generating the selection signal for selecting one conversion code from among 2 upper significant bits of conversion codes of the upper data encoder; and a selection gate selectively outputting one conversion code selected from among 2 upper significant bits of conversion codes output from said upper data encoder based on the selection signal output from the lower data encoder. The selection signal is output as the predetermined bit of the upper significant conversion code excluded at the upper data encoder.

According to the present invention, there is provided an analog/digital converter circuit including: a plurality of reference resistance elements connected in series between two reference potentials; a plurality of switching blocks, arranged in the form of a matrix and activated by the upper data conversion output signal for each row, comparing the respective reference voltages the by the reference resistance elements with an input signal to be converted, and detecting the presence/absence of the lower significant bit data and redundant bit data; an upper data encoder, comparing the reference voltage applied to the specific position of switching block in the row direction with the input signal to be converted, and providing the conversion code of the upper significant bit in accordance with the 2 modes set in advance in accordance with the result of this comparison; a lower data encoder dividing the outputs of said respective switching blocks in units of columns into two groups in accordance with 2 modes, providing the predetermined lower data conversion code in accordance with the lower significant bit data and the presence/absence of the redundant bit data for each of divided groups, and generating the selection signal for selecting one conversion code from among 2 upper significant bits of conversion codes of the upper data encoder; and a selection gate selectively outputting one conversion code selected from among 2 upper significant bits of conversion codes output from the upper data encoder based on the selection signal output from the lower data encoder.

According to the present invention, there is provided an analog/digital converter circuit including: a plurality of reference resistance elements connected in series between two reference potentials; a plurality of switching blocks, arranged in the form of a matrix and activated by the upper data conversion output signal for each row, comparing the respective reference voltages divided by the reference resistance elements with an input signal to be converted, and detecting the presence/absence of the lower significant bit data and redundant bit data; an upper data encoder comparing the reference voltage supplied to the switching block positioned intermediate in the rows excluding at least the uppermost row or lowermost row with the input signal to be converted, and providing the conversion code of the upper significant bit in accordance with the 2 modes set in advance in accordance with the result of this comparison; a lower data encoder dividing the outputs of said respective switching blocks in units of columns into two groups in accordance with the 2 modes, providing the predetermined lower data conversion code in accordance with the lower significant bit data and the presence/absence of the redundant bit data for each of divided groups, and generating the selection signal for selecting one conversion code from among 2 upper significant bits of conversion codes of the upper data encoder; and a selection gate selectively outputting one conversion code selected from among 2 upper significant bits of conversion codes output from the upper data encoder based on the selection signal output from the lower data encoder.

BRIEF DESCRIPTION OF THE DRAWINGS

The above objects and features and other objects and features of the present invention will be described more in detail with reference to the accompanying drawings, in which:

FIG. 5 and FIG. 6 show logical values of the A/D converter shown in FIG. 4;

FIGS. 8A and 8B are a block diagram of a serial/parallel A/D converter of a first embodiment of the present invention;

FIG. 12 shows the logical value of the A/D converter shown in FIG. 11;

FIG. 15 and FIG. 16 are views showing input/output characteristics of the A/D converter shown in FIG. 13;

FIGS. 19A and 19B are a block diagram of a serial/parallel A/D converter of a sixth embodiment of the present invention;

FIG. 20 and FIG. 21 show the logical values of the respective blocks for explaining the operation of the A/D converter shown in FIG. 19;

FIGS. 22A–22C are block diagrams of a serial/parallel A/D converter of a seventh embodiment of the present invention;

FIG. 23 and FIG. 24 show the logical values for explaining the logical value and redundancy of the A/D converter shown in FIG. 22;

FIGS. 25A–25C are block diagrams of a serial/parallel A/D converter of an eighth embodiment of the present invention;

FIGS. 26A–26C are block diagrams of a serial/parallel A/D converter of a ninth embodiment of the present invention;

FIG. 27 and FIG. 28 are views of showings the logical values for explaining the operation concerning the redundancy of the A/D converter shown in FIG. 26;

FIGS. 29A–29C are block diagrams of a serial/parallel A/D converter of a 10-th embodiment of the present invention;

FIGS. 30A–30C are block diagrams of a serial/parallel A/D converter of an 11th embodiment of the present invention;

FIG. 31 and FIG. 32 are views showing the logical values for explaining the operation concerning the redundancy of the A/D converter shown in FIG. 30;

FIGS. 33A–33C are block diagrams of a serial/parallel A/D converter of a 12-th embodiment the present invention;

FIG. 35 and FIG. 36 are vies showing the logical values for explaining the operation of the A/D converter shown in FIG. 34;

FIGS. 37A and 37B are a block diagram of a serial/parallel A/D converter of a 14th embodiment of the present invention.

DESCRIPTION OF THE PREFERRED EMBODIMENTS

Figure 1:
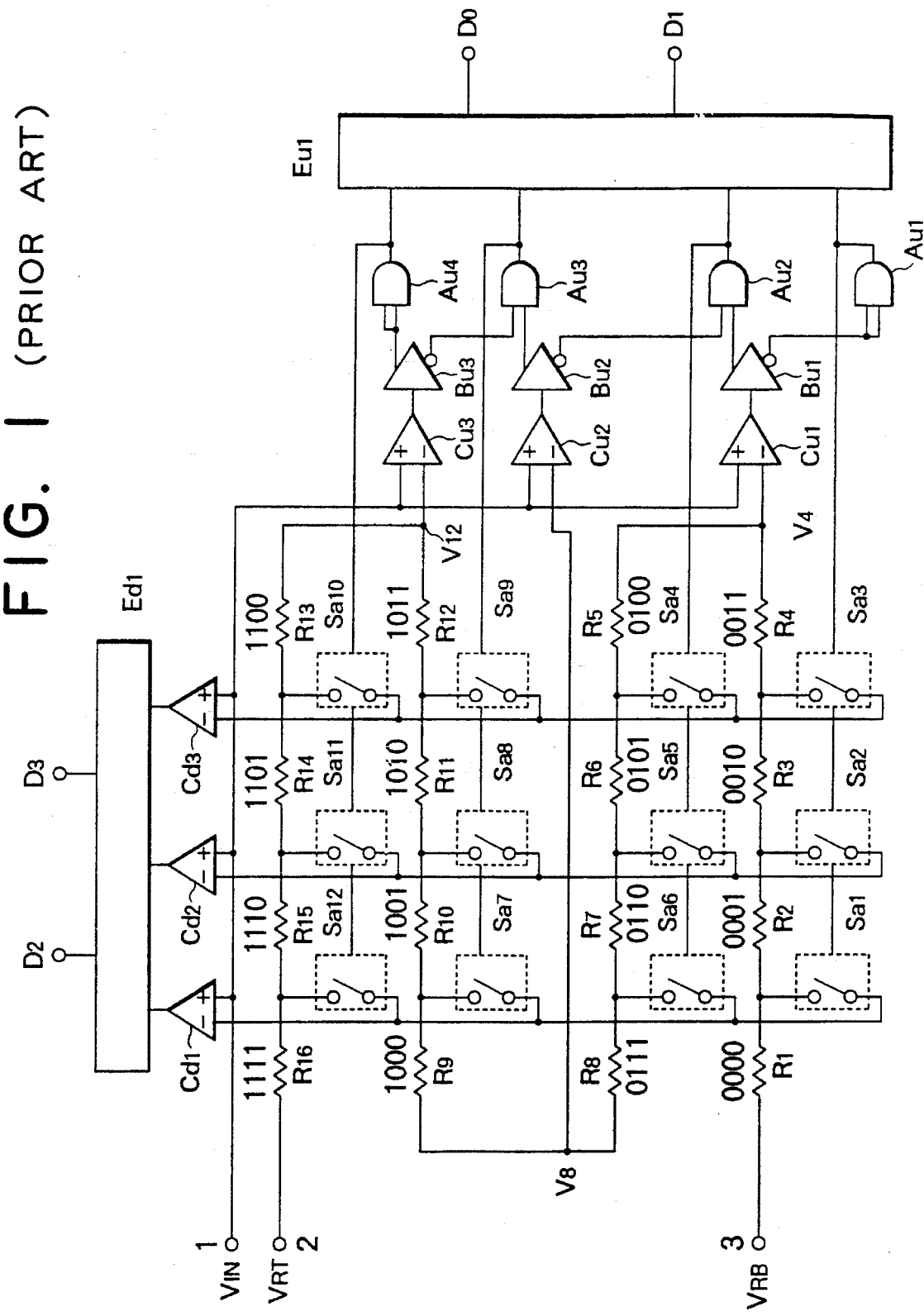
FIG. 1 is a block diagram of a serial/parallel A/D converter of a first related art.
Figure 2:
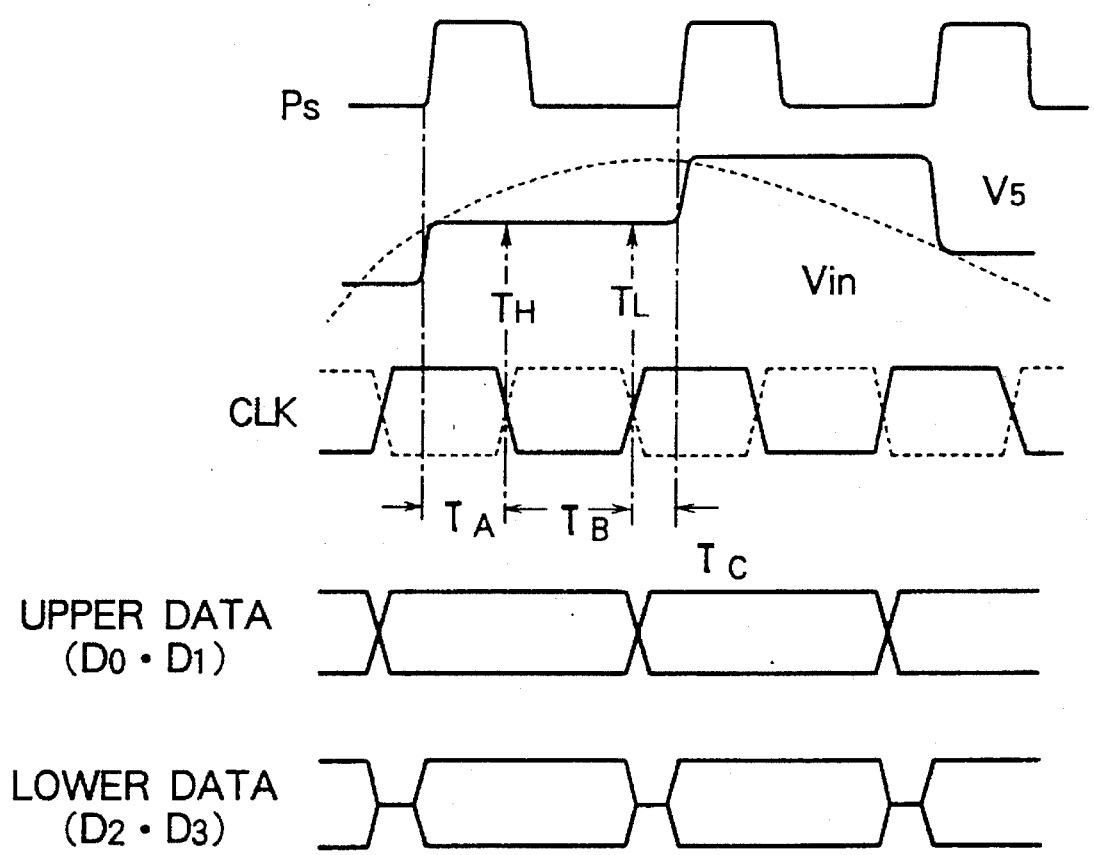
FIG. 2 is a timing chart of the A/D converter shown in FIG. 1.

Embodiments of the present invention will be explained in detail referring to the drawings.

An explanation will be made of a first embodiment of the present invention.

FIG. 8 is a circuit diagram showing one embodiment of an A/D converter circuit according to the present invention.

Reference numeral 100 denotes a matrix circuit; 151 to 153 denote upper data comparators; 130, an upper data encoder; 141, a selection gate; 142, an inverter; 101 to denote interpolation-type lower data comparators; 111 to 118 denote latch circuits; 121 and 122 denote suppression circuits; 130, a lower data side AND gate circuit; 140, a lower data encoder; $R_1$ to $R_{16}$ denote reference resistance elements; $r$ denotes a resistance element for a load; $B_{U1}$ to $B_{U3}$ and $B_{D0}$ to $B_{D33}$ denote multiple output pin buffers; $AD_{U1}$ to $AD_{U5}$ denote 2-input AND gates on the upper data side; and $OR_1$ denotes a 2-input OR gate for the conversion code output; respectively.

The present circuit shows a circuit configuration for converting the input analog signal $V_{IN}$ to 6 bits of a digital code.

The positive outputs of the comparators $CU_9$ of the upper data comparator 151 are connected to the two inputs of the 2-input AND gates $AD_{U9}$, and the negative outputs are connected to one input of the AND gate $AD_{U9}$.

The positive output of the comparator $CU_{10}$ of the upper data comparator 152 is connected to both inputs of the 2-input AND gate $AD_{U10}$, and the negative output is connected to the two inputs of the AND gate $AD_{U4}$.

The positive output of the comparators $CU_{11}$ of the upper data comparator 153 is connected to the other input of the 2-input AND gates $AD_{U11}$, and the negative output is connected to the two inputs of the AND gate $AD_{U5}$.

The output of the AND gate $AD_{U9}$ is supplied as the control signal $x_1$ to the base of the transistor $Q_3$ of the switching blocks $S_{C12}$, $S_{C14}$, $S_{C16}$, and $S_{C18}$; the output of the AND gate $AD_{U10}$ is supplied as the control signal $x_2$ to the base of the transistor $Q_3$ of the switching blocks $S_{C21}$, $S_{C23}$, $S_{C25}$, and $S_{C27}$; the output of the AND gate $AD_{U11}$ is supplied as the control signal $x_3$ to the base of the transistor $Q_3$ of the switching blocks $S_{C32}$, $S_{C34}$, $S_{C36}$, and $S_{C38}$; the output of the AND gate $AD_{U12}$ is supplied as the control signal $x_4$ to the base of the transistor $Q_3$ of the switching blocks $S_{C41}$, $S_{C43}$, $S_{C45}$, and $S_{C47}$; and the output of the AND gate $AD_{U13}$ is supplied as the control signal $x_{15}$ to the base of the transistor $Q_{103}$ of the switching blocks $S_{C52}$, $S_{C54}$, $S_{C56}$, and $S_{C58}$.

In these AND gates $AD_{U9}$ to $AD_{U13}$, the mutually adjoining two output levels simultaneously become "1".

Concretely, the binary output signal levels of the AND gates $AD_{U9}$ and $AD_{U10}$, $AD_{U10}$ and $AD_{U11}$, $AD_{U11}$ and $AD_{U12}$, and $AD_{U12}$ and $AD_{U13}$ simultaneously become "1", the transistors $Q_3$ of the respective switching blocks of the matrix circuit 100 connected to the control lines ($x_{11}$, $x_{12}$, $x_{13}$, $x_{14}$, and $x_{15}$) which have become the "1" level are controlled to turn ON in units of two rows, and the fine digitization of the quantization level is carried out.

The lower data comparators 101 to 108 are respectively constituted by comparators $C_{N1}$ with gains which are set to N, comparators $C_{N1}$ with gains which are set to $n_1$ ($n_1<N$), and comparators $C_{n1}$ with gains which are set to $n_2$ (note, $n_1=n_2<N$, $n_1+n_2=N$).

The collector outputs of the transistors $Q_1$ of the switching blocks $S_{C21}$ and $S_{C41}$ at the first column of the matrix circuit 10 are supplied to one side inputs of the comparators $C_{N1}$, $C_{n1}$, and $C_{n2}$ of the lower data comparator 101, and the collector outputs (differential outputs) of the transistors $Q_2$ of the switching blocks $S_{C21}$ and $S_{C41}$ are supplied to the other side inputs.

The collector outputs of the transistors $Q_1$ of switching blocks $S_{C12}$, $S_{C32}$, and $S_{C52}$ at the second column of the matrix circuit 10 are supplied to one side inputs of the respective comparators $C_{N1}$, $C_{n1}$, and $C_{n2}$ of the lower data comparator 102, and the collector outputs (differential outputs) of the transistors $Q_{102}$ of the switching blocks $S_{C12}$, $S_{C32}$, and $S_{C52}$ are supplied to the other side inputs.

The collector outputs of the transistors $Q_1$ of the switching blocks Sc23 and Sc43 at the third column of the matrix circuit 10 are supplied to one side inputs of the respective comparators $C_{N1}$, $C_{n1}$, and $C_{n2}$ of the lower data comparator 103, and the collector outputs (differential outputs) of the transistors $Q_{102}$ of the switching blocks $S_{C23}$ and $S_{C43}$ are supplied to the other side inputs.

The collector outputs of the transistors $Q_1$ of the switching blocks $S_{C14}$ and $S_{C34}$ at the fourth column of the matrix circuit 10 are supplied to one side inputs of the respective comparators $C_{N1}$, $C_{n1}$, and $C_{n2}$ of the lower data comparator 104, and the collector outputs (differential outputs) of the transistors $Q_{102}$ of the switching blocks $S_{C14}$ and $S_{C34}$ are supplied to the other side inputs.

The collector outputs of the transistors $Q_{101}$ of the switching blocks $S_{C25}$ and $S_{C45}$ at the fifth column of the matrix circuit 10 are supplied to one side inputs of the respective comparators $C_{N1}$, $C_{n1}$, and $C_{n2}$ of the lower data comparator 105, and the collector outputs (differential outputs) of the transistors $Q_{102}$ of the switching blocks $S_{C25}$ and $S_{C45}$ are supplied to the other side inputs.

The collector outputs of the transistors $Q_{101}$ of the switching blocks $S_{C16}$ and $S_{C36}$ at the sixth column of the matrix circuit 10 are supplied to one side inputs of the respective comparators $C_{N1}$, $C_{n1}$, and $C_{n2}$ of the lower data comparator 106, and the collector outputs (differential outputs) of the transistors $Q_{102}$ of the switching blocks $S_{C16}$ and $S_{C36}$ are supplied to the other side inputs.

The collector outputs of the transistors $Q_1$ of the switching blocks $S_{C27}$ and $S_{C47}$ at the seventh column of the matrix circuit 10 are supplied to one side inputs of the respective comparators $C_{N1}$, $C_{n1}$, and $C_{n2}$ of the lower data comparator 107, and the collector outputs (differential outputs) of the transistors $Q_{102}$ of the switching blocks $S_{C27}$ and $S_{C47}$ are supplied to the other side inputs.

The collector outputs of the transistors $Q_{101}$ of switching blocks $S_{C18}$ and $S_{C38}$ at the eighth column of the matrix circuit 10 are supplied to one side inputs of the respective comparators $C_{N1}$, $C_{n1}$, and $C_{n2}$ of the lower data comparator 108, and the collector outputs (differential outputs) of the transistors $Q_{102}$ of the switching blocks $S_{C18}$ and $S_{C38}$ are supplied to the other side inputs.

The two outputs on the positive side and negative side of the respective comparators $C_{N1}$, $C_{n1}$, and $C_{n2}$ of the lower data comparators 101 to 108 are connected to the load resistance element r which is connected to the ground level and, at the same time, connected to the respective latch circuits 111 to 118 and lower data comparators corresponding to the adjoining columns or corresponding to every other column.

Namely, the two outputs on the positive side and negative side of the comparator $C_{N1}$ of the lower data comparator 101 are connected to the latch circuit 111. The positive side and negative side outputs of the comparator $C_{n1}$ of the lower data comparator 101 are connected to the latch circuit 111 and, at the same time, the positive side output is connected to the positive side output of the comparator $C_{n1}$ of the lower data comparator 102, and the negative side output is connected to the negative side output of the comparator $C_{n1}$ of the lower data comparator 102. The positive side and negative side outputs of the comparator $C_{n2}$ of the lower data comparator 101 are connected to the latch circuit 111 and, at the same time, connected to the positive side output of the comparator $C_{n1}$ of the lower data comparator 103, and the negative side output is connected to the negative side output of the comparator $C_{n1}$ of the lower data comparator 103.

The two outputs on the positive side and negative side of the comparator $C_{N1}$ of the lower data comparator 102 are connected to the latch circuit 112, and the positive output of the comparator $C_{n1}$ is connected to the latch circuit 112. The positive side and negative side outputs of the comparator $C_{n2}$ of the lower data comparator 102 are connected to the latch circuit 112 and, at the same time, the positive side output is connected to the positive side output of the comparator $C_{n1}$ of the lower data comparator 104, and the negative side output is connected to the negative side output of the comparator $C_{n1}$ of the lower data comparator 104.

The two outputs on the positive side and negative side of the comparators $C_{N1}$ and $C_{n1}$ of the lower data comparator 103 are connected to the latch circuit 113. The positive side output of the comparator $C_{n2}$ of the lower data comparator 103 is connected to the latch circuit 113, and, connected to the positive side output of the comparator $C_{n1}$ of the lower data comparator 105, and the negative side output is connected to the negative side output of the comparator $C_{n1}$ of the lower data comparator 105.

The two outputs on the positive side and negative side of the comparator $C_{N1}$ of the lower data comparator 104 are connected to the latch circuit 114, and the positive output of the comparator $C_{n1}$ is connected to the latch circuit 114. The positive side and negative side outputs of the comparator $C_{n2}$ of the lower data comparator 104 are connected to the latch circuit 114 and, at the same time, the positive side output is connected to the positive side output of the comparator $C_{n1}$ of the lower data comparator 106, and the negative side output is connected to the negative side output of the comparator $C_{n1}$ of the lower data comparator 106.

The two outputs on the positive side and negative side of the comparators $C_{N1}$ and $C_{n1}$ of the lower data comparator 105 are connected to the latch circuit 115. The positive side output of the comparator $C_{n2}$ of the lower data comparator 105 is connected to the latch circuit 115, and, connected to the positive side output of the comparator $C_{n1}$ of the lower data comparator 107, and the negative side output is connected to the negative side output of the comparator $C_{n1}$ of the lower data comparator 107.

The two outputs on the positive side and negative side of the comparator $C_{N1}$ of the lower data comparator 106 are connected to the latch circuit 116, and the positive output of the comparator $C_{n1}$ is connected to the latch circuit 116. The positive side and negative side outputs of the comparator $C_{n2}$ of the lower data comparator 106 are connected to the latch circuit 116 and, at the same time, the positive side output is connected to the positive side output of the comparator $C_{n1}$ of the lower data comparator 108, and the negative side output is connected to the negative side output of the comparator $C_{n1}$ of the lower data comparator 108.

The two outputs on the positive side and negative side of the comparators $C_{N1}$ and $C_{n1}$ of the lower data comparator 107 are connected to the latch circuit 117. The positive side output of the comparator $C_{n2}$ of the lower data comparator 107 is connected to the latch circuit 117 and, at the same time, connected to the positive side output of the comparator $C_{n2}$ of the lower data comparator 108, and the negative side output is connected to the negative side output of the comparator $C_{n2}$ of the lower data comparator 108.

The two outputs on the positive side and negative side of the comparators $C_{N1}$ and $C_{n2}$ of the lower data comparator 108 are connected to the latch circuit 118 and, at the same time, the positive side output of the comparator $C_{n1}$ is connected to the latch circuit 118.

In this way, the outputs of the comparators $C_{n1}$ and $C_{n2}$ of the lower data comparators 101 to 108 having gains $n1$ and $n2$ are connected to the comparator $C_{n1}$ or $C_{n2}$ of the lower data comparators corresponding to respective adjoining columns or corresponding to every other column, and a comparison circuit having an interpolation construction is constituted by two comparators $C_{N1}$ of a gain N and comparators $C_{n1}$ and $C_{n2}$ having gains n1 and n2, of the connected two lower data comparators.

Below, a detailed explanation will be made of the fundamental structure of the comparison circuit having an interpolation construction constituted between two lower data comparators, and the function thereof using FIG. 9 and FIG. 10.

Figure 9:
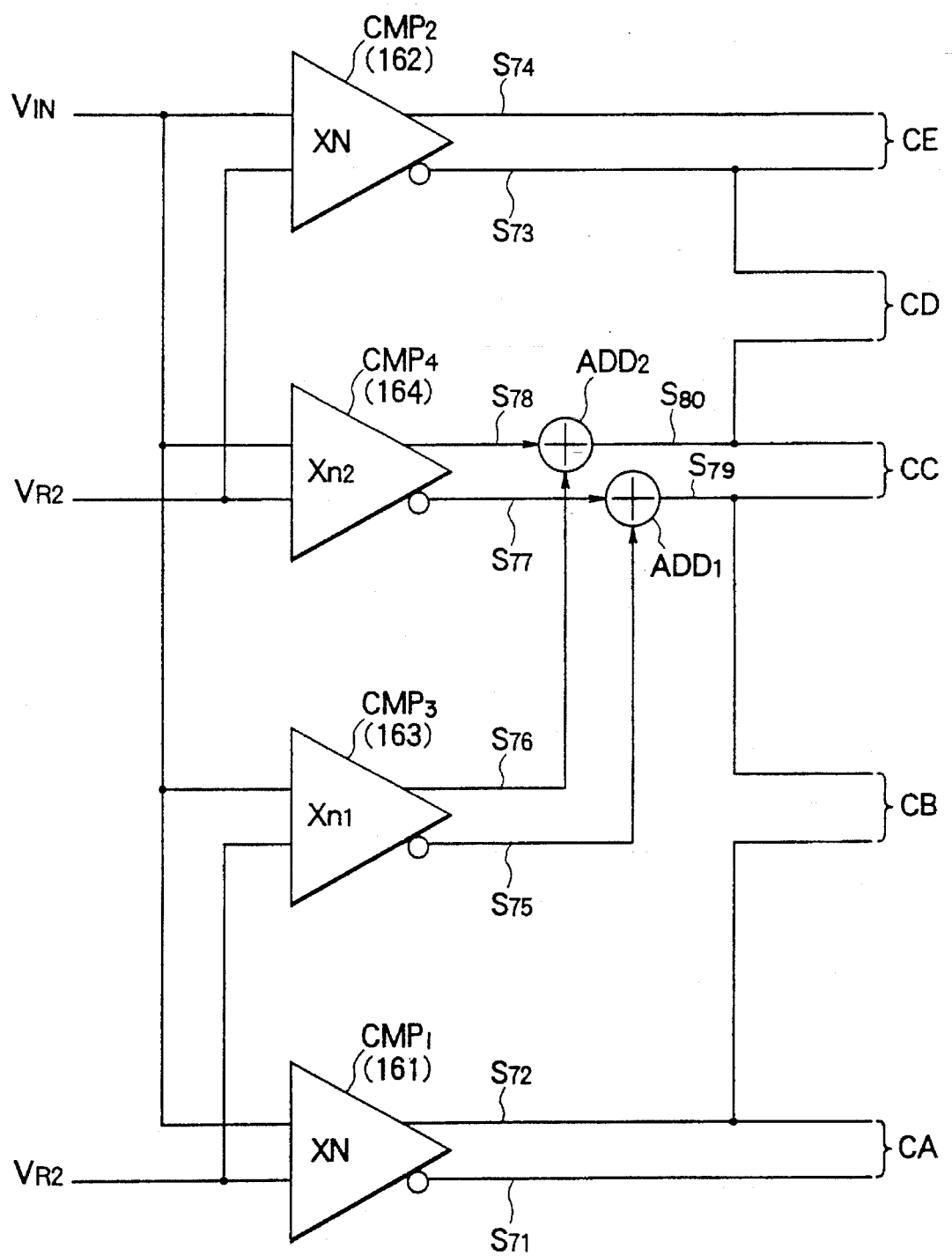
FIG. 9 is a structural view of the comparator of a second embodiment of the present invention.

FIG. 9 is a structural block diagram showing the fundamental structure of the present comparison circuit of a second embodiment of the present invention.

In FIG. 9, $CMP_1$ (161) denotes a first comparator; $CMP_2$ (162) denotes a second comparator; $CMP_3$ (163), a third comparator; $CMP_4$ (164), a fourth comparator; $ADD_1$, a first adder; $ADD_2$, a second adder; $V_{IN}$, an input analog signal (hereinafter simply referred to as an input signal); $V_{R1}$, a first reference voltage; $V_{R2}$, a second reference voltage; and A to E denote comparison outputs, respectively.

The first comparator $CMP_1$ (161) is constituted by a 2-input and 2-output differential amplifier obtaining a complementary output, for example, the weight of the output of which, that is, the gain of which, being set to N times, one side input terminals of which being connected to the input line of the input signal $V_{IN}$, and the other side inputs of which being connected to the input line of the first reference voltage $V_{R1}$.

The first comparator $CMP_1$ (161) compares the input signal $V_{IN}$ with the first reference voltage $V_{R1}$, outputs the signal $S_{71}$ from the negative output, and outputs the signal $S_{72}$ from the positive output, respectively.

The output A of the comparison circuit is constituted by the positive and negative outputs of this first comparator $CMP_1$ (161).

The second comparator $CMP_2$ (162) is constituted by a 2-input and 2-output differential amplifier obtaining a complementary output, for example, the weight of the output of which being set to N, one side input terminals of which being connected to the input line of the input signal $V_{IN}$, and the other side inputs of which being connected to the input line of the second reference voltage $V_{R2}$.

The second comparator $CMP_2$ (162) compares the input signal $V_{IN}$ with the second reference voltage $V_{R2}$, outputs the signal $S_{73}$ from the negative output, and outputs the signal $S_{74}$ from the positive output, respectively.

The output E of the comparison circuit is constituted by the positive and negative outputs of this second comparator $CMP_2$ (162).

The third comparator $CMP_3$ (163) is constituted by a 2-input and 2-output differential amplifier obtaining a complementary output, for example, the weight of the output of which being set to $n_1$ ($n_1<N$), one side input terminals of which being connected to the input line of the input signal $V_{IN}$, and the other side inputs of which being connected to the input line of the first reference voltage $V_{R1}$.

The third comparator $CMP_3$ (163) compares the input signal $V_{IN}$ with the first reference voltage $V_{R1}$, outputs the signal $S_{75}$ from the negative output, and outputs the signal $S_{76}$ from the positive output, respectively.

The fourth comparator $CMP_4$ (164) is constituted by a 2-input and 2-output differential amplifier obtaining a complementary output, for example, the weight of the output of which being set to $n_2$ (note, $n_2<N$, $n_1+n_2=N$), one side input terminals of which being connected to the input line of the input signal $V_{IN}$, and the other side inputs of which being connected to the input line of the second reference voltage $V_{R2}$.

The fourth comparator $CMP_4$ (164) compares the input signal $V_{IN}$ with the second reference voltage $V_{R2}$, outputs the signal $S_{77}$ from the negative output, and outputs the signal $S_{78}$ from the positive output, respectively.

The first adder $ADD_1$ finds the sum $(S_{75}+S_{77})$ of the negative output signal $S_{75}$ of the third comparator $CMP_3$ (163) and the negative output signal $S_{77}$ of the fourth comparator $CMP_4$ (164) and outputs the same as the signal $S_{79}$.

The second adder $ADD_2$ calculates the sum $(S_{76}+S_{78})$ of the positive output signal $S_{76}$ of the third comparator $CMP_3$ (163) and the positive output signal $S_{78}$ of the fourth comparator $CMP_4$ (164), and outputs the same as the signal $S_{80}$.

The output C of the comparison circuit is constituted by the output signals $S_{79}$ and $S_{80}$ of these first and second adders $ADD_1$ and $ADD_2$.

Also, the output B of the comparison circuit is constituted by the output signal $S_{79}$ of the first adder $ADD_1$ and the positive output signal $S_{72}$ of the first comparator $CMP_1$ (161), and the output D of the comparison circuit is constituted by the output signal $S_{80}$ of the second adder $ADD_2$ and the negative output signal $S_{73}$ of the second comparator $CMP_2$ (162).

As mentioned above, in the present comparison circuit, the output of the third comparator $CMP_3$ (163) and the output of the fourth comparator $CMP_4$ are subjected to the weight of $n_1:n_2$, and when the two are added, $n_1+n_2$ (=N) is obtained, and the gain is set so that the same weight as that for the outputs of the first and second comparators $CMP_1$ (161) and $CMP_2$ (162) is obtained.

Also, the outputs CA to CE of the present comparison circuit are connected to the not illustrated latch circuit.

Here, an explanation will be made of the input/output characteristics of the respective parts of the circuit of FIG. 9 using FIG. 10.

Figure 10:
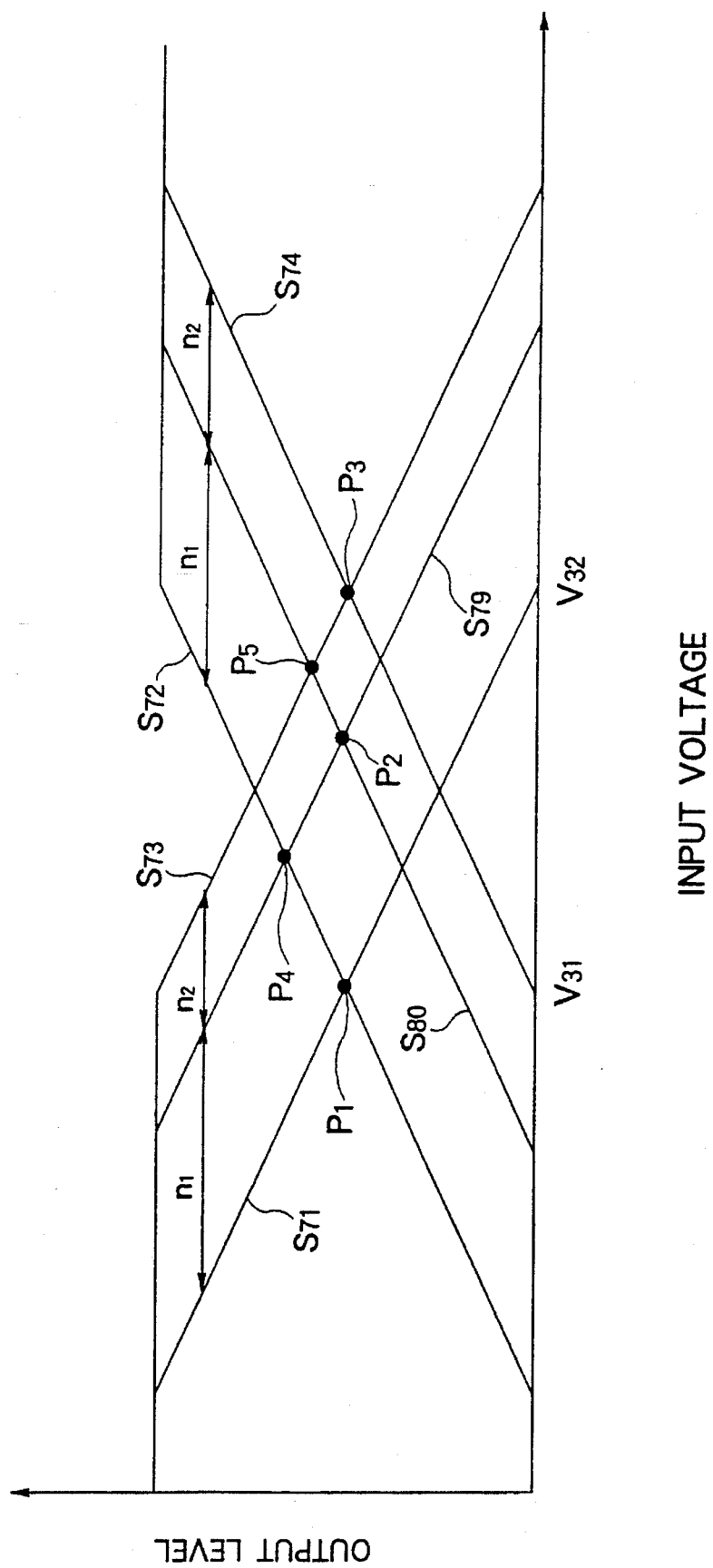
FIG. 10 is an explanatory view of the comparator shown in FIG. 9.

Note that, in FIG. 10, an abscissa represents an input voltage, and an ordinate represents a relative output level, respectively.

First, the output signal $S_{79}$ of the first adder $ADD_1$ will be considered.

The signal $S_{79}$ is the sum of the negative output signal $S_{75}$ of the third comparator $CMP_3$ (163) and the negative output signal $S_{77}$ of the fourth comparator $CMP_4$ (164).

$$S_{79}=S_{75}+S_{77} \tag{1}$$

Here, for the first comparator $CMP_1$ (161) and the third comparator $CMP_3$ (163), the same voltage is supplied to the two inputs thereof, respectively and, the weight of outputs of the both is $N:n_1$. Therefore, the following relationship equation is established between the negative output signals $S_{71}$ and $S_{75}$.

$$N:n_1=S_{71}:S_{75} \tag{2}$$

From this equation (2), the signal $S_{75}$ can be represented as in the following equation.

$$S_{75}=(n_1/N) \cdot S_{71} \tag{3}$$

Similarly, for the second comparator $CMP_2$ (162) and the fourth comparator $CMP_4$ (164), the same voltage is supplied to the two inputs thereof, respectively and the weight of outputs of the two is $N:n_2$. Therefore, the following relationship is established between the negative output signals $S_{73}$ and $S_{77}$.

$$N:n_2=S_{73}:S_{77} \tag{4}$$

From this equation (4), the signal $S_{77}$ can be represented as in the following equation.

$$S_{77}=(n_2/N) \cdot S_{73} \tag{5}$$

Accordingly, by substituting the above-described equations (3) and (5) into equation (1), equation (1) can be rewritten as follows:

$$S_{79}=(n_1/N) \cdot S_{71}+(n_2/N) \cdot S_{73} \tag{6}$$

When considering equation (6) using FIG. 10, it represents that the signal $S_{79}$ becomes the line obtained by interior division of the signal $S_{71}$ and signal $S_{73}$ to $n_1:n_2$.

Next, consideration will be made of the output signal $S_{80}$ of the second adder $ADD_2$.

The signal $S_{80}$ is the sum of the positive output signal $S_{76}$ of the third comparator $CMP_3$ (163) and the positive output signal $S_{78}$ of the fourth comparator $CMP_4$ (164).

$$S_{80} = S_{76} + S_{78} \quad (7)$$

As mentioned above, for the first comparator $CMP_1$ (161) and the third comparator $CMP_3$ (163), the same voltage is supplied to the two inputs thereof, and the weight of outputs of the two is $N:n_1$, and therefore the following relationship is established between the positive output signals $S_{72}$ and $S_{76}$.

$$N:n_1 = S_{72}:S_{76} \quad (8)$$

From this equation (8), the signal $S_{76}$ can be represented as in the following equation.

$$S_{76} = (n_1/N) \cdot S_{72} \quad (9)$$

Similarly, for the second comparator $CMP_2$ (162) and the fourth comparator $CMP_4$ (164), the same voltage is supplied to the two inputs thereof, respectively, and the weight of outputs of the two is $N:n_2$, and therefore the following relationship is established between the positive output signals $S_{74}$ and $S_{78}$.

$$N:n_2 = S_{74}:S_{78} \quad (10)$$

From this equation (10), the signal $S_{70}$ can be represented as in the following equation.

$$S_{78} = (n_2/N) \cdot S_{74} \quad (11)$$

Accordingly, by substituting the above-described equations (9) and (10) into equation (7), equation (7) can be rewritten as follows:

$$S_{80} = (n_1/N) \cdot S_{72} + (n_2/N) \cdot S_{74} \quad (12)$$

Figure 3:
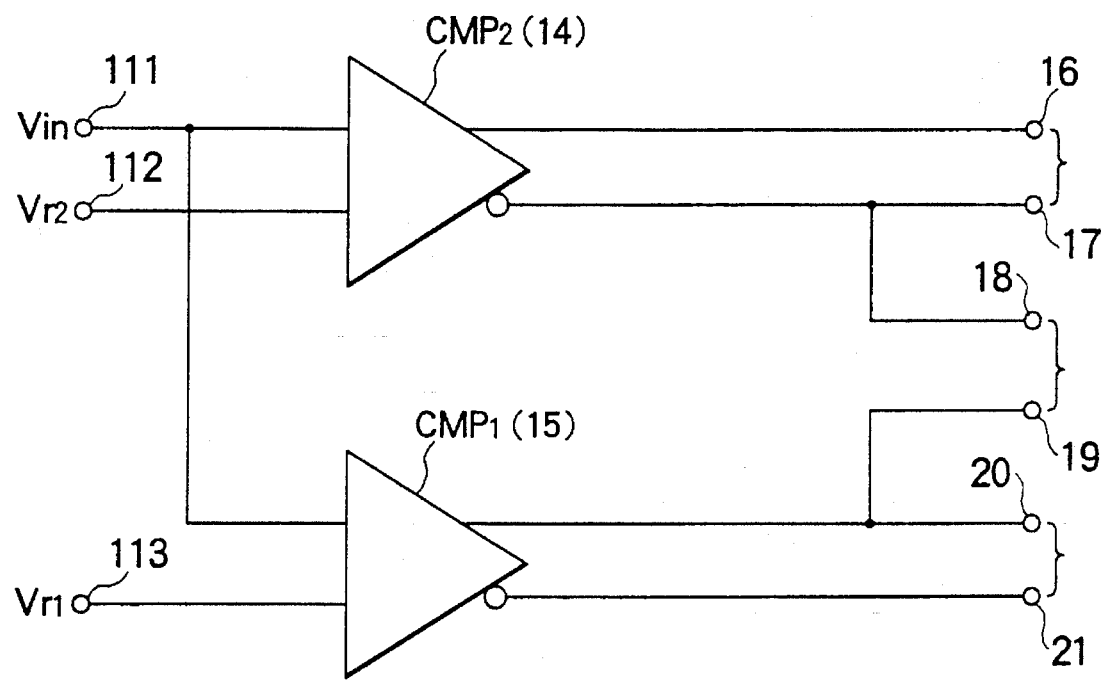
FIG. 3 is a view of a comparator used for the comparator of the A/D converter etc. of a second related art.
Figure 4A:
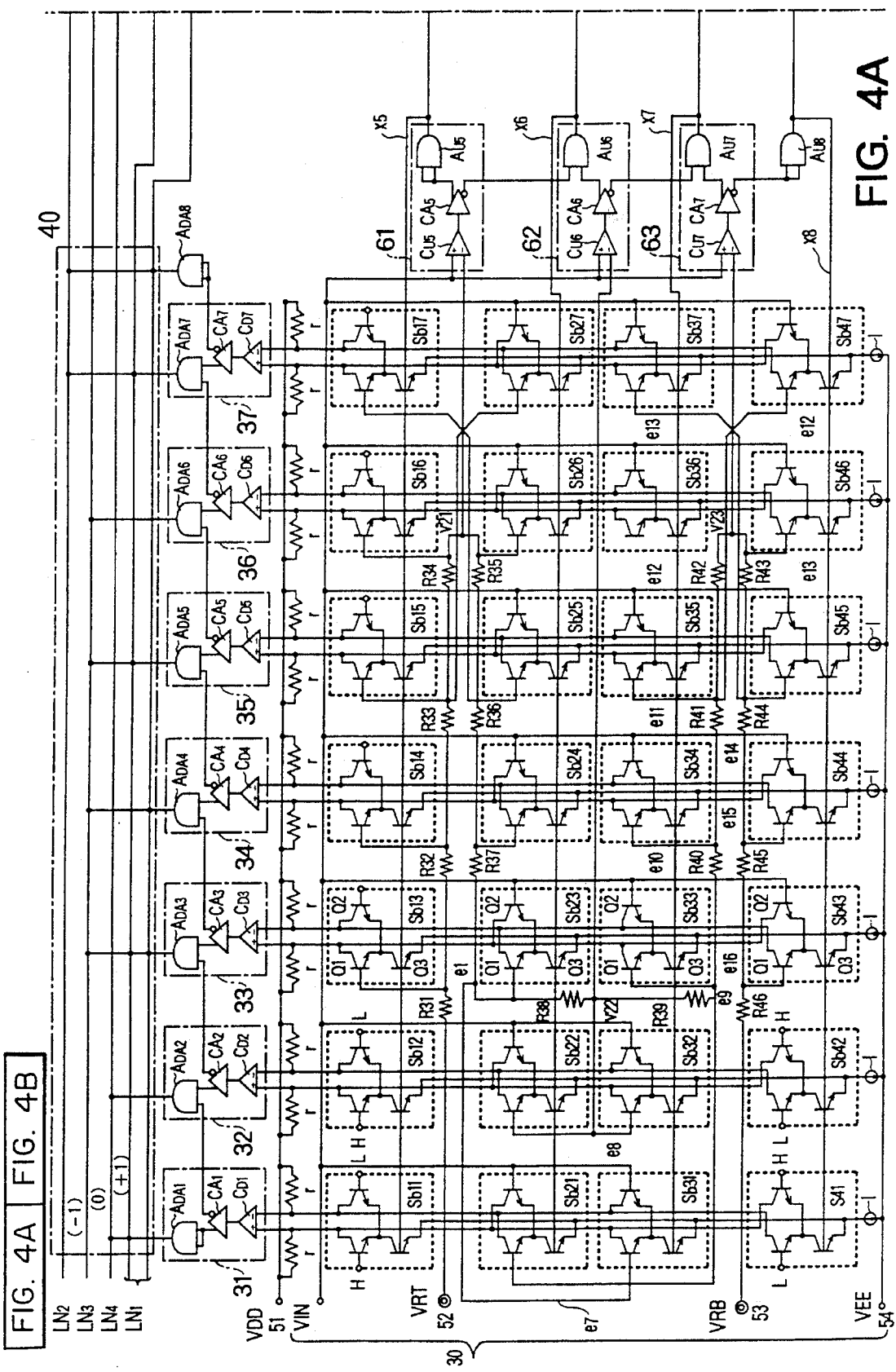
FIGS. 4A and 4B are a circuit diagram of another serial/parallel A/D converter of a third related art.
Figure 4B:
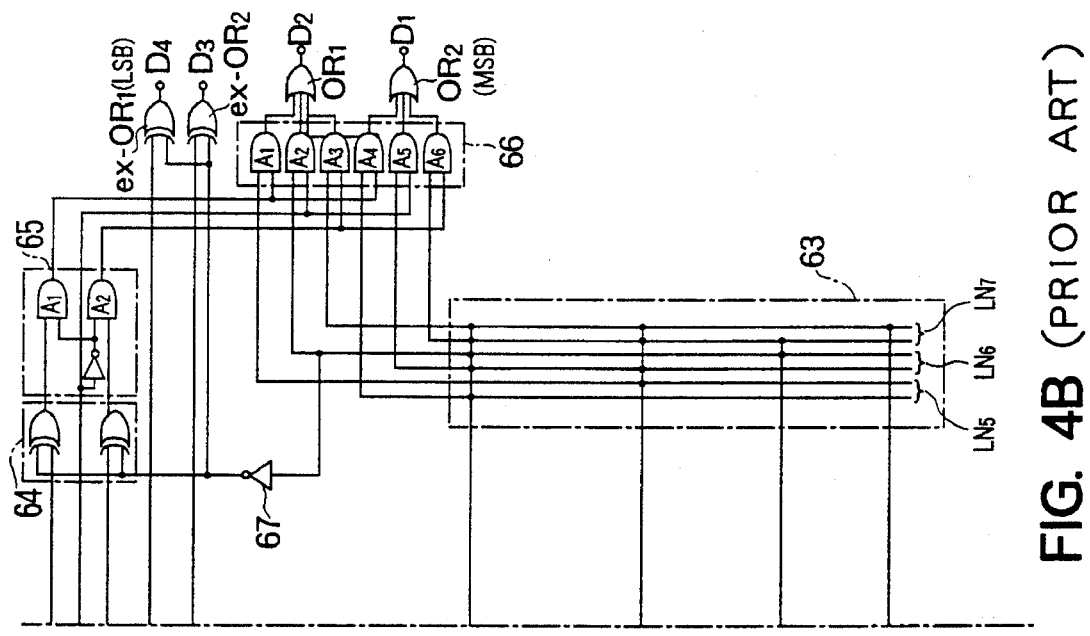
Figure 7:
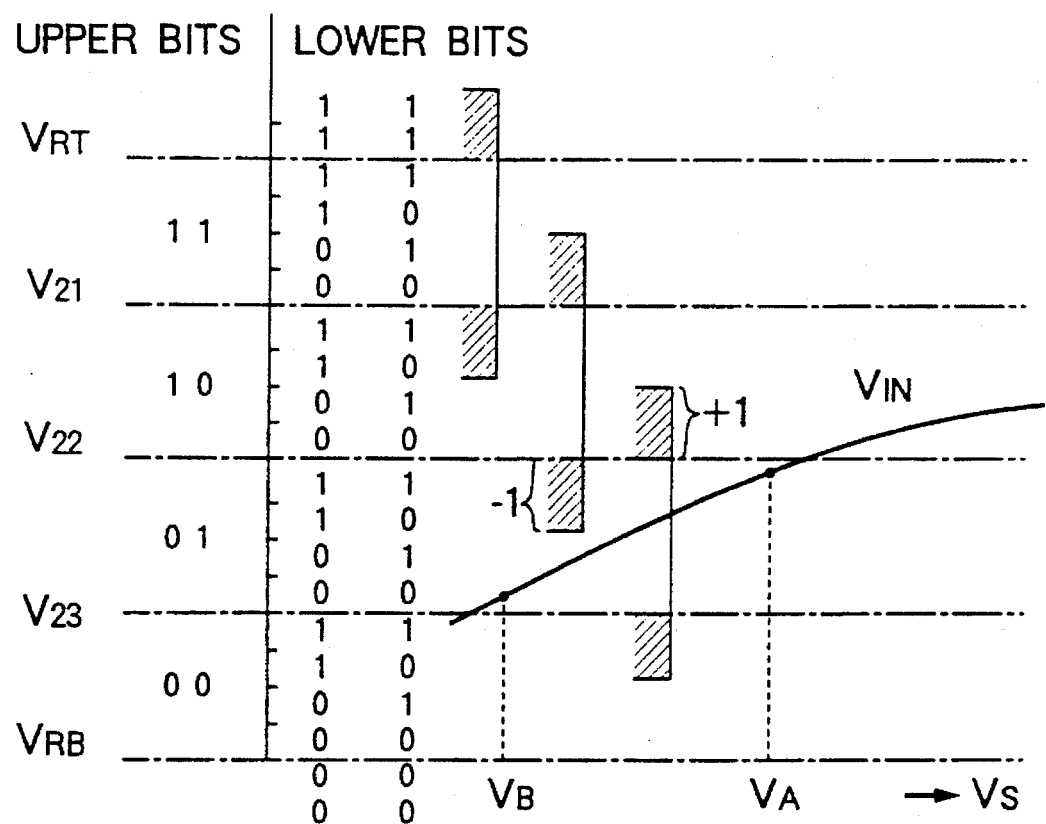
FIG. 7 is an explanatory view of the operation of the A/D converter shown in FIG. 5.

When considering equation (12) using FIG. 3, it represents that the signal $S_{80}$ becomes the line obtained by interior division of the signal $S_{72}$ and signal $S_{74}$ to $n_1:n_2$.

By the result of consideration of the above-mentioned equations (6) and (12), in FIG. 10, the cross point $P_2$ between the signal $S_{79}$ and signal $S_{80}$ is the point obtained by interior division of the cross point $P_1$ between the signal $S_{71}$ and $S_{72}$ and the cross point $P_3$ between the signal $S_{73}$ and the signal $S_{74}$ to $n_1:n_2$.

Accordingly, the output signals C ($S_{79}$, $S_{80}$) comprising the signal $S_{79}$ and the signal $S_{80}$ become the results of comparison between the input signal voltage and the imaginary voltage $V_C$ indicated by the next equation.

$$V_C = V_{R1} + (V_{R2} - V_{R1}) \cdot (n_1/N) \quad (13)$$

where, $N = n_1 + n_2$

Also, the level of the output signals B ($S_{72}$, $S_{79}$) comprising the signal $S_{72}$ and the signal $S_{79}$ change according to whether $P_4$, which is the cross point of the two, is high or low.

The cross point $P_4$ between the signal $S_{72}$ and the signal $S_{79}$ is a point of interior division of the cross point $P_1$ between the signal $S_{71}$ and signal $S_{72}$ and the cross point $P_2$ between the signal $S_{79}$ and signal $S_{80}$ to 1:1.

Accordingly, the output signals B ($S_{72}$, $S_{79}$) comprising the signal $S_{72}$ and the signal $S_{79}$ become the results of comparison between the input signal voltage and the imaginary voltage $V_B$ indicated by the following equation:

$$V_B = V_{R1} + (V_{R2} - V_{R1}) \cdot (n_1/2N) \quad (14)$$

Similarly, the level of the output signals D ($S_{73}$, $S_{80}$) comprising the signal $S_{73}$ and the signal $S_{80}$ change according to whether $P_5$ which is the cross point of the two is high or low.

The cross point $P_5$ between the signal $S_{73}$ and the signal $S_{80}$ is a point of interior division of the cross point $P_2$ between the signal $S_{79}$ and signal $S_{80}$ and the cross point $P_3$ between the signal $S_{73}$ and the signal $S_{74}$ to 1:1.

Accordingly, the output signals D ($S_{73}$, $S_{80}$) comprising the signal $S_{73}$ and the signal $S_{80}$ become the results of comparison between the input signal voltage and the imaginary voltage $V_D$ indicated by the following equation:

$$V_D = V_{R2} - (V_{R2} - V_{R1}) \cdot (n_2/2N) \quad (15)$$

As mentioned above, the present comparison circuit can obtain the result of comparison of the three interpolation points $P_2$, $P_4$, and $P_5$ from the two reference voltages $V_{R1}$ and $V_{R2}$.

The imaginary voltages $V_C$, $V_B$, and $V_D$ at the respective interpolation points $P_2$, $P_4$, and $P_5$ satisfy the following relationships from the above-described equations (13) to (15) and FIG. 10:

$$V_{R1} < V_B, V_C, V_D < V_{R2} \quad (16)$$

Also, it is possible to set the weights $n_1$ and $n_2$ of the outputs of the third and fourth comparators $CMP_3$ and $CMP_4$ to any value so long as it satisfies the condition of $n_1 + n_2 = N$.

Accordingly, by appropriately selecting the values of $n_1$ and $n_2$, the values of the respective imaginary voltages $V_B$, $V_C$, and $V_D$ can be set to any values between the first reference voltage $V_{R1}$ and the second reference voltage $V_{R2}$.

For example, where it is assumed that $n_1 = n_2 = N/2$ as in the present embodiment, $V_C = V_{R1} + (V_{R2} - V_{R1}) \cdot (½)$ is obtained from equation (13);

$V_B = V_{R1} + (V_{R2} - V_{R1}) \cdot (¼)$ is obtained from equation (14);

$$\begin{aligned} V_D &= V_{R2} - (V_{R2} - V_{R1}) \cdot (1/4) \\ &= V_{R1} + (V_{R2} - V_{R1}) \cdot (1/4) \end{aligned}$$

is obtained from equation (15).

They represent that the result of comparison between the imaginary voltage, obtained by dividing the voltages of $V_{R1}$ and $V_{R2}$ by four, and the input signal.

Where the comparison circuit having such an interpolation construction is applied to the A/D converter circuit, the weights $n_1$ and $n_2$ of the outputs of the third and fourth comparators $CMP_3$ (163) and $CMP_4$ (164) desirably satisfy the condition of $n_1 = n_2 = N/2$.

In the structure of FIG. 8, as mentioned above, a comparison circuit is constructed having an interpolation construction wherein two interpolation outputs are obtained by two comparators $C_{N1}$ of the gain N and the comparators $C_{n1}$ and $C_{n2}$ of the gains $n_1$ and $n_2$ of the two lower data comparators.

For example, the first comparator $CMP_1$ (161) and the third comparator $CMP_3$ (163) of FIG. 9 are constituted by the comparators $C_{N1}$ and $C_{n1}$ of the lower data comparator 101, respectively; and the second comparator $CMP_2$ (162) and the fourth comparator $CMP_4$ (164) of FIG. 9 are constituted by the comparators $C_{N1}$ and $C_{n1}$ of the lower data comparator 102, respectively. They function as the comparison circuits of FIG. 9. Note, as the output of the comparison circuit in this case, outputs corresponding to outputs CA, CC, and CE in FIG. 8 are obtained.

Similarly, the first comparator $CMP_1$ (161) and the third comparator $CMP_3$ (163) of FIG. 9 are constituted by the comparators $C_{N1}$ and $C_{n1}$ of the lower data comparator 101, respectively; and the second comparator $CMP_2$ (162) and the fourth comparator $CMP_4$ (164) of FIG. 9 are constituted by the comparators $C_{N1}$ and $C_{n1}$ of the lower data comparator 103, respectively. They function as the comparison circuits of FIG. 9.

Below, the first comparator $CMP_1$ (161) and the third comparator $CMP_3$ (163) of FIG. 9 are constituted by the comparators $C_{N1}$ and $C_{n1}$ of the lower data comparator 102, respectively; and the second comparator $CMP_2$ (162) and the fourth comparator $CMP_4$ (164) of FIG. 9 are constituted by the comparators $C_{N1}$ and $C_{n1}$ of the lower data comparator 104, respectively. They function as the comparison circuits of FIG. 9.

The first comparator $CMP_1$ (161) and the third comparator $CMP_3$ (163) of FIG. 9 are constituted by the comparators $C_{N1}$ and $C_{n2}$ of the lower data comparator 103, respectively; and the second comparator $CMP_2$ (162) and the fourth comparator $CMP_4$ (164) of FIG. 9 are constituted by the comparators $C_{N1}$ and $C_{n1}$ of the lower data comparator 105, respectively. They function as the comparison circuits of FIG. 9.

The first comparator $CMP_1$ (161) and the third comparator $CMP_3$ (163) of FIG. 9 are constituted by the comparators $C_{N1}$ and $C_{n2}$ of the lower data comparator 104, respectively; and the second comparator $CMP_2$ (162) and the fourth comparator $CMP_4$ (164) of FIG. 9 are constituted by the comparators $C_{N1}$ and $C_{n1}$ of the lower data comparator 106, respectively. They function as the comparison circuits of FIG. 9.

The first comparator $CMP_1$ (161) and the third comparator $CMP_3$ (163) of FIG. 9 are constituted by the comparators $C_{N1}$ and $C_{n2}$ of the lower data comparator 105, respectively; and the second comparator $CMP_2$ (162) and the fourth comparator $CMP_4$ (164) of FIG. 9 are constituted by the comparators $C_{N1}$ and $C_{n1}$ of the lower data comparator 107, respectively. They function as the comparison circuits of FIG. 9.

The first comparator $CMP_1$ (161) and the third comparator $CMP_3$ (163) of FIG. 9 are constituted by the comparators $C_{N1}$ and $C_{n2}$ of the lower data comparator 106, respectively; and the second comparator $CMP_2$ (162) and the fourth comparator $CMP_4$ (164) of FIG. 9 are constituted by the comparators $C_{N1}$ and $C_{n1}$ of the lower data comparator 108, respectively. They function as the comparison circuits of FIG. 9.

The first comparator $CMP_1$ (161) and the third comparator $CMP_3$ (163) of FIG. 9 are constituted by the comparators $C_{N1}$ and $C_{n1}$ of the lower data comparator 107, respectively; and the second comparator $CMP_2$ (162) and the fourth comparator $CMP_4$ (164) of FIG. 9 are constituted by the comparators $C_{N1}$ and $C_{n1}$ of the lower data comparator 108, respectively. They function as the comparison circuits of FIG. 9.

Note that, in these respective comparison circuits, their functions per se do not change even if the positions of the first and third comparators and the second and fourth comparators are inverted.

The latch circuits 111 to 118 are constituted by the 2-input and 2-output amplifiers a to d, respectively.

The suppression circuit 121 is constituted by the OR gates $OR_{D1}$ and $OR_{D2}$ and the AND gates $AD_{D1}$ to $AD_{D3}$, and the suppression circuit 122 is constituted by the OR gates $OR_{D3}$ and $OR_{D4}$ and the AND gates $AD_{D4}$ to $AD_{D6}$.

The AND gate circuit 130 is constituted by inverters $I_1$ ($AD_0$) and $I_2$ ($AD_{33}$) and AND gates $AD_1$ to $AD_{32}$.

In the structure of FIG. 8, a so-called ring comparator is constituted by these latch circuits 111 to 118, suppression circuits 121 and 122, the AND gate 130, and the lower data comparators 101 to 108 and constituted so that only either one of the inverters $I_1$ ($AD_0$) and $I_2$ ($AD_{33}$) and AND gates $AD_1$ to $AD_{32}$ outputs of the AND gate circuit 155 outputs the active "1" level.

Below, an explanation will be made of the configuration of connection between the outputs of the lower data comparators 101 to 108 and the latch circuits 111 to 118 and the connection configuration between the outputs of the latch circuits 111 to 118, the suppression circuits 121 and 122, and the AND gate circuit 155.

The positive output of the comparator $C_{n1}$ of the lower data comparator 101 is connected to one input of the amplifier a of the latch circuit 111, and the negative output is connected to the other input of the amplifier a and one input of the amplifier b.

The positive output of the comparator $C_{N1}$ of the lower data comparator 101 is connected to the other input of the amplifier b and one input of the amplifier c of the latch circuit 111, and the negative output is connected to the other input of the amplifier c and one input of the amplifier d. The positive output of the comparator $C_{n2}$ of the lower data comparator 101 is connected to the other input of the amplifier d of the latch circuit 111.

The positive output of the amplifier a of the latch circuit 111 is connected to one input of the AND gate $AD_1$ of the AND gate circuit 155, and the negative output is connected to one input of the AND gate $AD_{D1}$ of the suppression circuit 121; the positive output of the amplifier b is connected to one input of the AND gate $AD_2$ of the AND gate circuit 155, and the negative output is connected to one input of the AND gate $AD_{D2}$ of the suppression circuit 121; the positive output of the amplifier c is connected to one input of the AND gate $AD_3$ of the AND gate circuit 155, and the negative output is connected to one input of the AND gate $AD_{D3}$ of the suppression circuit 121 and one input of the OR gate $OR_{D1}$; and the positive output of the amplifier d is connected to one input of the AND gate $AD_4$ of the AND gate circuit 155, and the negative output is connected to the other input of the AND gate $AD_3$ of the AND gate circuit 155.

To other inputs of the AND gates $AD_{D1}$ to $AD_{D3}$ and the OR gate $OR_{D1}$ of the suppression circuit 121, the outputs of the inverter 142 inverting the output level of the upper data side other output buffers $B_{U1}$ and $B_{U3}$ (AND gates $A_{U1}$ and $A_{U3}$ of the upper data comparators 151 and 153) are connected.

The output of the OR gate $OR_{D1}$ is connected to the input of the inverter $I_1$ of the AND gate circuit 155; the output of the AND gate $AD_{D1}$ is connected to one input of the AND gate $AD_5$ of the AND gate circuit 155; the output of the AND gate $AD_{D2}$ is connected to the other input of the AND gate $AD_1$ of the AND gate circuit 155; and the output of the AND gate $AD_{D3}$ is connected to the other input of the AND gate $AD_2$ of the AND gate circuit 155.

The positive output of the comparator $C_{n1}$ of the lower data comparator 102 is connected to one input of the amplifier d of the latch circuit 112. The positive output of the comparator $C_{N1}$ of the lower data comparator 102 is connected to one input of the amplifier b of the latch circuit 112 and one input of the amplifier c, and the negative output is connected to the other input of the amplifier c and the other input of the amplifier d. The positive output of the comparator $C_{n2}$ of the lower data comparator 102 is connected to one input of the amplifier $\underline{a}$ of the latch circuit 112, and the negative output is connected to the other input of the amplifier $\underline{a}$ and the other input of the amplifier $\underline{b}$.

The positive output of the amplifier $\underline{d}$ of the latch circuit 112 is connected to the other input of the AND gate $AD_5$ of the AND gate circuit 155, and the negative output is connected to one input of the OR gate $OR_{D2}$ of the suppression circuit 121; the positive output of the amplifier $\underline{c}$ is connected to one input of the AND gate $AD_6$ of the AND gate circuit 155, and the negative output is connected to one input of the AND gate $AD_7$ of the AND gate circuit 155; the positive output of the amplifier $\underline{b}$ is connected to the other input of the AND gate $AD_7$ of the AND gate circuit 155, and the negative output is connected to one input of the AND gate $AD_8$ of the AND gate circuit 155; and the positive output of the amplifier $\underline{a}$ is connected to the other input of the AND gate $AD_8$ of the AND gate circuit 155; and the negative output is connected to one input of the AND gate $AD_{13}$ of the AND gate circuit 155.

To the other input of the OR gate $OR_{D2}$ of the suppression circuit 121, the outputs of the upper data side buffers $B_{U1}$ and $B_{U3}$ (AND gates $A_{U1}$ and $A_{U3}$ of the upper data comparators 151 and 153) are connected.

The output of the OR gate $OR_{D1}$ is connected to the other input of the AND gate $AD_6$ of the AND gate circuit 155.

The positive output of the comparator $C_{n1}$ of the lower data comparator 103 is connected to one input of the amplifier $\underline{a}$ of the latch circuit 113, and the negative output is connected to the other input of the amplifier $\underline{a}$ and one input of the amplifier $\underline{b}$. The positive output of the comparator $C_{N1}$ of the lower data comparator 103 is connected to the other input of the amplifier $\underline{b}$ of the latch circuit 113 and one input of the amplifier $\underline{c}$, and the negative output is connected to the other input of the amplifier $\underline{c}$ and one input of the amplifier $\underline{d}$. The positive output of the comparator $C_{n2}$ of the lower data comparator 103 is connected to the other input of the amplifier $\underline{d}$ of the latch circuit 113.

The positive output of the amplifier $\underline{a}$ of the latch circuit 113 is connected to one input of the AND gate $AD_9$ of the AND gate circuit 155, and the negative output is connected to the other input of the AND gate $AD_4$ of the AND gate circuit 155; the positive output of the amplifier $\underline{b}$ is connected to one input of the AND gate $AD_{10}$ of the AND gate circuit 155, and the negative output is connected to the other input of the AND gate $AD_9$ of the AND gate circuit 155; the positive output of the amplifier $\underline{c}$ is connected to one input of the AND gate $AD_{11}$ of the AND gate circuit 155, and the negative output is connected to the other input of the AND gate $AD_{10}$ of the AND gate circuit 155; and the positive output of the amplifier $\underline{d}$ is connected to one input of the AND gate $AD_{12}$ of the AND gate circuit 155, and the negative output is connected to the other input of the AND gate $AD_{11}$ of the AND gate circuit 155.

The positive output of the comparator $C_{n1}$ of the lower data comparator 104 is connected to one input of the amplifier $\underline{d}$ of the latch circuit 114. The positive output of the comparator $C_{N1}$ of the lower data comparator 104 is connected to one input of the amplifier $\underline{b}$ and one input of the amplifier $\underline{c}$ of the latch circuit 114, and the negative output is connected to the other input of the amplifier $\underline{c}$ and the other input of the amplifier $\underline{d}$. The positive output of the comparator $C_{n2}$ of the lower data comparator 104 is connected to one input of the amplifier $\underline{a}$ of the latch circuit 114, and the negative output is connected to the other input of the amplifier $\underline{a}$ and the other input of the amplifier $\underline{b}$.

The positive output of the amplifier $\underline{d}$ of the latch circuit 114 is connected to the other input of the AND gate $AD_{13}$ of the AND gate circuit 155, and the negative output is connected to one input of the AND gate $AD_{14}$ of the AND gate circuit 155; the positive output of the amplifier $\underline{c}$ is connected to the other input of the AND gate $AD_{14}$ of the AND gate circuit 155, and the negative output is connected to one input of the AND gate $AD_{15}$ of the AND gate circuit 155; the positive output of the amplifier $\underline{b}$ is connected to the other input of the AND gate $AD_{15}$ of the AND gate circuit 155, and the negative output is connected to one input of the AND gate $AD_{16}$ of the AND gate circuit 155; and the positive output of the amplifier $\underline{a}$ is connected to the other input of the AND gate $AD_{16}$ of the AND gate circuit 155, and the negative output is connected to one input of the AND gate $AD_{21}$ of the AND gate circuit 155.

The positive output of the comparator $C_{n1}$ of the lower data comparator 105 is connected to one input of the amplifier $\underline{a}$ of the latch circuit 115, and the negative output is connected to the other input of the amplifier $\underline{a}$ and one input of the amplifier $\underline{b}$. The positive output of the comparator $C_{N1}$ of the lower data comparator 105 is connected to the other input of the amplifier $\underline{b}$ and one input of the amplifier $\underline{c}$ of the latch circuit 115, and the negative output is connected to the other input of the amplifier $\underline{c}$ and one input of the amplifier $\underline{d}$. The positive output of the comparator $C_{n2}$ of the lower data comparator 105 is connected to the other input of the amplifier $\underline{d}$ of the latch circuit 115.

The positive output of the amplifier $\underline{a}$ of the latch circuit 115 is connected to one input of the AND gate $AD_{17}$ of the AND gate circuit 155, and the negative output is connected to the other input of the AND gate $AD_{12}$ of the AND gate circuit 155; the positive output of the amplifier $\underline{b}$ is connected to one input of the AND gate $A_{D18}$ of the AND gate circuit 155, and the negative output is connected to the other input of the AND gate $AD_{17}$ of the AND gate circuit 155; the positive output of the amplifier $\underline{c}$ is connected to one input of the AND gate $AD_{19}$ of the AND gate circuit 155, and the negative output is connected to the other input of the AND gate $AD_{18}$ of the AND gate circuit 155; and the positive output of the amplifier $\underline{d}$ is connected to one input of the AND gate $AD_{20}$ of the AND gate circuit 155, and the negative output is connected to the other input of the AND gate $AD_{19}$ of the AND gate circuit 155.

The positive output of the comparator $C_{n1}$ of the lower data comparator 106 is connected to one input of the amplifier $\underline{d}$ of the latch circuit 116. The positive output of the comparator $C_{N1}$ of the lower data comparator 106 is connected to one input of the amplifier $\underline{b}$ and one input of the amplifier $\underline{c}$ of the latch circuit 116, and the negative output is connected to the other input of the amplifier $\underline{c}$ and the other input of the amplifier $\underline{d}$. The positive output of the comparator $C_{n2}$ of the lower data comparator 106 is connected to one input of the amplifier $\underline{a}$ of the latch circuit 116, and the negative output is connected to the other input of the amplifier $\underline{a}$ and the other input of the amplifier $\underline{b}$.

The positive output of the amplifier $\underline{d}$ of the latch circuit 116 is connected to the other input of the AND gate $AD_{21}$ of the AND gate circuit 155, and the negative output is connected to one input of the AND gate $AD_{22}$ of the AND gate circuit 155; the positive output of the amplifier $\underline{c}$ is connected to the other input of the AND gate $AD_{22}$ of the AND gate circuit 155, and the negative output is connected to one input of the AND gate $AD_{23}$ of the AND gate circuit 155; the positive output of the amplifier $\underline{b}$ is connected to the other input of the AND gate $AD_{33}$ of the AND gate circuit 155, and the negative output is connected to one input of the AND gate $AD_{24}$ of the AND gate circuit 155; and the positive output of the amplifier $\underline{a}$ is connected to the other input of the AND gate $AD_{14}$ of the AND gate circuit 155, and the negative output is connected to one input of the AND gate $AD_{29}$ of the AND gate circuit 155.

The positive output of the comparator $C_{n1}$ of the lower data comparator 107 is connected to one input of the amplifier a of the latch circuit 117, and the negative output is connected to the other input of the amplifier a and one input of the amplifier b. The positive output of the comparator $C_{N1}$ of the lower data comparator 107 is connected to the other input of the amplifier b and one input of the amplifier c of the latch circuit 117, and the negative output is connected to the other input of the amplifier c and one input of the amplifier d. The positive output of the comparator $C_{n2}$ of the lower data comparator 107 is connected to the other input of the amplifier d of the latch circuit 117.

The positive output of the amplifier a of the latch circuit 117 is connected to one input of the AND gate $AD_{25}$ of the AND gate circuit 155, and the negative output is connected to the other input of the AND gate $AD_{20}$ of the AND gate circuit 155; the positive output of the amplifier b is connected to one input of the AND gate $AD_{26}$ of the AND gate circuit 155, and the negative output is connected to the other input of the AND gate $AD_{25}$ of the AND gate circuit 155; the positive output of the amplifier c is connected to one input of the AND gate $AD_{27}$ of the AND gate circuit 155, and the negative output is connected to the other input of the AND gate $AD_{26}$ of the AND gate circuit 155; and the positive output of the amplifier d is connected to one input of the AND gate $AD_{28}$ of the AND gate circuit 155, and the negative output is connected to one input of the OR gate $OR_{D3}$ of the suppression circuit 122.

To the other input of the OR gate $OR_{D3}$ of the suppression circuit 122, the outputs of the inverter 142 inverting the level of the outputs of the upper data side other output buffers $B_{U1}$ and $B_{U3}$ (AND gates $A_{U1}$ and $A_{U3}$ of the upper data comparators 151 and 153) are connected.

The output of the OR gate $OR_{D3}$ is connected to the other input of the AND gate $AD_{27}$ of the AND gate circuit 130.

The positive output of the comparator $C_{n1}$ of the lower data comparator 108 is connected to one input of the amplifier d of the latch circuit 118. The positive output of the comparator $C_{N1}$ of the lower data comparator 108 is connected to one input of the amplifier b and one input of the amplifier c of the latch circuit 118, and the negative output is connected to the other input of the amplifier c and the other input of the amplifier d. The positive output of the comparator $C_{n2}$ of the lower data comparator 108 is connected to one input of the amplifier a of the latch circuit 118, and the negative output is connected to the other input of the amplifier a and the other input of the amplifier b.

The positive output of the amplifier d of the latch circuit 118 is connected to the other input of the AND gate $AD_{29}$ of the AND gate circuit 155, and the negative output is connected to one input of the AND gate $AD_{30}$ of the AND gate circuit 155; the positive output of the amplifier c is connected to the other input of the AND gate $AD_{30}$ of the AND gate circuit 155, and the negative output is connected to one input of the AND gate $AD_{D4}$ of the suppression circuit 122 and one input of the OR gate $OR_{D4}$; the positive output of the amplifier b is connected to one input of the AND gate $AD_{31}$ of the AND gate circuit 155, and the negative output is connected to one input of the AND gate $AD_{D5}$ of the suppression circuit 122; and the positive output of the amplifier a is connected to one input of the AND gate $AD_{32}$ of the AND gate circuit 155, and the negative output is connected to one input of the AND gate $AD_{D6}$ of the suppression circuit 122.

To the other inputs of the AND gates $AD_{D4}$ to $AD_{D6}$ and the OR gate $OR_{D4}$ of the suppression circuit 122 are connected the outputs of the upper data side buffers $B_{U1}$ and $B_{U3}$ (the AND gates $A_{U1}$ and $A_{U3}$ of the upper data comparators 151 and 153).

The output of the OR gate $OR_{D4}$ is connected to the input of the inverter $I_2$ of the AND gate circuit 155; the output of the AND gate $AD_{D4}$ is connected to the other input of the AND gate $AD_{31}$ of the AND gate circuit 155; the output of the AND gate $AD_{D5}$ is connected to the other input of the AND gate $AD_{32}$ of the AND gate circuit 155; and the output of the AND gate $AD_{D6}$ is connected to the other input of the AND gate $AD_{28}$ of the AND gate circuit 155.

The outputs of the respective inverters $I_1$ and $I_2$ and the AND gates $AD_1$ to $AD_{32}$ of the AND gate circuit 155 are connected to the lower data encoder 140 via the buffers $B_{D0}$ to $B_{D33}$, respectively.

A ring comparator is constituted by the above connection configuration. Where the ring comparator is constituted using the comparison circuit having an interpolation construction of FIG. 9, it is necessary to cut the left or right of the ring, and the suppression circuits 121 and 122 have this ring cutting function. The suppression circuit 121 is a circuit cutting the left of the ring, and the suppression circuit 122 is a circuit cutting the right of the ring.

Here, an explanation will be made of the fundamental operation of the suppression circuit of the third embodiment of the present invention using FIG. 11.

Figure 11:
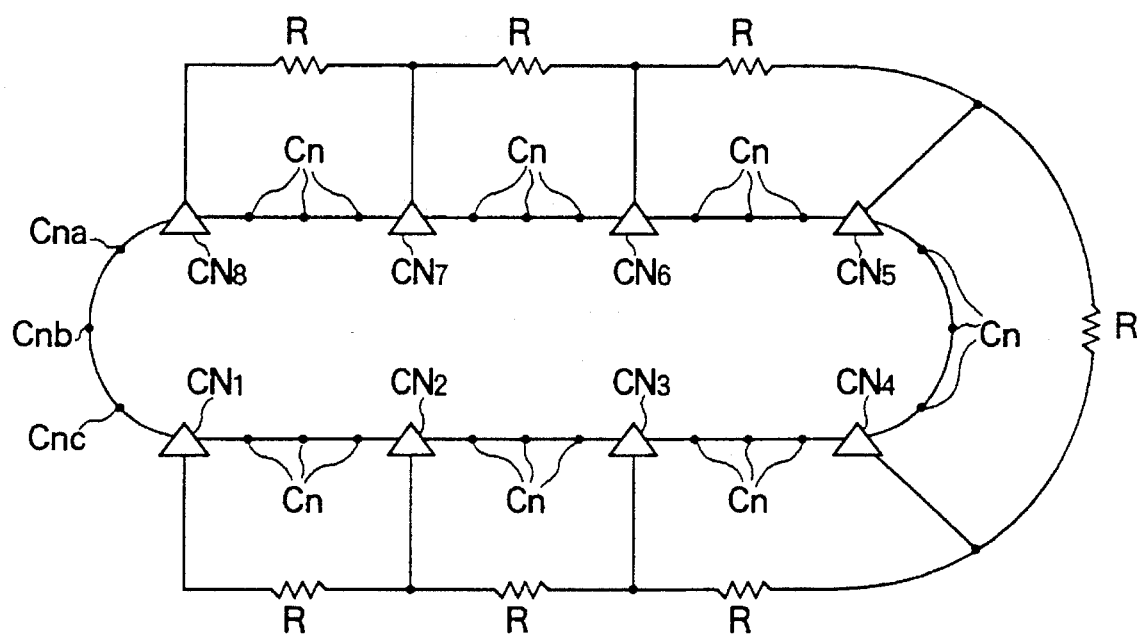
FIG. 11 is a structural view of an A/D converter of a third embodiment of the present invention.

In FIG. 11, CN1 to CN8 are comparison circuits comparing the reference voltage divided by the reference resistance element R and the input signal $V_{IN}$ as they are, and Cn denotes the comparison circuit using interpolation. FIG. 11 indicates a case where the left side of the ring is cut.

In this case, the lowest reference voltage is supplied to the comparison circuit CN1, and the highest reference voltage is supplied to the comparison circuit CN8.

For this reason, the outputs of the three interpolation comparison circuits of $Cn_a$, $Cn_b$, and $Cn_c$ in FIG. 11 become unnecessary. So as not to input these outputs to the lower data encoder 140, the suppression circuit 121 acts so as to suppress the three outputs of the interpolation comparison circuits $Cn_a$, $Cn_b$, and $Cn_c$.

This is the same also in the case where the right of the ring is cut.

The lower data encoder 140 is constituted by a data line $LN_{141}$ generating conversion code data $D_2$ to $D_6$, a selection line $LN_{142}$ generating a selection signal $SEL_1$ showing that one of the outputs of the AND gates $AD_1$, $AD_2$, $AD_5$ to $AD_8$, $AD_{13}$, and $AD_{14}$ of the AND gate circuit 155 becomes "1"; a selection line $LN_{143}$ generating a selection signal $SEL_2$ indicating that one of the outputs of the inverter $I_1$, AND gates $AD_2$, $AD_3$, $AD_4$, $AD_9$ to $AD_{12}$, $AD_{17}$ to $AD_{20}$, $AD_{25}$ to $AD_{28}$, $AD_{31}$, and $AD_{32}$ of the AND gate circuit 155 becomes "1"; and a selection line $LN_{144}$ generating a selection signal $SEL_3$ indicating that one of the outputs of the AND gates $AD_{15}$, $AD_{16}$, $AD_{21}$ to $AD_{24}$, $AD_{29}$, and $AD_{30}$, and the inverter $I_2$ of the AND gate circuit 155 becomes "1".

FIG. 12 shows the correspondence between the output conversion code data $D_2$ to $D_6$ and the selection line data $LN_{142}$ to $LN_{144}$ which is the result of encoding of the lower data encoder 140 when the outputs of the inverters $I_1$ and $I_2$ and $AD_1$ to $AD_{32}$ of the lower data side AND gate circuit 155 are "1".

Next, the operation by the above-described structure will be explained.

For example, when the sampling voltage $V_S$ of the sampled analog signal is represented as $V_{RB} < V_S < V_3$ (=$e_{12}$), the outputs of the comparators $CU_1$ to $CU_3$ of the upper data comparators 151 to 153 become "L", and the digital signals of "0" are output from the AND gates $AU_1$ to $AU_3$, respectively.

As a result, the digital signal such as [000] is input via the buffers $B_{U1}$ to $B_{U3}$ to the upper data encoder 130. The outputs of the AND gates $AU_1$ and $AU_3$ pass through the buffers $B_{U1}$ to $B_{U3}$, and then are input to the suppression circuits 121 and 122 directly or after an inversion of the level at the inverter 80.

At the upper data encoder 130, the upper significant data of [000] is issued to the three columns of encoder lines $[LN_{31}]$ to $[LN_{33}]$ generating the predetermined data by a so-called wired-OR circuit and is output to the selection gate 141.

Also, at this time, only the outputs of the AND gates $AD_{U4}$ and $AD_{U5}$ among the upper data side AND gates $AD_{U1}$ to $AD_{U5}$ become "H", and the control signals $x_4$ and $x_5$ of "1" are output from the AND gates $AD_{U4}$ and $AD_{U5}$.

Also, if the sampling voltage $V_S$ is represented as $V_3 < V_S < V_2 \, (=e_8)$, the outputs of the comparators $CU_1$ and $CU_2$ of the upper data comparators 151 and 151 become "L", and the output of the comparator $CU_3$ of the upper data comparator 153 becomes "H", and the digital signal is output, i.e., "0" is output from the AND gates $AU_1$ and $AU_2$ of the upper data comparators 151 and 152, and "1" is output from the AND gate $AU_3$ of the upper data comparator 153, respectively.

As a result, the digital signal such as [001] is input via the buffers $B_{U1}$ to $B_{U3}$ to the upper data encoder 155, and the outputs of the AND gates $AU_1$ and $AU_3$ pass through the buffers $B_{U1}$ and $B_{U3}$, and then are input to the suppression circuits 121 and 122 directly or after being inverted in their levels at the inverter 142.

At the upper data encoder 130, the upper significant data of [001] is generated to the encoder lines $[LN_{31}]$ to $[LN_{33}]$ and is output to the selection gate 141.

Also, at this time, only the outputs of the AND gates $AD_{U3}$ and $AD_{U4}$ among the upper data side AND gates $AD_{U1}$ to $AD_{U5}$ become "H", and the control signals $x_{13}$ and $x_{14}$ of "1" are output from the AND gates $AD_{U3}$ and $AD_{U4}$.

Also, if the sampling voltage $V_S$ is represented as $V_{32} < V_S < V_{31}$, the outputs of the comparators $CU_2$ and $CU_3$ of the upper data comparators 152 and 153 become "H", the output of the comparator $CU_1$ of the upper data comparator 151 becomes "L", and the digital signal is output, i.e., "1" is output from the AND gate $AU_2$ of the upper data comparator 152, and "0" is output from the AND gates $AU_1$ and $AU_3$ of the upper data comparators 151 and 153, respectively.

As a result, a digital signal such as [010] is input via the buffers $B_{U1}$ to $B_{U3}$ to the upper data encoder 155, and the outputs of the AND gates $AU_1$ and $AU_3$ pass through the buffers $B_{U1}$ and $B_{U3}$ and then are input to the suppression circuits 121 and 122 directly or after being inverted in their levels at the inverter 142.

At the upper data encoder 130, the upper significant data of [011] is generated to the encoder lines $[LN_{31}]$ to $[LN_{33}]$ and is output to the selection gate 141.

Also, at this time, only the outputs of the AND gates $AD_{U2}$ and $AD_{U3}$ among the upper data side AND gates $AD_{U1}$ to $AD_{U5}$ become "H", and the control signals $x_{12}$ and $x_{13}$ of "1" are output from the AND gates $AD_{U2}$ and $AD_{U3}$.

Also, if the sampling voltage $V_S$ is represented as $V_{31} < V_S < V_{RT}$, the outputs of the comparators $CU_1$ to $CU_3$ of the upper data comparators 151 to 153 become "H", and a digital signal is output, i.e., "1" is output from the AND gate $AU_2$ of the upper data comparator 151, and "0" is output from the AND gates $AU_2$ and $AU_3$ of the upper data comparators 152 and 153, respectively.

As a result, a digital signal such as [100] is input via the buffers $B_{U1}$ to $B_{U3}$ to the upper data encoder 155, and the outputs of the AND gates $AU_1$ and $AU_3$ pass through the buffers $B_{U1}$ and $B_{U3}$ and then are input to the suppression circuits 121 and 122 directly or after being inverted in their levels at the inverter 142.

At the upper data encoder 130, the upper significant data of [110] is generated to the encoder lines $[LN_{31}]$ to $[LN_{33}]$ and is output to the selection gate 70.

Also, at this time, only the outputs of the AND gates $AD_{U1}$ and $AD_{U2}$ among the upper data side AND gates $AD_{U1}$ to $AD_{U5}$ become "H", and the control signals $x_{11}$ and $x_{12}$ of "1" are output from the AND gates $AD_{U1}$ and $AD_{U2}$.

In parallel with this, the transistors $Q_{103}$ of the respective switching blocks of the matrix circuit 100 connected to the control lines ($x_{11}, x_{12}, x_{13}, x_{14}$ and $x_{15}$) at which the digital output signal among the respective upper data side AND gates $AD_{U(1, 2, 3, 4, 5)}$ has become "1" are controlled to turn ON in units of two rows, and further a fine digitization of the quantization level is executed.

For example, when the outputs of the output control signals $x_{14}$ and $x_{13}$ of the AND gates $AD_{U4}$ and $AD_{U3}$ become the "1" level (at this time, only the output of the AND gate $A_{U3}$ is the "1" level), respective transistors $Q_{103}$ of the switching blocks $S_{C41}, S_{C43}, S_{C45}$, and $S_{C47}$ at the second row from the bottom in the diagram, and the switching blocks $S_{C32}, S_{C34}, S_{C36}$, and $S_{C38}$ at the third row adjoining them become ON, so that the reference voltages $e_7$ to $e_{15}$ divided by the reference resistors $R_7$ to $R_{16}$ and the sampling voltage $V_S$ are differentially amplified at the respective switching blocks $S_{C41}, S_{C43}, S_{C45}$, and $S_{C47}$, and $S_{C32}, S_{C34}, S_{C36}$, and $S_{C38}$, and the differential output is input to the 2-input ends of the comparators $C_{N1}, C_{n1}$, and $C_{n2}$ of the lower data comparators 101 to 108.

Similarly, when the outputs of the output control signals $x_{13}$ and $x_{12}$ of the AND gates $AD_{U3}$ and $AD_{U2}$ become the "1" level (at this time, only the output of the AND gate $A_{U2}$ is the "1" level), the switching blocks $S_{C32}, S_{C34}, S_{C36}$, and $S_{C38}$ at the third row, and the switching blocks $S_{C21}, S_{C23}, S_{C25}$, and $S_{C27}$ at the second row adjoining them are activated, so that the differential amplification operation is performed, and the differential output is input to the 2-input ends of the comparators $C_{N1}, C_{n1}$, and $C_{n2}$ of the lower data comparators 101 to 108.

For example, when the output of the AND gate $AU_2$ is at "1" level, the lower data conversion code is detected by the switching blocks $S_{C21}, S_{C23}, S_{C32}$, and $S_{C34}$, and the redundant bit of the lower data conversion code is detected by the switching blocks $S_{C25}, S_{C27}, S_{C36}$, and $S_{C38}$.

The outputs of the comparators $C_{n1}$ and $C_{n2}$ of the respective lower data comparators 101 to 108 having the gain of $n_1$ (or $n_2$) are connected to the comparators $C_{n1}$ and $C_{n2}$ of the lower data comparators corresponding to the adjoining columns or corresponding to every other column, whereby the ring comparator is constituted, and the differential outputs between the sampled voltage $V_S$ obtained at the activated switching block and the reference voltage divided by the reference resistance element are compared between the two comparators $C_{N1}$ and $C_{n1}$ of the connected two lower data comparators or by the comparison circuit having an interpolation construction constituted by $C_{n1}$ and $C_{n2}$. As a result, an interpolation output is obtained, which is input to the respective latch circuits 111 to 118.

The output of the latch circuit 118 is input to the inverters $I_1$ and $I_2$ and the AND gates $A_{D1}$ to $A_{D32}$ of the AND gate circuit 130 via the suppression circuits 121 and 122 or directly, whereby a digital signal in accordance with the result of comparison will be output to the lower data encoder 140.

Note that, at this time, in the suppression circuits 121 and 122, based on the output signal of the upper data comparators 151 and 153, cutting is carried out on the left side or right side of the ring comparator and, at the same time, the unnecessary input of the output of the interpolation circuit to the lower data encoder 140 is suppressed.

At the lower data encoder 140, by the wired-OR circuit, as shown in FIG. 12, the output conversion codes $D_2$ to $D_6$ are set at the line $LN_{141}$ in accordance with the output level of the inverters $I_1$ and $I_2$ and the AND gates $AD_1$ to $AD_{32}$ of the AND gate circuit 155 and output, and at the same time, one line among the selection lines $LN_{142}$ to $LN_{144}$ is set at "1", which is input as the selection signals $SEL_1$ to $SEL_3$ to the AND gates $A_1$ to $A_3$ of the selection gate 70, respectively.

At this time, where for example the output of the AND gate $AD_1$ of the AND gate circuit 155 is at the "1" level, the conversion codes $D_2$ to $D_6$ are set at [00110] and output, the selection signal $SEL_1$ is input to the AND gate $A_1$ of the selection gate 70 as the "1" level, and the selection signals $SEL_2$ and $SEL_3$ are input to the AND gates $A_2$ and $A_3$ of the selection gate as the "0" level.

At the selection gate 141, along with the fact that only the selection signal $SEL_1$ is input as the "1" level, only the AND gate $A_1$ is activated.

To the AND gate $A_1$, the upper significant data generated in the line $LN_{31}$ of the upper data encoder 130 has been supplied.

Accordingly, the upper significant data generated in the line $LN_{31}$ is selected at the selection gate 141, and as a result, it is output as the upper data conversion code $D_1$ via the OR gate $OR_1$.

As explained above, according to the present embodiment, the lower data comparators 101 to 108 corresponding to respective columns of the switching block are constituted by the comparator $C_{N1}$ having a gain of N and comparators $C_{n1}$ and $C_{n2}$ having a gain of $n_1$ (or $n_2$) and, at the same time, a ring comparator is constituted by connecting the outputs of the comparators $C_{n1}$ and $C_{n2}$ to the comparators $C_{n1}$ and $C_{n2}$ of the lower data comparators corresponding to the adjoining columns or corresponding to every other column, and constituted so that the differential outputs between the sampled voltage $V_S$ obtained at the activated switching block and the reference voltage divided by the reference resistance element are compared between the two comparators $C_{N1}$ and $C_{n1}$ of the connected two lower data comparators or by the comparison circuit having an interpolation construction constituted by $C_{n1}$ and $C_{n2}$, whereby an interpolation output is obtained and, provision is made of suppression circuits 121 and 122 which act as the left side or right side of the ring comparator in accordance with the outputs of the upper data comparators 151 and 153 and, at the same time, suppress the unnecessary input of the output of the interpolation circuit to the lower data encoder 140. Therefore, a great improvement of the resolution can be achieved, and an A/D converter circuit having a high precision can be realized.

Also, the restrictions with respect to the emitter size of the reference resistance element and transistor are eased, and as a result, the elements can be made smaller, and thus there is an advantage that a reduction of the surface area of the chip can be achieved and so on.

Also, in the above-mentioned embodiment, the structure in which the other output pin buffers $B_{U1}$ to $B_{U3}$ and $B_{D0}$ to $B_{D33}$ are arranged on the input side of the upper data encoder 30 and the lower data encoder 140 was shown, but these other output pin buffers $B_{U1}$ to $B_{U3}$ and $B_{D0}$ to $B_{D33}$ are provided so as to reliably drive the upper data encoder 130 and the lower data encoder 140. It is necessary to provide the same according to a certain capacitance of the upper data encoder 130 and the lower data encoder 140 acting as a so-called load.

As explained above, according to the present invention, a great improvement of the resolution can be achieved, and an A/D converter circuit having a high precision can be realized.

Also, the restrictions with respect to the emitter size of the reference resistance element and transistor are eased, and as a result, the elements can be made smaller, and thus there is an advantage that a reduction of the surface area of the chip can be achieved and so on.

An explanation will now be made of a fourth embodiment of the present invention.

Figure 13:
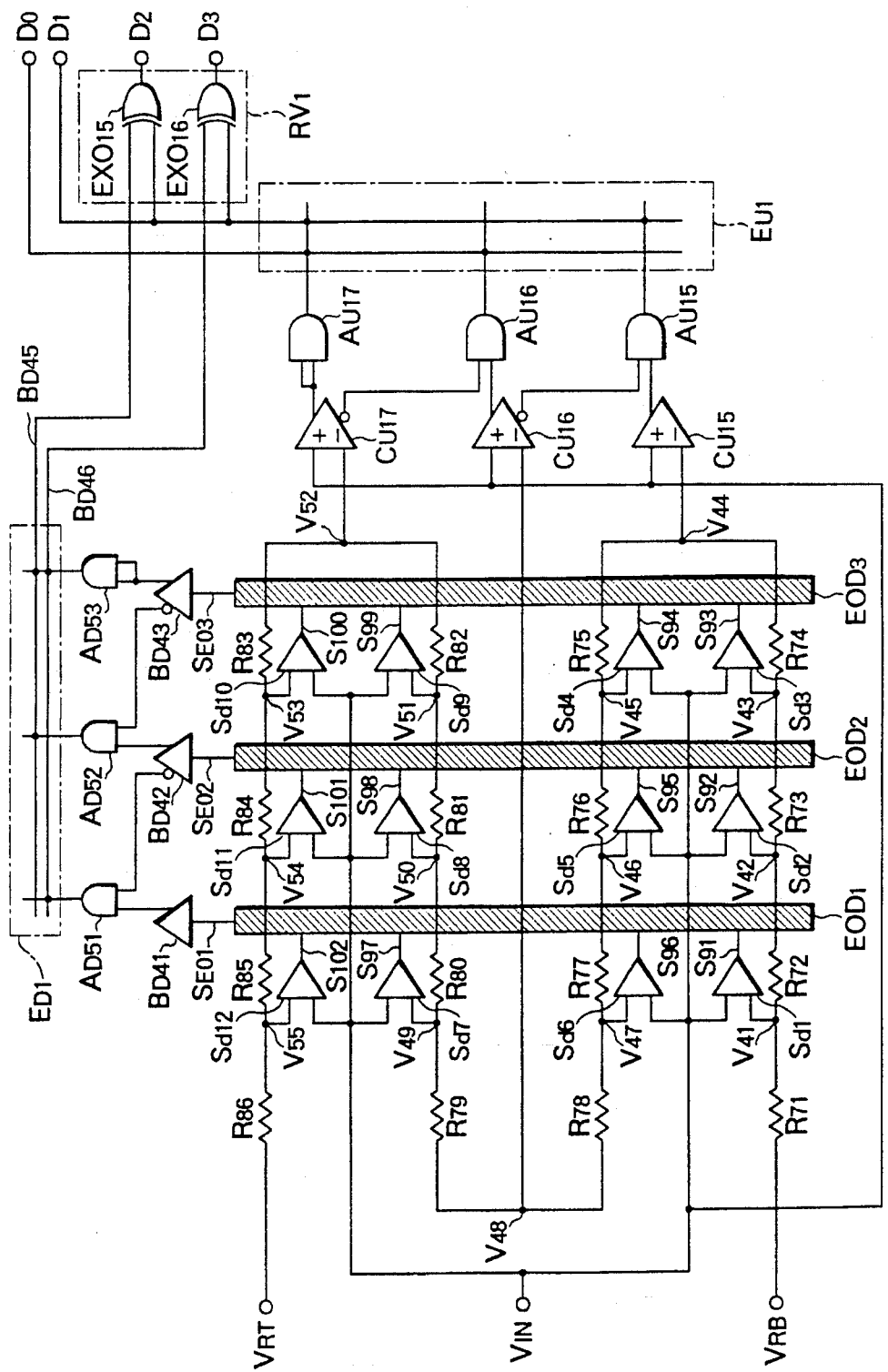
FIG. 13 is a block diagram of a serial/parallel A/D converter of a fourth embodiment of the present invention.

FIG. 13 is a structural view showing a fourth embodiment of an A/D converter circuit according to the present invention.

$R_{71}$ to $R_{86}$ denote reference resistance elements; $CU_{11}$ to $CU_{13}$ denote upper data comparators; $AU_{15}$ to $AU_{17}$ denote upper data side AND gates; $E_{U1}$ denotes an upper data encoder; $S_{d1}$ to $S_{d12}$ denote switching blocks; $EOD_1$ to $EOD_3$ denote even/odd determination circuits; $B_{D1}$ to $B_{D3}$ denote complementary output buffers; $AD_{51}$ to $AD_{53}$ denote lower data side AND gates; $E_{D1}$, a lower data encoder; $RV_1$, an inverted gate; $V_{IN}$, an input analog signal; and $V_{RT}$ and $V_{RB}$ denote reference voltages set with a predetermined differential therebetween; respectively.

The reference resistance elements $R_{71}$ to $R_{86}$ are connected in series between the terminals of the reference voltages $V_{RT}$ to $V_{RB}$ (0 to −2 V) and generate the reference voltages $V_1$ to $V_{15}$ obtained by dividing the reference voltage between the adjoining resistance elements, respectively.

The upper data comparator $CU_{15}$ is connected to the input line of the analog signal $V_{IN}$ which is to be converted at its one input terminal, is connected to the middle point of connection of the resistance elements $R_{74}$ and $R_{75}$ generated by the reference voltage $V_{44}$ of the rough quantization level divided by the reference resistance elements $R_{71}$ to $R_{86}$ at its other input terminal, and is connected to one input terminal of the 2-input AND gate $AU_{15}$ at its positive output terminal.

This upper data comparator $CU_{15}$ compares the input analog signal $V_{IN}$ with the reference voltage $V_{44}$ and outputs the signal indicating the result of that comparison at a high level ("1") when the level of the analog signal $V_{IN}$ is higher than the reference voltage $V_{44}$, while at a low level ("0") when the level of the analog signal $V_{In}$ is lower than the reference voltage $V_{44}$, to the AND gate $AU_{11}$ from its positive output terminal.

The upper data comparator $CU_{16}$ is connected to the input line of the analog signal $V_{IN}$ which is to be converted at its one input terminal, is connected to the middle point of connection of the resistance elements and $R_{79}$ generated by the reference voltage $V_{48}$ of the rough quantization level divided by the reference resistance elements $R_{71}$ to $R_{86}$ at its other input terminal, is connected to one input terminal of the 2-input AND gate $AU_{16}$ at its positive output terminal, and is connected to the other input terminal of the 2-input AND gate $AU_{15}$ at its negative output terminal.

This upper data comparator $CU_{16}$ compares the input analog signal $V_{IN}$ with the reference voltage $V_{48}$, outputs the signal indicating the result of that comparison at a high level when the level of the analog signal $V_{IN}$ is higher than the reference voltage $V_{48}$, while at a low level when the level of the analog signal $V_{IN}$ is lower than the reference voltage $V_{48}$, to the AND gate $AU_{16}$ from its positive output terminal and outputs the signal obtained by inverting the level of the positive output to the other input terminal of the AND gate $AU_{15}$ from its negative output terminal.

The upper data comparator $CU_{17}$ is connected to the input line of the analog signal $V_{IN}$ which is to be converted at its one input terminal, is connected to the middle point of connection of the resistance elements $R_{82}$ and $R_{83}$ generated by the reference voltage $V_{12}$ of the rough quantization level divided by the reference resistance elements $R_{71}$ to $R_{86}$ at its other input terminal, is connected to the two input terminals of the 2-input AND gate $AU_{17}$ at its positive output terminal, and is connected to the other input terminal of the 2-input AND gate $AU_{16}$ at its negative output terminal.

This upper data comparator $CU_{17}$ compares the input analog signal $V_{IN}$ with the reference voltage $V_{52}$, outputs the signal indicating the result of that comparison at a high level when the level of the analog signal $V_{IN}$ is higher than the reference voltage $V_{52}$, while at a low level when the level of the analog signal $V_{IN}$ is lower than the reference voltage $V_{52}$, to the AND gate $AU_{17}$ from its positive output terminal, and outputs the signal obtained by inverting the level of the positive output to the other input terminal of the AND gate $AU_{16}$ from its negative output terminal.

The AND gate $AU_{15}$ obtains the logical product between the positive output of the upper data comparator $CU_{15}$ and the negative output of the upper data comparator $CU_{16}$ and outputs the result of the same to the upper data encoder $E_{U1}$.

The AND gate $AU_{16}$ obtains a logical product between the positive output of the upper data comparator $CU_{16}$ and the negative output of the upper data comparator $CU_{17}$ and outputs the result of the same to the upper data encoder $E_{U1}$.

The AND gate $AU_{17}$ obtains a logical product for the positive output of the upper data comparator $CU_{17}$ as a 2-input and outputs the result of the same to the upper data encoder $E_{U1}$.

The upper data encoder $E_{U1}$ encodes the output signals of the respective AND gates $AU_{15}$ to $AU_{17}$ in accordance with the output levels of the same, converts the same to a digital code of 2 bits, and outputs the result as the conversion codes $D_0$ and $D_1$ of the upper significant 2 bits.

Concretely, where the output levels of the AND gates $AU_{15}$ to $AU_{17}$ are all "0", the conversion codes $D_0$ and $D_1$ are set to [0,0] and output; where the output level of the AND gate $AU_{15}$ is "1", they are set to [0,1] and output; where the output level of the AND gate $AU_{16}$ is "1", they are set to [1,0] and output; and where the output level of the AND gate $AU_{17}$ is "1", they are set to [1,1] and output.

The switching blocks $S_{d1}$ to $S_{d2}$ are arranged in the form of a matrix comprising four rows and three columns and constituted by for example differential type amplifiers, which compare one reference voltage among the reference voltages $V_{41}$ to $V_{55}$ (note, $V_{44}$, $V_{48}$, and $V_{52}$ are excluded) divided by the reference resistance elements $R_{71}$ to $R_{86}$ with the input analog signal $V_{IN}$, and in accordance with the magnitude of the input analog signal $V_{IN}$ with respect to the reference voltage. Concretely, in the case of ($V_{IN}$>reference voltage V), they output $S_1$ to $S_{12}$ of "1", and in the case of (level $V_{IN} \leq$ reference voltage V), $S_1$ to $S_{12}$ of the "0" level to the corresponding even/odd determination circuits $EOD_1$ to $EOD_3$ arranged in accordance with the columns.

Explaining this in further detail, the switching blocks $S_{d1}$, $S_{d6}$, $S_{d7}$, and $S_{d12}$ arranged in the first column (left side in the figure) compare the reference voltages $V_{41}$, $V_{47}$, $V_{49}$, and $V_{55}$ with the analog signal $V_{IN}$, respectively, and output the results of this as the signals $S_{91}$, $S_{96}$, $S_{97}$, and $S_{102}$ to the even/odd determination circuit $EOD_1$.

The switching blocks $S_{d2}$, $S_{d5}$, $S_{d8}$, and $S_{d11}$ arranged in the second column compare the reference voltages $V_{42}$, $V_{46}$, $V_{50}$, and $V_{54}$ with the analog signal $V_{IN}$, respectively, and output the results of this as the signals $S_{92}$, $S_{95}$, $S_{98}$, and $S_{101}$ to the even/odd determination circuit $EOD_2$.

The switching blocks $S_{d3}$, $S_{d4}$, $S_{d9}$ and $S_{d10}$ arranged in the third column compare the reference voltages $V_{43}$, $V_{45}$, $V_{51}$, and $V_{53}$ with the analog signal $V_{IN}$, respectively, and output the results of this as the signals $S_{93}$, $S_{94}$, $S_{99}$, and $S_{100}$ to the even/odd determination circuit $EOD_3$.

The even/odd determination circuit $EOD_1$ determines whether or not there are an even number of the signals $S_{91}$, $S_{96}$, $S_{97}$, and $S_{102}$ which are output from the switching blocks $S_{d1}$, $S_{d6}$, $S_{d7}$, and $S_{d12}$ and simultaneously input which have an input level of "1". It outputs the signal $S_{EO1}$ to the buffer $B_{D1}$ with the "0" level where it determines that the number is even, while with the "1" level where it determines that the number is not even, that is, an odd number.

The even/odd determination circuit $EOD_2$ determines whether or not there are even number of signals $S_{92}$, $S_{95}$, $S_{98}$, and $S_{101}$ which are output from the switching blocks $S_{d2}$, $S_{d5}$, $S_{d8}$, and $S_{d11}$ and simultaneously input which have an input level of "1". It outputs the signal $S_{EO2}$ to the buffer $B_{U2}$ with the "0" level where it determines that the number is even, while with the "1" level where it determines that the number is odd.

The even/odd determination circuit $EOD_3$ determines whether or not there are an even number of the signals $S_{93}$, $S_{94}$, $S_{99}$, and $S_{100}$ which are output from the switching blocks $S_{d3}$, $S_{d4}$, $S_{d9}$, and $S_{d10}$ and simultaneously input which have an input level of "1". It outputs the signal $S_{EO3}$ to the buffer $B_{D3}$ with the "0" level where it determines that the number is even, while with the "1" level where it determines that the number is odd.

Figure 14C:
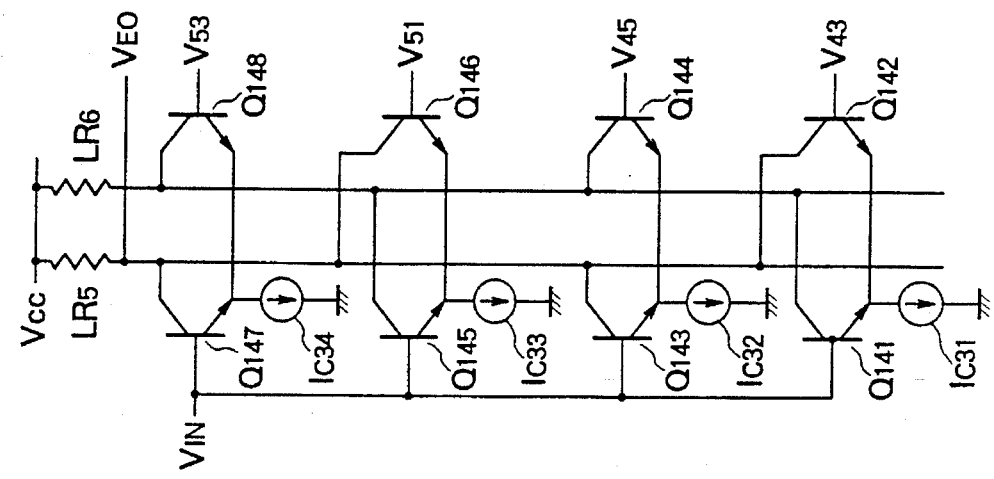
FIG. 14A to FIG. 14C are structural views of the circuit of the switching block of the A/D converter shown in FIG. 13.
Figure 14B:
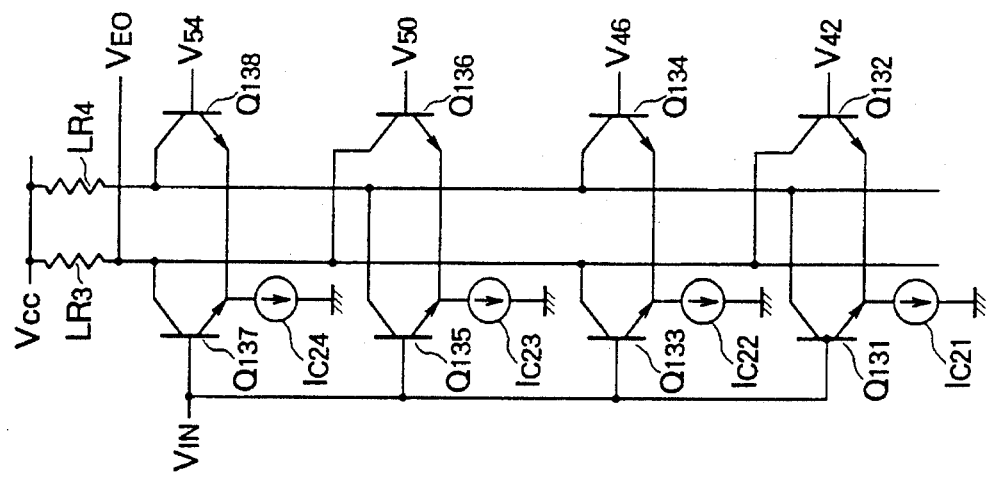
Figure 14A:
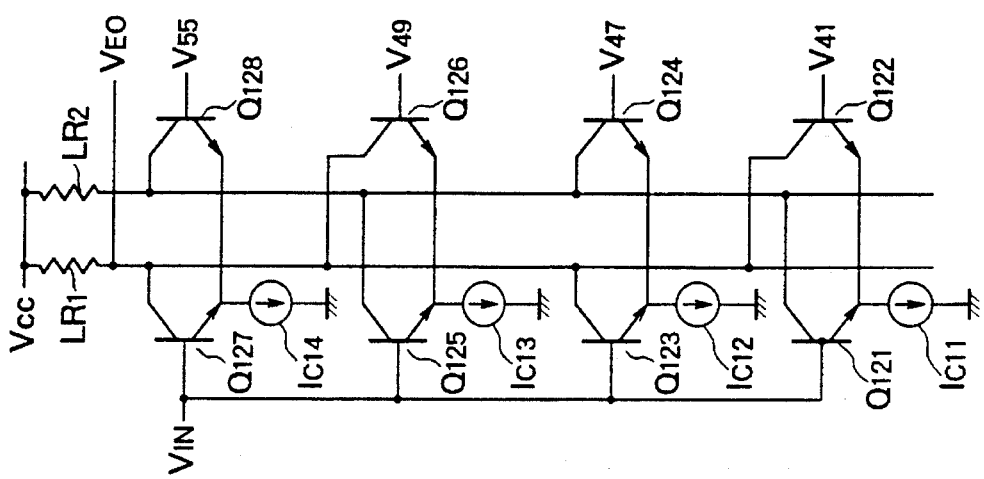

FIG. 14 is a view showing an example of the circuit structure of the switching block and even/odd determination circuit for each column, in which FIG. 14A shows an example of the circuit structure of the switching blocks $S_{d1}$, $S_{d6}$, $S_{d7}$, and $S_{d12}$ and the even/odd determining circuit $EOD_1$ at the first column; FIG. 14B shows an example of the circuit structure of the switching blocks $S_{d2}$, $S_{d5}$, $S_{d8}$, and $S_{d11}$ and the even/odd determining circuit $EOD_2$ at the second column; and FIG. 14C shows an example of the circuit structure of the switching blocks $S_{d3}$, $S_{d4}$, $S_{d9}$, and $S_{d10}$ and the even/odd determining circuit $EOD_3$ at the third column; respectively.

These circuits have the same fundamental structure and function in each column except the input reference voltage differs, and therefore an explanation will be made here of the structure of the example of FIG. 14A.

In FIG. 14A, $V_{CC}$ denotes a power source voltage; $LR_1$ and $LR_2$ denote load resistance elements of the resistance value R; $Q_{121}$ to $Q_{128}$ denote npn-type transistors; and $I_{C11}$ to $I_{C14}$ denote constant current sources supplying the current I; respectively.

The constant current source $I_{C11}$ is connected to the emitter of the transistor $Q_{121}$ and the emitter of the transistor $Q_{122}$, so that the switching block $S_{d1}$ comprising a differential amplifier is constituted; the constant current source $I_{C12}$ is connected to the emitter of the transistor $Q_{123}$ and the emitter of the transistor $Q_{124}$, so that the switching block $S_{d6}$ comprising a differential amplifier is constituted; a constant current source $I_{C13}$ is connected to the emitter of the transistor $Q_{125}$ and the emitter of the transistor $Q_{126}$, so that the switching block $S_{d7}$ comprising a differential amplifier is constituted; and the constant current source $I_{C14}$ is connected to the emitter of the transistor $Q_{127}$ and the emitter of the transistor $Q_{128}$, so that the switching block $S_{d12}$ comprising a differential amplifier is constituted.

Then, the system is constituted so that an analog signal $V_{IN}$ is input to the respective bases of the transistors $Q_{121}$, $Q_{123}$, $Q_{125}$, and $Q_{127}$; the reference voltage $V_{41}$ is input to the base of the transistor $Q_{122}$; the reference voltage $V_{47}$ is input to the base of the transistor $Q_{124}$; the reference voltage $V_{49}$ is input to the base of the transistor $Q_{126}$; and the reference voltage $V_{55}$ is input to the base of the transistor $Q_{128}$; respectively.

The even/odd determining circuit $EOD_1$ is constituted by the combination of connection of the respective collectors of the respective transistors $Q_{121}$ to $Q_{128}$ with respect to the load resistance elements $LR_1$ and $LR_2$.

Namely, the collectors of the transistors $Q_{121}$, $Q_{124}$, $Q_{125}$, and $Q_{128}$ are connected to the power source voltage $V_{CC}$ via the load resistance element $LR_2$; the collectors of the transistors $Q_{122}$, $Q_{123}$, $Q_{126}$, and $Q_{127}$ are connected to the power source voltage $V_{CC}$ via the load resistance element $LR_1$; and the output terminal of the signal $S_{EO1}$ is constituted by the connection point between the collector of the transistor $Q_{127}$ and the load resistance element $LR_1$.

Explaining an example of the fundamental operation of the structure of FIG. 14A, for example in the case where $V_{IN}<V_{41}$, the reference voltages $V_{41}$, $V_{47}$, $V_{49}$, and $V_{55}$ are larger than the input analog signal $V_{IN}$ in all of the switching blocks $S_{d1}$, $S_{d6}$, $S_{d7}$, and $S_{d12}$, and therefore the transistors $Q_{122}$, $Q_{124}$, $Q_{126}$, and $Q_{128}$ become ON. As a result, a current such as 2I flows through the load resistance elements $LR_1$ and $LR_2$, respectively.

Accordingly, the level of the output signal $S_{EO1}$ becomes $(V_{CC}-2I\cdot R)$.

Also, in the case where $V_{41}<V_{IN}<V_{47}$, the transistors $Q_{121}$, $Q_{124}$, $Q_{126}$, and $Q_{128}$ become ON. As a result, a current such as I flows through the load resistance element $LR_1$, and a current such as 3I flows through the load resistance element $LR_2$.

Accordingly, the level of the output signal $S_{EO1}$ becomes $(V_{CC}-I\cdot R)$.

Namely, when the differential pair (switching block) of (analog signal $V_{IN}$>reference voltage V) is even, the level of the output signal $S_{EO1}$ becomes $(V_{CC}-2I\cdot R)$ at the low level, while becomes $(V_{CC}-I\cdot R)$ at the high level when it is the odd number.

The complementary output buffer $B_{D1}$ is connected to the output terminal of the even/odd determining circuit $EOD_1$ at its input terminal and is connected to one input terminal of the AND gate $AD_{51}$ at its positive output terminal.

This buffer $B_{D1}$ performs the predetermined level adjustment of the even/odd determining circuit $EOD_1$ with respect to the output signal $S_{EO1}$ and outputs the result to one input terminal of the AND gate $AD_{51}$ from its positive output terminal.

The complementary output buffer $B_{D2}$ is connected to the output terminal of the even/odd determining circuit $EOD_2$ at its input terminal, connected to one input terminal of the AND gate $AD_{52}$ at its positive output terminal, and connected to the other input terminal of the AND gate $AD_{51}$ at its negative output terminal.

This buffer $B_{D2}$ performs the predetermined level adjustment of the even/odd determining circuit $EOD_2$ with respect to the output signal $S_{EO2}$ and outputs the result to one input terminal of the AND gate $AD_{52}$ from its positive output terminal; while outputs the inverted input level to the other input terminal of the AND gate $AD_{51}$ from its negative output terminal.

The complementary output buffer $B_{D3}$ is connected to the output terminal of the even/odd determining circuit $EOD_3$ at its input terminal, connected to the two input terminals of the AND gate $AD_{53}$ at its positive output terminal, and connected to the other input terminal of the AND gate $AD_{52}$ at its negative output terminal.

This buffer $B_{D3}$ performs the predetermined level adjustment of the even/odd determining circuit $EOD_3$ with respect to the output signal $S_{EO3}$ and outputs the result to the two input terminals of the AND gate $AD_{53}$ from its positive output terminal; while outputs the inverted input level to the other input terminal of the AND gate $AD_{52}$ from its negative output terminal.

The AND gate $AD_{51}$ obtains the logical product between the positive output of the buffer $BD_1$ and the negative output of the buffer $BD_{45}$ and outputs the result thereof to the lower data encoder $E_{D1}$.

The AND gate $AD_{52}$ obtains the logical product between the positive output of the buffer $BD_{45}$ and the negative output of the buffer $BD_{46}$ and outputs the result thereof to the lower data encoder $E_{D1}$.

The AND gate $AD_{53}$ obtains the logical product between two inputs of the positive output of the buffer $BD_{46}$ and outputs the result thereof to the lower data encoder $E_{D1}$.

The lower data encoder $E_{D1}$ encodes the output signals of the respective AND gates $AD_{51}$ to $AD_{53}$ in accordance with the output levels of the same, converts the same to the 2 bits of a digital code, and outputs the same as preceding output codes $BD_{45}$ and $BD_{46}$ of the conversion codes $D_2$ and $D_3$ of the lower significant 2 bits to the inverted gate $RV_1$.

Concretely, it sets the preceding output codes $BD_{45}$ and $BD_{46}$ to [0,0] and outputs the same where the output levels of the AND gates $AD_{51}$ to $AD_{53}$ are all "0"; sets the same to [0,1] where the output level of the AND gate $AD_{51}$ is "1" and outputs the result; sets the same to [1,0] where the output level of the AND gate $AD_{52}$ is "1" and outputs the result; and sets the same to [1,1] where the output level of the AND gate $AD_{53}$ is "1" and outputs the result.

The inverted gate $RV_1$ is constituted by for example parallel-arranged exclusive-OR gates $EXO_1$ and $EXO_2$, obtains the exclusive-OR between the preceding output codes $BD_{45}$ and $BD_{46}$ output from the lower data encoder $E_{D1}$ and the output conversion code $D_1$ of the upper data encoder $E_{D1}$, and outputs the same as the conversion codes $D_2$ and $D_3$ of the lower significant 2 bits.

Concretely, it obtains the exclusive-OR between the preceding output code $BD_{45}$ and the upper data conversion code $D_1$ at the exclusive-OR gate $EXO_1$, outputs the result thereof as the lower data conversion code $D_2$, obtains the exclusive-OR between the preceding output code $BD_{46}$ and the upper data conversion code $D_1$ at the exclusive-OR gate $EXO_2$, and outputs the result thereof as the lower data conversion code $D_3$.

Next, an explanation will be made of the operation by the above-described structure in sequence dividing the same into the upper data conversion and the lower data conversion and referring to FIG. 15 and FIG. 16.

Note that, FIG. 15 shows the correspondence between the output levels of the upper data comparators $CU_{15}$ to $CU_{17}$, output levels of the AND gates $AU_{15}$ to $AU_{17}$, and the output levels of the conversion codes $D_0$ and $D_1$ in accordance with the magnitude of the input voltage (analog signal) level at the time of upper data conversion with respect to the reference voltages $V_4$ to $V_{12}$.

Also, FIG. 16 shows the correspondence between the levels of the output signals $S_{91}$ to $S_{102}$ of the switching blocks $S_{d1}$ to $S_{d2}$, the levels of the output signals $S_{EO1}$ to $S_{EO3}$ of the even/odd determining circuit $EOD_1$ to $EOD_3$, the output levels of the AND gates $AD_{51}$ to $AD_{53}$, and the output levels of the conversion codes $D_2$ and $D_3$, in accordance with the magnitude of the input voltage (analog signal) level at the time of lower data conversion with respect to the reference voltages $V_1$ to $V_4$.

First, the upper data conversion operation will be explained using FIG. 15.

The reference voltages $V_4$, $V_8$, and $V_{12}$ of the rough quantization level divided by the reference resistance elements $R_{71}$ to $R_{86}$ and the input analog signal $V_{IN}$ are compared by the upper data comparators $CU_{15}$ to $CU_{17}$, respectively.

As a result of this comparison, if for example $V_{IN} < V_{44}$, as shown in FIG. 15, the outputs of the upper data comparators $CU_{15}$, $CU_{16}$, and $CU_{17}$ become all the "0" level.

By this, also the output levels of the AND gates $AU_{15}$ to $AU_{17}$ become all "0".

As a result, [00] is output as the upper significant 2 bits of the conversion codes $D_0$ and $D_1$ from the upper data encoder $E_{U1}$.

As a result of comparison, if for example $V_{44} < V_{IN} < V_{48}$, the output of the upper data comparator $CU_{15}$ becomes the "1" level, and the outputs of the upper data comparators $CU_{16}$ and $CU_{17}$ become the "0" level.

By this, among the output levels of the AND gates $AU_{15}$ to $AU_{17}$, only the output of the AND gate $AU_{15}$ becomes "1", and the outputs of the other AND gates $AU_{16}$ and $AU_{17}$ become "0".

As a result, [01] is output as the upper significant 2 bits of the conversion codes $D_0$ and $D_1$ from the upper data encoder $E_{U1}$.

As a result of comparison, if for example $V_{48} < V_{IN} < V_{52}$, the outputs of the upper data comparators $CU_{15}$ and $CU_{16}$ become the "1" level, and the output of the upper data comparator $CU_{17}$ becomes the "0" level.

By this, among the output levels of the AND gates $AU_{15}$ to $AU_{17}$, only the output of the AND gate $AU_{15}$ becomes "1", and the outputs of the other AND gates $AU_{15}$ and $AU_{17}$ become "0".

As a result, [10] is output as the upper significant 2 bits of the conversion codes $D_0$ and $D_1$ from the upper data encoder $E_{U1}$.

Further, as a result of comparison, if for example $V_{52} < V_{IN}$, the outputs of the upper data comparators $CU_{15}$, $CU_{16}$ and $CU_{17}$ become all the "1" level.

By this, among the output levels of the AND gates $AU_{15}$ to $AU_{17}$, only the output of the AND gate $AU_{17}$ becomes "1", and the outputs of the other AND gates $AU_{15}$ and $AU_{16}$ become "0".

As a result, [11] is output as the upper significant 2 bits of conversion codes $D_O$ and $D_1$ from the upper data encoder $E_{U1}$.

Next, an explanation will be made of the lower data conversion operation using FIG. 16.

At the time of the conversion operation, all switching blocks $S_{d1}$ to $S_{d2}$ are in the ON state, the input analog signal $V_{IN}$ is compared with the corresponding reference voltages $V_{41}$ to $V_{43}$, $V_{45}$ to $V_{47}$, $V_{49}$ to $V_{51}$ and $V_{53}$ to $V_{55}$ of the fine quantization level divided by the reference resistance elements $R_{71}$ to $R_{86}$ in the respective switching blocks $S_{d1}$ to $S_{d2}$, respectively.

In the respective switching blocks $S_{d1}$ to $S_{d12}$, as a result of comparison, if $V_{IN} >$ reference voltage V, the output signals $S_{91}$ to $S_{102}$ are output as the "1" level, while if $V_{IN} \leq$ reference voltage V, the output signals $V_{91}$ to $S_{102}$ are output as the "0" level.

Accordingly, if for example $V_{IN} < V_{41}$, the signals $S_{91}$ to $S_{102}$ of the "0" level are output from all switching blocks $S_{d1}$ to $S_{d2}$. Namely, the number of signals of the "1" level of each column is zero.

Accordingly, the signals $S_{EO1}$ to $S_{EO3}$ are output as the "0" level from all even/odd determining circuits $EOD_1$ to $EOD_3$, and also the output levels of the lower data side AND gates $AD_{51}$ to $AD_{53}$ become all "0".

As a result, [00] is output as the preceding output codes $BD_{42}$ and $BD_{43}$ of the lower significant 2 bits from the lower data encoder. At this time, since also the conversion code $D_1$ by the upper data encoder $E_{U1}$ is [0], the preceding output codes $BD_{42}$ and $BD_{43}$ are not subjected to the inversion function at the inverted gate $RV_1$ and are output as the lower data conversion codes $D_2$ and $D_3$ while holding their level [00] as they are.

Also, if $V_1 < V_{IN} < V_2$, only the output signal $S_1$ of the switching block $S_{d1}$ is output as the "1" level, and the output signals $S_{92}$ to $S_{102}$ of the remaining switching blocks $S_{d2}$ to $S_{d12}$ are output as the "0" level. Namely, the number of signals of the "1" level in the left first column is (1), and the number of the signals of the "1" level in the second and third columns is zero.

Accordingly, the signal $S_{EO1}$ is output as the "1" level from the even/odd determining circuit $EOD_1$, and the signals $S_{EO2}$ and $S_{EO3}$ are output as the "0" level from the even/odd determining circuits $EOD_2$ and $EOD_3$.

By this, among the output levels of the AND gates $AD_{51}$ to $AD_{53}$, only the output of the AND gate $AD_{51}$ becomes "1", and the outputs of the other AND gates $AD_{52}$ and $AD_{53}$ become "0".

As a result, [01] is output as the preceding output codes $BD_{42}$ and $BD_{43}$ of the lower significant 2 bits from the lower data encoder $E_{D1}$. At this time, since also the conversion code $D_1$ by the upper data encoder $E_{U1}$ is [0], the preceding output codes $BD_{42}$ and $BD_{43}$ are not subjected to the inversion function at the inverted gate $RV_{41}$ and are output as the lower data conversion codes $D_2$ and $D_3$ while holding their level [01] as they are.

Also, if $V_{42} < V_{IN} < V_{43}$, only the output signals $S_{91}$ and $S_{92}$ of the switching blocks $S_{d1}$ and $S_{d2}$ are output as the "1" level, and the output signals $S_{93}$ to $S_{102}$ of the remaining switching blocks $S_{d3}$ to $S_{d12}$ are output as the "0" level. Namely, the number of signals of the "1" level in the first column and second column is one, and the number of the signals of the "1" level in the third column is zero.

Accordingly, the signals $S_{EO1}$ and $S_{EO2}$ are output as the "1" level from the even/odd determining circuits $EOD_1$ and $EOD_2$, and the signal $S_{EO3}$ is output as the "0" level from the even/odd determining circuit $EOD_3$.

By this, among the output levels of the AND gates $AD_{51}$ to $AD_{53}$, only the output of the AND gate $AD_{52}$ becomes "1", and the outputs of the other AND gates $AU_{15}$ and $AU_{17}$ become "0".

As a result, [10] is output as the preceding output codes $BD_{42}$ and $BD_{43}$ of the lower significant 2 bits from the lower data encoder $E_{D1}$. At this time, since also the conversion code $D_1$ by the upper data encoder $E_{U1}$ is [0], the preceding output codes $BD_{42}$ and $BD_{43}$ are not subjected to the inversion function at the inverted gate $RV_1$ and are output as the lower data conversion codes $D_2$ and $D_3$ while holding their level [20] as they are.

Further, if $V_{43} < V_{IN} < V_{44}$, only the output signals $S_{91}$, $S_{92}$, and $S_{93}$ of the switching blocks $S_{d1}$, $S_{d2}$, and $S_{d3}$ are output as the "1" level, and the output signals $S_{94}$ to $S_{102}$ of the remaining switching blocks $S_{d4}$ to $S_{d12}$ are output as the "0" level. Namely, the number of signals of the "1" level of all columns of the first column, second column, and third column is one.

Accordingly, the signals $S_{EO1}$ to $S_{EO3}$ are output as the "1" level from the even/odd determining circuits $EOD_1$ to $EOD_3$.

By this, among the output levels of the AND gates $AD_{51}$ to $AD_{53}$, only the output of the AND gate $AD_{53}$ becomes "1", and the outputs of the other AND gates $AU_{15}$ and $AU_{16}$ become "0".

As a result, [11] is output as the preceding output codes $BD_{42}$ and $BD_{43}$ of the lower significant 2 bits from the lower data encoder $E_{D1}$. At this time, since also the conversion code $D_1$ by the upper data encoder $E_{U1}$ is [0], the preceding output codes $BD_{42}$ and $BD_{43}$ are not subject to the inversion function at the inverted gate $RV_1$ and are output as the lower data conversion codes $D_2$ and $D_3$ while holding their level [11] as they are.

In above way, the lower data conversion code is obtained. In the case where the reference voltage $V_4 < V_{IN}$ as well, the conversion operation of lower significant data is similarly carried out.

Note, in the case where $V_{44} < V_{IN} < V_{48}$ and $V_{52} < V_{IN}$, due to the restrictions of the circuit structure etc., the direction of application of the reference voltage from the second row to the fourth row of the switching block array from the bottom in FIG. 13 has become reverse to that at the first row and the third row, and therefore the levels of the preceding output codes $BD_{45}$ and $B_{46}$ are inverted, and thus the level is returned to the normal level at the inverted gate $RV_1$ and output as the lower data conversion codes $D_2$ and $D_3$.

As explained above, according to the present embodiment, by simultaneously actuating all of the switching blocks $S_{d1}$ to $S_{d12}$ of the serial/parallel type A/D converter circuit, arranged in the form of matrix, to made the same perform a comparison between the respective reference voltages $V_{41}$ to $V_{55}$ (note, $V_{44}$, $V_{48}$, and $V_{52}$ are excluded) and the input analog signal $V_{IN}$, it is determined for each column whether the number of the switching blocks for which the result of comparison that the analog signal $V_{IN}$ is larger than the reference voltage is output is even or odd, and the conversion of lower data is carried out in accordance with the result of determination. Therefore, the conversions of data of the upper significant and lower significant data can be simultaneously carried out.

Accordingly, it becomes unnecessary to provide the sampling and holding circuit as in the conventional serial/parallel type A/D converter circuit, and also cumbersome circuit control is not required.

Also, the circuit can be constituted by a greatly reduced number of comparators in comparison with the parallel type A/D converter circuit requiring $(2^n-1)$ comparators so as to obtain the n bits of conversion code, and therefore a reduction of the surface area of the chip and the power consumption can be achieved.

An explanation will now be made of a fifth embodiment of the present invention.

Figure 17:
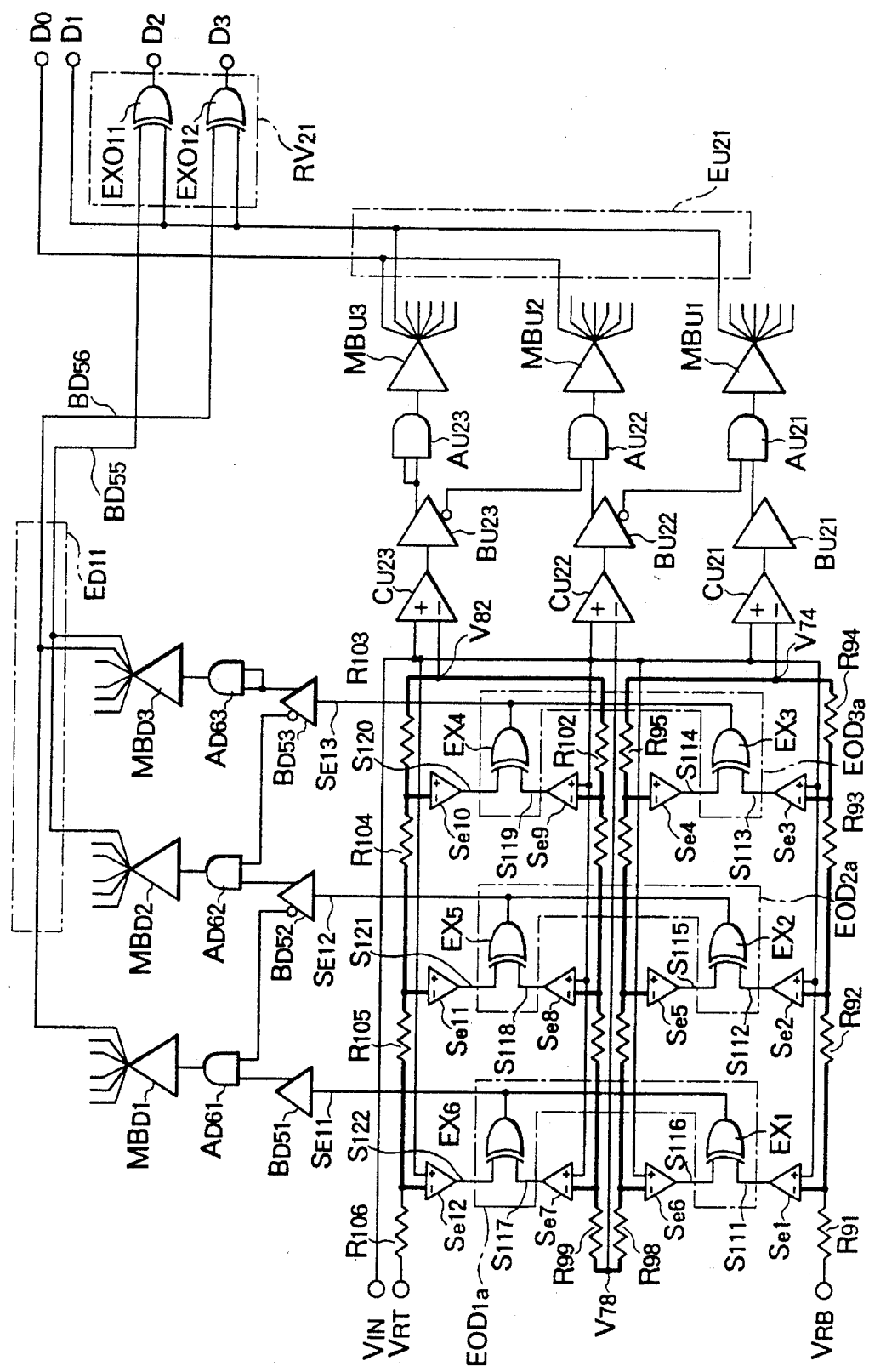
FIG. 17 is a block diagram of a serial/parallel A/D converter of a fifth embodiment of the present invention.

FIG. 17 is a structural view showing a fifth embodiment of the A/D converter circuit according to the present invention.

The essential point of difference of the present embodiment from the above-described embodiments resides in the constitution in which a plurality of sets of block comprising two adjoining switching blocks in the same column treated as one set are provided instead of performing the even/odd determination based on the combination of connection of the collector outputs of the transistor differential pairs constituting the respective switching blocks of the same column, the exclusive-OR of the two switching blocks of respective sets are obtained, respectively, and the results are subjected to so-called a wired-OR, whereby the even/odd determination is carried out.

In FIG. 17, $EX_1$ to $EX_6$ indicate the exclusive-OR gate constituting the even/odd determining circuit $EOD_{1a}$ to $EOD_{3a}$. These are connected as follows.

Namely, one input terminal of the exclusive-OR gate $EX_1$ is connected to the output terminal of the switching block $S_{e1}$, and the other input terminal is connected to the output terminal of the switching block $S_{e6}$; one input terminal of the exclusive-OR gate $EX_6$ is connected to the output terminal of the switching block $S_{e7}$, and the other input terminal is connected to the output terminal of the switching block $S_{e12}$; and the output terminals of the exclusive-OR gates $EX_1$ and $EX_6$ are connected to each other, whereby the even/odd determining circuit $EOD_{1a}$ at the first column is constituted.

This even/odd determining circuit $EOD_{1a}$ performs the wired-OR (logical OR) of the result of the exclusive-OR of the two gates at the middle point of connection between the output terminals of the exclusive-OR gates $EX_1$ and $EX_6$ and outputs the result thereof as the signal $S_{EO1}$ indicating the result of even/odd determination at the first column to the buffer $BD_{21}$.

Also, one input terminal of the exclusive-OR gate $EX_2$ is connected to the output terminal of the switching block $S_{e2}$, and the other input terminal is connected to the output terminal of the switching block $S_{e5}$; one input terminal of the exclusive-OR gate $EX_5$ is connected to the output terminal of the switching block $S_{e8}$, and the other input terminal is connected to the output terminal of the switching block $S_{e11}$; and the output terminals of the exclusive-OR gates $EX_2$ and $EX_5$ are connected to each other, whereby the even/odd determining circuit $EOD_{2a}$ at the second column is constituted.

This even/odd determining circuit $EOD_{2a}$ performs the wired-OR (logical OR) of the result of the exclusive-OR of the two gates at the middle point of connection between the output terminals of the exclusive-OR gates $EX_2$ and $EX_5$ and outputs the result thereof as the signal $S_{EO2}$ indicating the result of even/odd determination at the second column to the buffer $B_{D2}$.

Further, one input terminal of the exclusive-OR gate $EX_3$ is connected to the output terminal of the switching block $S_{B3}$, and the other input terminal is connected to the output terminal of the switching block $S_{e4}$; one input terminal of the exclusive-OR gate $EX_4$ is connected to the output terminal of the switching block $S_{e9}$, and the other input terminal is connected to the output terminal of the switching block $S_{e10}$; and the output terminals of the exclusive-OR gates $EX_3$ and $EX_4$ are connected to each other, whereby the even/odd determining circuit $EOD_{3a}$ at the third column is constituted.

This even/odd determining circuit $EOD_{3a}$ performs the wired-OR (logical OR) of the result of the exclusive-OR of the two gates at the middle point of connection between the output terminals of the exclusive-OR gates $EX_3$ and $EX_4$ and outputs the result thereof as the signal $S_{EO3}$ indicating the result of even/odd determination at the third column to the buffer $BD_{23}$.

Note that, in the structure of FIG. 17, the upper data comparators $CU_{21}$ to $CU_{23}$ are constituted not by complementary outputs, but by the usual single outputs, and are constituted so that the complementary output buffers $BU_{21}$ to $BU_{23}$ are provided on the input side of the next stage to this, that is on the input side of the AND gates $AU_{21}$ to $AU_{23}$, and further multiple output pin buffers $MB_{U1}$ to $MB_{U3}$ are provided between the outputs of the AND gates $AU_{21}$ to $AU_{23}$ and the inputs of the upper data encoders $E_{U1}$, but the upper data conversion function is the same as that of the case of the first embodiment mentioned above.

Similarly, the circuit has a structure wherein multiple output pin buffers $MB_{D1}$ to $MB_{D3}$ are provided between the outputs of the AND gates $AD_{61}$ to $AD_{63}$ and the inputs of the lower data encoders $E_{D1}$, but the lower significant data conversion function is the same as that of the case of the embodiment mentioned above.

Figure 18:
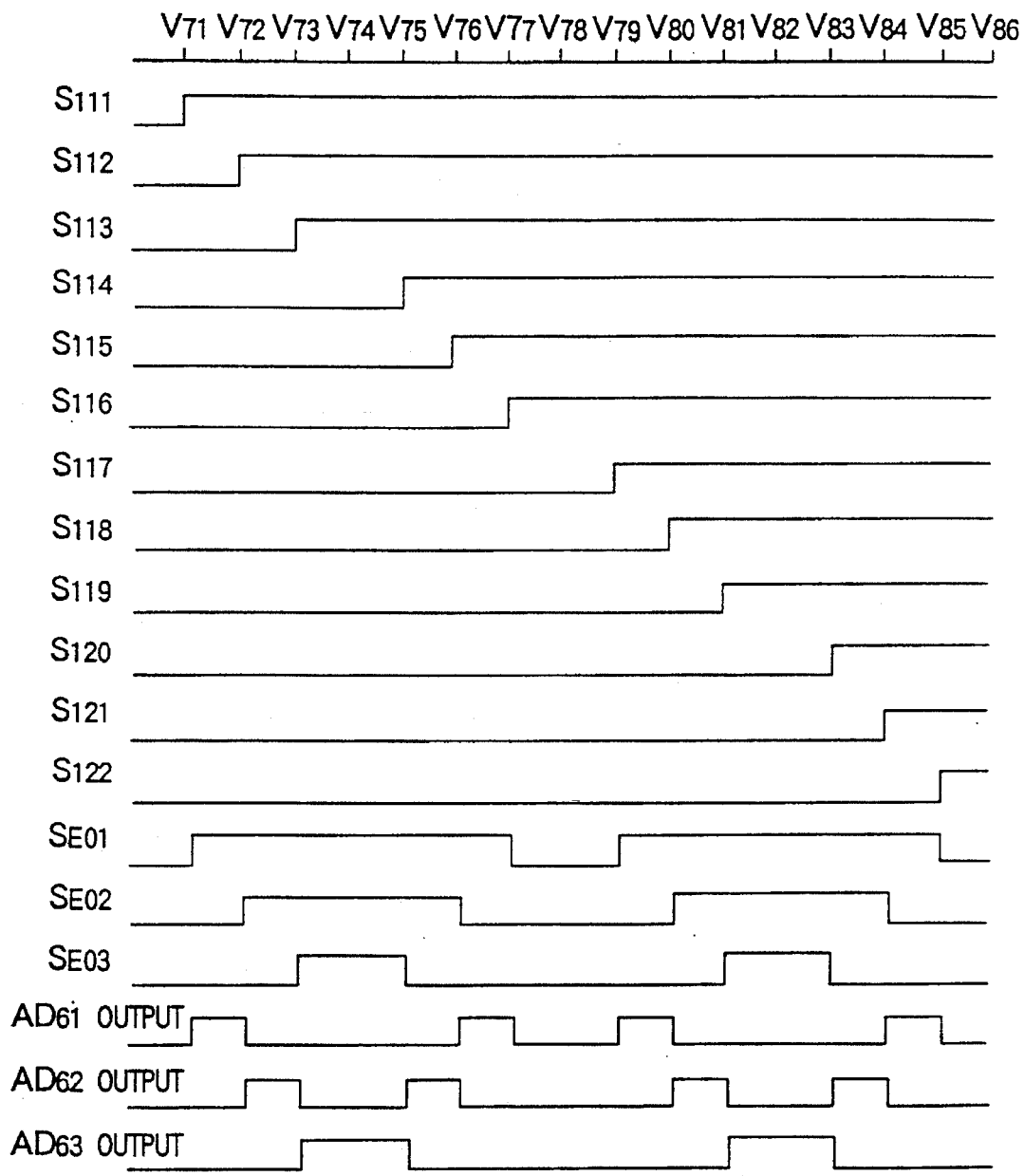
FIG. 18 shows the operation of the A/D converter shown in FIG. 17.

Next, the operation by the structure of FIG. 17 will be explained using the timing chart of FIG. 18. Note that, the upper significant data conversion operation is essentially the same as that in the embodiment and therefore an explanation will be omitted.

In the same way as the case of the above-mentioned fourth embodiment, all switching blocks $S_{e1}$ to $S_{e12}$ are in the ON state at the time of the conversion operation, the input analog signal $V_{IN}$ is compared with the corresponding reference voltages $V_{71}$ to $V_{73}$, $V_{75}$ to $V_{77}$, $V_{79}$ to $V_{81}$, and $V_{83}$ to $V_{85}$ of the fine quantization level divided by the reference resistance elements $R_{91}$ to $R_{106}$ at the respective switching blocks $S_{e1}$ to $S_{e12}$, respectively.

In the respective switching blocks $S_{e1}$ to $S_{e12}$, as the result of comparison, the output signals $S_{111}$ to $S_{122}$ are output as the "1" level if $V_{IN}$>reference voltage V, while the output signals $S_{71}$ to $S_{82}$ are output as the "0" level if $V_{IN}$≦reference voltage V.

Accordingly, if for example $V_{IN}<V_{71}$, the signals $S_{111}$ to $S_{122}$ of the "0" level are output from all switching blocks $S_{e1}$ to $S_{e12}$.

For this reason, the signal levels input to both input terminals of all of the exclusive-OR gates $EX_1$ to $EX_6$ are "0".

Accordingly, since the output levels of all of the exclusive-OR gates $EX_1$ to $EX_6$ become "0", signals $S_{EO1}$ to $S_{EO3}$ are output from all of the even/odd determining circuits $EOD_{1a}$ to $EOD_{3a}$ as the "0" level, and also the output levels of the lower data side AND gates $AD_{61}$ to $AD_{63}$ become all "0".

As a result, [00] is output as the preceding output codes $BD_{55}$ and $BD_{56}$ of the lower significant 2 bits, from the lower data encoder $E_{D1}$, and at this time, also the conversion code $D_1$ by the upper data encoder $E_{U1}$ is [0], and therefore the preceding output codes $BD_{55}$ and $BD_{56}$ are not subjected to the inversion function at the inverted gate $RV_1$ and are output as the lower significant data conversion codes $D_2$ and $D_3$ while maintaining their levels [00] as they are.

If $V_{71}<V_{IN}<V_{72}$, only the output signal $S_{111}$ of the switching block $S_{e1}$ is output as the "1" level, and the output signals $S_{112}$ to $S_{122}$ of the remaining switching blocks $S_{e1}$ to $S_{e12}$ are output as the "0" level.

For this reason, only the output level of the exclusive-OR gate $EX_1$ at the first column from the left becomes "1", and the output levels of the other exclusive-OR gates $EX_2$ to $EX_6$ become "0".

Accordingly, the signal $S_{EO1}$ is output as the "1" level from the even/odd determining circuit $EOD_1$, and signals $S_{EO2}$ and $S_{EO3}$ are output as the "0" level from the even/odd determining circuits $EOD_2$ and $EOD_3$.

By this, in the output levels of the AND gates $AD_{61}$ to $AD_{63}$, only the output of the AND gate $AD_{61}$ becomes "1", and the outputs of the other AND gates $AD_{62}$ and $AD_{63}$ become "0".

As a result, [01] is output as the preceding output codes $BD_{55}$ and $BD_{56}$ of the lower significant 2 bits from the lower data encoder $E_{D1}$. At this time, also the conversion code $D_1$ by the upper data encoder $E_{U1}$ is [0], and therefore the preceding output codes $BD_{55}$ and $BD_{56}$ are not subjected to the inversion function at the inverted gate $RV_{21}$ and are output as the lower significant data conversion codes $D_2$ and $D_3$ while maintaining their levels [01] as they are.

If $V_{72}<V_{IN}<V_{73}$, only the output signals $S_{111}$ and $S_{112}$ of the switching blocks $S_{B1}$ and $S_{B2}$ are output as the "1" level, and the output signals $S_{113}$ to $S_{122}$ of the remaining switching blocks $S_{e3}$ to $S_{e12}$ are output as the "0" level.

For this reason, only the output levels of the exclusive-OR gates $EX_1$ and $EX_2$ become "1", and the output levels of the other exclusive-OR gates $EX_3$ to $EX_6$ become "0".

Accordingly, the signals $S_{EO1}$ and $S_{EO2}$ are output as the "1" level from the even/odd determining circuits $EOD_1$ and $EOD_2$, and the signal $S_{EO3}$ is output as the "0" level from the even/odd determining circuit $EOD_3$.

By this, among the output levels of the AND gates $AD_{61}$ to $AD_{63}$, only the output of the AND gate $AD_{62}$ becomes "1", and the outputs of the other AND gates $AU_{21}$ and $AU_{23}$ become "0".

As a result, [10] is output as the preceding output codes $BD_{55}$ and $BD_{56}$ of the lower significant 2 bits from the lower data encoder $E_{D1}$. At this time, also the conversion code $D_1$ by the upper data encoder $E_{U1}$ is [0], and therefore the preceding output codes $BD_{55}$ and $BD_{56}$ are not subject to the inversion function at the inverted gate $RV_1$ and are output as the lower significant data conversion codes $D_2$ and $D_3$ while maintaining their levels [10] as they are.

If $V_{73}<V_{IN}<V_{74}$, only the output signals $S_{111}$, $S_{112}$, and $S_{113}$ of the switching blocks $S_{e1}$, $S_{e2}$, and $S_{e3}$ are output as the "1" level, and the output signals $S_{24}$ to $S_{32}$ of the remaining switching blocks $S_{e4}$ to $S_{e12}$ are output as the "0" level.

For this reason, only the output levels of the exclusive-OR gates $EX_1$, $EX_2$, and $EX_3$ become "1", and the output levels of the other exclusive-OR gates $EX_4$ to $EX_6$ become "0".

Accordingly, the signals $S_{EO1}$ to $S_{EO3}$ are output as the "1" level from the even/odd determining circuits $EOD_1$ to $EOD_3$.

By this, among the output levels of the AND gates $AD_{61}$ to $AD_{63}$, only the output of the AND gate $AD_{63}$ becomes "1", and the outputs of the other AND gates $AU_{21}$ and $AU_{22}$ become "0".

As a result, [11] is output as the preceding output codes $BD_{55}$ and $BD_{56}$ of the lower significant 2 bits from the lower data encoder $E_{D1}$. At this time, also the conversion code $D_1$ by the upper data encoder $E_{U1}$ is [0], and therefore the preceding output codes $BD_{55}$ and $BD_{56}$ are not subjected to the inversion function at the inverted gate $RV_1$ and are output as the lower significant data conversion codes $D_2$ and $D_3$ while maintaining their levels [11] as they are.

Note that, the case where $V_{74}<V_{IN}<V_{75}$ is the same as the case where $V_{73}<V_{IN}<V_{74}$, but at this time, the conversion code $D_3$ by the upper data encoder $E_{U1}$ is [1], and therefore the preceding output codes $BD_{55}$ and $BD_{56}$ are subjected to the inversion function at the inverted gate $RV_1$ and output as the lower significant data conversion codes $D_2$ and $D_3$ with the level [00].

Further, if $V_{75}<V_{IN}<V_{76}$, only the output signals $S_{111}$ to $S_{114}$ of the switching blocks $S_{e1}$ to $S_{e4}$ are output as the "1" level, and the output signals $S_{25}$ to $S_{32}$ of the remaining switching blocks $S_{e5}$ to $S_{e12}$ are output as the "0" level.

For this reason, only the output levels of the exclusive-OR gates $EX_1$ and $EX_2$ become "1", and the output levels of the other exclusive-OR gates $EX_3$ to $EX_6$ become "0".

Accordingly, the signals $S_{EO1}$ and $S_{EO2}$ are output as the "1" level from the even/odd determining circuits $EOD_1$ and EOD$_2$, and the signal S$_{EO3}$ is output as the "0" level from the even/odd determining circuit EOD$_3$.

By this, in the output levels of the AND gates AD$_{61}$ to AD$_{63}$, only the output of the AND gate AD$_{62}$ becomes "1", and the outputs of the other AND gates AU$_{21}$ and AU$_{63}$ become "0".

As a result, [10] is output as the preceding output codes BD$_2$ and BD$_3$ of the lower significant 2 bits, from the lower data encoder E$_{D1}$. At this time, the conversion code D$_1$ by the upper data encoder E$_{U1}$ is [1], and therefore the preceding output codes BD$_{55}$ and BD$_{56}$ are subjected to the inversion function at the inverted gate RV$_1$ and output as the lower significant data conversion codes D$_2$ and D$_3$ with the level [01].

Further, if V$_{76}$<V$_{IN}$<V$_{77}$, the output signals S$_{111}$ to S$_{115}$ of the switching blocks S$_{e1}$ to S$_{e5}$ are output as the "1" level, and the output signals S$_{116}$ to S$_{122}$ of the remaining switching blocks S$_{e6}$ to S$_{e12}$ are output as the "0" level.

For this reason, only the output level of the exclusive-OR gate EX$_1$ becomes "1", and the output levels of the other exclusive-OR gates EX$_2$ to EX$_6$ become "0".

Accordingly, the signal S$_{EO1}$ is output as the "1" level from the even/odd determining circuit EOD$_1$, and the signals S$_{EO2}$ and S$_{EO3}$ are output as the "0" level from the even/odd determining circuits EOD$_2$ and EOD$_3$.

By this, in the output levels of the AND gates AD$_{61}$ to AD$_{63}$, only the output of the AND gate AD$_{61}$ becomes "1", and the outputs of the other AND gates AU$_{22}$ and AU$_{23}$ become "0".

As a result, [01] is output as the preceding output codes BD$_{55}$ and BD$_{56}$ of the lower significant 2 bits from the lower data encoder E$_{D1}$. At this time, the conversion code D$_1$ by the upper data encoder E$_{U1}$ is [1], and therefore the preceding output codes BD$_{55}$ and BD$_{56}$ are subjected to the inversion function at the inverted gate RV$_1$ and output as the lower significant data conversion codes D$_2$ and D$_3$ with the level [10].

If V$_{77}$<V$_{IN}$<V$_{78}$, the output signals S$_{111}$ to S$_{116}$ of the switching blocks S$_{e1}$ to S$_{e6}$ are output as the "1" level, and the output signals S$_{117}$ to S$_{122}$ of the remaining switching blocks S$_{e7}$ to S$_{e12}$ are output as the "0" level.

For this reason, all of the output levels of the exclusive-OR gates EX$_1$ to EX$_6$ become "0".

Accordingly, the signals S$_{EO1}$ to S$_{EO3}$ are output as the "0" level from all of the even/odd determining circuits EOD$_{1a}$ to EOD$_{3a}$.

By this, in the output levels of the AND gates AD$_{61}$ to AD$_{63}$, the output levels of all of the AND gates AU$_1$ to AU$_3$ become "0".

As a result, [00] is output as the preceding output codes BD$_{55}$ and BD$_{56}$ of the lower significant 2 bits from the lower data encoder E$_{D1}$. At this time, the conversion code D$_1$ by the upper data encoder E$_{U1}$ is [1], and therefore the preceding output codes BD$_{55}$ and BD$_{56}$ are subjected to the inversion function at the inverted gate RV$_1$ and output as the lower significant data conversion codes D$_2$ and D$_3$ with the level [11].

Thereafter, in the case where V$_{78}$<V$_{IN}$<V$_{82}$, the conversion code D$_1$ by the upper data encoder E$_{U1}$ becomes [0], the conversion operation is the same as that in the case where V$_{IN}$<V$_{74}$ mentioned above, and in the case where V$_{82}$<V$_{IN}$, the conversion code D$_3$ by the upper data encoder E$_{U1}$ becomes [1], and therefore the conversion operation becomes the same operation as that of the case where V$_{74}$<V$_{IN}$<V$_{78}$.

As explained above, in the fifth embodiment, similar effects to those obtained in the above-mentioned fourth embodiment can be obtained.

Note that, in the above-mentioned fourth embodiment and fifth embodiment, an explanation was made taking as an example a circuit structure corresponding to 4-bit conversion, but needless to say the present invention can be applied also to the case of a larger number of bit conversion, and similar effects to those mentioned above can be obtained.

As explained above, according to the present invention, there are advantages that the increase of the power consumption and surface area of chip can be prevented, it is not necessary to provide the sampling and holding circuit, and the complication of the circuit control etc. can be prevented.

An explanation will be made next of a sixth embodiment of the present invention.

Figure 19B:
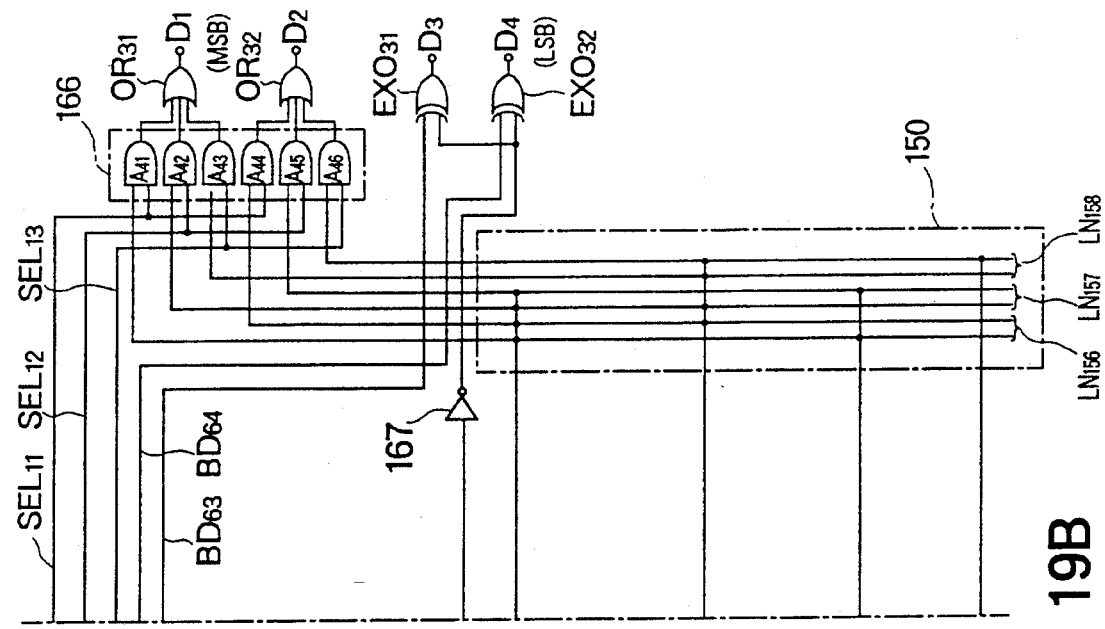

FIG. 19 is a circuit diagram showing the sixth embodiment of the A/D converter circuit according to the present invention.

Namely, 170 denotes a matrix circuit; 161 to 163 denote upper data comparators; 151 to 157 denote lower data comparators; 167 denotes an inverter; 150, an upper data encoder; 165, a lower data encoder; 166, a selection gate; OR$_{31}$ and OR$_{32}$ denote OR gates; and EXO$_{31}$ and EXO$_{32}$ denote exclusive-OR gates; respectively.

The upper data encoder 150 is constituted by an encoder line LN$_{156}$ generating the data for the redundant L (left) mode, an encoder line LN$_{157}$ generating the data for a non-redundant mode, and an encoder line LN$_{158}$ generating the data for the redundant R (right) mode.

Namely, in the upper data encoder 150, respective encoder lines LN$_{156}$ to LN$_{158}$ are set corresponding to a structure in which the columns of switching blocks shown with the hatching in the diagram, which detect the redundant bit among the switching blocks S$_{f11}$ to S$_{f17}$, S$_{f21}$ to S$_{f27}$, S$_{f31}$ to S$_{f37}$, and S$_{f41}$ to S$_{f47}$ arranged in the matrix circuit 170 are arranged so as to be positioned on both sides, i.e., the left side and right side, of the switching block columns outputting the conversion codes of the lower significant bits in FIG. 1.

FIG. 20 shows the correspondence between the outputs of the respective AND gates AU$_{31}$, AU$_{32}$, AU$_{33}$, and AU$_{34}$ of the upper data comparators 161 to 163, and the set output data code pattern of the respective encoder lines LN$_{156}$ to LN$_{157}$ of the upper data encoder 150.

The setting of the data is carried out so that, in accordance with the direction of transition of the reference voltage level by the respective reference resistance elements in the rows among the serially connected reference resistance element groups which are folded-back so that the number of rows becomes four, concretely an orientation (hereinafter referred to as a direction) of transition of the reference voltage from the low potential side to the high potential side, so that (data of redundant L mode)≦(data of non-redundant mode)<(data of redundant R mode) or (data of redundant L mode)≧(data of non-redundant mode)>(data of redundant R mode) stands.

In the structure of FIG. 19, the first row from the bottom comprising the resistance elements R$_{133}$ to R$_{136}$ and the third row comprising the resistance elements R$_{125}$ to R$_{128}$ have the same direction, and the second row comprising the resistance elements R$_{129}$ to R$_{133}$ and the fourth row comprising the resistance elements R$_{121}$ to R$_{124}$ have the same direction.

Accordingly, the data setting level in the case where the AND gates AU$_{34}$ and AU$_{32}$ corresponding to the first row and the third row are at the "1" level is set so that (data of redundant L mode)≦(data of non-redundant mode)<(data of redundant R mode) stands.

Contrary to this, the data setting level in the case where the AND gates AU$_{33}$ and AU$_{31}$ corresponding to the second row and the fourth row are at the "1" level is set so that (data of redundant L mode)≧(data of non-redundant mode)>(data of redundant R mode) stands.

The lower data encoder 165 is constituted by a data line $LN_{151}$ generating the lower significant data $BD_{63}$ and $BD_{64}$; a selection line $LN_{152}$ generating the selection signal $SEL_1$ indicating that either of the outputs of the AND gates $AD_{71}$ and $AD_{72}$ of the lower data comparators 151 and 152 becomes "1"; a selection line $LN_{153}$ generating the selection signal $SEL_2$ indicating that either of the outputs of the AND gates $AD_{73}$ to $AD_{76}$ of the lower data comparators 153 to 156 becomes "1"; and a selection line $LN_{153}$ generating the selection signal $SEL_{13}$ indicating that either of the outputs of the AND gates $AD_{77}$ and $AD_{78}$ of the lower data comparator 157 becomes "1".

FIG. 21 shows the correspondence between the outputs of the AND gates $AD_{71}$ to $AD_{78}$ of the lower data comparators 151 to 157, output data of the lower data encoder 165, and the selection signal.

The selection gate 166 is constituted by AND gates $A_{41}$ to $A_{46}$, selects one upper significant data from among the respective upper significant data of the redundant L mode, non-redundant mode, and the redundant R mode output from the upper data encoder 150 using the selection signals $SEL_{11}$ to $SEL_{13}$ output from the lower data encoder 166, and outputs the same as the conversion codes $D_1$ and $D_2$ via the OR gates $OR_{31}$ and $OR_{32}$.

Concretely, one input terminal of the AND gate $A_{41}$ is connected to one line (upper significant side) of the encoder line $LN_{156}$ generating the data for the redundant L mode of the upper data encoder 150, and the other input terminal is connected to the selection line $LN_{152}$ outputting the selection signal $SEL_{11}$ of the lower data encoder 165.

One input terminal of the AND gate $A_{42}$ is connected to one line (upper significant side) of the encoder line $LN_{157}$ generating the data for the non-redundant mode of the upper data encoder 150, and the other input terminal is connected to the selection line $LN_{153}$ outputting the selection signal $SEL_{12}$ of the lower data encoder 165.

One input terminal of the AND gate $A_{43}$ is connected to one line (upper data side) of the encoder line $LN_{158}$ generating the data for the redundant R mode of the upper data encoder 150, and the other input terminal is connected to the selection line $LN_{154}$ outputting the selection signal $SEL_{13}$ of the lower data encoder 165.

The outputs of these AND gates $A_{41}$ to $A_{43}$ are connected to the input terminals of the 3-input OR gate $OR_{31}$.

Further, one input terminal of the AND gate $A_{44}$ is connected to the other line (lower data side) of the encoder line $LN_{156}$ generating the data for the redundant L mode of the upper data encoder 150, and the other input terminal is connected to the selection line $LN_{152}$ outputting the selection signal $SEL_{11}$ of the lower data encoder 165.

One input terminal of the AND gate $A_{45}$ is connected to the other line (lower data side) of the encoder line $LN_{157}$ generating the data for the non-redundant mode of the upper data encoder 150, and the other input terminal is connected to the selection line $LN_{153}$ outputting the selection signal $SEL_{12}$ of the lower data encoder 165.

One input terminal of the AND gate $A_{46}$ is connected to the other line (lower data side) of the encoder line $LN_{158}$ generating the data for the redundant R mode of the upper data encoder 150, and the other input terminal is connected to the selection line $LN_{154}$ outputting the selection signal $SEL_{13}$ of the lower data encoder 165.

The outputs of these AND gates $A_{44}$ to $A_{46}$ are connected to respective input terminals of the 3-input OR gate $OR_{32}$.

The exclusive-OR gate $EXO_{31}$ obtains the exclusive-OR between the lower significant data $BD_{63}$ output from one line of the data line $LN_{151}$ of the lower data encoder 165 and the signal obtained by inverting the output level of the AND gate $AU_{31}$ or $AU_{33}$ of the upper data comparators 151 and 153 by the inverter 167 and outputs the result thereof as the lower data conversion code $D_3$.

The exclusive-OR gate $EXO_{32}$ obtains the exclusive-OR between the lower significant data $BD_{64}$ output from the other line of the data line $LN_{151}$ of the lower data encoder 165 and the signal obtained by inverting the output level of the AND gate $AU_{31}$ or $AU_{33}$ of the upper data comparators 161 and 163 by the inverter 167 and outputs the result thereof as the lower data conversion code $D_4$.

In these processings, the direction of application of the reference voltage is reverse between the first row and the third row along with the folded-back arrangement of the reference resistance columns in the second row and the fourth row of the switching blocks in the matrix circuit 170, and, therefore when the second row and the fourth row are selected by the control signal, it is carried out so as to invert the levels of the lower significant data $BD_{63}$ and $BD_{64}$ and output the same as the lower significant data conversion codes $D_3$ and $D_4$.

Next, an explanation will be made of the operation by the above-described structure.

For example, when the sampling voltage $V_S$ of the sampled analog signal is represented as $V_{RB}<V_S<V_{93}$, the outputs of the comparators CU of the upper data comparators 161, 162, and 163 become all "L", so that the digital signals are output, i.e., "0" is output from the AND gates $AU_{31}$ to $AU_{33}$, and "1" is output from the $AU_{34}$, respectively.

As a result, a digital signal such as [0001] is input to the upper data encoder 150. At the upper data encoder 150, using a so-called wired-OR circuit, [00] is generated in the two columns of the encoder line $[LN_{156}]$ generating the redundant L mode data; [00] is generated in the two columns of the encoder line $[LN_{157}]$ generating the non-redundant mode data; and [01] is generated in the two columns of the encoder line $[LN_{158}]$ generating the redundant R mode data; respectively, which are output to the selection gate 166.

Also, when the sampling voltage $V_S$ is represented as $V_{93}<V_S<V_{92}$, similarly the digital signals are output, i.e., "0" is output from the upper significant side AND gates $AU_{31}$, $AU_{32}$, and $AU_{34}$, and "1" is output from the $AU_{33}$, respectively.

As a result, a digital signal such as [0010] is input to the upper data encoder 150, and the upper significant data is output, i.e., [10] is output from the line $[LN_{156}]$; [01] is output from the line $[LN_{157}]$; and [00] is output from the line $[LN_{158}]$, to the selection gate 166.

Further, when the sampling voltage $V_S$ is represented as $V_{92}<V_S<V_{91}$, the digital signals are output, i.e., "0" is output from the upper data side AND gates $AU_{31}$, $AU_{33}$, and $AU_{34}$, and "1" is output from the $AU_{92}$, respectively.

As a result, a digital signal such as [0100] is input to the upper data encoder 100, and the upper significant data is output, i.e., [01] is output from the line $[LN_{156}]$; [10] is output from the line $[LN_{157}]$; and [11] is output from the line $[LN_{158}]$, to the selection gate 166.

Similarly, when the sampling voltage $V_S$ is represented as $V_{91}<V_S<V_{RT}$, the digital signals are output, i.e., "0" is output from the upper data side AND gates $AU_{32}$, $AU_{33}$, and $AU_{34}$, and "1" is output from the $AU_{31}$, respectively.

As a result, a digital signal such as [1000] is input to the upper data encoder 150, and the upper significant data is output, i.e., [11] is output from the line [$LN_{156}$]; [11] is output from the line [$LN_{157}$]; and [10] is output from the line [$LN_{156}$], to the selection gate 166.

In parallel with this, the transistors $Q_{153}$ of the respective switching blocks of the matrix circuit 170 connected to the control lines ($x_{31}$, $x_{32}$, $x_{33}$, and $x_{34}$) at which the digital output signal has become "1" among the respective AND gates $AU_{(31, 32, 33, 34)}$ are controlled to turn ON in units of rows, and further a fine digitization of the quantization level is executed.

For example, when only the output of the AND gate $AU_{33}$ becomes the "1" level, the transistors $Q_{153}$ of the switching blocks $S_{\beta1}$ to $S_{\beta7}$ become ON, so that the reference voltages divided by the reference resistors $R_{127}$ to $R_{133}$ and the sampling voltage $V_S$ are differentially amplified at the switching blocks $S_{31}$ to $S_{37}$ and compared by the lower data comparators 151 to 157.

Similarly, when the output of the AND gate $AU_{32}$ is at the "1" level, the switching blocks $S_{\beta 21}$ to $S_{\beta 27}$ are activated, so that a differential amplification operation is performed, and the comparison by the lower data comparators 151 to 157 is carried out.

In this way, in the lower data conversion codes, the sampled voltage $V_S$ and the reference voltage divided by the reference resistance of that row are compared in units of rows of the switching blocks, so that the digital signal will be output from the AND gates $AD_{71}$ to $AD_{77}$ and $AD_{78}$ of the lower data comparators 151 to 157 as shown in FIG. 21.

At this time, where the level of the analog signal outputting the upper significant 2 bits of the conversion code is not changed from that of the analog signal when the lower significant 2 bits of the conversion code are output, the signal of the "1" level is output from one AND gate among the AND gates $AD_{73}$ to $AD_{76}$ of the lower data comparators 153 to 156 to the lower data encoder 165.

In this case, in the lower data encoder 165, only the selection line $LN_{153}$ becomes "1". As a result, the selection signal $SEL_{12}$ is input to the selection gate 166 as the "1" level, and the selection signals $SEL_{11}$ and $SEL_{13}$ are input to the selection gate 166 as the "0" level.

In the selection gate 166, along with the fact that only the selection signal $SEL_{12}$ is input as the "1" level, only the AND gates $A_{42}$ and $A_{45}$ are activated.

To these AND gates $A_{42}$ and $A_{45}$, the upper data side and lower data side of the upper significant data for the non-redundant mode generated in the line $LN_{157}$ of the upper data encoder 150 are respectively supplied.

Accordingly, in the selection gate 166, the respective bits of the upper significant data at the non-redundant mode are selected, and as a result, they are output as the upper significant data conversion codes $D_1$ and $D_2$ via the OR gates $OR_{31}$ and $OR_{32}$.

Concretely, when the sampling voltage $V_S$ of the analog signal $V_{IN}$ is defined as $V_{RB}<V_S<V_{93}$, the upper data conversion codes [$D_1$, $D_2$] are output as [00]; when $V_{93}<V_S<V_{92}$ stands, the upper data conversion codes [$D_1$, $D_2$] are output as [01]; when $V_{92}<V_S<V_{91}$ stands, the upper data conversion codes [$D_1$, $D_2$] are output as [10]; and when $V_{91}<V_S<V_{RT}$ stands, the upper significant data conversion codes [$D_1$, $D_2$] are output as [11].

Also, in the selection gate 165, when the output of the AND gate $A_{D3}$ of the lower data comparator 153 is "1", the lower significant data $BD_{63}$ and $BD_{64}$ are generated as [11]; when the output of the AND gate $AD_{73}$ of the lower data comparator 154 is "1", the lower significant data $BD_{63}$ and $BD_{64}$ are generated as [10]; when the output of the AND gate $AD_{75}$ of the lower data comparator 155 is "1", the lower significant data $BD_{63}$ and $BD_{64}$ are generated as [01]; when the output of the AND gate $AD_{76}$ of the lower data comparator 156 is "1", the lower significant data $BD_{63}$ and $BD_{64}$ are generated as [00]; and the data $BD_{63}$ is output to the exclusive-OR gate $EXO_{31}$, and the data $BD_{64}$ is output to the exclusive-OR gate $EXO_{32}$.

In the exclusive-OR gates $EXO_{31}$ and $EXO_{32}$, when $V_{RB}<V_S<V_{93}$ and $V_{92}<V_S<V_{91}$ stand, that is where the switching blocks $S_{\beta 41}$ to $S_{\beta 47}$ and $S_{\beta 21}$ to $S_{\beta 27}$ of the first row and third row from the bottom of the matrix circuit 170 are selected, since the direction of application of the reference voltage is the forward direction, the levels of the lower significant data are output as the lower significant data conversion codes $D_3$ and $D_4$ while inverting the output level of the lower data encoder 165.

Contrary to this, when $V_{93}<V_S<V_{92}$ and $V_{91}<V_S<V_{RT}$ stand, that is where the switching blocks $S_{\beta 31}$ to $S_{\beta 37}$ and $S_{\beta 11}$ to $S_{\beta 17}$ of the second row and fourth row from the bottom of the matrix circuit 170 are selected, since the direction of application of the reference voltage is the inverse direction, the levels of the lower significant data are held at the output level of the lower data encoder 165 as they are and output as the lower significant data conversion codes $D_3$ and $D_4$.

Also, at the time of conversion, in a case where $V_{93}<V_{IN}<V_{92}$ when the upper significant 2 bits $D_1$ and $D_2$ are digitized and $V_{92}<V_{IN}$ when the lower significant 2 bits $D_3$ and $D_4$ are digitized; or in a case where $V_{92}<V_{IN}<V_{91}$ when the upper significant 2 bits $D_1$ and $D_2$ are digitized and $V_{IN}<V_{92}$ when the lower significant 2 bits $D_3$ and $D_4$ are digitized, a signal of the "1" level is output from one AND gate among the AND gates $AD_{71}$ and $AD_{72}$ of the lower data comparators 151 and 152 to the lower data encoder 165.

In this case, in the lower data encoder 165, only the selection line $LN_{152}$ becomes "1". As a result, the selection signal $SEL_{11}$ is input to the selection gate 166 as the "1" level, and the selection signals $SEL_{12}$ and $SEL_{13}$ are input to the selection gate 166 as the "0" level.

In the selection gate 166, along with the fact that only the selection signal $SEL_{11}$ is input as the "1" level, only the AND gates $A_{41}$ and $A_{44}$ are activated.

To these AND gates $A_{41}$ and $A_{44}$, the upper data side and lower data side of the upper significant data for the redundant n mode generated in the line $LN_{156}$ of the upper data encoder 150 are respectively supplied.

Accordingly, in the selection gate 166, the respective bits of the upper significant data at the redundant n mode are selected, and as a result, they are output as the upper significant data conversion codes $D_1$ and $D_2$ via the OR gates $OR_{31}$ and $OR_{32}$.

Concretely, when the sampling voltage $V_S$ of the analog signal $V_{IN}$ is defined as $V_{RB}<V_S<V_{93}$, the upper data conversion codes [$D_1$, $D_2$] are output as [00]; when $V_{93}<V_S<V_{92}$ stands, the upper data conversion codes [$D_1$, $D_2$] are output as [10]; when $V_{92}<V_S<V_{91}$ stands, the upper data conversion codes [$D_1$, $D_2$] are output as [01]; and when $V_{91}<V_S<V_{RT}$ stands, the upper data conversion codes [$D_1$, $D_2$] are output as [11].

Namely, at this redundant L mode, when $V_{93}<V_S<V_{92}$ (when the output of the AND gate $AU_{33}$ is "1"), the upper data conversion code [$D_1$, $D_2$] is corrected to a code [10] which is larger than the output code [01] in the case of the non-redundancy by "1" and output; and when $V_{92}<V_S<V_{91}$ (when the output of the AND gate $AU_{32}$ is "1"), the upper data conversion code [$D_1$, $D_2$] is corrected to a code [01] which is smaller than the output code [10] in the case of the non-redundancy by "1" and output.

Also, in the selection gate 165, when the output of the AND gate $AD_{71}$ of the lower data comparator 151 is "1", the lower significant data $BD_{63}$ and $BD_{64}$ are generated as [01]; and when the output of the AND gate $AD_{72}$ of the lower data comparator 152 is "1", the lower significant data $BD_{63}$ and $BD_{64}$ are generated as [00], so that the data $BD_{63}$ is output to the exclusive OR gate $EXO_{31}$, the data $BD_{63}$ is output to the exclusive-OR gate $EXO_{32}$, which is subjected to the predetermined level adjustment function here and output as the lower data conversion codes $D_3$ and $D_4$.

Also, at the time of conversion, in a case where $V_{IN}<V_{93}$ when the upper significant 2 bits $D_1$ and $D_2$ are digitized and $V_{93}<V_{IN}$ when the lower significant 2 bits $D_3$ and $D_4$ are digitized; or in a case where $V_{93}<V_{IN}<V_{92}$ when the upper significant 2 bits $D_1$ and $D_2$ are digitized and $V_{IN}<V_{93}$ when the lower significant 2 bits $D_3$ and $D_4$ are digitized; or in a case where $V_{92}<V_{IN}<V_{91}$ when the upper significant 2 bits $D_1$ and $D_2$ are digitized and $V_1<V_{IN}$ when the lower significant 2 bits $D_3$ and $D_4$ are digitized; or in a case where $V_1<V_{IN}$ when the upper significant 2 bits $D_1$ and $D_2$ are digitized and $V_{IN}<V_{91}$ when the lower significant 2 bits $D_3$ and $D_4$ are digitized, a signal of the "1" level is output from one AND gate among the AND gate $AD_{77}$ and AND gate $AD_{78}$ of the lower data comparator 157 to the lower data encoder 165.

In this case, in the lower data encoder 165, only the selection line $LN_{154}$ becomes "1". As a result, the selection signal $SEL_{13}$ is input to the selection gate 166 as the "1" level, and the selection signals $SEL_{11}$ and $SEL_{12}$ are input to the selection gate 166 as the "0" level.

In the selection gate 166, along with the fact that only the selection signal $SEL_{13}$ is input as the "1" level, only the AND gates $A_{43}$ and $A_{46}$ are activated.

To these AND gates $A_{43}$ and $A_{46}$, the upper data side and lower data side of the upper significant data for the redundant R mode generated in the line $LN_{103}$ of the upper data encoder 150 are respectively supplied.

Accordingly, in the selection gate 166, the respective bits of the upper significant data at the redundant R mode are selected, and as a result, they are output as the upper significant data conversion codes $D_1$ and $D_2$ via the OR gates $OR_{31}$ and $OR_{32}$.

Concretely, when the sampling voltage $V_S$ of the analog signal $V_{IN}$ is defined as $V_{RB}<V_S<V_{93}$, the upper data conversion codes [$D_1$, $D_2$] are output as [01]; when $V_{93}<V_S<V_{92}$ stands, the upper data conversion codes [$D_1$, $D_2$] are output as [00]; when $V_{92}<V_S<V_{91}$ stands, the upper data conversion codes [$D_1$, $D_2$] are output as [11]; and when $V_{91}<V_S<V_{RT}$ stands, the upper data conversion codes [$D_1$, $D_2$] are output as [10].

Namely, at this redundant R mode, when $V_{RB}<V_S<V_{93}$ (when the output of the AND gate $A_{U4}$ is "1"), the upper data conversion code [$D_1$, $D_2$] is corrected to a code [01] which is larger than the output code [00] in the case of the non-redundancy by "1" and output, and when $V_{93}<V_S<V_{92}$ (when the output of the AND gate $AU_{33}$ is "1"), the upper data conversion code [$D_1$, $D_2$] is corrected to a code [00] which is smaller than the output code [01] in the case of the non-redundancy by "1" and output; and when $V_{92}<V_S<V_{91}$ (when the output of the AND gate $AU_{32}$ is "1"), the upper data conversion code [$D_1$, $D_2$] is corrected to a code [11] which is larger than the output code [10] in the case of the non-redundancy by "1" and output, and when $V_{91}<V_S<V_{RT}$ (when the output of the AND gate $AU_{31}$ is "1"), the upper data conversion code [$D_1$, $D_2$] is corrected to a code [10] which is smaller than the output code [11] in the case of the non-redundancy by "1" and output.

Also, in the selection gate 165, when the output of the AND gate $AD_{77}$ of the lower data comparator 157 is "1", the lower significant data $BD_{63}$ and $BD_{64}$ are generated as [11]; and when the output of the AND gate $AD_{78}$ of the lower data comparator 152 is "1", the lower significant data $BD_{63}$ and $BD_{64}$ are generated as [10], so that the data $BD_{63}$ is output to the exclusive OR gate $EXO_{31}$, the data $BD_{64}$ is output to the exclusive-OR gate $EXO_{32}$, which is subjected to the predetermined level adjustment function here and output as the lower data conversion codes $D_3$ and $D_4$.

As explained above, according to the present embodiment, so as to correct the upper significant data, the output data level of the encoder 150 and the output level of the selection signal of the lower data encoder 165 were set in advance so as to select an appropriate data from among three data, i.e., the left redundant data (data to be selected by the lower data encoder in the left part of the resistance column), normal data, and the right redundant data, and therefore it is possible to use the selection signal directly for the selection of the upper significant data without the use of the inverted gate and inhibit gate as in the conventional circuit.

Accordingly, an A/D converter circuit with which the input of the selection signal to the selection gate 166 is not delayed in relative to the output of the upper data encoder 150, the increase of speed of conversion processing can be achieved, and the decrease of the chip area and reduction of the power consumption can be achieved can be realized.

Note that, in the present embodiment, an explanation was made taking as an example an A/D converter circuit for four bits, but needless to say the present invention can be applied to a A/D converter circuit for more bits.

As explained above, according to the present invention, there are advantages that the inverted gate and inhibit gate which have been conventionally necessary become unnecessary, the increase of speed of conversion processing can be achieved, and the decrease of the chip area and reduction of the power consumption can be achieved.

An explanation will be made next of a seventh embodiment of the present invention.

Figure 22C:
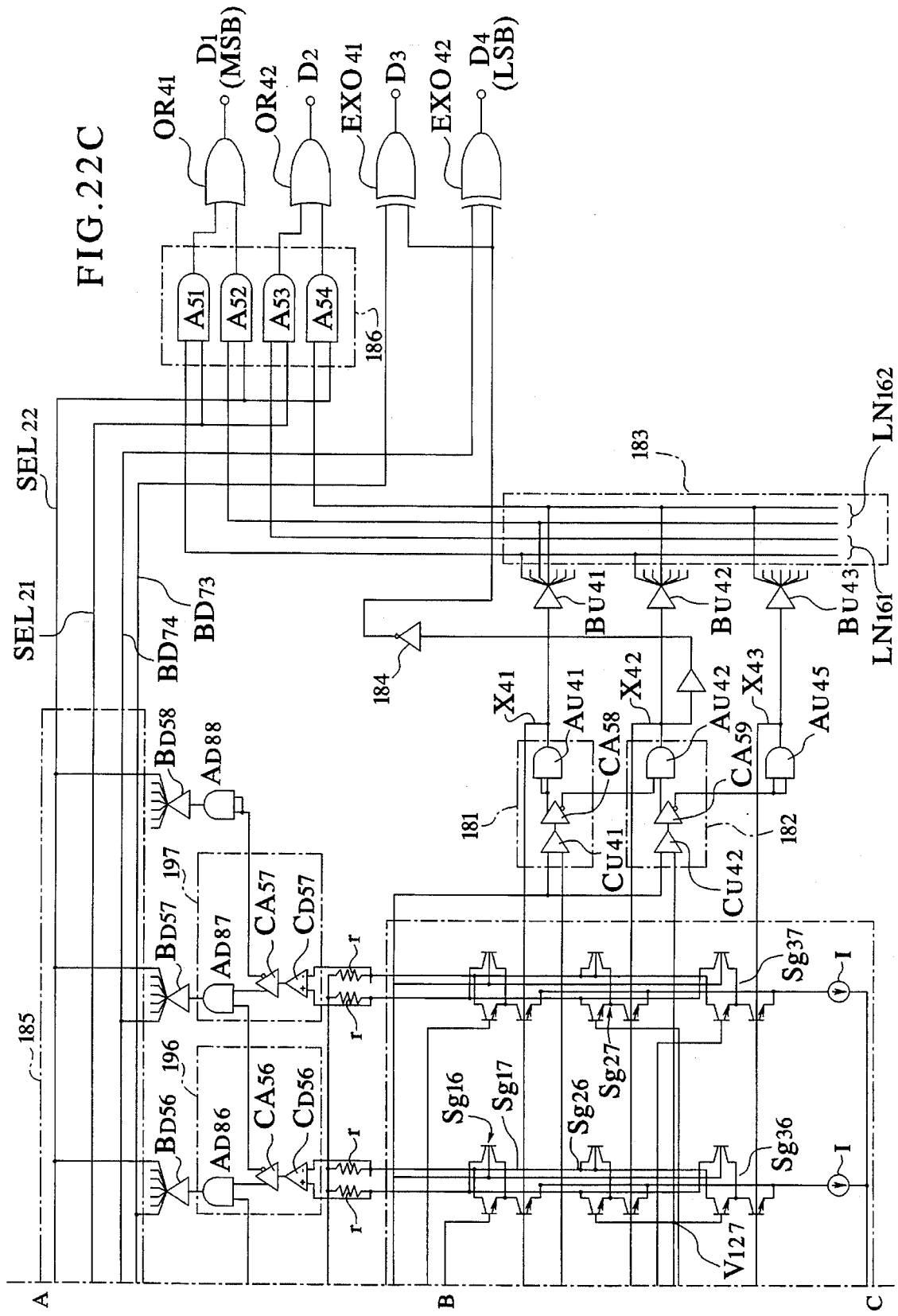

FIGS. 22A–22C are circuit diagrams showing the seventh embodiment of the A/D converter circuit according to the present invention.

In FIG. 22, 180 denotes a matrix circuit; 181 and 182 denote upper data comparators as the data change point detection circuits; 183, an upper data encoder; 191 to 197 denote lower data comparators; 185, a lower data encoder; 186, a selection gate; 184, an inverter; $R_{141}$ to $R_{156}$ denote reference resistance elements; $B_{U41}$ to $B_{U43}$ and $B_{D51}$ to $B_{D58}$ denote multiple output pin buffers; $OR_{41}$ and $OR_{42}$ denote OR gates; and $EXO_{41}$ and $EXO_{42}$ denote exclusive-OR gates; respectively.

The matrix circuit 180 is constituted by the arrangement of 21 switching blocks $S_{g11}$ to $S_{g17}$, $S_{g21}$ to $S_{g27}$, and $S_{g31}$ to $S_{g37}$ in the form of a matrix comprising three rows and seven columns.

The respective switching blocks $S_{g11}$ to $S_{g17}$, $S_{g21}$ to $S_{g27}$, and $S_{g31}$ to $S_{g37}$ are constituted by differential type amplifiers comprising the npn-type transistors $Q_{161}$, $Q_{162}$, and $Q_{163}$.

A reference voltage obtained by dividing the reference voltages $V_{RT}$ to $V_{RB}$ by the reference resistance elements $R_{141}$ to $R_{156}$ is supplied to the base of one side transistors $Q_{161}$ constituting a so-called differential pair of the respective switching blocks, and analog signals $V_{IN}$ which are to be converted to the digital code are supplied to the base of the other side transistors $Q_{162}$, respectively.

Also, the emitters of the transistors $Q_{161}$ and $Q_{162}$ are connected to each other, and the middle point of connection thereof is connected to the current source I via the transistor $Q_{163}$ switched by the control signals $x_{41}$ and $x_{42}$, respectively.

To the collectors of the transistors $Q_{161}$ and $Q_{163}$, the power source voltage $V_{DD}$ is supplied via the resistance element r, the output of which is input to the comparators $C_{D51}$ to $C_{D57}$ of the seven lower data comparators 191 to 197 as mentioned later, which act also as the initial stage amplifiers of the lower data comparators 191 to 197.

Also, the collectors of the transistors $Q_{161}$ and $Q_{162}$ of the switching block at the second row from the bottom of the diagram are connected to the line in an opposite direction to that for the collector output of the transistors $Q_{161}$ and $Q_{162}$ of the switching blocks at the first row and third row, and a measure is devised so that the line of the serial reference resistance elements $R_{141}$ to $R_{156}$ to which the reference potentials $V_{RT}$ to $V_{RB}$ are applied can be formed by folding-back.

The reference resistance elements $R_{141}$ to $R_{156}$ are serially connected between the two reference potentials $V_{RT}$ and $V_{RB}$ and arranged by folding-back so as to extend over a predetermined number of rows, e.g., five rows in the present embodiment, to correspond to the matrix arrangement of the switching blocks in the matrix circuit 184.

Concretely, each two resistance elements $R_{156}$ and $R_{155}$ and $R_{142}$ and $R_{141}$ are serially connected to the first row and the fifth row from the bottom in the diagram, and the resistance elements $R_{154}$ to $R_{151}$, $R_{150}$ to $R_{147}$, and $R_{146}$ to $R_{143}$ are serially connected to the second row to the fourth row, respectively.

Viewing this folding-back arrangement of the resistance element columns from the reference potential $V_{RB}$ terminal side positioned on the left end and lower end side of the matrix circuit 180, the wiring pattern extended in the right direction in the diagram is folded-back between the switching block column of the fourth column from the left in the diagram and the switching block column of the fifth column, and two resistance elements $R_{156}$ and $R_{155}$ are connected in series, whereby the first row of the resistance column is constituted.

The resistance column at the first row is folded-back between the switching block column of the third column and the switching block column of the second column, and four resistance elements $R_{154}$ to $R_{151}$ are connected in series between the switching block rows of the first row and the second row and, corresponding to the arrangement position of the switching blocks $S_{g33}$ to $S_{g36}$ of the first row, whereby the resistance column of the second row is constituted.

The resistance column of the second row is folded-back between the switching block column of the fifth column and the switching block column of the sixth column, and four resistance elements $R_{150}$ to $R_{147}$ are connected in series between the switching block rows at the first row and the second row and, corresponding to the arrangement position of the switching blocks $S_{g26}$ to $S_{g23}$ at the second row, whereby the resistance column of the third row is constituted.

The resistance column of the third row is folded-back between the switching block column of the third column and the switching block column of the second column, and four resistance elements $R_{146}$ to $R_{143}$ are connected in series corresponding to the arrangement position of the switching blocks $S_{13}$ to $S_{16}$ at the third row, whereby the resistance column of the fourth row is constituted.

The resistance column of the fourth row is folded-back between the switching block column of the fifth column and the switching block column of the sixth column, four resistance elements $R_{142}$ to $R_{141}$ are connected in series corresponding to the arrangement position of the switching blocks $S_{g16}$ to $S_{g15}$ at the third row, and one end of the resistance element $R_1$ is connected to the terminal of the reference potential $V_{RT}$, whereby the resistance column of the fifth row is constituted.

Namely, the resistance columns at the first row and the fifth row are arranged at a deviation of a half cycle with respect to the resistance columns at the second row to the fourth row so that the position exhibiting the lowest value of the reference voltage (connection point between the reference potential $V_{RB}$ terminal and the resistance element $R_{156}$) and the position exhibiting the highest value (connection point between the reference potential $V_{RT}$ terminal and the resistance element $R_{141}$) are positioned at an intermediate point in the row direction of the switching blocks arranged in the form of the matrix.

Such a structure of arrangement of the resistance columns is made for the purpose of dividing the switching block columns comprising seven columns into the group comprising the switching block columns from the first column to the fourth column and the group of the switching block columns from the fifth column to the seventh column of the switching point between the upper data and lower data as will be mentioned later.

Also, the voltages $V_{128}$ and $V_{127}$ generated between the rows of the fourth row and the third row and between the rows of the third row and the second row of the resistance columns are supplied to the upper data comparators 181 and 182 as the reference voltages obtained by dividing the reference potentials $V_{RT}$ to $V_{RB}$ by rough quantization, respectively.

In the structure of FIG. 1, when assuming that the voltage between the reference potentials $V_{RT}$ to $V_{RB}$ is $V_{REF}$, the respective reference voltages $V_{128}$ and $V_{127}$ become the following values, respectively:

$$V_{128}=(10/16) \cdot V_{REF}$$

$$V_{127}=(6/16) \cdot V_{REF}$$

Further, wiring is carried out so that the respective reference voltages $V_{111}$ to $V_{125}$ divided by the reference resistance elements $R_{141}$ to $R_{156}$ are supplied to the base of the transistor $Q_{161}$ of the predetermined switching block.

Concretely, a reference voltage $V_{111}$ [$=(15/16) \cdot V_{REF}$] generated at the middle point of connection between the resistance elements $R_{141}$ and $R_{142}$ is supplied to the base of the transistor $Q_{161}$ of the switching block $S_{g17}$.

A reference voltage $V_{112}$ [$=(14/16) \cdot V_{REF}$] generated at the connection between the resistance elements $R_{142}$ and $R_{143}$ is supplied to the base of the transistor $Q_{161}$ of the switching block $S_{g16}$.

A reference voltage $V_{113}$ [$=(13/16) \cdot V_{REF}$] generated at the connection between the resistance elements $R_{143}$ and $R_{144}$ is supplied to the base of the transistor $Q_{161}$ of the switching block $S_{g15}$.

A reference voltage $V_{114}$ [$=(12/16) \cdot V_{REF}$] generated at the connection between the resistance elements $R_{144}$ and $R_{145}$ is supplied to the base of the transistor $Q_{161}$ of the switching block $S_{g14}$.

A reference voltage $V_{115}$ [$=(11/16) \cdot V_{REF}$] generated at the connection between the resistance elements $R_{145}$ and $R_{146}$ is supplied to the bases of the transistors $Q_{161}$ of the switching blocks $S_{g13}$ and $S_{g21}$.

A reference voltage $V_{116}$ [$=V_{128}=(10/16) \cdot V_{REF}$] generated at the connection between the resistance elements $R_{146}$ and $R_{147}$ is supplied to the bases of the transistors $Q_{161}$ of the switching blocks $S_{g12}$ and $S_{g22}$.

A reference voltage $V_{117}$ [$=(9/16)\cdot V_{REF}$] generated at the connection between the resistance elements $R_{147}$ and $R_{148}$ is supplied to the bases of the transistors $Q_{161}$ of the switching blocks $S_{g4}$ and $S_{g23}$.

A reference voltage $V_{118}$ [$=(8/16)\cdot V_{REF}$] generated at the connection between the resistance elements $R_{148}$ and $R_{149}$ is supplied to the base of the transistor $Q_{161}$ of the switching block $S_{g24}$.

A reference voltage $V_{119}$ [$=(7/16)\cdot V_{REF}$] generated at the connection between the resistance elements $R_{149}$ and $R_{150}$ is supplied to the bases of the transistors $Q_{161}$ of the switching blocks $S_{g25}$ and $S_{g37}$.

A reference voltage $V_{120}$ [$=V_{127}=(6/16)\cdot V_{REF}$] generated at the connection between the resistance elements $R_{150}$ and $R_{151}$ is supplied to the bases of the transistors $Q_{161}$ of the switching blocks $S_{g26}$ and $S_{g36}$.

A reference voltage $V_{121}$ [$=(5/16)\cdot V_{REF}$] generated at the connection between the resistance elements $R_{151}$ and $R_{152}$ is supplied to the bases of the transistors $Q_{161}$ of the switching blocks $S_{g27}$ and $S_{g35}$.

A reference voltage $V_{122}$ [$=(4/16)\cdot V_{REF}$] generated at the connection between the resistance elements $R_{152}$ and $R_{153}$ is supplied to the base of the transistor $Q_{161}$ of the switching block $S_{g34}$.

A reference voltage $V_{123}$ [$=(3/16)\cdot V_{REF}$] generated at the connection between the resistance elements $R_{153}$ and $R_{154}$ is supplied to the base of the transistor $Q_{161}$ of the switching block $S_{g33}$.

A reference voltage $V_{124}$ [$=(2/16)\cdot V_{REF}$] generated at the connection between the resistance elements $R_{154}$ and $R_{155}$ is supplied to the base of the transistor $Q_{161}$ of the switching block $S_{g32}$.

A reference voltage $V_{125}$ [$=(1/16)\cdot V_{REF}$] generated at the connection between the resistance elements $R_{155}$ and $R_{156}$ is supplied to the base of the transistor $Q_{161}$ of the switching block $S_{g31}$.

The upper data comparators 181 and 182 respectively are provided with comparators $C_{U41}$ and $C_{U42}$, complementary-type output amplifiers $CA_{58, 59}$, and AND gates $AU_{41}$ and $AU_{42}$. Note that, for the reasons described later, the upper data comparator 181 acts also as the upper data comparator for the uppermost row, and the upper data comparator 182 acts also as the upper data comparator for the lowermost row.

An analog signal $V_{IN}$ is supplied to one input of the comparator $CU_{41}$ of the upper data comparator 181, and a reference voltage $V_{128}$ [$=(10/16)\cdot V_{REF}$] obtained by dividing the reference potentials $V_{RT}$ to $V_{RB}$ by the rough quantization is supplied to the other input.

The analog signal $V_{IN}$ is supplied to one input of the comparator $CU_{42}$ of the upper data comparator 182, and a reference voltage $V_{127}$ [$=(6/16)\cdot V_{REF}$] obtained by dividing the reference potentials $V_{RT}$ to $V_{RB}$ by the rough quantization is supplied to the other input.

The output of the comparator $CU_{41}$ of the upper data comparator 181 is connected to the input of the output amplifier $CA_{58}$, the positive output thereof is connected to both inputs of a 2-input AND gate $AU_{41}$, and the negative output is connected to one input of the 2-input AND gate $AU_{42}$ of the upper data comparator 182.

The output of comparator $CU_{42}$ of the upper data comparator 182 is connected to the input of the output amplifier $CA_{42}$, the positive output thereof is connected to the other input of the 2-input AND gate $AU_{42}$, and the negative output is connected to the both inputs of the 2-input AND gate $AU_{43}$.

The outputs of the respective comparators $CU_{41}$ and $CU_{42}$ of the upper data comparators 181 and 182 constituted in this way become the level of "H" or "L" corresponding to the level of the sampled analog signal $V_{IN}$, and only one among the respective AND gates $AU_{41}$ to $AU_{43}$ outputs the "1" level.

The output of the AND gate $AU_{41}$ of the upper data comparator 181 is connected via the buffer $BU_{41}$ to the upper data encoder 183 and, at the same time, connected to the bases of the transistors $Q_{163}$ of the switching blocks $S_{g11}$ to $S_{g17}$.

The output of the AND gate $AU_{42}$ of the upper data comparator 182 is connected via the buffer $BU_{42}$ to the upper data encoder 183 and, at the same time, connected to the bases of the transistors $Q_{163}$ of the switching blocks $S_{g21}$ to $S_{g27}$ and connected to the input of the inverter 184 via the buffer.

The AND gate $AU_{43}$ of the upper data comparator 183 is connected via the buffer $BU_{43}$ to the upper data encoder 183 and, at the same time, connected to the bases of the transistors $Q_{163}$ of the switching blocks $S_{g31}$ to $S_{g37}$.

The upper data encoder 183 is constituted by an encoder line $LN_{161}$ generating the data for an L (left) mode, and an encoder line $LN_{162}$ generating the data for an R (right) mode.

Namely, in the upper data encoder 183, respective encoder lines $LN_{161}$ and $LN_{162}$ are set up corresponding to a first group of from the first column to the fourth column arranged on the left side from the center of the matrix circuit 180, and a second group of from the fifth column to the seventh column arranged on the right side among the switching blocks $S_{g11}$ to $S_{g17}$, $S_{g21}$ to $S_{g27}$ and $S_{g31}$ to $S_{g37}$ arranged in the matrix circuit 180.

FIG. 23 shows the correspondence between the outputs of the respective AND gates $AU_{41}$, $AU_{42}$, and $AU_{43}$ of the upper data comparators 181 and 182 and the set output data code pattern of the respective encoder lines $LN_{161}$ and $LN_{142}$ of the upper data encoder 183.

The data is set in a manner that, in accordance with the direction of transition of the reference voltage level by the respective reference resistance elements in the first row to the fifth row (the second row to the fourth row in the present embodiment) from the bottom among the serially connected reference resistance element groups which are folded-back so that the number of rows becomes five, concretely an orientation (hereinafter referred to as a direction) of transition of the reference voltage from the low potential side to the high potential side, so that (data of L mode)<(data of R mode) and (data of L mode)<(data of R mode) stand.

In the structure of FIG. 22, the first row from the bottom comprising the resistance elements $R_{156}$ and $R_{155}$, the third row comprising the resistance elements $R_{150}$ to $R_{147}$, and the fifth row comprising the resistance elements $R_{142}$ and $R_{141}$ have the same direction, and the second row comprising the resistance elements $R_{154}$ to $R_{151}$ and the fourth row comprising the resistance elements $R_{146}$ to $R_{143}$ have the same direction.

Accordingly, the data setting level in the case where the AND gate $AU_{42}$ corresponding to the third row is at the "1" level is set so that (data of L mode)>(data of R mode) stands.

Contrary to this, the data setting level in the case where the AND gates $AU_{43}$ and $AU_{41}$ corresponding to the second row and the fourth row are at the "1" level is set so that (data of L mode)<(data of R mode) stands.

The lower data comparators 191 to 197 are respectively provided with comparators $CD_{51}$ to $CD_{57}$, complementary-type output amplifiers $CA_{51\ to\ 57}$, and AND gates $AD_{81}$ to $AD_{87}$.

To one input of the comparator $CD_{51}$ of the lower data comparator 191 is supplied the collector output of the transistor $Q_{161}$ of the switching block $S_{g21}$ at the first column of the matrix circuit 180 and the collector output of the transistor $Q_{162}$ of the switching blocks $S_{g11}$ and $S_{g31}$, and to the other input is supplied the collector outputs of the transistors $Q_{161}$ of the switching blocks $S_{g11}$ and $S_{g31}$ and the collector output of the transistor $Q_{162}$ of the switching block $S_{g21}$.

To one input of the comparator $CD_{52}$ of the lower data comparator 192 is supplied the collector output of the transistor $Q_{161}$ of the switching block $S_{g22}$ at the second column of the matrix circuit 180 and the collector output of the transistor $Q_{162}$ of the switching blocks $S_{g12}$ and $S_{g32}$, and to the other input is supplied the collector outputs of the transistors $Q_{161}$ of the switching blocks $S_{g12}$ and $S_{g32}$ and the collector output of the transistor $Q_{162}$ of the switching block $S_{g22}$.

To one input of the comparator $CD_{53}$ of the lower data comparator 193 is supplied the collector output of the transistor $Q_{161}$ of the switching block $S_{g23}$ at the third column of the matrix circuit 180 and the collector output of the transistor $Q_{162}$ of the switching blocks $S_{g13}$ and $S_{g33}$, and to the other input is supplied the collector outputs of the transistors $Q_{161}$ of the switching blocks $S_{g13}$ and $S_{g33}$ and the collector output of the transistor $Q_{162}$ of the switching block $S_{g23}$.

To one input of the comparator $CD_{54}$ of the lower data comparator 194 is supplied the collector output of the transistor $Q_{161}$ of the switching block $S_{g24}$ at the fourth column of the matrix circuit 180 and the collector output of the transistor $Q_{162}$ of the switching blocks $S_{g14}$ and $S_{g34}$, and to the other input is supplied the collector outputs of the transistors $Q_{161}$ of the switching blocks $S_{g14}$ and $S_{g34}$ and the collector output of the transistor $Q_{162}$ of the switching block $S_{g24}$.

To one input of the comparator $CD_{55}$ of the lower data comparator 195 is supplied the collector output of the transistor $Q_{161}$ of the switching block $S_{g25}$ at the fifth column of the matrix circuit 180 and the collector output of the transistor $Q_{162}$ of the switching blocks $S_{g15}$ and $S_{g35}$, and to the other input is supplied the collector outputs of the transistors $Q_{161}$ of the switching blocks $S_{g15}$ and $S_{g35}$ and the collector output of the transistor $Q_{162}$ of the switching block $S_{g25}$.

To one input of the comparator $CD_{56}$ of the lower data comparator 196 is supplied the collector output of the transistor $Q_{161}$ of the switching block $S_{g26}$ at the sixth column of the matrix circuit 180 and the collector output of the transistor $Q_{162}$ of the switching blocks $S_{g16}$ and $S_{g36}$, and to the other input is supplied the collector outputs of the transistors $Q_{161}$ of the switching blocks $S_{g16}$ and $S_{g36}$ and the collector output of the transistor $Q_{162}$ of the switching block $S_{g26}$.

To one input of the comparator $CD_{57}$ of the lower data comparator 197 is supplied the collector output of the transistor $Q_{161}$ of the switching block $S_{g27}$ at the seventh column of the matrix circuit 180 and the collector output of the transistor $Q_{162}$ of the switching blocks $S_{g17}$ and $S_{g37}$, and to the other input is supplied the collector outputs of the transistors $Q_{161}$ of the switching blocks $S_{g17}$ and $S_{g37}$ and the collector output of the transistor $Q_{162}$ of the switching block $S_{g27}$.

The output of the comparator $CD_{51}$ of the lower data comparator 191 is connected to the input of the output amplifier $CA_{51}$, the positive output thereof is connected to both inputs of the 2-input AND gate $AD_{81}$, and the negative output is connected to one input of the 2-input AND gate $AD_{82}$ of the lower data comparator 192.

The output of the comparator $CD_{52}$ of the lower data comparator 192 is connected to the input of the output amplifier $CA_{52}$, the positive output thereof is connected to the other input of the 2-input AND gate $AD_{82}$, and the negative output is connected to one input of the 2-input AND gate $AD_{83}$ of the lower data comparator 193.

The output of the comparator $CD_{53}$ of the lower data comparator 193 is connected to the input of the output amplifier $CA_{53}$, the positive output thereof is connected to the other input of the 2-input AND gate $AD_{83}$, and the negative output is connected to one input of the 2-input AND gate $AD_{84}$ of the lower data comparator 194.

The output of the comparator $CD_{54}$ of the lower data comparator 194 is connected to the input of the output amplifier $CA_{54}$, the positive output thereof is connected to the other input of the 2-input AND gate $AD_{84}$, and the negative output is connected to one input of the 2-input AND gate $AD_{85}$ of the lower data comparator 195.

The output of the comparator $CD_{55}$ of the lower data comparator 195 is connected to the input of the output amplifier $CA_{55}$, the positive output thereof is connected to the other input of the 2-input AND gate $AD_{85}$, and the negative output is connected to one input of the 2-input AND gate $AD_{86}$ of the lower data comparator 196.

The output of the comparator $CD_{56}$ of the lower data comparator 196 is connected to the input of the output amplifier $CA_{56}$, the positive output thereof is connected to the other input of the 2-input AND gate $AD_{86}$, and the negative output is connected to one input of the 2-input AND gate $AD_{87}$ of the lower data comparator 197.

The output of the comparator $CD_{57}$ of the lower data comparator 197 is connected to the input of the output amplifier $CA_{57}$, the positive output thereof is connected to the other input of the 2-input AND gate $AD_{87}$, and the negative output is connected to the both inputs of the 2-input AND gate $AD_{88}$.

The outputs of the respective comparators $CD_{51}$ to $CD_{57}$ of the lower data comparators 191 to 197 constituted in this way become the level of "H" or "L" corresponding to the level of 2 inputs, and only one of the respective AND gates $AD_{81}$ to $AD_{88}$ outputs the "1" level.

The outputs of the AND gates $AD_{81}$ to $AD_{87}$ and $AD_{88}$ of the lower data comparators 191 to 197 are connected via the buffers $B_{D1}$ to $B_{D8}$, to the lower data encoder 185.

[0060]

The lower data encoder 185 is constituted by a data line $LN_{163}$ generating lower significant data $BD_{73}$ and $BD_{74}$; a selection line $LN_{164}$ generating the selection signal $SEL_{21}$ indicating that either of the outputs of the AND gates $AD_{81}$ to $AD_{84}$ of the lower data comparators 191 to 194 becomes "1"; and a selection line $LN_{165}$ generating the selection signal $SEL_{22}$ indicating that either of the outputs of the AND gates $AD_{85}$ to $AD_{87}$ and $AD_{88}$ of the lower data comparators 195 to 197 becomes "1".

FIG. 24 shows the correspondence between the outputs of the AND gates $AU_{41}$ to $AU_{43}$ on the upper data side and the outputs of the AND gates $AD_{81}$ to $AD_{88}$ on the lower data side, and the output conversion code data.

As mentioned above, in the matrix circuit 180 in the present embodiment, the respective switching blocks are divided to two in the row direction. At this division point C, as seen from FIG. 24, when paying attention to the upper significant 2 bits of the output conversion codes $D_1$ to $D_4$, division is made at the point at which the value of the upper significant 2 bits is switched.

Also, originally, it is necessary to make also the number of the upper data side AND gates (number of the upper data comparators) five, i.e., the same number in accordance with the number five of rows of the resistance columns, but in the present embodiment, two AND gates $A_L$ and $A_H$ corresponding to the resistance columns at the first row (lowermost stage) and the fifth row (uppermost stage) are omitted. As a result, two rows worth of the switching blocks which are to be arranged in the lowermost stage and uppermost stage are omitted.

An explanation will be made below of the reason why the AND gate and the switching block can be omitted using FIG. 24.

Here, at first, assume a structure in which a single row of the switching blocks is provided at the uppermost stage and, at the same time, corresponding to this, an upper data comparator having an AND gate $A_H$ and a buffer for driving the upper data encoder 183 are provided.

In such a structure, when considering a case where the input analog signal $V_{IN}$ is larger than the reference voltage $V_{112}$ ($V_{IN} > V_{112}$), the comparator output becomes "H" and the output of the AND gate $A_H$ becomes the "1" level. The output of this case is one among four types of from [1111] to [1100] as shown in FIG. 24.

When paying attention to these four types of data, the data are similar to the data obtained where the output of the AND gate $AU_{41}$ of the upper data comparator 111 in one lower stage is at the "1" level and either of the outputs of the lower significant side AND gate $AD_{85}$ to $AD_{88}$ is at the "1" level.

Accordingly, where the AND gate $A_H$ in the upper most stage becomes the "1" level, this means that it is sufficient if one lower stage of the switching blocks $S_{g11}$ to $S_{g17}$ and the buffer $BU_{41}$ are activated instead of activation of the switching block at the uppermost stage and the buffer for driving the upper data encoder 183.

This means that if the sum of the output of the AND gate $A_H$ and the output of the AND gate $AU_{41}$ is given to the switching blocks $S_{g11}$ to $S_{g17}$ and the buffer $BU_{41}$, the switching block corresponding to the uppermost stage and the buffer for driving the upper data encoder become unnecessary.

Namely, in a case where $V_{IN} > V_{128}$ ($=V_{116}$), it is sufficient if the switching blocks $S_{g11}$ to $S_{g17}$ and the buffer $BU_{41}$ are activated as in the present embodiment, and it is not necessary to compare the input analog signal $V_{IN}$ with the reference voltage $V_{112}$, and therefore also the upper data comparator corresponding to the uppermost stage becomes unnecessary.

Similarly, assume a structure in which a single row of the switching blocks is provided in the lower most stage, and the upper data comparator having the AND gate $A_L$ is provided corresponding to this.

In such a structure, when considering a case where the input analog signal $V_{IN}$ is smaller than the reference voltage $V_{124}$ ($V_{IN} < V_{124}$), the comparator output becomes "L" and the output of the AND gate $A_L$ becomes the "1" level. The output of this case is one among four types of from [0011] to [0000] as shown in FIG. 24.

Paying attention to these four types of data, these data are similar to the data obtained in a case where the output of the AND gate $AU_{43}$ in one upper stage is at the "1" level and one of the outputs of the lower data side AND gates $AD_{81}$ to $AD_{84}$ is at the "1" level.

Accordingly, where the AND gate $A_L$ in the lowermost stage becomes the "1" level, this means that it is sufficient if one upper stage of the switching blocks $S_{g31}$ to $S_{g37}$ and the buffer $BU_{43}$ are activated instead of activation of the switching block at the uppermost stage and the buffer for driving the upper data encoder 183.

This means that if the sum of the output of the AND gate $A_L$ and the output of the AND gate $AU_{43}$ is given to the switching blocks $S_{g31}$ to $S_{g37}$ and the buffer $BU_{43}$, the switching block corresponding to the lowermost stage and the buffer for driving the upper data encoder become unnecessary.

Namely, in a case where $V_{IN} < V_{127}$ ($=V_{120}$), it is sufficient if the switching blocks $S_{g31}$ to $S_{g37}$ and the buffer $BU_{43}$ are activated as in the present embodiment, and it is not necessary to compare the input analog signal $V_{IN}$ with the reference voltage $V_{124}$. Therefore, also the upper data comparator corresponding to the lowermost stage becomes unnecessary.

The selection gate 186 is constituted by AND gates $A_{51}$ to $A_{54}$, selects a single upper significant data from among the respective upper significant data of the L mode and R mode output from the upper data encoder 183 using the selection signals $SEL_{21}$ and $SEL_{22}$ output from the lower data encoder 185, and outputs the same via the OR-gates $OR_{41}$ and $OR_{42}$ as the conversion codes $D_1$ and $D_2$.

Concretely, one input terminal of the AND gate $A_{51}$ is connected to one line (upper data side) of the encoder line $LN_{161}$ generating the data for the L mode of the upper data encoder 183, and the other input terminal is connected to the selection line $LN_{164}$ outputting the selection signal $SEL_{21}$ of the lower data encoder 185.

One input terminal of the AND gate $A_{42}$ is connected to one line (upper significant side) of the encoder line $LN_{162}$ generating the data for the R mode of the upper data encoder 183, and the other input terminal is connected to the selection line $LN_{165}$ outputting the selection signal $SEL_{22}$ of the lower data encoder 185.

The outputs of these AND gates $A_{51}$ and $A_{52}$ are connected to the respective input terminals of the 2-input OR-gate $OR_{41}$.

One input terminal of the AND gate $A_{53}$ is connected to the other line (lower data side) of the encoder line $LN_{161}$ generating the data for the L mode of the upper data encoder 183, and the other input terminal is connected to the selection line $LN_{164}$ outputting the selection signal $SEL_{21}$ of the lower data encoder 185.

One input terminal of the AND gate $A_{54}$ is connected to the other line (lower significant side) of the encoder line $LN_{162}$ generating the data for the R mode of the upper data encoder 183, and the other input terminal is connected to the selection line $LN_{165}$ outputting the selection signal $SEL_{22}$ of the lower data encoder 185.

The outputs of these AND gates $A_{53}$ and $A_{54}$ are connected to the respective input terminals of the 2-input OR-gate $OR_{42}$.

The exclusive-OR gate $EXO_{41}$ obtains the exclusive-OR between the lower significant data $BD_{73}$ output from one line of the data line $LN_{163}$ of the lower data encoder 185 and the signal obtained by inverting the output level of the AND gate $A_{U2}$ of the upper data comparator 182 by the inverter 184 and outputs the result thereof as the lower data conversion code $D_3$.

The exclusive-OR gate $EXO_{42}$ obtain the exclusive-OR between the lower significant data $BD_{74}$ output from the other line of the data line $LN_{163}$ of the lower data encoder 185 and the signal obtained by inverting the output level of the AND gate $AU_{42}$ of the upper data comparator 182 by the inverter 184 and outputs the result thereof as the lower data conversion code $D_4$.

Next, an explanation will be made of the operation by the above-described structure.

For example, when the sampling voltage $V_S$ of the sampled analog signal is represented as $V_{RB} < V_S < V_{127}$, the outputs of the comparators $CU_{41}$ and $CU_{42}$ of the upper data comparators 181 and 182 become all "L", so that the digital signals are output, i.e., "0" is output from the AND gates $AU_{41}$ to $AU_{42}$, and "1" is output from the AND gate $AU_{43}$, respectively.

As a result, a digital signal such as [001] is input to the upper data encoder 183. At the upper data encoder 183, using a so-called wired-OR circuit, [00] is generated in the two columns of encoder lines [$LN_{161}$] generating the L mode data; and [01] is generated in the two columns of encoder lines [$LN_{162}$] generating the R mode data; respectively, which are output to the selection gate 183.

Also, when the sampling voltage $V_S$ is represented as $V_{127} < V_S < V_{128}$, the output of the comparator $CU_1$ of the upper data comparator 181 becomes "L", and the output of the comparator $CU_2$ of the upper data comparator 182 becomes "H", so that the digital signals are output, i.e., "0" is output from the AND gates $AU_{41}$ to $AU_{43}$ of the upper data comparator 181, and "1" is output from the AND gate $AU_{42}$ of the upper data comparator 182, respectively.

As a result, a digital signal such as [010] is input to the upper data encoder 183. At the upper data encoder 183, using a so-called wired-OR circuit, [10] is generated in the two columns of encoder lines [$LN_{161}$] generating the L mode data; and [01] is generated in the two columns of encoder lines [$LN_{162}$] generating the R mode data; respectively, which are output to the selection gate 183.

Also, when the sampling voltage $V_S$ is represented as $V_{128} < V_S < V_{RT}$, the output of the comparator $CU_{41}$ of the upper data comparator 181 becomes "H", and the output of the comparator $CU_{42}$ of the upper data comparator 182 becomes "L", so that the digital signals are output, i.e., "1" is output from the AND gate $AU_{41}$ of the upper data comparator 181, and "0" is output from the AND gates $AU_{42}$ and $AU_{43}$ of the upper data comparator 182, respectively.

As a result, a digital signal such as [100] is input to the upper data encoder 183. At the upper data encoder 183, using a so-called wired-OR circuit, [10] is generated in the two columns of encoder lines [$LN_{161}$] generating the L mode data; and [11] is generated in the two columns of encoder lines [$LN_{162}$] generating the R mode data; respectively, which are output to the selection gate 183.

In parallel with this, the transistors $Q_{163}$ of the respective switching blocks of the matrix circuit 180 connected to the control lines ($x_{41}$, $x_{42}$, and $x_{43}$) at which the digital output signal has become "1" among the respective AND gates $AU_{(41, 42, 43)}$ are controlled to turn ON in units of rows, and further a fine digitization of the quantization level is executed.

For example, when only the output of the AND gate $AU_{43}$ becomes the "1" level, the transistors $Q_{163}$ of the switching blocks $S_{g31}$ to $S_{g17}$ become ON, so that the reference voltages $V_{119}$ to $V_{125}$ divided by the reference resistors $R_{149}$ to $R_{156}$ and the sampling voltage $V_S$ are differentially amplified at the switching blocks $S_{g31}$ to $S_{g37}$ and compared by the lower data comparators 191 to 197.

Similarly, when the output of the AND gate $AU_{42}$ is at the "1" level, the switching blocks $S_{g21}$ to $S_{g27}$ are activated, so that the differential amplification operation is performed, and the comparison by the lower data comparator 191 to 197 is carried out.

In this way, in the lower data conversion codes, the sampled voltage $V_S$ and the reference voltage divided by the reference resistance of that row are compared in units of rows of the switching blocks, so that a digital signal in accordance with the results of comparison will be output from the AND gates $AD_{81}$ to $AD_{87}$ and $AD_{88}$ of the lower data comparators 191 to 197.

At this time, in a case where the input analog signal $V_{IN}$ when converting the upper significant 2 bits $D_1$ and $D_2$ is defined as $V_{IN} < V_{127}$, and the analog signal when converting the lower significant 2 bits $D_3$ and $D_4$ is defined as $V_{IN} < V_{122}$, or in a case where the input analog signal when converting the upper significant 2 bits $D_1$ and $D_2$ is defined as $V_{127} < V_{IN} < V_{128}$, and the analog signal when converting the lower significant 2 bits $D_3$ and $D_4$ is defined as $V_{118} < V_{IN}$, or in a case where the input analog signal when converting the upper significant 2 bits $D_1$ and $D_2$ is defined as $V_{128} < V_{IN}$, and the analog signal when converting the lower significant 2 bits $D_3$ and $D_4$ is defined as $V_{IN} < V_{114}$, and the signal of "1" level is output from a single AND gate among the AND gates $AD_{81}$ to $AD_{84}$ of the lower data comparators 191 to 194 to the lower data encoder 185, in the lower data encoder 185, the selection line $LN_{164}$ becomes "1".

As a result, the selection signal $SEL_{21}$ is input to the selection gate 186 as the "1" level, and the selection signal $SEL_{22}$ is input to the selection gate 186 as the "0" level.

In the selection gate 186, along with the fact that only the selection signal $SEL_{21}$ is input as the "1" level, only the AND gates $A_{51}$ and $A_{53}$ are activated.

To these AND gates $A_{51}$ and $A_{53}$, the bit data of the upper data side and lower data side of the upper significant data for the L mode generated in the line $LN_{121}$ of the upper data encoder 183 are respectively supplied.

Accordingly, in the selection gate 186, the respective bits of the upper significant data at the L mode are selected, and as a result, they are output as the upper significant data conversion codes $D_1$ and $D_2$ via the OR gates $OR_{41}$ and $OR_{42}$.

Concretely, when the sampling voltage $V_S$ of the analog signal $V_{IN}$ is defined as $V_{RB} < V_S < V_{127}$, the upper data conversion codes [$D_1$, $D_2$] are output as [00]; when $V_{127} < V_S < V_{128}$ stands, the upper significant data conversion codes [$D_1$, $D_2$] are output as [10]; and when $V_{128} < V_S < V_{RT}$ stands, the upper significant data conversion codes [$D_1$, $D_2$] are output as [10].

Also, in the lower data encoder 185, when the output of the AND gate $AD_{81}$ of the lower data comparator 191 is "1", the lower significant data $BD_{73}$ and $BD_{74}$ are generated as [11]; when the output of the AND gate $AD_{82}$ of the lower data comparator 192 is "1", the lower significant data $BD_{73}$ and $BD_{74}$ are generated as [10]; when the output of the AND gate $AD_{83}$ of the lower data comparator 193 is "1", the lower significant data $BD_{73}$ and $BD_{74}$ are generated as [01]; and when the output of the AND gate $AD_{84}$ of the lower data comparator 194 is "1", the lower significant data $BD_{73}$ and $BD_{74}$ are generated as [00], and the data $BD_{73}$ is output to the exclusive-OR gate $EXO_{41}$, and the data $BD_{74}$ is output to the exclusive-OR gate $EXO_{42}$.

In the exclusive-OR gates $EXO_{41}$ and $EXO_{42}$, when $V_{RB} < V_S < V_{127}$ and $V_{128} < V_S < V_{RT}$ stand, that is where the switching blocks $S_{g31}$ to $S_{g37}$ and $S_{g11}$ to $S_{g17}$ at the first row and third row from the bottom of the matrix circuit 180 are selected, since the direction of application of the reference voltage is the forward direction, the levels of the lower significant data are output as the lower significant data conversion codes $D_3$ and $D_4$ while inverting the output level of the lower data encoder 185.

Contrary to this, when $V_{127} < V_S < V_{128}$ stands, that is where the switching blocks $S_{g21}$ to $S_{g27}$ at the second row from the bottom of the matrix circuit 180 are selected, since the direction of application of the reference voltage is the inverse direction, the levels of the lower significant data are held at the output level of the lower data encoder 185 level and output as the lower significant data conversion codes $D_3$ and $D_4$.

Also, in a case where the input analog signal $V_{IN}$ when converting the upper significant 2 bits $D_1$ and $D_2$ is defined as $V_{IN}<V_{127}$, and the analog signal when converting the lower significant 2 bits $D_3$ and $D_4$ is defined as $V_{122}<V_{IN}$, or in a case where the input analog signal when converting the upper significant 2 bits $D_1$ and $D_2$ is defined as $_{127}<V_{IN}<V_{128}$, and the analog signal when converting the lower significant 2 bits $D_3$ and $D_4$ is defined as $V_{IN}<V_{118}$; or in a case where the input analog signal when converting the upper significant 2 bits $D_1$ and $D_2$ is defined as $V_{128}<V_{IN}$, and the analog signal when converting the lower significant 2 bits $D_3$ and $D_4$ is defined as $V_{114}<V_{IN}$, and the signal of "1" level is output from a single AND gate among the AND gates $AD_{85}$ to $AD_{87}$ and AND gate $AD_{88}$ of the lower data comparators 195 to 197 to the lower data encoder 185, in the lower data encoder 185, the selection line $LN_{165}$ becomes "1".

As a result, the selection signal $SEL_{22}$ is input to the selection gate 186 as the "1" level, and the selection signal $SEL_{21}$ is input to the selection gate 186 as the "0" level.

In the selection gate 186, along with the fact that only the selection signal $SEL_{22}$ is input as the "1" level, only the AND gates $A_{52}$ and $A_{54}$ are activated.

To these AND gates $A_{52}$ and $A_{54}$, the bit data of the upper data side and lower data side of the upper significant data for the R mode generated in the line $LN_{162}$ of the upper data encoder 183 are respectively supplied.

Accordingly, in the selection gate 186, the respective bits of the upper significant data at the R mode are selected, and as a result, they are output as the upper significant data conversion codes $D_1$ and $D_2$ via the OR gates $OR_{4\ 1}$ and $OR_{42}$.

Concretely, when the sampling voltage $V_S$ of the analog signal $V_{IN}$ is defined as $V_{RB}<V_S<V_{127}$, the upper data conversion codes $[D_1, D_2]$ are output as [01]; when $V_{127}<V_S<V_{128}$ stands, the upper significant data conversion codes $[D_1, D_2]$ are output as [01]; and when $V_{128}<V_S<V_{RT}$ stands, the upper significant data conversion codes $[D_1, D_2]$ are output as [11].

Also, in the lower data encoder 185, when the output of the AND gate $AD_{85}$ of the lower data comparator 195 is "1", the lower significant data $BD_{73}$ and $BD_{74}$ are generated as [11]; when the output of the AND gate $AD_{86}$ of the lower data comparator 196 is "1", the lower significant data $BD_{73}$ and $BD_{74}$ are generated as [10]; when the output of the AND gate $AD_{87}$ of the lower data comparator 197 is "1", the lower significant data $BD_{73}$ and $BD_{74}$ are generated as [01]; and when the output of the AND gate $AD_{88}$ is "1", the lower significant data $BD_{73}$ and $BD_{74}$ are generated as [00], and the data $BD_{73}$ is output to the exclusive-OR gate $EXO_{41}$, and the data $BD_{74}$ is output to the exclusive-OR gate $EXO_{42}$.

In the exclusive-OR gates $EXO_{41}$ and $EXO_{42}$, when $V_{RB}<V_S<V_{127}$ and $V_{128}<V_S<V_{RT}$ stand, that is where the switching blocks $S_{g31}$ to $S_{g37}$ and $S_{g11}$ to $S_{g17}$ of the first row and third row from the bottom of the matrix circuit 180 are selected, since the direction of application of the reference voltage is the forward direction, the levels of the lower significant data are output as the lower significant data conversion codes $D_3$ and $D_4$ while inverting the output level of the lower data encoder 185.

Contrary to this, when $V_{127}<V_S<V_{128}$ stands, that is where the switching blocks $S_{g21}$ to $S_{g27}$ at the second row from the bottom of the matrix circuit 180 are selected, since the direction of application of the reference voltage is the inverse direction, the levels of the lower significant data are held at the output level of the lower data encoder 185 as they are and output as the lower significant data conversion codes $D_3$ and $D_4$.

As explained above, according to the present embodiment, the lower data codes are divided to two groups, signals $SEL_{21}$ and $SEL_{22}$ for selecting the L mode data and R mode data are output from the lower data encoder 185 obtaining this group of conversion codes, so that the L mode data and R mode data output from the upper data encoder 183 are selected, thereby obtaining the upper data conversion codes $D_1$ and $D_2$, and therefore it is possible to use the selection signal directly for the selection of the upper significant data without the use of the inverted gate and inhibit gate as in the conventional circuit.

Accordingly, the input of the selection signal to the selection gate 186 is not delayed relative to the output of the upper data encoder 183, and thus the increase of speed of conversion processing can be achieved.

Also, in addition to the fact that the inverted gate and inhibit gate become unnecessary, the number of selection signals can be reduced to two, and also the number of the upper data codes to be selected and the number of the input gates of the selection gate can be reduced to two.

Further, the upper data comparator 181 detecting the change of the data between the third row and second row acts also as the upper data comparator for the uppermost stage of the matrix circuit 180, and the upper data comparator 182 detecting the change of the data between the second row and first row acts also as the upper data comparator for the lowermost stage of the matrix circuit 180, and therefore the number of the upper data comparators and the number of rows of the switching blocks which conventionally had to be $(2^a-1)$ and $2^a$, respectively can be reduced to $(2^a-2)$ and $(2^a-1)$ rows, respectively.

Accordingly, there is an advantage that an A/D converter circuit with which the reduction of the chip area and the reduction of the power consumption can be achieved can be realized.

An explanation will next be made of an eighth embodiment of the present invention.

Figure 25C:
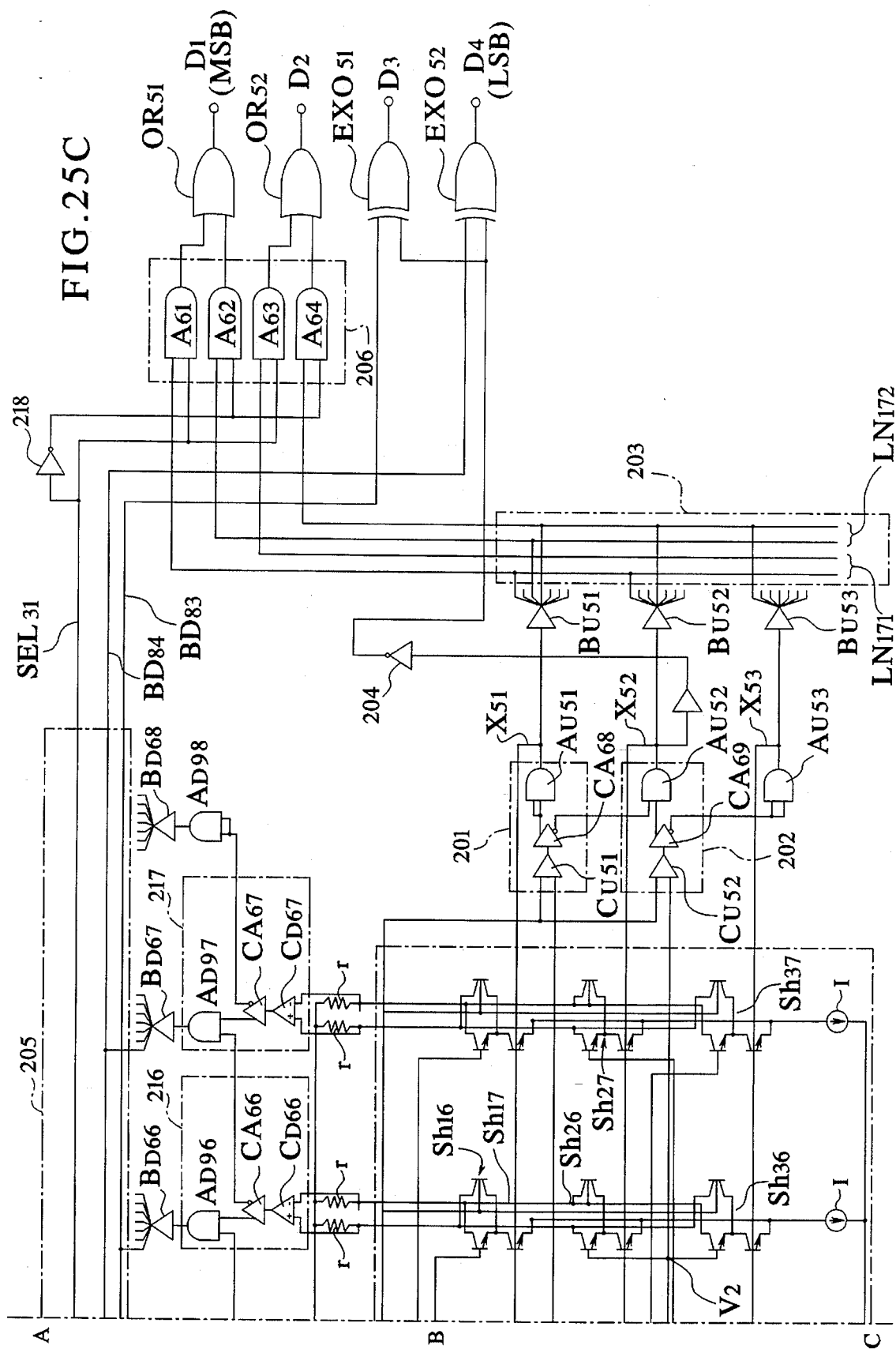

FIGS. 25A–25C are circuit diagrams showing the eighth embodiment of the A/D converter circuit according to the present invention.

The point of difference of the present embodiment from the above-mentioned seventh embodiment resides in the constitution that the number of the selection lines of the lower data encoder 205 is reduced to only one line, i.e., $LN_{174}$, to generate only one selection signal $SEL_{31}$ from among the selection signals, and a signal obtained by inverting the level of the selection signal $SEL_{31}$ at the inverter 218 is supplied as the signal in place of the selection signal $SEL_{22}$ to the other inputs of the AND gates $A_{62}$ and $A_{64}$ of the selection gate 260.

According to the present eighth embodiment, in addition to the effect of the above-described seventh embodiment, a simpler structure can be realized, and the chip area can be further reduced.

Note that, in the above-mentioned first and second embodiments, an explanation was made taking as an example an A/D converter circuit for four bits, but needless to say the present invention can be applied to an A/D converter circuit for more bits as well.

Also, in the above-mentioned seventh and eighth embodiments, the structure in which the other output pin buffers are arranged on the input side of the upper data encoder and the lower data encoder was shown, but these other output pin buffers are provided so as to reliably drive the upper data encoder and the lower data encoder, and it is necessary to provide the same according to a certain capacitance of the upper data encoder and the lower data encoder acting as a so-called load.

As explained above, according to the present invention, there are advantages such that the inverted gate and inhibit gate which have been conventionally necessary become unnecessary, and the increase of speed of conversion processing can be achieved.

Also, in addition to the fact that the inverted gate and inhibit gate become unnecessary, the number of the selection signals can be reduced, the number of the upper significant codes to be selected and the number of the input gates of the selection gates can be reduced, and further the number of the upper data comparators and the number of switching block rows of the data change point detection circuit can be reduced, and therefore there is an advantage that a reduction of the chip area and a reduction of the power consumption can be achieved.

Figure 26C:
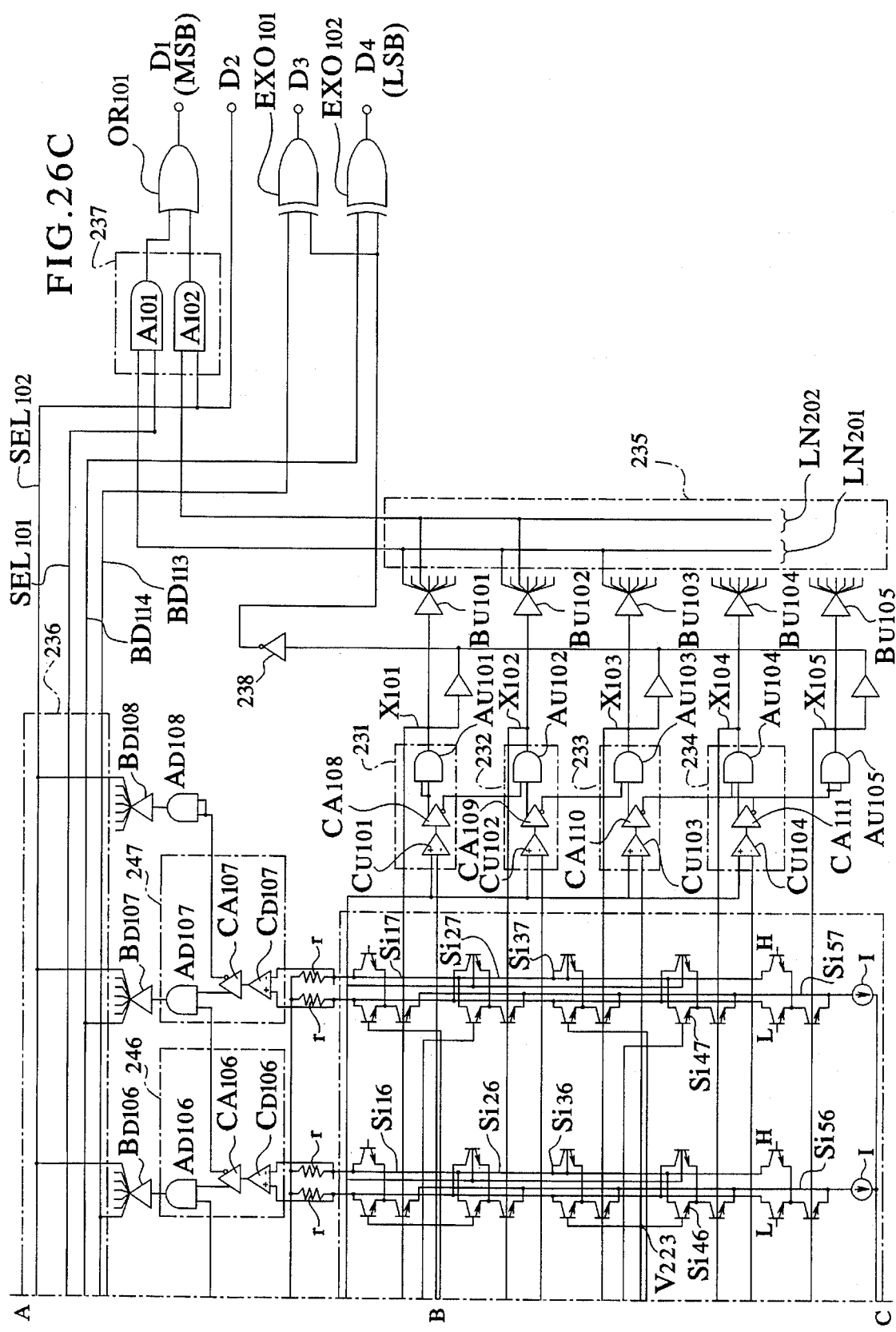

FIGS. 26A–26C are circuit diagrams showing a ninth embodiment of the A/D converter circuit according to the present invention.

In FIG. 26, 230 denotes a matrix circuit; 231 to 234 denote upper data comparators; 235, an upper data encoder; 241 to 247 denote lower data comparators; 236, a lower data encoder; 237, a selection gate; 238, an inverter; $R_{201}$ to $R_{216}$ denote reference resistance elements; $BU_{101}$ to $BU_{105}$, $BD_{101}$ and $BD_{107}$ denote multiple output pin buffers; $OR_{101}$ and $OR_{102}$ denote OR gates; and $EXO_{101}$ and $EXO_{102}$ denote exclusive-OR gates; respectively.

The matrix circuit 230 is constituted by the arrangement of 35 switching blocks $S_{i11}$ to $S_{i17}$, $S_{i21}$ to $S_{i27}$, $S_{i31}$ to $S_{i37}$, $S_{i41}$ to $S_{i47}$, and $S_{i51}$ to $S_{i57}$ in the form of a matrix comprising five rows and seven columns.

The respective switching blocks $S_{i11}$ to $S_{i17}$, $S_{i21}$ to $S_{i27}$, $S_{i31}$ to $S_{i37}$, $S_{i41}$ to $S_{i47}$, and $S_{i51}$ to $S_{i57}$ are constituted by differential type amplifiers comprising the npn-type transistors $Q_{201}$, $Q_{202}$, and $Q_{203}$.

Excluding the switching blocks $S_{i11}$ to $S_{i14}$ and $S_{i54}$ to $S_{i57}$, reference voltage obtained by dividing the reference voltages $V_{RT}$ to $V_{RB}$ by the reference resistance elements $R_{201}$ to $R_{216}$ are supplied to the base of one side transistors $Q_{201}$ constituting a so-called differential pair of the switching blocks, and analog signals $V_{IN}$ to be converted to the digital code are supplied to the base of the other side transistors $Q_{202}$, respectively.

Also, the emitters of the transistors $Q_{201}$ and $Q_{202}$ are connected to each other, and the middle point of connection thereof is connected to the current source I via the transistor $Q_{203}$ switched by the control signals $x_{101}$ to $x_{105}$, respectively.

Also, to the collectors of the transistors $Q_{201}$ and $Q_{202}$, the power source voltage $V_{DD}$ is supplied via the resistance element r, the output of which is input to the comparators $CD_{101}$ to $CD_{107}$ of the seven lower data comparators 241 to 247 as mentioned later, which act also as the initial stage amplifiers of the lower data comparators 241 to 247.

Also, the collectors of the transistors $Q_{101}$ and $Q_{102}$ of the switching block at the second row and the fourth row from the bottom of the diagram are connected to the line in an opposite direction to that for the collector output of the transistors $Q_{101}$ and $Q_{102}$ of the switching blocks of the first row and third row, and steps are taken so that the line of the serial reference resistance elements $R_{201}$ to $R_{216}$ to which the reference potential $V_{RT}$–$V_{RB}$ is applied can be formed by folding-back.

The reference resistance elements $R_{201}$ to $R_{216}$ are serially connected between the two reference potentials $V_{RT}$ and $V_{RB}$ and arranged by folding-back so as to extend over each predetermined number of rows, e.g., five rows in the present embodiment, to correspond to the matrix arrangement of the switching blocks in the matrix circuit 230.

Concretely, each two resistance elements $R_{216}$ and $R_{215}$ and $R_{202}$ and $R_{201}$ are serially connected at the first row and the fifth row from the bottom in the diagram, and the resistance elements $R_{214}$ to $R_{211}$, $R_{210}$ to $R_{207}$, and $R_{216}$ to $R_{213}$ are serially connected at the second row to the fourth row, respectively.

Viewing this folding-back arrangement of the resistance element columns from the reference potential $V_{RB}$ terminal side positioned on the left end and lower end side of the matrix circuit 180, the wiring pattern extended in the right direction in the diagram is folded-back between the switching block column of the fourth column from the left in the diagram and the switching block column of the fifth column, and two resistance elements $R_{216}$ and $R_{215}$ are connected in series corresponding to the arrangement position of the switching blocks $S_{i54}$ and $S_{i53}$ of the first row from the bottom, whereby the first row of resistance column is constituted.

The resistance column of the first row is folded-back between the switching block column of the third column and the switching block column of the second column, and four resistance elements $R_{214}$ to $R_{211}$ are connected in series between the switching block rows of the first row and the second row and corresponding to the arrangement position of the switching blocks $S_{i43}$ to $S_{i46}$ of the second row, whereby the resistance column of the second row is constituted.

The resistance column of the second row is folded-back between the switching block column of the fifth column and the switching block column of the sixth column, and four resistance elements $R_{210}$ to $R_{207}$ are connected in series between the switching block rows of the second row and the third row and corresponding to the arrangement position of the switching blocks $S_{i36}$ to $S_{i33}$ at the third row, whereby the resistance column of the third row is constituted.

The resistance column of the third row is folded-back between the switching block column of the third column and the switching block column of the second column, and four resistance elements $R_{206}$ to $R_{203}$ are connected in series between the switching block rows of the fourth row and the fifth row and corresponding to the arrangement position of the switching blocks $S_{i23}$ to $S_{i26}$ of the fourth row, whereby the resistance column of the fourth row is constituted.

The resistance column of the fourth row is folded-back between the switching block column of the fifth column and the switching block column of the sixth column, two resistance elements $R_{202}$ and $R_{201}$ are connected in series between the switching block rows at the fourth row and the fifth row and corresponding to the arrangement position of the switching blocks $S_{i16}$ to $S_{i15}$ at the fifth row, and one end of the resistance element $R_{201}$ is connected to the terminal of the reference potential $V_{RT}$, whereby the resistance column of the fifth row is constituted.

Namely, the resistance columns at the first row and the fifth row are arranged with a deviation of a half cycle with respect to the resistance columns of the second row to the fourth row so that the position exhibiting the lowest value of the reference voltage (connection point between the reference potential $V_{RB}$ terminal and the resistance element $R_{216}$) and the position exhibiting the highest value (connection point between the reference potential $V_{RT}$ terminal and the resistance element $R_1$) are positioned at an intermediate point in the row direction of the switching blocks arranged in the form of the matrix.

Such an arrangement structure of resistance columns is made for the purpose of dividing the switching block columns comprising seven columns into two groups, i.e. the group comprising the switching block columns of from the first column to the fourth column and the group of the switching block columns of from the fifth column to the seventh column at the switching point between upper data and lower data as will be mentioned later.

Also, the voltages $V_{221}$ and $V_{224}$ generated between the rows of the respective resistance columns are supplied to the upper data comparators 231 to 234 as the reference voltages obtained by dividing the reference potentials $V_{RT}$ to $V_{RB}$ by rough quantization, respectively.

In the structure of FIG. 26, when assuming that the voltage between the reference potentials $V_{RT}$ to $V_{RB}$ is $V_{REF}$, the respective reference voltages $V_{221}$ to $V_{224}$ become the following values, respectively:

$$V_{221}=(14/16)\cdot V_{REF}$$

$$V_{222}=(10/16)\cdot V_{REF}$$

$$V_{223}=(6/16)\cdot V_{REF}$$

$$V_{224}=(2/16)\cdot V_{REF}$$

Further, wiring is carried out so that the respective reference voltages $V_{201}$ to $V_{215}$ divided by the reference resistance elements $R_{201}$ to $R_{216}$ are supplied to the base of the transistor $Q_{201}$ of the predetermined switching block.

Concretely, a reference voltage $V_{201}$ [$=(15/16)\cdot V_{REF}$] generated at the connection point between the resistance elements $R_{201}$ and $R_{202}$ is supplied to the bases of the transistors $Q_{201}$ of the switching blocks $S_{i15}$ and $S_{i27}$.

A reference voltage $V_{202}$ [$=V_{221}=(14/16)\cdot V_{REF}$] generated at the connection point between the resistance elements $R_{202}$ and $R_{203}$ is supplied to the bases of the transistors $Q_{201}$ of the switching blocks $S_{i16}$ and $S_{i26}$.

A reference voltage $V_{203}$ [$=(13/16)\cdot V_{REF}$] generated at the connection point between the resistance elements $R_{203}$ and $R_{204}$ is supplied to the bases of the transistors $Q_{201}$ of the switching blocks $S_{i17}$ and $S_{i25}$.

A reference voltage $V_{204}$ [$=(12/16)\cdot V_{REF}$] generated at the connection point between the resistance elements $R_{204}$ and $R_{205}$ is supplied to the base of the transistor $Q_{201}$ of the switching block $S_{i24}$.

A reference voltage $V_{205}$ [$=(11/16)\cdot V_{REF}$] generated at the connection point between the resistance elements $R_{205}$ and $R_{206}$ is supplied to the bases of the transistors $Q_{201}$ of the switching blocks $S_{i23}$ and $S_{i31}$.

A reference voltage $V_{206}$ [$=V_{222}=(10/16)\cdot V_{REF}$] generated at the connection point between the resistance elements $R_{206}$ and $R_{207}$ is supplied to the bases of the transistors $Q_{201}$ of the switching blocks $S_{i22}$ and $S_{i32}$.

A reference voltage $V_{207}$ [$=(9/16)\cdot V_{REF}$] generated at the connection point between the resistance elements $R_{207}$ and $R_{208}$ is supplied to the bases of the transistors $Q_{201}$ of the switching blocks $S_{i21}$ and $S_{i33}$.

A reference voltage $V_{208}$ [$=(8/16)\cdot V_{REF}$] generated at the connection point between the resistance elements $R_{208}$ and $R_{209}$ is supplied to the base of the transistor $Q_{201}$ of the switching block $S_{i34}$.

A reference voltage $V_{209}$ [$=(7/16)\cdot V_{REF}$] generated at the connection point between the resistance elements $R_{209}$ and $R_{210}$ is supplied to the bases of the transistors $Q_{201}$ of the switching blocks $S_{i35}$ and $S_{i47}$.

A reference voltage $V_{210}$ [$=V_{223}=(6/16)\cdot V_{REF}$] generated at the connection point between the resistance elements $R_{210}$ and $R_{211}$ is supplied to the bases of the transistors $Q_{201}$ of the switching blocks $S_{i36}$ and $S_{i46}$.

A reference voltage $V_{211}$ [$=(5/16)\cdot V_{REF}$] generated at the connection point between the resistance elements $R_{211}$ and $R_{212}$ is supplied to the bases of the transistors $Q_{201}$ of the switching blocks $S_{i37}$ and $S_{i45}$.

A reference voltage $V_{212}$ [$=(4/16)\cdot V_{REF}$] generated at the connection point between the resistance elements $R_{212}$ and $R_{213}$ is supplied to the base of the transistor $Q_{201}$ of the switching block $S_{i44}$.

A reference voltage $V_{213}$ [$=(3/16)\cdot V_{REF}$] generated at the connection point between the resistance elements $R_{213}$ and $R_{214}$ is supplied to the bases of the transistors $Q_{201}$ of the switching blocks $S_{i43}$ and $S_{i51}$.

A reference voltage $V_{214}$ [$=V_{224}=(2/16)\cdot V_{REF}$] generated at the connection point between the resistance elements $R_{214}$ and $R_{215}$ is supplied to the bases of the transistors $Q_{201}$ of the switching blocks $S_{i42}$ and $S_{i52}$.

A reference voltage $V_{215}$ [$=(1/16)\cdot V_{REF}$] generated at the connection point between the resistance elements $R_{215}$ and $R_{216}$ is supplied to the bases of the transistors $Q_{201}$ of the switching blocks $S_{i41}$ and $S_{i53}$.

Upper data comparators 231, 232, 233 and 234 respectively are provided with comparators $CU_{101}$ to $CU_{104}$, complementary-type output amplifiers $CA_{101}$ to $CA_{105}$, and AND gates $AU_{101}$ to $AU_{104}$.

An analog signal $V_{IN}$ is supplied to one input of the comparator $CU_{101}$ of the upper data comparator 231, and a reference voltage $V_{221}$ [$=(14/16)\cdot V_{REF}$] obtained by dividing the reference potentials $V_{RT}$ to $V_{RB}$ by rough quantization is supplied to the other input.

The analog signal $V_{IN}$ is supplied to one input of the comparator $CU_{102}$ of the upper data comparator 232, and a reference voltage $V_{222}$ [$=(10/16)\cdot V_{REF}$] obtained by dividing the reference potentials $V_{RT}$ to $V_{RB}$ by rough quantization is supplied to the other input.

The analog signal $V_{IN}$ is supplied to one input of the comparator $CU_{103}$ of the upper data comparator 233, and a reference voltage $V_{223}$ [$=(6/16)\cdot V_{REF}$] obtained by dividing the reference potentials $V_{RT}$ to $V_{RB}$ by rough quantization is supplied to the other input.

The analog signal $V_{IN}$ is supplied to one input of the comparator $CU_{104}$ of the upper data comparator 234, and a reference voltage $V_{224}$ [$=(2/16)\cdot V_{REF}$] obtained by dividing the reference potentials $V_{RT}$ to $V_{RB}$ by rough quantization is supplied to the other input.

The output of comparator $CU_{101}$ of the upper data comparator 231 is connected to the input of the output amplifier $CA_{108}$, the positive output thereof is connected to both inputs of a 2-input AND gate $AU_{101}$, and the negative output is connected to one input of the 2-input AND gate $AU_{102}$ of the upper data comparator 232.

The output of comparator $CU_{102}$ of the upper data comparator 232 is connected to the input of the output amplifier $CA_{109}$, the positive output thereof is connected to the other input of the 2-input AND gate $AU_{102}$, and the negative output is connected to one input of the 2-input AND gate $AU_{103}$ of the upper data comparator 233.

The output of comparator $CU_{103}$ of the upper data comparator 233 is connected to the input of the output amplifier $CA_{110}$, the positive output thereof is connected to the other input of a 2-input AND gate $AU_{103}$, and the negative output is connected to one input of the 2-input AND gate $AU_{104}$ of the upper data comparator 234.

The output of comparator $CU_{104}$ of the upper data comparator 234 is connected to the input of the output amplifier $CA_{111}$, the positive output thereof is connected to the other input of a 2-input AND gate $AU_{104}$, and the negative output is connected to the two inputs of the 2-input AND gate $AU_{105}$.

The outputs of the respective comparators $CU_{101}$ to $CU_{104}$ of the upper data comparators 231 to 234 constituted in this way become the level of "H" or "L" corresponding to the level of the sampled analog signal $V_{In}$, and only one among the respective AND gates $AU_{101}$ to $AU_{104}$ outputs the "1" level.

The output of the AND gate $AU_{101}$ of the upper data comparator 231 is connected via the buffer $BU_{101}$ to the upper data encoder 235 and, at the same time, connected to the bases of the transistors $Q_{203}$ of the switching blocks $S_{i11}$ to $S_{i17}$ and connected to the input of the inverter 238 via the buffer.

The AND gate $AU_{102}$ of the upper data comparator 232 is connected via the buffer $BU_{102}$ to the upper data encoder 235 and, at the same time, connected to the bases of the transistors $Q_{203}$ of the switching blocks $S_{i21}$ to $S_{i27}$.

The output of the AND gate $AU_{103}$ of the upper data comparator 233 is connected via the buffer $BU_{103}$ to the upper data encoder 235 and, at the same time, connected to the bases of the transistors $Q_{203}$ of the switching blocks $S_{i31}$ to $S_{i37}$ and connected to the input of the inverter 238 via the buffer.

The AND gate $AU_{104}$ of the upper data comparator 234 is connected via the buffer $BU_{104}$ to the upper data encoder 235 and, at the same time, connected to the bases of the transistors $Q_{203}$ of the switching blocks $S_{i41}$ to $S_{i47}$.

The output of the AND gate $AU_{105}$ is connected to the input of the buffer $BU_{105}$ and, at the same time, connected to the bases of the transistors $Q_{203}$ of the switching blocks $S_{i51}$ to $S_{i57}$ and connected to the input of the inverter 238 via the buffer.

The upper data encoder 235 is constituted by an encoder line $LN_{201}$ generating the data for an L (left) mode, and an encoder line $LN_{202}$ generating the data for an R (right) mode.

Namely, in the upper data encoder 235, respective encoder lines $LN_{201}$ and $LN_{202}$ are set corresponding to a first group of from the first column to the fourth column arranged on the left side from the center of the matrix circuit 230 and a second group of from the fifth column to the seventh column arranged on the right side among the switching blocks $S_{i11}$ to $S_{i17}$, $S_{i21}$ to $S_{i27}$, $S_{i31}$ to $S_{i37}$, $S_{i41}$ to $S_{i47}$ and $S_{i51}$ to $S_{i57}$ arranged in the matrix circuit 230. The data for the bits excluding the least significant bit (lower data side bit of the upper significant bits) among the upper significant 2 bits, in the case of the present embodiment, for the most significant bit (upper data side bit of the upper significant bits) among the upper significant 2 bits are set.

FIG. 27 shows the correspondence between the outputs of the respective AND gates $AU_{101}$, $AU_{102}$, $AU_{103}$, $AU_{104}$, and $AU_{105}$ of the upper data comparators 231 to 234 and the set output data code pattern of the respective encoder lines $LN_{201}$ and $LN_{202}$ of the upper data encoder 235.

The setting of data is carried out as shown in FIG. 28 in accordance with the most significant bit in the output data of the left side column group (corresponding to the L mode) and the right side column group (corresponding to the R mode) when dividing the same to two groups around the intermediate point C.

The lower data comparators 241 to 247 respectively are provided with comparators $CD_{101}$ to $CD_{107}$, complementary-type output amplifiers $CA_{101\ to\ 107}$, and AND gates $AD_{101}$ to $AD_{107}$.

To one input of the comparator $CD_{101}$ of the lower data comparator 241 is supplied the collector outputs of the transistors $Q_{201}$ of the switching block $S_{i11}$, $S_{i31}$, and $S_{i51}$ at the first column of the matrix circuit 230 and the collector outputs of the transistors $Q_{202}$ of the switching blocks $S_{i21}$ and $S_{i41}$, and to the other input is supplied the collector outputs of the transistors $Q_{201}$ of the switching blocks $S_{i21}$ and $S_{i41}$ and the collector outputs of the transistors $Q_{202}$ of the switching blocks $S_{i11}$, $S_{i31}$, and $S_{i51}$.

To one input of the comparator $CD_{102}$ of the lower data comparator 242 is supplied the collector outputs of the transistors $Q_{201}$ of the switching block $S_{i12}$, $S_{i32}$, and $S_{i52}$ at the second column of the matrix circuit 230 and the collector outputs of the transistors $Q_{202}$ of the switching blocks $S_{i22}$ and $S_{i42}$, and to the other input is supplied the collector outputs of the transistors $Q_{201}$ of the switching blocks $S_{i22}$ and $S_{i42}$ and the collector outputs of the transistors $Q_{202}$ of the switching blocks $S_{i12}$, $S_{i32}$, and $S_{i52}$.

To one input of the comparator $CD_{103}$ of the lower data comparator 243 is supplied the collector outputs of the transistors $Q_{201}$ of the switching block $S_{i13}$, $S_{i33}$, and $S_{i53}$ at the third column of the matrix circuit 230 and the collector outputs of the transistors $Q_{202}$ of the switching blocks $S_{i23}$ and $S_{i43}$, and to the other input is supplied the collector outputs of the transistors $Q_{201}$ of the switching blocks $S_{i23}$ and $S_{i43}$ and the collector outputs of the transistors $Q_{202}$ of the switching blocks $S_{i13}$, $S_{i33}$, and $S_{i53}$.

To one input of the comparator $CD_{104}$ of the lower data comparator 244 is supplied the collector outputs of the transistors $Q_{201}$ of the switching block $S_{i14}$, $S_{i34}$, and $S_{i54}$ at the fourth column of the matrix circuit 230 and the collector outputs of the transistors $Q_{202}$ of the switching blocks $S_{i24}$ and $S_{i44}$, and to the other input is supplied the collector outputs of the transistors $Q_{201}$ of the switching blocks $S_{i24}$ and $S_{i44}$ and the collector outputs of the transistors $Q_{202}$ of the switching blocks $S_{i14}$, $S_{i34}$, and $S_{i54}$.

To one input of the comparator $CD_{105}$ of the lower data comparator 245 is supplied the collector outputs of the transistors $Q_{201}$ of the switching block $S_{i15}$, $S_{i35}$, and $S_{i55}$ at the fifth column of the matrix circuit 230 and the collector outputs of the transistors $Q_{202}$ of the switching blocks $S_{i25}$ and $S_{i45}$, and to the other input is supplied the collector outputs of the transistors $Q_{201}$ of the switching blocks $S_{i25}$ and $S_{i45}$ and the collector outputs of the transistors $Q_{202}$ of the switching blocks $S_{i15}$, $S_{i35}$, and $S_{i55}$.

To one input of the comparator $CD_{106}$ of the lower data comparator 246 is supplied the collector outputs of the transistors $Q_{201}$ of the switching block $S_{i16}$, $S_{i36}$, and $S_{i56}$ at the sixth column of the matrix circuit 230 and the collector outputs of the transistors $Q_{202}$ of the switching blocks $S_{i26}$ and $S_{i46}$, and to the other input is supplied the collector outputs of the transistors $Q_{201}$ of the switching blocks $S_{i26}$ and $S_{i46}$ and the collector outputs of the transistors $Q_{202}$ of the switching blocks $S_{i16}$, $S_{i36}$, and $S_{i56}$.

To one input of the comparator $CD_{107}$ of the lower data comparator 247 is supplied the collector outputs of the transistors $Q_{201}$ of the switching block $S_{i17}$, $S_{i37}$, and $S_{i57}$ at the seventh column of the matrix circuit 230 and the collector outputs of the transistors $Q_{202}$ of the switching blocks $S_{i27}$ and $S_{i47}$, and to the other input is supplied the collector outputs of the transistors $Q_{201}$ of the switching blocks $S_{i27}$ and $S_{i47}$ and the collector outputs of the transistors $Q_{202}$ of the switching blocks $S_{i17}$, $S_{i37}$, and $S_{i57}$.

The output of the comparator $CD_{101}$ of the lower data comparator 241 is connected to the input of the output amplifier $CA_{101}$, the positive output thereof is connected to both inputs of the 2-input AND gate $AD_{101}$, and the negative output is connected to one input of the 2-input AND gate $AD_{102}$ of the lower data comparator 242.

The output of the comparator $CD_{102}$ of the lower data comparator 242 is connected to the input of the output amplifier $CA_{102}$, the positive output thereof is connected to the other input of the 2-input AND gate $AD_{102}$, and the negative output is connected to one input of the 2-input AND gate $AD_{103}$ of the lower data comparator 243.

The output of the comparator $CD_{103}$ of the lower data comparator 243 is connected to the input of the output amplifier $CA_{103}$, the positive output thereof is connected to the other input of the 2-input AND gate $AD_{103}$, and the negative output is connected to one input of the 2-input AND gate $AD_{104}$ of the lower data comparator 244.

The output of the comparator $CD_{104}$ of the lower data comparator 244 is connected to the input of the output amplifier $CA_{104}$, the positive output thereof is connected to the other input of the 2-input AND gate $AD_{104}$, and the negative output is connected to one input of the 2-input AND gate $AD_{105}$ of the lower data comparator 245.

The output of the comparator $CD_{105}$ of the lower data comparator 245 is connected to the input of the output amplifier $CA_{105}$, the positive output thereof is connected to the other input of the 2-input AND gate $AD_{105}$, and the negative output is connected to one input of the 2-input AND gate $AD_{106}$ of the lower data comparator 246.

The output of the comparator $CD_{106}$ of the lower data comparator 246 is connected to the input of the output amplifier $CA_{106}$, the positive output thereof is connected to the other input of the 2-input AND gate $AD_{106}$, and the negative output is connected to one input of the 2-input AND gate $AD_{107}$ of the lower data comparator 247.

The output of the comparator $CD_{107}$ of the lower data comparator 247 is connected to the input of the output amplifier $CA_{107}$, the positive output thereof is connected to the other input of the 2-input AND gate $AD_{107}$, and the negative output is connected to both inputs of the 2-input AND gate $AD_{108}$.

The outputs of the respective comparators $CD_{101}$ to $CD_{107}$ of the lower data comparators 241 to 247 constituted in this way become the level of the two inputs, and only one among the respective AND gates $AD_{101}$ to $AD_{108}$ outputs the "1" level.

The output of the AND gates $AD_{101}$ to $AD_{107}$ and $AD_{108}$ of the lower data comparator 241 to 247 are connected via the buffers $BD_{101}$ to $BD_{108}$ to the lower data encoder 236.

The lower data encoder 236 is comprised of a data line $LN_{203}$ generating the lower significant data $BD_{113}$ and $DB_{114}$, a selection line $LN_{204}$ generating a selection signal $SEL_{101}$ indicating that one of the outputs of the AND gates $AD_{101}$ and $AD_{104}$ of the lower data comparators 241 to 244 becomes "1"; and a selection line $LN_{205}$ generating the selection signal $SEL_{102}$ indicating that one of the outputs of the AND gates $AD_{105}$ to $AD_{107}$ and $AD_{108}$ of the lower data comparators 245 to 247 becomes "1".

The selection signal $SEL_{101}$ is set for selecting the upper significant data of the L mode mentioned above, and the selection signal $SEL_{102}$ is set for selecting the upper significant data of the R mode.

FIG. 28 shows the correspondence between the outputs of the upper data side AND gates $AU_{101}$ to $AU_{105}$ and the lower data side AND gates $AD_{101}$ to $AD_{108}$ and the output conversion code data.

As mentioned above, in the matrix circuit 230 in the present embodiment, the switching blocks are divided into two in the row direction, and at this division point C, as seen from FIG. 28, when paying attention to the upper significant 2 bits of the output conversion codes $D_1$ to $D_4$, division is made at the point at which the value of the upper significant 2 bits is switched.

Further, the lower data encoder 236 outputs the selection signal $SEL_{102}$ as the conversion code $D_2$ on the lower data side (least significant bit of the upper significant bits) of the upper significant data excluded from the set data of the upper data encoder 235 based on a fact that, when paying attention to the upper significant 2 bits of the output conversion codes $D_1$ to $D_4$, there is a relationship of inversion of the level in the lower data side bits thereof between the L (left) side and the R (right side) around the intermediate point C.

The selection gate 237 is constituted by AND gates $AD_{101}$ and $AD_{102}$, selects a single upper significant data (the most significant bit among the upper significant bits) from among the respective upper significant data of the L mode and the R mode output from the upper data encoder 235 using the selection signals $SEL_{101}$ to $SEL_{102}$ output from the lower data encoder 236, and outputs the same as the conversion code $D_1$ via the OR gate $OR_{101}$.

[0065]

Concretely, one input terminal of the AND gate $A_{101}$ is connected to the encoder line $LN_{201}$ generating the data for the L mode of the upper data encoder 235, and the other input terminal is connected to the selection line $LN_{204}$ outputting the selection signal $SEL_{101}$ of the lower data encoder 236.

One input terminal of the AND gate $A_{102}$ is connected to the encoder line $LN_{202}$ generating the data for the R mode of the upper data encoder 235, and the other input terminal is connected to the selection line $LN_{205}$ outputting the selection signal $SEL_{102}$ of the lower data encoder 236.

The outputs of these AND gates $A_{101}$ and $A_{102}$ are connected to respective input terminals of the 2-input OR gate $OR_{101}$.

The exclusive-OR gate $EXO_{101}$ obtains the exclusive-OR between the lower significant data $BD_{113}$ output from one line of the data line $LN_{203}$ of the lower data encoder 236 and the signal obtained by inverting the sum of the output levels of the AND Gates $AU_{101}$, $AU_{103}$, or $AU_{105}$ of the upper data comparators 231 and 233 by the inverter 238 and outputs the result thereof as the lower significant data conversion code $D_3$.

The exclusive-OR gate $EXO_{102}$ obtains the exclusive-OR between the lower significant data $BD_{114}$ output from one line of the data line $LN_{203}$ of the lower data encoder 236 and the signal obtained by inverting the sum of the output levels of the AND gates $AU_{101}$, $AU_{103}$, or $AU_{105}$ of the upper data comparators 231 and 233 by the inverter 238 and outputs the result thereof as the lower significant data conversion code $D_4$.

Next, an explanation will be made of the operation by the above-described structure.

For example, when the sampling voltage $V_S$ of the sampled analog signal is represented as $V_{RB} < V_S < V_{224}$, the outputs of the comparators $CU_{101}$ to $CU_{104}$ of the upper data comparators 231 to 234 become all "L", so that the digital signals are output, i.e., "0" is output from the AND gates $AU_{101}$ to $AU_{104}$, and "1" is output from the $AU_{105}$, respectively.

As a result, a digital signal such as [0000] is input to the upper data encoder 235. At the upper data encoder 235, using a so-called wired-OR circuit, the upper significant data of [0] are respectively generated in the encoder line $[LN_{201}]$ generating the L mode data and the encoder line $[LN_{202}]$ generating the R mode data, which are output to the selection gate 235.

Also, when the sampling voltage $V_S$ of the sampled analog signal is represented as $V_{224} < V_S < V_{223}$, the outputs of the comparators $CU_{101}$ to $CU_{103}$ of the upper data comparators 231 to 233 become all "H", so that the digital signals are output i.e., "0" is output from the AND gates $AU_{101}$ to $AU_{103}$ and $AU_{105}$ of the upper data comparators 231 to 233, and "1" is output from the $AU_{104}$ of the upper data comparator 234, respectively.

As a result, a digital signal such as [0001] is input to the upper data encoder 235. At the upper data encoder 235, using a so-called wired-OR circuit, the upper significant data of [0] is generated in the encoder line $[LN_{201}]$ generating the L mode data, and the upper significant data of [0] is generated in the encoder line $[LN_{202}]$ generating the R mode data, respectively, which are output to the selection gate 235.

Also, when the sampling voltage $V_S$ is represented as $V_{223}<V_S<V_{222}$, similarly the digital signals are output, i.e., "0" is output from the upper significant side AND gates $AU_{101}$, $AU_{102}$, $AU_{104}$, and $AU_{105}$, and "1" is output from the AND gate $AU_{103}$, respectively.

As a result, a digital signal such as [0010] is input to the upper data encoder 235, and the upper significant data are output, i.e.m [1] is output from the line $[LN_{201}]$, and [0] is output from the line $[LN_{202}]$, to the selection gate 235.

Further, when the sampling voltage $V_S$ is represented as $V_{222}<V_S<V_{221}$, similarly the digital signals are output, i.e., "0" is output from the upper significant side AND gates $AU_{101}$, $AU_{103}$, $AU_{104}$, and $AU_{105}$, and "1" is output from the AND gate $AU_{102}$, respectively.

As a result, a digital signal such as [0100] is input to the upper data encoder 235, and the upper significant data are output, i.e. [1] is output from the line $[LN_{201}]$, and [1] is output from the line $[LN_{202}]$, to the selection gate 235.

Similarly, when the sampling voltage $V_S$ is represented as $V_{221}<V_S<V_{RT}$, the digital signals are output, i.e., "0" is output from the upper significant side AND gates $AU_{102}$, $AU_{103}$, $AU_{104}$, and $AU_{105}$, and "1" is output from the AND gate $AU_{101}$, respectively.

As a result, a digital signal such as [1000] is input to the upper data encoder 235, and the upper significant data are output, i.e., [1] is output from the line $[LN_{201}]$, and [1] is output from the line $[LN_{202}]$, to the selection gate 235.

In parallel with this, the transistors $Q_{203}$ of the respective switching blocks of the matrix circuit 230 connected to the control lines ($x_{101}$, $x_{102}$, $x_{103}$, $x_{104}$, and $x_{105}$) at which the digital output signal has become "1" among the respective AND gates $AU_{(101, 102, 103, 104, 105)}$ are controlled to turn ON in units of rows, and further a fine digitization of the quantization level is executed.

For example, when only the output of the AND gate $AU_{103}$ becomes the "1" level, the transistors $Q_{203}$ of the switching blocks $S_{i31}$ to $S_{i37}$ become ON, so that the reference voltages $V_{205}$ to $V_{211}$ divided by the reference resistors $R_{206}$ to $R_{211}$ and the sampling voltage $V_S$ are differentially amplified at the switching blocks $S_{i33}$ to $S_{i36}$, and compared by the lower data comparators 241 to 247.

Similarly, when the output of the AND gate $AU_{102}$ is at the "1" level, the switching blocks $S_{i21}$ to $S_{i27}$ are activated, so that a differential amplification operation is performed, and the comparison by the lower data comparators 241 to 247 is carried out.

In this way, in the lower data conversion codes, the sampled voltage $V_S$ and the reference voltage divided by the reference resistance of that row are compared in units of rows of the switching blocks, so that the digital signal in accordance with the result of comparison will be output from the AND gates $AD_{101}$ to $AD_{107}$ and $AD_{108}$ of the lower data comparators 241 to 247.

At this time, where the input analog signal when converting the upper significant 2 bits $D_1$ and $D_2$ is defined as $V_{224}>V_{IN}$, and the input analog signal when converting the lower significant 2 bits $D_3$ and $D_4$ is defined as $V_{RB}<V_{IN}<[(V_{224}+V_{223})/2]$; or where the input analog signal when converting the upper significant 2 bits $D_1$ and $D_2$ is defined as $V_{224}<V_{IN}<V_{223}$, and the input analog signal when converting the lower significant 2 bits $D_3$ and $D_4$ is defined as $V_{RB}<V_{IN}<[(V_{224}+V_{223})/2]$; or where the input analog signal when converting the upper significant 2 bits $D_1$ and $D_2$ is defined as $V_{223}<V_{IN}<V_{222}$, and the input analog signal when converting the lower significant 2 bits $D_3$ and $D_4$ is defined as $[(V_{223}+V_{222})/2]<V_{IN}<[(V_{221}+V_{222})/2]$; or where the input analog signal when converting the upper significant 2 bits $D_1$ and $D_2$ is defined as $V_{222}<V_{IN}<V_{221}$, and the input analog signal when converting the lower significant 2 bits $D_3$ and $D_4$ is defined as $[(V_{223}+V_{222})/2]<V_{IN}<[(V_{221}+V_{222})/2]$, in the lower data encoder 236, only the selection line $LN_{204}$ becomes "1". As a result, the selection signal $SEL_{101}$ is input to the selection gate 237 as the "1" level, and the selection signal $SEL_{102}$ is input to the selection gate 237 as the "0" level.

In the selection gate 237, along with the fact that only the selection signal $SEL_{101}$ is input as the "1" level, only the AND gate $A_{101}$ is activated.

To the AND gate $A_{101}$, the upper data side bit data of the upper significant data for the L mode generated in the line $LN_{201}$ of the upper data encoder 235 is supplied.

Accordingly, in the selection gate 237, the bits of the upper significant data at the L mode are selected, and as a result, they are output as the upper significant data conversion code $D_1$ via the OR gate $OR_{101}$.

At this time, in parallel with the output of the upper data conversion code $D_1$, the selection signal $SEL_{102}$ is output as the upper significant data conversion code $D_2$ while holding its level "0" as it is.

Concretely, when the sampling voltage $V_S$ of the analog signal $V_{IN}$ is defined as $V_{RB}<V_S<V_{224}$, the upper data conversion code $[D_1, D_2]$ is output as [00]; when $V_{224}<V_S<V_{223}$ stands, the upper data conversion code $[D_1, D_2]$ is output as [00]; when $V_{223}<V_S<V_{222}$ stands, the upper data conversion code $[D_1, D_2]$ is output as [10]; and when $V_{222}<V_S<V_{221}$ stands, the upper data conversion code $[D_1, D_2]$ is output as [10].

Note that, when $V_{221}<V_S<V_{RT}$, the upper significant data conversion code $[D_1, D_2]$ outputs [11], but this code will not be selected.

Also, in the lower data encoder 236, when the output of the AND gate $AD_{101}$ of the lower data comparator 241 is "1", the lower significant data $BD_{113}$ and $BD_{114}$ are generated as [11]; when the output of the AND gate $AD_{102}$ of the lower data comparator 242 is "1", the lower significant data $BD_{113}$ and $BD_{114}$ are generated as [10]; when the output of the AND gate $AD_{103}$ of the lower data comparator 243 is "1", the lower significant data $BD_{113}$ and $BD_{114}$ are generated as [01]; and when the output of the AND gate $AD_{104}$ of the lower data comparator 244 is "1", the lower significant data $BD_{113}$ and $BD_{114}$ are generated as [00], the data $BD_{113}$ is output to the exclusive-OR gate $EXO_{101}$, and the data $BD_{114}$ is output to the exclusive-OR gate $EXO_{102}$.

In the exclusive-OR gates $EXO_{101}$ and $EXO_{102}$, when $V_{224}<V_S<V_{223}$ and $V_{222}<V_S<V_{221}$ stand, that is where the switching blocks $S_{i41}$ to $S_{i47}$ and $S_{i21}$ to $S_{i27}$ at the second row and fourth row from the bottom of the matrix circuit 230 are selected, since the direction of application of the reference voltage is the forward direction, the levels of the lower significant data are output as the lower significant data conversion codes $D_3$ and $D_4$ while inverting the output level of the lower data encoder 236.

Contrary to this, when $V_{RB}<V_S<V_{224}$, $V_{223}<V_S<V_{222}$ and $V_{221}<V_S<V_{RT}$ stand, that is where the switching blocks $S_{i51}$ to $S_{i57}$, $S_{i31}$ to $S_{i37}$ and $S_{i11}$ to $S_{i17}$ at the first row, third row, and fifth row from the bottom of the matrix circuit 230 are selected, since the direction of application of the reference voltage is the inverse direction, the levels of the lower significant data are held at the output level of the lower data encoder 236 as they are and output as the lower significant data conversion codes $D_3$ and $D_4$.

Also, where the input analog signal when converting the upper significant 2 bits $D_1$ and $D_2$ is defined as $V_{224}<V_{IN}<V_{223}$, and the input analog signal when converting the lower significant 2 bits $D_3$ and $D_4$ is defined as $[(V_{224}+V_{223})/2]<V_{IN}<[(V_{223}+V_{222})/2]$; or where the input analog signal when converting the upper significant 2 bits $D_1$ and $D_2$ is defined as $V_{223}<V_{IN}<V_{222}$, and the input analog signal when converting the lower significant 2 bits $D_3$ and $D_4$ is defined as $[(V_{224}+V_{223})/2]<V_{IN}<[(V_{223}+V_{222})/2]$; or where the input analog signal when converting the upper significant 2 bits $D_1$ and $D_2$ is defined as $V_{222}<V_{IN}<V_{221}$, and the input analog signal when converting the lower significant 2 bits $D_3$ and $D_4$ is defined as $[(V_{222}+V_{221})/2]<V_{IN}<V_{RT}$; or where the input analog signal when converting the upper significant 2 bits $D_1$ and $D_2$ is defined as $V_{221}<V_{IN}$, and the input analog signal when converting the lower significant 2 bits $D_3$ and $D_4$ is defined as $[(V_{222}+V_{221})/2]<V_{IN}<V_{RT}$, in the lower data encoder 236, only the selection line $LN_{205}$ becomes "1".

As a result, the selection signal $SEL_{102}$ is input to the selection gate 237 as the "1" level, and the selection signal $SEL_{101}$ is input to the selection gate 237 as the "0" level.

In the selection gate 237, along with the fact that only the selection signal $SEL_{102}$ is input as the "1" level, only the AND gate $A_{102}$ is activated.

To the AND gate $A_{102}$, the upper data side bit data of the upper significant data for the R mode generated in the line $LN_{202}$ of the upper data encoder 235 is supplied.

Accordingly, in the selection gate 237, the bits of the upper significant data at the R mode are selected, and as a result, they are output as the upper significant data conversion code $D_1$ via the OR gate $OR_{101}$.

At this time, in parallel with the output of the upper data conversion code $D_1$, the selection signal $SEL_{102}$ is output as the upper significant data conversion code $D_2$ while holding its level "1" as it is.

Concretely, when the sampling voltage $V_S$ of the analog signal $V_{IN}$ is defined as $V_{224}<V_S<V_{223}$, the upper data conversion code $[D_1, D_2]$ is output as [01]; when $V_{223}<V_S<V_{222}$ stands, the upper data conversion code $[D_1, D_2]$ is output as [01]; when $V_{222}<V_S<V_{221}$ stands, the upper data conversion code $[D_1, D_2]$ is output as [11]; and when $V_{221}<V_S<V_{RT}$ stands, the upper data conversion code $[D_1, D_2]$ is output as [11].

Note that, when the sampling voltage $V_S$ is defined as $V_{RB}<V_S<V_{224}$, the upper significant data conversion code $[D_1, D_2]$ outputs [00], but this code will not be selected.

Also, in the lower data encoder 236, when the output of the AND gate $AD_{105}$ of the lower data comparator 245 is "1", the lower significant data $BD_{113}$ and $BD_{114}$ are generated as [11]; when the output of the AND gate $AD_{106}$ of the lower data comparator 246 is "1", the lower significant data $BD_{113}$ and $BD_{114}$ are generated as [10]; when the output of the AND gate $AD_{107}$ of the lower data comparator 247 is "1", the lower significant data $BD_{113}$ and $BD_{114}$ are generated as [01]; and when the output of the AND gate $AD_{108}$ is "1", the lower significant data $BD_{113}$ and $BD_{114}$ are generated as [00], the data $BD_{113}$ is output to the exclusive-OR gate $EXO_{101}$, and the data $BD_{114}$ is output to the exclusive-OR gate $EXO_{102}$.

In the exclusive-OR gates $EXO_{101}$ and $EXO_{102}$, when $V_{224}<V_S<V_{223}$ and $V_{222}<V_S<V_{221}$ stand, that is where the switching blocks $S_{i41}$ to $S_{i47}$ and $S_{i21}$ to $S_{i27}$ at the second row and fourth row from the bottom of the matrix circuit 230 are selected, since the direction of application of the reference voltage is the forward direction, the levels of the lower significant data are output as the lower significant data conversion codes $D_3$ and $D_4$ while inverting the output level of the lower data encoder 236.

Contrary to this, when $V_{RB}<V_S<V_{224}$, $V_{223}<V_S<V_{222}$ and $V_{221}<V_S<V_{RT}$ stand, that is where the switching blocks $S_{i51}$ to $S_{i57}$, $S_{i31}$ to $S_{i37}$ and $S_{i11}$ to $S_{i17}$ at the first row, third row, and fifth row from the bottom of the matrix circuit 230 are selected, since the direction of application of the reference voltage is the inverse direction, the levels of the lower significant data are held at the output level of the lower data encoder 236 as they are and output as the lower significant data conversion codes $D_3$ and $D_4$.

As explained above, according to the present embodiment, the lower significant codes are divided to two groups, signals $SEL_{101}$ and $SEL_{102}$ for selecting the L mode data and R mode data are output from the lower data encoder 236 obtaining the conversion code of the groups, and the L mode data and R mode data output from the upper data encoder 235 are selected, to obtain the upper significant data conversion code $D_1$, and output the selection signal $SEL_{101}$ and the selection signal $SEL_{102}$ inverted in its level as the lower significant side conversion code $D_2$ of the upper significant bit data. Therefore the selection signal can be used directly for the selection of the upper significant data without the use of the inverted gate and inhibit gate as in the conventional circuit.

Accordingly, the input of the selection signal to the selection gate 237 is not delayed relative to the output of the upper data encoder 235, and thus the increase of speed of conversion processing can be achieved.

Also, in addition to the fact that the inverted gate and inhibit gate become unnecessary, the number of the selection signals can be reduced to two, and also the number of the upper data codes to be selected and the number of the input gates of selection gates can be reduced to two. Therefore an A/D converter circuit with which the reduction of the chip area and the reduction of the power consumption can be achieved can be realized.

FIGS. 29A–29C are circuit diagrams showing a 10th embodiment of the A/D converter circuit according to the present invention.

The point of difference of the present embodiment from the above-mentioned ninth embodiment resides in the constitution whereby the number of the selection lines of the lower data encoder 255 is reduced to only one line, i.e., $LN_{214}$, to generate only one selection signal $SEL_{111}$ selected from among the selection signals; and a signal obtained by inverting the level of the selection signal $SEL_{111}$ at the inverter 259 is supplied as the signal in place of the selection signal $SEL_{102}$ to the other input of the AND gate $A_{112}$ of the selection gate 257 and output as the lower data conversion code $D_2$ of the upper significant bit data.

According to the present 10th embodiment, in addition to the effect of the above-described first embodiment, a simpler structure can be realized, and the chip area can be further reduced.

Note that, in the above-mentioned ninth and 10th embodiments, an explanation was made taking as an example an A/D converter circuit for four bits, but needless to say the present invention can be applied to an A/D converter circuit for more bits.

Also, in the above-mentioned ninth and 10th embodiments, the structure in which the other output pin buffers are arranged on the input side of the upper data encoder and the lower data encoder was indicated, but these other output pin buffers are provided so as to reliably drive the upper data encoder and the lower data encoder, and it is necessary to provide the same according to a certain capacitance of the upper data encoder and the lower data encoder acting as a so-called load.

As explained above, according to the present invention, there are advantages such that the inverted gate and inhibit gate which have been conventionally necessary become unnecessary, and the increase of speed of conversion processing can be achieved. In addition to the fact that the inverted gate and inhibit gate become unnecessary, the number of the selection signals can be reduced, and the number of the upper data codes to be selected and the number of the input gates of selection gates can be reduced, and therefore there is an advantage in that the reduction of the chip area and the reduction of the power consumption can be achieved.

Figure 30C:
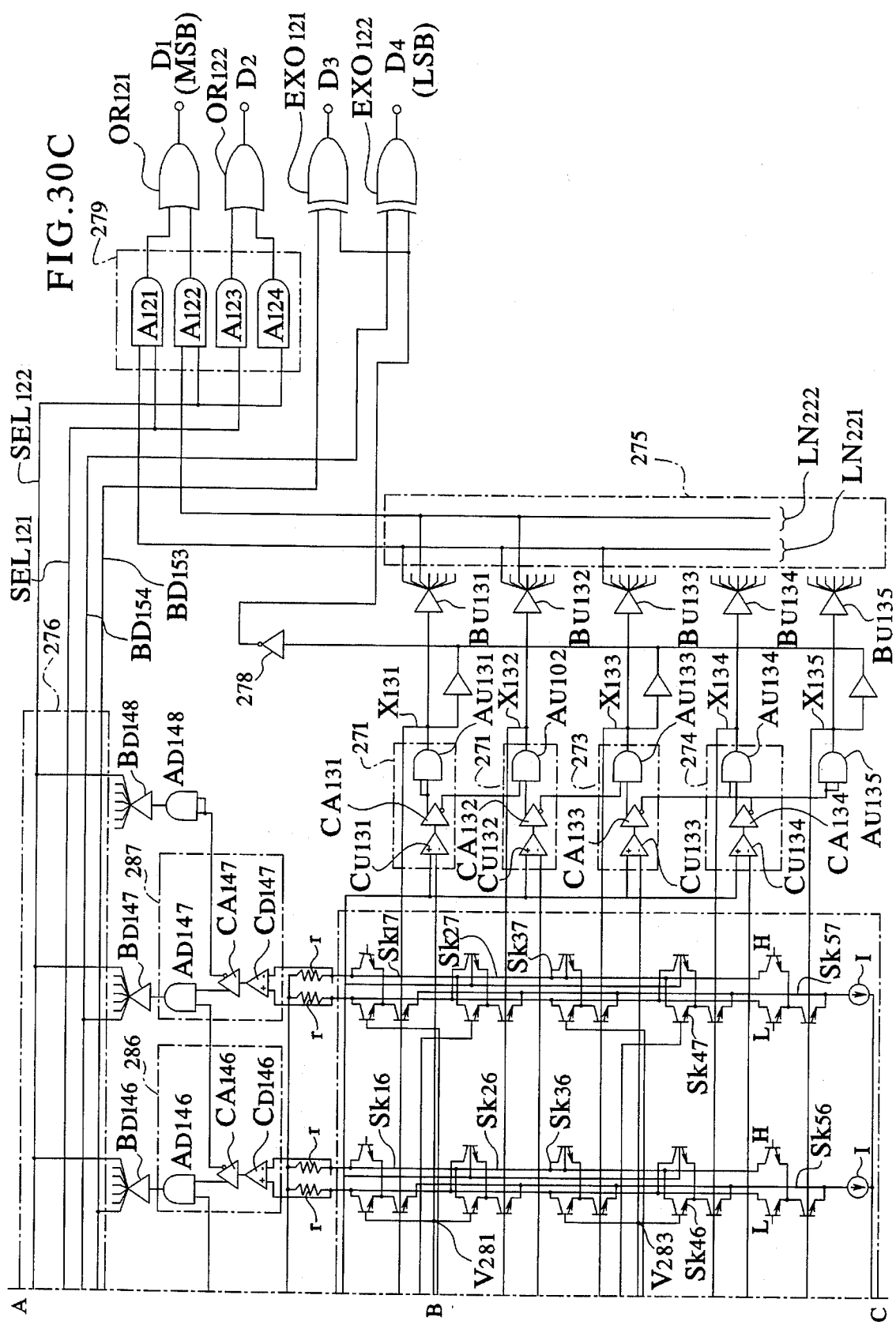

FIGS. 30A–30C are circuit diagrams showing an 11th embodiment of the A/D converter circuit according to the present invention.

In FIG. 30, 270 denotes a matrix circuit; 271 to 274 denote upper data comparators; 275, an upper data encoder; 281 to 287 denote lower data comparators; 276, a lower data encoder; 279, a selection gate; 278, an inverter; $R_{241}$ to $R_{256}$ denote reference resistance elements; $BU_{131}$ to $BU_{135}$ and $BD_{141}$ and $BD_{147}$ denote multiple output pin buffers; $OR_{121}$ and $OR_{122}$ denote OR gates; and $EXO_{121}$ and $EXO_{122}$ denote exclusive-OR gates; respectively.

The matrix circuit 270 is constituted by the arrangement of 35 switching blocks $S_{k11}$ to $S_{k17}$, $S_{k21}$ to $S_{k27}$, $S_{k31}$ to $S_{k37}$, $S_{k41}$ to $S_{k47}$, and $S_{k51}$ to $S_{k57}$ in the form of a matrix comprising five rows and seven columns.

The respective switching blocks $S_{k11}$ to $S_{k17}$, $S_{k21}$ to $S_{k27}$, $S_{k31}$ to $S_{k37}$, $S_{k41}$ to $S_{k47}$, and $S_{k51}$ to $S_{k57}$ are constituted by differential type amplifiers comprising the npn-type transistors $Q_{231}$, $Q_{232}$, and $Q_{233}$.

Excluding the switching blocks $S_{k11}$ to $S_{k14}$ and $S_{k54}$ to $S_{k57}$, a reference voltage obtained by dividing the reference voltages $V_{RT}$ to $V_{RB}$ by the reference resistance elements $R_{241}$ to $R_{256}$ are supplied to the base of one side transistors $Q_{231}$ constituting a so-called differential pair of the respective switching blocks, and analog signals $V_{IN}$ which should be converted to the digital code are supplied to the base of the other side transistors $Q_{232}$, respectively.

Also, the emitters of the transistors $Q_{231}$ and $Q_{232}$ are connected to each other, and the middle point of connection thereof is connected to the current source I via the transistor $Q_{233}$ switched by the control signals $x_{131}$ to $x_{135}$, respectively.

Also, to the collectors of the transistors $Q_{231}$ and $Q_{232}$, the power source voltage $V_{DD}$ is supplied via the resistance element r, the output of which is respectively input to the comparators $CD_{141}$ to $CD_{147}$ of the seven lower data comparators 281 to 287 as mentioned later, which act also as the initial stage amplifiers of the lower data comparators 281 to 287.

Also, the collectors of the transistors $Q_{231}$ and $Q_{232}$ of the switching blocks at the second row and the fourth row from the bottom of the diagram are connected to the line in an opposite direction to that for the collector output of the transistors $Q_{231}$ and $Q_{232}$ of the switching blocks of the first row and third row, and steps are taken so that the line of the serial reference resistance elements $R_{241}$ to $R_{256}$ to which the reference potentials $V_{RT}$ to $V_{RB}$ are applied can be formed by folding-back.

The reference resistance elements $R_{241}$ to $R_{256}$ are serially connected between the two reference potentials $V_{RT}$ and $V_{RB}$ and arranged by folding-back so as to extend over a predetermined number of rows, e.g., five rows in the present embodiment to correspond to the matrix arrangement of the switching blocks in the matrix circuit 270.

Concretely, each two resistance elements $R_{256}$ and $R_{255}$ and $R_{242}$ and $R_{241}$ are serially connected at the first row and the fifth row from the bottom in the diagram, and the resistance elements $R_{254}$ to $R_{251}$, $R_{250}$ to $R_{247}$, and $R_{246}$ to $R_{243}$ are serially connected at the second row to the fourth row, respectively.

Viewing this folding-back arrangement of the resistance element columns from the reference potential $V_{RB}$ terminal side positioned on the left end and lower end side of the matrix circuit 270, the wiring pattern extended in the right direction in the diagram is folded-back between the switching block column of the fourth column from the left in the diagram and the switching block column of the fifth column, and two resistance elements $R_{256}$ and $R_{255}$ are connected in series corresponding to the arrangement position of the switching blocks $S_{k54}$ and $S_{k53}$ at the first row from the bottom, whereby the first row of resistance column is constituted.

The resistance column at the first row is folded-back between the switching block column of the third column and the switching block column of the second column, and four resistance elements $R_{254}$ to $R_{251}$ are connected in series between the switching block rows of the first row and the second row and corresponding to the arrangement position of the switching blocks $S_{k43}$ to $S_{k46}$ of the second row, whereby the resistance column of the second row is constituted.

The resistance column of the second row is folded-back between the switching block column of the fifth column and the switching block column of the sixth column, and four resistance elements $R_{250}$ to $R_{247}$ are connected in series between the switching block rows of the second row and the third row and corresponding to the arrangement position of the switching blocks $S_{k36}$ to $S_{k33}$ of the third row, whereby the resistance column of the third row is constituted.

The resistance column of the third row is folded-back between the switching block column of the third column and the switching block column of the second column, and four resistance elements $R_{246}$ to $R_{243}$ are connected in series between the switching block rows of the fourth row and the fifth row and corresponding to the arrangement position of the switching blocks $S_{k23}$ to $S_{k26}$ of the fourth row, whereby the resistance column of the fourth row is constituted.

The resistance column of the fourth row is folded-back between the switching block column of the fifth column and the switching block column of the sixth column, two resistance elements $R_{242}$ and $R_{241}$ are connected in series between the switching block rows of the fourth row and the fifth row and corresponding to the arrangement position of the switching blocks $S_{k16}$ to $S_{k15}$ at the fifth row, and one end of the resistance element $R_1$ is connected to the terminal of the reference potential $V_{RT}$, whereby the resistance column of the fifth row is constituted.

Namely, the resistance columns of the first row and the fifth row are arranged with a deviation of a half cycle with respect to the resistance columns of the second row to the fourth row so that the position exhibiting the lowest value of the reference voltage (connection point between the reference potential $V_{RB}$ terminal and the resistance element $R_{256}$)

and the position exhibiting the highest value (connection point between the reference potential $V_{RT}$ terminal and the resistance element $R_{241}$) are positioned at an intermediate point in the row direction of the switching blocks arranged in the form of the matrix.

In such an arrangement structure of resistance columns, the switching block columns comprising seven columns are divided into two groups, i.e., the group comprising the switching block columns of from the first column to the fourth column and the group of the switching block columns of from the fifth column to the seventh column at the switching point between the upper data and lower data as will be mentioned later.

Also, the voltages $V_{281}$ to $V_{284}$ generated between the rows of the respective resistance columns are supplied to the upper data comparators 271 to 274 as the reference voltages obtained by dividing the reference potentials $V_{RT}$ to $V_{RB}$ by rough quantization, respectively.

In the structure of FIG. 30, when assuming that the voltage between the reference potentials $V_{RT}$ to $V_{RB}$ is $V_{REF}$, the respective reference voltages $V_{281}$ to $V_{284}$ become the following values:

$V_{281}=(14/16)\cdot V_{REF}$ $V_{282}=(10/16)\cdot V_{REF}$ $V_{283}=(6/16)\cdot V_{REF}$ $V_{284}=(2/16)\cdot V_{REF}$ Further, wiring is carried out so that the respective reference voltages $V_{261}$ to $V_{275}$ divided by the reference resistance elements $R_{241}$ to $R_{256}$ are supplied to the base of the transistor $Q_{231}$ of the predetermined switching block.

Concretely, a reference voltage $V_{261}$ [=(15/16)·$V_{REF}$] generated at the connection point between the resistance elements $R_{241}$ and $R_{242}$ is supplied to the bases of the transistors $Q_{231}$ of the switching blocks $S_{k15}$ and $S_{k27}$.

A reference voltage $V_{262}$ [=$V_{281}$=(14/16)·$V_{REF}$] generated at the connection point between the resistance elements $R_{242}$ and $R_{243}$ is supplied to the bases of the transistors $Q_{231}$ of the switching blocks $S_{k16}$ and $S_{k26}$.

A reference voltage $V_{263}$ [=(13/16)·$V_{REF}$] generated at the connection point between the resistance elements $R_{243}$ and $R_{244}$ is supplied to the bases of the transistors $Q_{231}$ of the switching blocks $S_{k17}$ and $S_{k25}$.

A reference voltage $V_{264}$ [=(12/16)·$V_{REF}$] generated at the connection point between the resistance elements $R_{244}$ and $R_{245}$ is supplied to the base of the transistor $Q_{231}$ of the switching block $S_{k24}$.

A reference voltage $V_{265}$ [=(11/16)·$V_{REF}$] generated at the connection point between the resistance elements $R_{245}$ and $R_{246}$ is supplied to the bases of the transistors $Q_{231}$ of the switching blocks $S_{k23}$ and $S_{k31}$.

A reference voltage $V_{266}$ [=$V_{282}$=(10/16)·$V_{REF}$] generated at the connection point between the resistance elements $R_{246}$ and $R_{247}$ is supplied to the bases of the transistors $Q_{231}$ of the switching blocks $S_{k22}$ and $S_{k32}$.

A reference voltage $V_{267}$ [=(9/16)·$V_{REF}$] generated at the connection point between the resistance elements $R_{247}$ and $R_{248}$ is supplied to the bases of the transistors $Q_{231}$ of the switching blocks $S_{k21}$ and $S_{k33}$.

A reference voltage $V_{268}$ [=(8/16)·$V_{REF}$] generated at the connection point between the resistance elements $R_{248}$ and $R_{249}$ is supplied to the base of the transistor $Q_{231}$ of the switching block $S_{k34}$.

A reference voltage $V_{269}$ [=(7/16)·$V_{REF}$] generated at the connection point between the resistance elements $R_{249}$ and $R_{250}$ is supplied to the bases of the transistors $Q_{231}$ of the switching blocks $S_{k35}$ and $S_{k47}$.

A reference voltage $V_{270}$ [=$V_{283}$=(6/16)·$V_{REF}$] generated at the connection point between the resistance elements $R_{250}$ and $R_{251}$ is supplied to the bases of the transistors $Q_{231}$ of the switching blocks $S_{k36}$ and $S_{k46}$.

A reference voltage $V_{271}$ [=(5/16)·$V_{REF}$] generated at the connection point between the resistance elements $R_{251}$ and $R_{252}$ is supplied to the bases of the transistors $Q_{231}$ of the switching blocks $S_{k37}$ and $S_{k45}$.

A reference voltage $V_{272}$ [=(4/16)·$V_{REF}$] generated at the connection point between the resistance elements $R_{252}$ and $R_{253}$ is supplied to the base of the transistor $Q_{231}$ of the switching block $S_{k44}$.

A reference voltage $V_{273}$ [=(3/16)·$V_{REF}$] generated at the connection point between the resistance elements $R_{253}$ and $R_{254}$ is supplied to the bases of the transistors $Q_{231}$ of the switching blocks $S_{k43}$ and $S_{k51}$.

A reference voltage $V_{274}$ [=$V_{284}$=(2/16)·$V_{REF}$] generated at the connection point between the resistance elements $R_{254}$ and $R_{255}$ is supplied to the bases of the transistors $Q_{231}$ of the switching blocks $S_{k42}$ and $S_{k52}$.

A reference voltage $V_{275}$ [=(1/16)·$V_{REF}$] generated at the connection point between the resistance elements $R_{255}$ and $R_{256}$ is supplied to the bases of the transistors $Q_{231}$ of the switching blocks $S_{k41}$ and $S_{k53}$.

Upper data comparators 271, 272, 273, and 274 respectively are provided with comparators $CU_{131}$ to $CU_{134}$, complementary-type output amplifiers $CA_{131}$ to $CA_{134}$, and AND gates $AU_{131}$ to $AU_{134}$.

An analog signal $V_{IN}$ is supplied to one input of the comparator $CU_{131}$ of the upper data comparator 271, and a reference voltage $V_{281}$ [=(14/16)·$V_{REF}$] obtained by dividing the reference potentials $V_{RT}$ to $V_{RB}$ by rough quantization is supplied to the other input.

The analog signal $V_{IN}$ is supplied to one input of the comparator $CU_{132}$ of the upper data comparator 272, and a reference voltage $V_{282}$ [=(10/16)·$V_{REF}$] obtained by dividing the reference potentials $V_{RT}$ to $V_{RB}$ by rough quantization is supplied to the other input.

The analog signal $V_{IN}$ is supplied to one input of the comparator $CU_{133}$ of the upper data comparator 273, and a reference voltage $V_{283}$ [=(6/16)·$V_{REF}$] obtained by dividing the reference potentials $V_{RT}$ to $V_{RB}$ by rough quantization is supplied to the other input.

The analog signal $V_{IN}$ is supplied to one input of the comparator $CU_{134}$ of the upper data comparator 274, and a reference voltage $V_{284}$ [=(2/16)·$V_{REF}$] obtained by dividing the reference potentials $V_{RT}$ to $V_{RB}$ by rough quantization is supplied to the other input.

The output of the comparator $CU_{131}$ of the upper data comparator 271 is connected to the input of the output amplifier $CA_{131}$, the positive output thereof is connected to both inputs of a 2-input AND gate $AU_{131}$, and the negative output is connected to one input of the 2-input AND gate $AU_{132}$ of the upper data comparator 272.

The output of the comparator $CU_{132}$ of the upper data comparator 272 is connected to the input of the output amplifier $CA_{132}$, the positive output thereof is connected to the other input of the 2-input AND gate $AU_{132}$, and the negative output is connected to one input of the 2-input AND gate $AU_{133}$ of the upper data comparator 273.

The output of the comparator $CU_{133}$ of the upper data comparator 273 is connected to the input of the output amplifier $CA_{133}$, the positive output thereof is connected to the other input of a 2-input AND gate $AU_{133}$, and the negative output is connected to one input of the 2-input AND gate $AU_{134}$ of the upper data comparator 274.

The output of the comparator $CU_{134}$ of the upper data comparator 274 is connected to the input of the output amplifier $CA_{134}$, the positive output thereof is connected to the other input of a 2-input AND gate $AU_{134}$, and the negative output is connected to the both inputs of the 2-input AND gate $AU_{135}$.

The outputs of the respective comparators $CU_{131}$ to $CU_{134}$ of the upper data comparators 271 to 274 constituted in this way become the level of "H" or "L" corresponding to the level of the sampled analog signal $V_{IN}$, and only one among the respective AND gates $AU_{131}$ to $AU_{134}$ outputs the "1" level.

The output of the AND gate $AU_{131}$ of the upper data comparator 271 is connected via the buffer $BU_{131}$ to the upper data encoder 275 and, at the same time, connected to the bases of the transistors $Q_{233}$ of the switching blocks $S_{k11}$ to $S_{k17}$ and connected to the input of the inverter 278 via the buffer.

The AND gate $AU_{132}$ of the upper data comparator 272 is connected via the buffer $BU_{132}$ to the upper data encoder 275 and, at the same time, connected to the bases of the transistors $Q_{233}$ of the switching blocks $S_{k21}$ to $S_{k27}$.

The output of the AND gate $AU_{133}$ of the upper data comparator 273 is connected via the buffer $BU_{133}$ to the upper data encoder 275 and, at the same time, connected to the bases of the transistors $Q_{233}$ of the switching blocks $S_{k31}$ to $S_{k37}$ and connected to the input of the inverter 278 via the buffer.

The AND gate $AU_{134}$ of the upper data comparator 274 is connected via the buffer $BU_{134}$ to the upper data encoder 275 and, at the same time, connected to the bases of the transistors $Q_{233}$ of the switching blocks $S_{k41}$ to $S_{k47}$.

The output of the AND gate $AU_{135}$ is connected to the input of the buffer $BU_{135}$ and, at the same time, connected to the bases of the transistors $Q_{233}$ of the switching blocks $S_{k51}$ to $S_{k57}$ and connected to the input of the inverter 278 via the buffer.

The upper data encoder 275 is constituted by an encoder line $LN_{221}$ generating the data for an L (left) mode and an encoder line $LN_{222}$ generating the data for an R (right) mode.

Namely, in the upper data encoder 275, respective encoder lines $LN_{221}$ and $LN_{222}$ are set corresponding to a first group of from the first column to the fourth column arranged on the left side from the center of the matrix circuit 270 and a second group of from the fifth column to the seventh column arranged on the right side among the switching blocks $S_{k11}$ to $S_{k17}$, $S_{k21}$ to $S_{k27}$, $S_{k31}$ to $S_{k37}$, $S_{k41}$ to $S_{k47}$ and $S_{k51}$ to $S_{k57}$ arranged in the matrix circuit 270.

FIG. 31 shows the correspondence between the outputs of the respective AND gates $AU_{131}$, $AU_{132}$, $AU_{133}$, $AU_{134}$, and $AU_{135}$ of the upper data comparators 271 to 274 and the set output data code pattern of the respective encoder lines $LN_{221}$ and $LN_{222}$ of the upper data encoder 275.

The setting of the data is carried out in such a manner that, in accordance with the direction of transition of the reference voltage level by the respective reference resistance elements in the rows among the serially connected reference resistance element groups which are folding-arranged so that the number of rows becomes five, concretely an orientation (hereinafter referred to as a direction) of transition of the reference voltage from the low potential side to the high potential side, so that (data of L mode)$\geq$(data of R mode) and (data of L mode)$\leq$(data of R mode) stands.

In the structure of FIG. 30, the first row from the bottom comprising the resistance elements $R_{256}$ and $R_{255}$, the third row comprising the resistance elements $R_{250}$ to $R_{247}$, and the fifth row comprising the resistance elements $R_{242}$ and $R_{241}$ have the same direction, and the second row comprising the resistance elements $R_{254}$ to $R_{251}$ and the fourth row comprising the resistance elements $R_{246}$ to $R_{243}$ have the same direction.

Accordingly, the data setting level in the case where the AND gates $AU_{135}$, $AU_{133}$, and $AU_{131}$ corresponding to the first row, third row, and fifth row are at the "1" level is set so that the data of the L mode becomes equal to or larger than the data of the R mode.

Contrary to this, the data setting level in the case where the AND gates $AU_{134}$ and $AU_{132}$ corresponding to the second row and the fourth row are at the "1" level is set so that the data of the L mode becomes equal to or smaller than the data of the R mode.

The lower data comparators 281 to 287 respectively are provided with comparators $CD_{141}$ to $CD_{147}$, complementary-type output amplifiers $CA_{141}$ to $CA_{147}$, and AND gates $AD_{141}$ to $AD_{147}$.

To one input of the comparator $CD_{141}$ of the lower data comparator 281 is supplied the collector output of the transistors $Q_{231}$ of the switching blocks $S_{k11}$, $S_{k31}$, and $S_{k51}$ at the first column of the matrix circuit 270 and the collector outputs of the transistors $Q_{232}$ of the switching blocks $S_{k21}$ and $S_{k41}$, and to the other input is supplied the collector outputs of the transistors $Q_{231}$ of the switching blocks $S_{k21}$ and $S_{k41}$ and the collector outputs of the transistors $Q_{232}$ of the switching blocks $S_{k11}$, $S_{k31}$, and $S_{k51}$.

To one input of the comparator $CD_{142}$ of the lower data comparator 282 is supplied the collector output of the transistors $Q_{231}$ of the switching blocks $S_{k12}$, $S_{k32}$, and $S_{k52}$ of the second column of the matrix circuit 270 and the collector outputs of the transistors $Q_{232}$ of the switching blocks $S_{k22}$ and $S_{k42}$, and to the other input is supplied the collector outputs of the transistors $Q_{231}$ of the switching blocks $S_{k22}$ and $S_{k42}$ and the collector outputs of the transistors $Q_{232}$ of the switching blocks $S_{k12}$, $S_{k32}$, and $S_{k52}$.

To one input of the comparator $CD_{143}$ of the lower data comparator 283 is supplied the collector output of the transistors $Q_{231}$ of the switching blocks $S_{k13}$, $S_{k33}$, and $S_{k53}$ at the third column of the matrix circuit 270 and the collector outputs of the transistors $Q_{232}$ of the switching blocks $S_{k23}$ and $S_{k43}$, and to the other input is supplied the collector outputs of the transistors $Q_{231}$ of the switching blocks $S_{k23}$ and $S_{k43}$ and the collector outputs of the transistors $Q_{232}$ of the switching blocks $S_{k13}$, $S_{k33}$, and $S_{k53}$.

To one input of the comparator $CD_{144}$ of the lower data comparator 284 is supplied the collector output of the transistors $Q_{231}$ of the switching blocks $S_{k14}$, $S_{k34}$, and $S_{k54}$ of the fourth column of the matrix circuit 270 and the collector outputs of the transistors $Q_{232}$ of the switching blocks $S_{k24}$ and $S_{k44}$, and to the other input is supplied the collector outputs of the transistors $Q_{231}$ of the switching blocks $S_{k24}$ and $S_{k44}$ and the collector outputs of the transistors $Q_{232}$ of the switching blocks $S_{k14}$, $S_{k34}$, and $S_{k54}$.

To one input of the comparator $CD_{145}$ of the lower data comparator 285 is supplied the collector output of the transistors $Q_{231}$ of the switching blocks $S_{k15}$, $S_{k35}$, and $S_{k55}$ at the fifth column of the matrix circuit 270 and the collector outputs of the transistors $Q_{232}$ of the switching blocks $S_{k25}$ and $S_{k45}$, and to the other input is supplied the collector outputs of the transistors $Q_{231}$ of the switching blocks $S_{k25}$ and $S_{k45}$ and the collector outputs of the transistors $Q_{232}$ of the switching blocks $S_{k15}$, $S_{k35}$, and $S_{k55}$.

To one input of the comparator $CD_{146}$ of the lower data comparator 286 is supplied the collector output of the transistors $Q_{231}$ of the switching blocks $S_{k16}$, $S_{k36}$, and $S_{k56}$ at the sixth column of the matrix circuit 270 and the collector outputs of the transistors $Q_{232}$ of the switching blocks $S_{k26}$ and $S_{k46}$, and to the other input is supplied the collector outputs of the transistors $Q_{231}$ of the switching blocks $S_{k26}$ and $S_{k46}$ and the collector outputs of the transistors $Q_{232}$ of the switching blocks $S_{k16}$, $S_{k36}$, and $S_{k56}$.

To one input of the comparator $CD_{147}$ of the lower data comparator 287 is supplied the collector output of the transistors $Q_{231}$ of the switching blocks $S_{k17}$, $S_{k37}$, and $S_{k57}$ at the seventh column of the matrix circuit 270 and the collector outputs of the transistors $Q_{232}$ of the switching blocks $S_{k27}$ and $S_{k47}$, and to the other input is supplied the collector outputs of the transistors $Q_{231}$ of the switching blocks $S_{k27}$ and $S_{k47}$ and the collector outputs of the transistors $Q_{232}$ of the switching blocks $S_{k17}$, $S_{k37}$, and $S_{k57}$.

The output of the comparator $CD_{141}$ of the lower data comparator 281 is connected to the input of the output amplifier $CA_{141}$, the positive output thereof is connected to both inputs of the 2-input AND gate $AD_{141}$, and the negative output is connected to one input of the 2-input AND gate $AD_{142}$ of the lower data comparator 282.

The output of the comparator $CD_{142}$ of the lower data comparator 282 is connected to the input of the output amplifier $CA_{142}$, the positive output thereof is connected to the other input of the 2-input AND gate $AD_{142}$, and the negative output is connected to one input of the 2-input AND gate $AD_{143}$ of the lower data comparator 283.

The output of the comparator $CD_{143}$ of the lower data comparator 283 is connected to the input of the output amplifier $CA_{143}$, the positive output thereof is connected to the other input of the 2-input AND gate $AD_{143}$, and the negative output is connected to one input of the 2-input AND gate $AD_{144}$ of the lower data comparator 284.

The output of the comparator $CD_{144}$ of the lower data comparator 284 is connected to the input of the output amplifier $CA_{144}$, the positive output thereof is connected to the other input of the 2-input AND gate $AD_{144}$, and the negative output is connected to one input of the 2-input AND gate $AD_{145}$ of the lower data comparator 285.

The output of the comparator $CD_{145}$ of the lower data comparator 285 is connected to the input of the output amplifier $CA_{145}$, the positive output thereof is connected to the other input of the 2-input AND gate $AD_{145}$, and the negative output is connected to one input of the 2-input AND gate $AD_{146}$ of the lower data comparator 286.

The output of the comparator $CD_{146}$ of the lower data comparator 286 is connected to the input of the output amplifier $CA_{146}$, the positive output thereof is connected to the other input of the 2-input AND gate $AD_{146}$, and the negative output is connected to one input of the 2-input AND gate $AD_{147}$ of the lower data comparator 287.

The output of the comparator $CD_{147}$ of the lower data comparator 287 is connected to the input of the output amplifier $CA_{147}$, the positive output thereof is connected to the other input of the 2-input AND gate $AD_{147}$, and the negative output is connected to both inputs of the 2-input AND gate $AD_{148}$.

The outputs of the respective comparators $CD_{141}$ to $CD_{147}$ of the lower data comparators 281 to 287 constituted in this way become the level of "H" or "L" corresponding to the level of 2 inputs, and only one of the respective AND gates $AD_{141}$ to $AD_{148}$ outputs the "1" level.

The outputs of the AND gates $AD_{141}$ to $AD_{147}$ and $AD_{148}$ of the lower data comparators 281 to 287 are connected via the buffers $BD_{141}$ to $BD_{148}$ to the lower data encoder 276.

The lower data encoder 276 is constituted by a data line $LN_{223}$ generating lower significant data $BD_{153}$ and $BD_{154}$; a selection line $LN_{224}$ generating the selection signal $SEL_{121}$ indicating that one of the outputs of the AND gates $AD_{141}$ to $AD_{144}$ of the lower data comparators 281 to 284 becomes "1"; and a selection line $LN_{225}$ generating the selection signal $SEL_{122}$ indicating that one of the outputs of the AND gates $AD_{145}$ to $AD_{147}$ and $AD_{148}$ of the lower data comparators 285 to 287 becomes "1".

FIG. 32 shows the correspondence between the outputs of the AND gates $AD_{141}$ to $AD_{145}$ on the upper data side and the outputs of the AND gates $AD_{141}$ to $AD_{148}$ on the lower data side and the output conversion code data.

As mentioned above, in the matrix circuit 170 in the present embodiment, the respective switching blocks are divided into two in the row direction. At this division point C, as seen from FIG. 32, when paying attention to the upper significant 2 bits of the output conversion codes $D_1$ to $D_4$, the division is made at the point at which the value of the upper significant 2 bits is switched.

The selection gate 279 is constituted by AND gates $A_{121}$ to $A_{124}$, selects a single upper significant data from among the respective upper significant data of the L mode and R mode output from the upper data encoder 275 using the selection signals $SEL_{121}$ and $SEL_{122}$ output from the lower data encoder 276, and outputs the same via the OR-gates $OR_{121}$ and $OR_{122}$ as the conversion codes $D_1$ and $D_2$.

Concretely, one input terminal of the AND gate $A_{121}$ is connected to one line (upper data side) of the encoder line $LN_{221}$ generating the data for the L mode of the upper data encoder 275, and the other input terminal is connected to the selection line $LN_{224}$ outputting the selection signal $SEL_{121}$ of the lower data encoder 276.

One input terminal of the AND gate $A_{122}$ is connected to one line (upper data side) of the encoder line $LN_{222}$ generating the data for the R mode of the upper data encoder 275, and the other input terminal is connected to the selection line $LN_{223}$ outputting the selection signal $SEL_{122}$ of the lower data encoder 276.

The outputs of these AND gates $A_{121}$ and $A_{122}$ are connected to the respective input terminals of the 2-input OR-gate $OR_{121}$.

One input terminal of the AND gate $A_{123}$ is connected to the other line (lower data side) of the encoder line $LN_{221}$ generating the data for the L mode of the upper data encoder 275, and the other input terminal is connected to the selection line $LN_{224}$ outputting the selection signal $SEL_{121}$ of the lower data encoder 276.

One input terminal of the AND gate $A_{124}$ is connected the other line (lower data side) of the encoder line $LN_{222}$ generating the data for the R mode of the upper data encoder 275, and the other input terminal is connected to the selection line $LN_{225}$ outputting the selection signal $SEL_{122}$ of the lower data encoder 276.

The outputs of these AND gates $A_{123}$ and $A_{124}$ are connected to the respective input terminals of the 2-input OR-gate $OR_{122}$.

The exclusive-OR gate $EXO_{121}$ obtains the exclusive-OR between the lower significant data $BD_{153}$ output from one line of the data line $LN_{223}$ of the lower data encoder 276 and the signal obtained by inverting the sum of output levels of the AND gates $AU_{131}$, $AU_{133}$, or $AU_{135}$ of the upper data comparators 271 and 273 by the inverter 278, and outputs the result thereof as the lower data conversion code $D_3$.

The exclusive-OR gate $EXO_{122}$ obtains the exclusive-OR between the lower significant data $BD_{154}$ output from the other line of the data line $LN_{223}$ of the lower data encoder 276 and the signal obtained by inverting the sum of output levels of the AND gates $AU_{131}$, $AU_{133}$, or $AU_{135}$ of the upper data comparators 271 and 273 by the inverter 278 and outputs the result thereof as the lower data conversion code $D_4$.

Next, an explanation will be made of the operation by the above-described structure.

For example, when the sampling voltage $V_S$ of the sampled analog signal is represented as $V_{RB}<V_S<V_{284}$, the outputs of the comparators $CU_{131}$ to $CU_{134}$ of the upper data comparators 271 to 274 become all "L", so that the digital signals are output, i.e., "0" is output from the AND gates $AU_{131}$ to $AU_{134}$, and "1" is output from the AND gate $AU_{135}$, respectively.

As a result, a digital signal such as [0000] is input to the upper data encoder 275. At the upper data encoder 275, using a so-called wired-OR circuit, the upper significant data of [00] are generated in two columns of encoder lines [$LN_{221}$] generating the redundant L mode data and two columns of encoder lines [$LN_{222}$] generating the redundant R mode data, respectively, which are output to the selection gate 275.

Also, when the sampling voltage $V_S$ is represented as $V_{284}<V_S<V_{283}$, the outputs of the comparators $CU_{131}$ to $CU_{133}$ of the upper data comparators 271 to 273 become "L", and the output of the comparator $CU_{134}$ of the upper data comparator 274 becomes "H", so that the digital signals are output, i.e., "0" is output from the AND gates $AU_{131}$ to $AU_{133}$ and $AU_{135}$ of the upper data comparators 271 to 273, and "1" is output from the AND gate $AU_{134}$ of the upper data comparator 274, respectively.

As a result, a digital signal such as [0001] is input to the upper data encoder 275. At the upper data encoder 275, using a so-called wired-OR circuit, the upper significant data are generated, i.e., [00] is generated in two columns of encoder lines [$LN_{221}$] generating the redundant L mode data, and [01] is generated in two columns of encoder lines [$LN_{222}$] generating the redundant R mode data, respectively, which are output to the selection gate 275.

Also, when the sampling voltage $V_S$ is represented as $V_{283}<V_S<V_{282}$, similarly digital signals are output, i.e., "0" is output from the upper data side AND gates $AU_{131}$, $AU_{132}$, $AU_{134}$, and $AU_{135}$, and "1" is output from the AND gate $AU_{133}$, respectively.

As a result, a digital signal such as [0010] is input to the upper data encoder 275, and the upper significant data are output, i.e., [10] is output from the line [$LN_{221}$], and [01] is output from the line [$LN_{222}$] to the selection gate 275.

Further, when the sampling voltage $V_S$ is represented as $V_{282}<V_S<V_{281}$, the digital signals are output, i.e., "0" is output from the upper data side AND gates $AU_{131}$, $AU_{133}$, $AU_{134}$, and $AU_{135}$, and "1" is output from the AND gate $AU_{132}$, respectively.

As a result, a digital signal such as [0100] is input to the upper data encoder 275, and the upper significant data are output, i.e., [10] is output from the line [$LN_{221}$], and [11] is output from the line [$LN_{222}$] to the selection gate 275.

Similarly, when the sampling voltage $V_S$ is represented as $V_{281}<V_S<V_{RT}$, the digital signals are output, i.e., "0" is output from the upper data side AND gates $AU_{132}$, $AU_{133}$, $AU_{134}$, and $AU_{135}$, and "1" is output from the AND gate $AU_{131}$, respectively.

As a result, a digital signal such as [1000] is input to the upper data encoder 275, and the upper significant data are output, i.e., [11] is output from the line [$LN_{221}$], and [11] is output from the line [$LN_{222}$] to the selection gate 275.

In parallel with this, the transistors $Q_{233}$ of the respective switching blocks of the matrix circuit 270 connected to the control lines ($x_{131}$, $x_{132}$, $x_{133}$, $x_{134}$, and $X_{135}$) at which the digital output signal has become "1" among the respective AND gates $AU_{(131, 132, 133, 134, 135)}$ are controlled to turn ON in units of rows, and further a fine digitization of the quantization level is executed.

For example, when only the output of the AND gate $AU_{133}$ becomes the "1" level, the transistors $Q_{233}$ of the switching blocks $S_{k31}$ to $S_{k37}$ become ON, so that the reference voltages $V_{267}$ to $V_{270}$ (=$V_{283}$) divided by the reference resistors $R_{247}$ to $R_{251}$ and the sampling voltage $V_S$ are differentially amplified at the switching blocks $S_{k33}$ to $S_{k36}$ and compared by the lower data comparators 281 to 287.

Similarly, when the output of the AND gate $AU_{132}$ is at the "1" level, the switching blocks $S_{k21}$ to $S_{k27}$ are activated, so that a differential amplification operation is performed, and the comparison by the lower data comparators 281 to 287 is carried out.

In this way, in the lower data conversion codes, the sampled voltage $V_S$ and the reference voltage divided by the reference resistance of that row are compared in units of rows of the switching blocks, so that the digital signal in accordance with the result of comparison will be output from the AND gates $AD_{141}$ to $AD_{147}$ and $AD_{148}$ of the lower data comparators 281 to 287.

At this time, in a case where the input analog signal when converting the upper significant 2 bits $D_1$ and $D_2$ is defined as $V_{284}>V_{IN}$, and the input analog signal when converting the lower significant 2 bits $D_3$ and $D_4$ is defined as $V_{RB}<V_{IN}<[(V_{284}+V_{283})/2]$, or in a case where the input analog signal when converting the upper significant 2 bits $D_1$ and $D_2$ is defined as and the input analog signal when converting the lower significant 2 bits $D_3$ and $D_4$ is defined as $V_{RB}<V_{IN}<[(V_{284}+V_{283})/2]$, or in a case where the input analog signal when converting the upper significant 2 bits $D_1$ and $D_2$ is defined as $V_{283}<V_{IN}<V_{282}$, and the input analog signal when converting the lower significant 2 bits $D_3$ and $D_4$ is defined as $[(V_{283}+V_{282})/2]<V_{IN}<[(V_{281}+V_{282})/2]$, or in a case where the input analog signal when converting the upper significant 2 bits $D_1$ and $D_2$ is defined as $V_{282}<V_{IN}<V_{281}$, and the input analog signal when converting the lower significant 2 bits $D_3$ and $D_4$ is defined as $[(V_{283}+V_{282})/2]<V_{IN}<[(V_{281}+V_{282})/2]$, in the lower data encoder 276, only the selection line $LN_{224}$ becomes "1".

As a result, the selection signal $SEL_{121}$ is input to the selection gate 279 as the "1" level, and the selection signal $SEL_{122}$ is input to the selection gate 279 as the "0" level.

In the selection gate 279, along with the fact that only the selection signal $SEL_{121}$ is input as the "1" level, only the AND gates $A_{121}$ and $A_{123}$ are activated.

To these AND gates $A_{121}$ and $A_{123}$, the bit data of the upper data side and lower data side of the upper significant data for the L mode generated in the line $LN_{221}$ of the upper data encoder 275 are respectively supplied.

Accordingly, in the selection gate 279, the respective bits of the upper significant data at the L mode are selected, and as a result, they are output as the upper significant data conversion codes $D_1$ and $D_2$ via the OR gates $OR_{121}$ and $OR_{122}$.

Concretely, when the sampling voltage $V_S$ of the analog signal $V_{IN}$ is defined as $V_{RB}<V_S<V_{284}$, the upper data conversion codes [$D_1$, $D_2$] are output as [00]; when $V_{284}<V_S<V_{283}$ stands, the upper significant data conversion codes [$D_1$, $D_2$] are output as [00]; when $V_{283}<V_S<V_{282}$ stands, the upper significant data conversion codes [$D_1$, $D_2$] are output as [10]; when $V_{282}<V_S<V_{281}$ stands, the upper significant data conversion codes [$D_1$, $D_2$] are output as [10]; and when $V_{281}<V_S<V_{RT}$ stands, the upper significant data conversion codes [$D_1$, $D_2$] are output as [11].

Also, in the lower data encoder 276, when the output of the AND gate $AD_{141}$ of the lower data comparator 281 is "1", the lower significant data $BD_{153}$ and $BD_{154}$ are generated as [11]; when the output of the AND gate $AD_{142}$ of the lower data comparator 282 is "1", the lower significant data $BD_{153}$ and $BD_{154}$ are generated as [10]; when the output of the AND gate $AD_{143}$ of the lower data comparator 283 is "1", the lower significant data $BD_{153}$ and $BD_{154}$ are generated as [01]; and when the output of the AND gate $AD_{144}$ of the lower data comparator 284 is "1", the lower significant data $BD_{153}$ and $BD_{154}$ are generated as [00], the data $BD_{153}$ is output to the exclusive-OR gate $EXO_{121}$, and the data $BD_{154}$ is output to the exclusive-OR gate $EXO_{122}$.

In the exclusive-OR gates $EXO_{121}$ and $EXO_{122}$, when $V_{284}<V_S<V_{283}$ and $V_{282}<V_S<V_{281}$ stand, that is where the switching blocks $S_{k41}$ to $S_{k47}$ and $S_{k21}$ to $S_{k27}$ of the second row and fourth row from the bottom of the matrix circuit 270 are selected, since the direction of application of the reference voltage is the forward direction, the levels of the lower significant data are output as the lower significant data conversion codes $D_3$ and $D_4$ while inverting the output level of the lower data encoder 276.

Contrary to this, when $V_{RB}<V_S<V_{284}$, $V_{283}<V_S<V_{282}$ and $V_{281}<V_S<V_{RT}$ stand, that is where the switching blocks $S_{k51}$ to $S_{k57}$, $S_{k31}$ to $S_{k37}$, and $S_{k11}$ to $S_{k17}$ at the first row, third row, and fifth row from the bottom of the matrix circuit 270 are selected, since the direction of application of the reference voltage is the inverse direction, the levels of the lower significant data are held at the output level of the lower data encoder 276 as they are and output as the lower significant data conversion codes $D_3$ and $D_4$.

Also, in a case where the input analog signal when converting the upper significant 2 bits $D_1$ and $D_2$ is defined as $V_{284}<V_{IN}<V_{283}$, and the input analog signal when converting the lower significant 2 bits $D_3$ and $D_4$ is defined as $[(V_{284}+V_{283})/2]<V_{IN}<[(V_{283}+V_{282})/2]$, or in a case where the input analog signal when converting the upper significant 2 bits $D_1$ and $D_2$ is defined as $V_{283}<V_{IN}<V_{282}$, and the input analog signal when converting the lower significant 2 bits $D_3$ and $D_4$ is defined as $[(V_{284}+V_{283})/2]<V_{IN}<[(V_{283}+V_{282})/2]$, or in a case where the input analog signal when converting the upper significant 2 bits $D_1$ and $D_2$ is defined as $V_{282}<V_{IN}<V_{281}$, and the input analog signal when converting the lower significant 2 bits $D_3$ and $D_4$ is defined as $[(V_{282}+V_{281})/2]<V_{IN}<V_{RT}$, or in a case where the input analog signal when converting the upper significant 2 bits $D_1$ and $D_2$ is defined as $V_{281}<V_{IN}$, and the input analog signal when converting the lower significant 2 bits $D_3$ and $D_4$ is defined as $[(V_2+V_{281})/2]<V_{IN}<V_{RT}$, in the lower data encoder 276, only the selection line $LN_{225}$ becomes "1".

As a result, the selection signal $SEL_{122}$ is input to the selection gate 279 as the "1" level, and the selection signal $SEL_{121}$ is input to the selection gate 279 as the "0" level.

In the selection gate 279, along with the fact that only the selection signal $SEL_{122}$ is input as the "1" level, only the AND gates $A_{122}$ and $A_{124}$ are activated.

To these AND gates $A_{122}$ and $A_{124}$, the bit data of the upper data side and lower data side of the upper significant data for the R mode generated in the line $LN_{222}$ of the upper data encoder 275 are respectively supplied.

Accordingly, in the selection gate 279, the respective bits of the upper significant data at the R mode are selected, and as a result, they are output as the upper significant data conversion codes $D_1$ and $D_2$ via the OR gates $OR_{121}$ and $OR_{122}$.

Concretely, when the sampling voltage $V_S$ of the analog signal $V_{IN}$ is defined as $V_{RB}<V_S<V_{284}$, the upper data conversion codes $[D_1, D_2]$ are output as [00]; when $V_{284}<V_S<V_{283}$ stands, the upper significant data conversion codes $[D_1, D_2]$ are output as [01]; when $V_{283}<V_S<V_{282}$ stands, the upper significant data conversion codes $[D_1, D_2]$ are output as [01]; when $V_{282}<V_S<V_{281}$ stands, the upper significant data conversion codes $[D_1, D_2]$ are output as [11]; and when $V_{281}<V_S<V_{RT}$ stands, the upper significant data conversion codes $[D_1, D_2]$ are output as [11].

Also, in the lower data encoder 276, when the output of the AND gate $AD_{145}$ of the lower data comparator 285 is "1", the lower significant data $BD_{153}$ and $BD_{154}$ are generated as [11]; when the output of the AND gate $AD_{146}$ of the lower data comparator 286 is "1", the lower significant data $BD_{153}$ and $BD_{154}$ are generated as [10]; when the output of the AND gate $AD_{147}$ of the lower data comparator 287 is "1", the lower significant data $BD_{153}$ and $BD_{154}$ are generated as [01]; and when the output of the AND gate $AD_{148}$ is "1". the lower significant data $BD_{153}$ and $BD_{154}$ are generated as [00], the data $BD_{153}$ is output to the exclusive-OR gate $EXO_{121}$, and the data $BD_{154}$ is output to the exclusive-OR gate $EXO_{122}$.

In the exclusive-OR gates $EXO_{121}$ and $EXO_{122}$, when $V_{284}<V_S<V_{283}$ and $V_{282}<V_S<V_{281}$ stand, that is where the switching blocks $S_{k41}$ to $S_{k47}$ and $S_{k21}$ to $S_{k27}$ at the second row and fourth row from the bottom of the matrix circuit 270 are selected, since the direction of application of the reference voltage is the forward direction, the levels of the lower significant data are output as the lower significant data conversion codes $D_3$ and $D_4$ while inverting the output level of the lower data encoder 276.

Contrary to this, when $V_{RB}<V_S<V_{284}$, $V_{283}<V_S<V_{282}$ and $V_{281}<V_S<V_{RT}$ stand, that is where the switching blocks $S_{k51}$ to $S_{k57}$, $S_{k31}$ to $S_{k37}$, and $S_{k11}$ to $S_{k17}$ at the first row, third row, and fifth row from the bottom of the matrix circuit 270 are selected, since the direction of application of the reference voltage is the inverse direction, the levels of the lower significant data are held at the output level of the lower data encoder 276 as they are and output as the lower significant data conversion codes $D_3$ and $D_4$.

As explained above, according to the present embodiment, the lower significant codes are divided into two groups, and the signals $SEL_{221}$ and $SEL_{222}$ for selecting the L mode data and R mode data are output from the lower data encoder 276 obtaining these groups of conversion code, so that the L mode data and R mode data output from the upper data encoder 275 are selected, thereby obtaining the upper data conversion codes $D_1$ and $D_2$, and therefore it is possible to use the selection signal directly for the selection of the upper significant data without the use of the inverted gate and inhibit gate as in the conventional circuit.

Accordingly, the input of the selection signal to the selection gate 275 is not delayed relative to the output of the upper data encoder 270, and thus the increase of speed of conversion processing can be achieved.

Also, in addition to the fact that the inverted gate and inhibit gate become unnecessary, the number of selection signals can be reduced to two, and also the number of the upper significant codes to be selected and the number of the input gates of the selection gates can be reduced to two, and therefore an A/D converter circuit with which the reduction of the surface area of the chip and the reduction of the power consumption can be achieved can be realized.

Figure 33C:
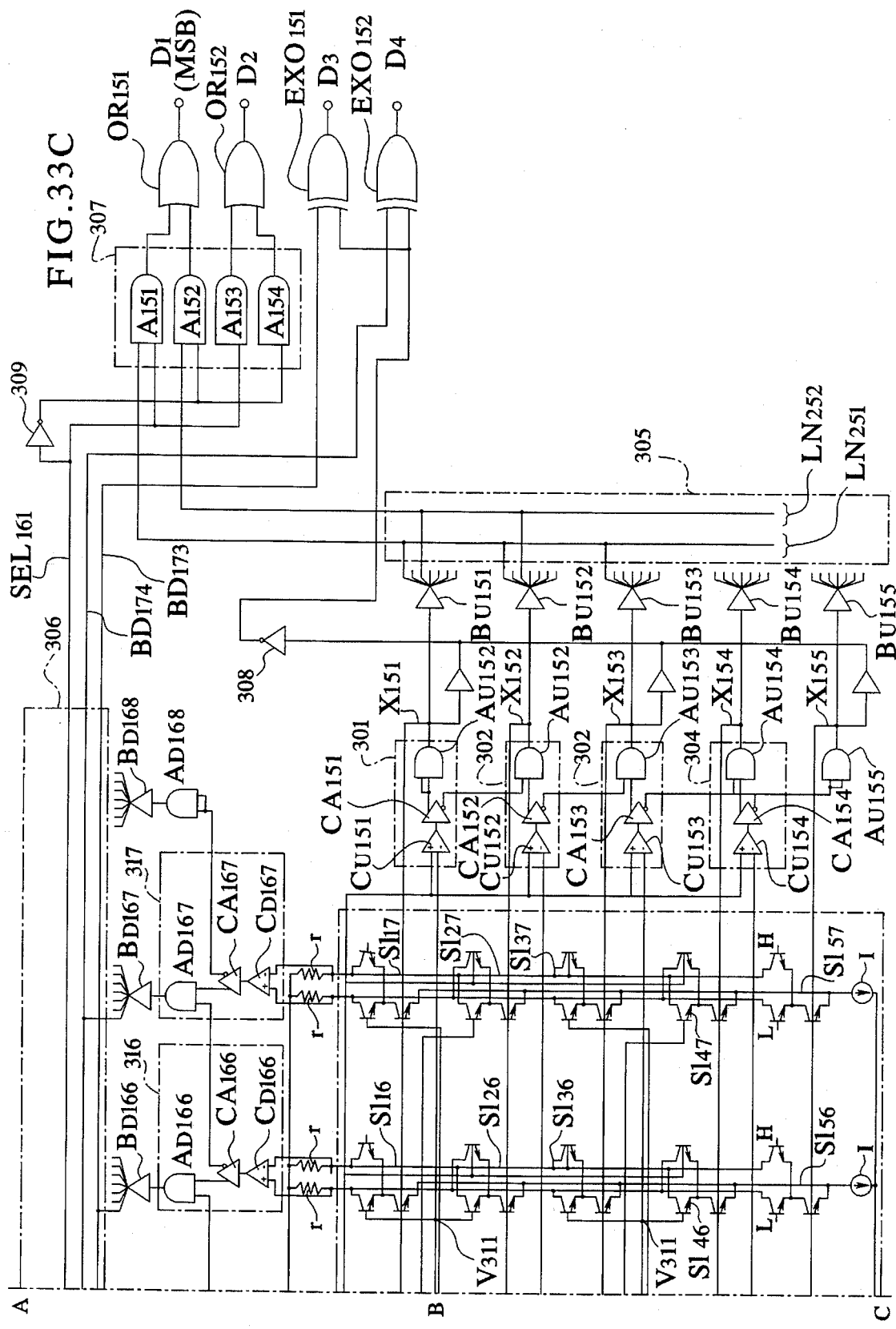

FIGS. 33A–33C are circuit diagrams showing a 12th embodiment of the A/D converter circuit according to the present invention.

The point of difference of the present embodiment from the above-mentioned 11th embodiment resides in the constitution whereby the number of the selection lines of the lower data encoder 306 is reduced to only one line, i.e., $LN_{252}$, to generate only one selection signal $SEL_{161}$ selected from among the selection signals, and a signal obtained by inverting the level of the selection signal $SEL_{161}$ at the inverter 309 is supplied as the signal in place of the selection signal $SEL_{122}$ to the other inputs of the AND gates $A_{152}$ and $A_{154}$ of the selection gate 307.

According to the present 12th embodiment, in addition to the effect of the above-described 11th embodiment, a simpler structure can be realized, and the chip area can be further reduced.

Note that, in the above-mentioned 11th and 12th embodiments, an explanation was made taking as an example an A/D converter circuit for four bits, but needless to say the present invention can be applied to an A/D converter circuit for more bits as well.

Also, in the above-mentioned 11th and 12th embodiments, the structure in which the other output pin buffers are arranged on the input side of the upper data encoder and the lower data encoder was indicated, but these other output pin buffers are provided so as to reliably drive the upper data encoder and the lower data encoder, and it is necessary to provide the same according to a certain capacitance of the upper data encoder and the lower data encoder acting as a so-called load.

As explained above, according to the present invention, there are advantages such that the inverted gate and inhibit gate which have been conventionally necessary become unnecessary, the increase of speed of conversion processing can be achieved. Also, in addition to the fact that the inverted gate and inhibit gate become unnecessary, the number of the selection signals can be reduced and the number of the upper data codes to be selected and the number of the input gates of selection gates can be reduced, so there is an advantage that the reduction of the chip area and the reduction of the power consumption can be achieved.

Figure 34A:
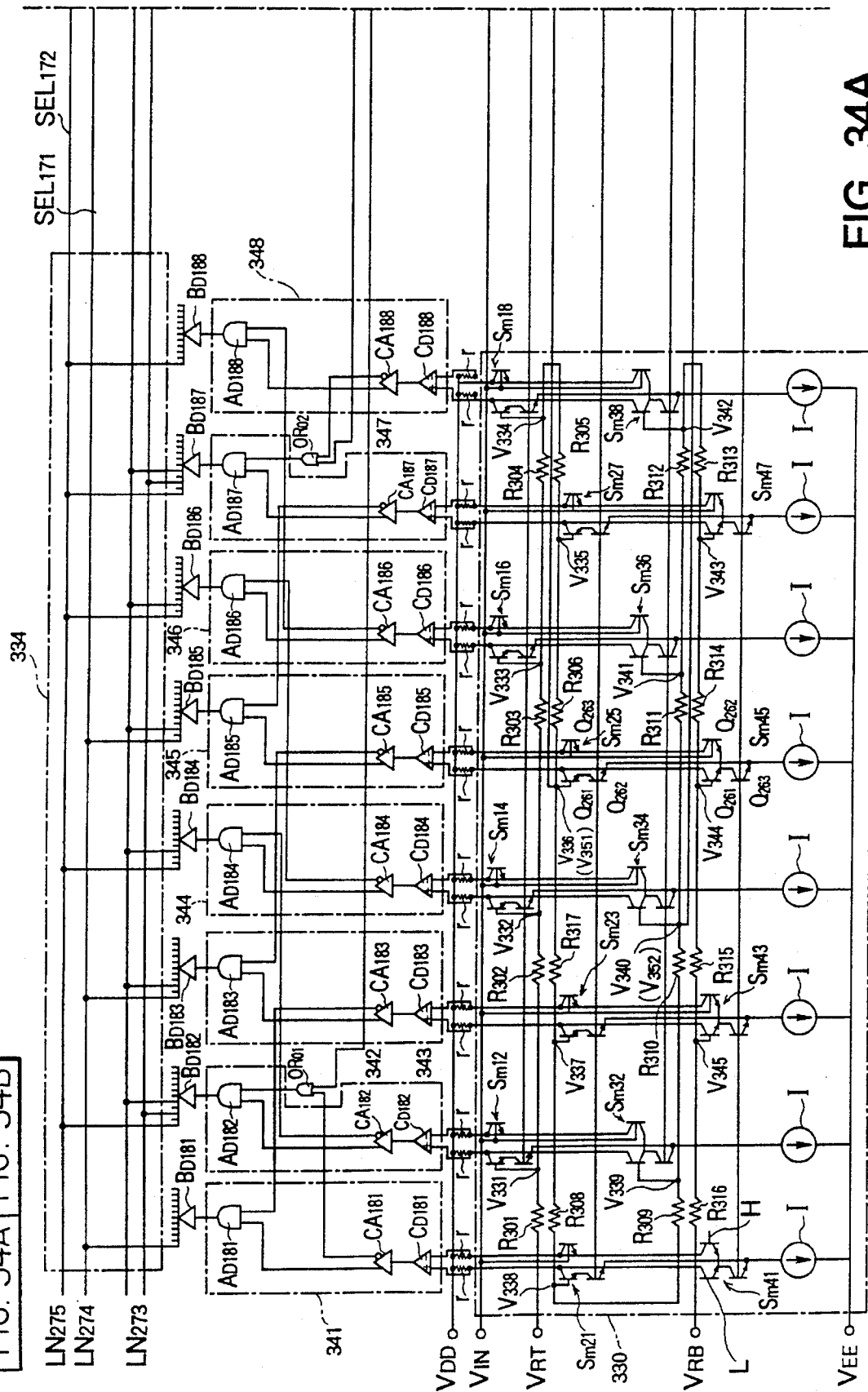
FIGS. 34A and 34B are a block diagram of a serial/parallel A/D converter of a 13th embodiment of the present invention.
Figure 34B:
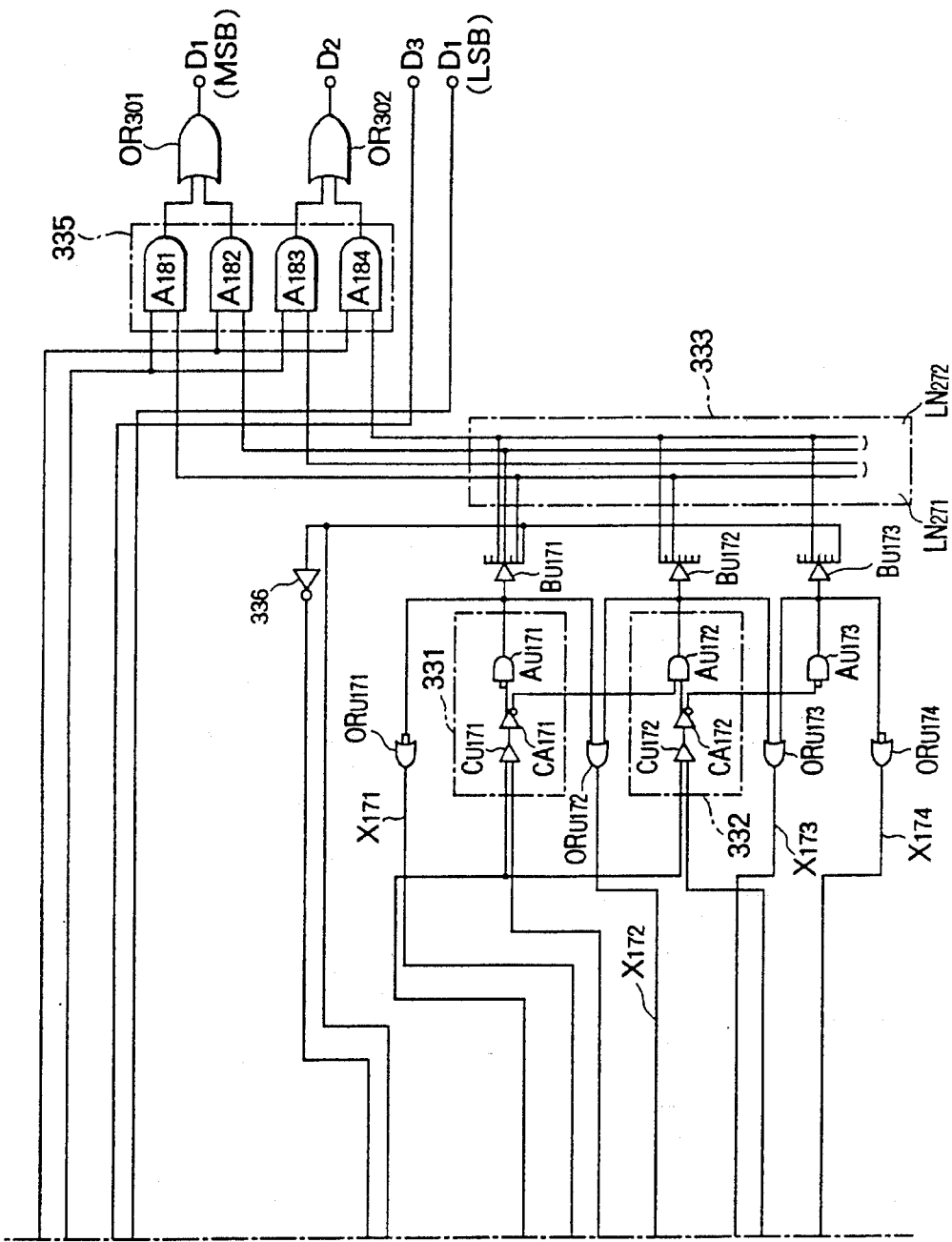

FIG. 34 is a circuit diagram showing a 13th embodiment of the A/D converter circuit according to the present invention.

In FIG. 34, 330 denotes a matrix circuit; 331 and 332 denote upper data comparators; 333, an upper data encoder; 341 to 348 denote lower data comparators; 334, a lower data encoder; 335, a selection gate; 336, an inverter; $R_{301}$ to $R_{316}$ denote reference resistance elements; r, a resistance element for load; $BU_{331}$ to $BU_{333}$ and $BD_{181}$ to $BD_{188}$ denote multiple output pin buffers; $OR_{U171}$ to $OR_{U174}$ denote upper data side 2-input OR-gates; $OR_{D1}$ to $OR_{D2}$ denote lower data side 2-input OR-gates; and $OR_{301}$ and $OR_{302}$ denote 2-input OR-gates for outputting the conversion code; respectively.

The matrix circuit 330 is constituted in the form of a so-called zigzag-shaped matrix comprising 4 rows and 8 columns in which two switching blocks selected from among 16 switching blocks $S_{m12}$, $S_{m14}$, $S_{m16}$, $S_{m18}$, $S_{m21}$, $S_{m23}$, $S_{m25}$, $S_{m27}$, $S_{m32}$, $S_{m34}$, $S_{m36}$, $S_{m38}$, and $S_{m41}$, $S_{m43}$, $S_{m45}$, $S_{m47}$ are arranged in each column.

The specific arrangement is one where the switching blocks $S_{m12}$, $S_{m14}$, $S_{m16}$, and $S_{m18}$ are arranged in the upper stage; the switching blocks $S_{m21}$, $S_{m23}$, $S_{m25}$, and $S_{m27}$ are arranged in the next stage; the switching blocks $S_{m32}$, $S_{m34}$, $S_{m36}$, and $S_{m38}$ are arranged in a lower stage than this; and the switching blocks $S_{m41}$, $S_{m43}$, $S_{m45}$, and $S_{m47}$ are arranged in the lowermost stage, and the switching blocks $S_{m41}$, $S_{m43}$, $S_{m45}$ and $S_{m47}$ and $S_{m21}$, $S_{m23}$, $S_{m25}$ and $S_{m27}$ arranged at the first row and third row from the bottom are formed into sets, whereby the first, third, fifth, and seventh columns are constituted; and the switching blocks $S_{m32}$, $S_{m34}$, $S_{m36}$ and $S_{m38}$ and $S_{m12}$, $S_{m14}$, $S_{m16}$ and $S_{m18}$ are formed into sets, whereby the second, fourth, sixth and eighth columns are constituted.

The respective switching blocks $S_{m12}$, $S_{m14}$, $S_{m16}$, $S_{m18}$, $S_{m21}$, $S_{m23}$, $S_{m25}$, $S_{m27}$, $S_{m32}$, $S_{m34}$, $S_{m36}$, $S_{m38}$, and $S_{m41}$, $S_{m43}$, $S_{m45}$, $S_{m47}$ are constituted by differential type amplifiers comprising the npn-type transistors $Q_{261}$, $Q_{262}$ and $Q_{263}$.

Reference voltages $V_{331}$ to $V_{345}$ obtained by dividing the reference voltages $V_{RT}$ to $V_{RB}$ by the reference resistance elements $R_{301}$ to $R_{316}$ are supplied to the base of one side transistors $Q_{261}$ constituting a so-called differential pair of the respective switching blocks, respectively, and analog signals $V_{IN}$ which are to be converted to a digital code are supplied to the base of the other side transistors $Q_{262}$, respectively.

Also, the emitters of the transistors $Q_{261}$ and $Q_{262}$ are connected to each other, and the middle point of connection thereof is connected to the current source I via the transistor $Q_{263}$ switched by the control signals $x_{171}$ to $x_{174}$ of the OR-gates $ORU_{171}$ to $ORU_{174}$, respectively.

To the collectors of the transistors $Q_{261}$ and $Q_{262}$, the power source voltage $V_{DD}$ is supplied via the resistance element r, the output of which is respectively input to the comparators $CD_{181}$ to $CD_{188}$ of the eight lower data comparators 341 to 348 as mentioned later, which act also as the initial stage amplifiers of the lower data comparators 341 to 348.

The reference resistance elements $R_{301}$ to $R_{316}$ are serially connected between the two reference potentials $V_{RT}$ and $V_{RB}$ and arranged by folding-back so as to extend over a predetermined number of rows, e.g., four rows in the present embodiment, to correspond to the matrix arrangement of the switching blocks in the matrix circuit 330.

Concretely, resistance elements $R_{316}$ to $R_{313}$ are serially connected at the first row from the bottom in the diagrams as to correspond to the switching blocks $S_{m41}$, $S_{m43}$, $S_{m45}$ and $S_{m47}$; resistance elements $R_{312}$ to $R_{309}$ are serially connected at the second row so as to correspond to the switching blocks $S_{m32}$, $S_{m34}$, $S_{m36}$ and $S_{m38}$; resistance elements $R_{308}$ to $R_{305}$ are serially connected at the third row so as to correspond to the switching blocks $S_{m21}$, $S_{m23}$, $S_{m25}$ and $S_{m27}$; and resistance elements $R_{304}$ to $R_{301}$ are serially connected at the fourth row so as to correspond to the switching blocks $S_{m12}$, $S_{m14}$, $S_{m16}$ and $S_{m18}$.

Also, the reference voltage $V_{331}$ $(=V_{351})$ generated at the middle point of connection between the resistance elements $R_{306}$ and $R_{307}$ constituting the resistance column at the third row from the bottom; and the reference voltage $V_{340}$ $(=V_{352})$ generated at the middle point of connection between the resistance elements $R_{310}$ and $R_{311}$ constituting the resistance column at the second row are supplied to the upper data comparators 331 and 332 as the reference voltages obtained by dividing the reference potentials $V_{RT}$ to $V_{RB}$ by rough quantization, respectively.

In the structure of FIG. 34, when assuming that the voltage between the reference potentials $V_{RT}$ to $V_{RB}$ is $V_{REF}$, the respective reference voltages $V_{351}$ and $V_{352}$ become the following values, respectively:

$$V_{336}=V_{351}=(10/16) \cdot V_{REF}$$

$$V_{340}=V_{352}=(6/16) \cdot V_{REF}$$

Wiring is carried out so that the respective reference voltages $V_{331}$ to $V_{345}$ divided by the reference resistance elements $R_{301}$ to $R_{316}$ are supplied to the base of the transistor $Q_{261}$ of the predetermined switching block.

Concretely, a reference voltage $V_{331}$ [=(15/16)·$V_{REF}$] generated at the connection point between the resistance elements $R_{301}$ and $R_{302}$ is supplied to the base of the transistor $Q_{261}$ of the switching block $S_{M12}$.

A reference voltage $V_{332}$ [=(14/16)·$V_{REF}$] generated at the connection point between the resistance elements $R_{302}$ and $R_{303}$ is supplied to the base of the transistor $Q_{261}$ of the switching block $S_{m14}$.

A reference voltage $V_{333}$ [=(13/16)·$V_{REF}$] generated at the connection point between the resistance elements $R_{303}$ and $R_{304}$ is supplied to the base of the transistor $Q_{261}$ of the switching block $S_{m16}$.

A reference voltage $V_{334}$ [=(12/16)·$V_{REF}$] generated at the connection point between the resistance elements $R_{304}$ and $R_{305}$ is supplied to the base of the transistor $Q_{261}$ of the switching block $S_{m18}$.

A reference voltage $V_{335}$ [=(11/16)·$V_{REF}$] generated at the connection point between the resistance elements $R_{305}$ and $R_{306}$ is supplied to the base of the transistor $Q_{261}$ of the switching block $S_{m27}$.

A reference voltage $V_{336}$ [=$V_{351}$=(10/16)·$V_{REF}$] generated at the connection point between the resistance elements $R_{306}$ and $R_{307}$ is supplied to the base of the transistor $Q_{261}$ of the switching block $S_{m25}$.

A reference voltage $V_{337}$ [=(9/16)·$V_{REF}$] generated at the connection point between the resistance elements $R_{307}$ and $R_{308}$ is supplied to the base of the transistor $Q_{261}$ of the switching block $S_{m23}$.

A reference voltage $V_{338}$ [=(8/16)·$V_{REF}$] generated at the connection point between the resistance elements $R_{308}$ and $R_{309}$ is supplied to the base of the transistor $Q_{261}$ of the switching block $S_{m21}$.

A reference voltage $V_{339}$ [=(7/16)·$V_{REF}$] generated at the connection point between the resistance elements $R_{309}$ and $R_{310}$ is supplied to the base of the transistor $Q_{261}$ of the switching block $S_{m32}$.

A reference voltage $V_{340}$ [=$V_{352}$=(6/16)·$V_{REF}$] generated at the connection point between the resistance elements $R_{310}$ and $R_{311}$ is supplied to the base of the transistor $Q_{261}$ of the switching block $S_{m34}$.

A reference voltage $V_{341}$ [=(5/16)·$V_{REF}$] generated at the connection point between the resistance elements $R_{311}$ and $R_{312}$ is supplied to the base of the transistor $Q_{261}$ of the switching block $S_{m36}$.

A reference voltage $V_{342}$ [=(4/16)·$V_{REF}$] generated at the connection point between the resistance elements $R_{312}$ and $R_{313}$ is supplied to the base of the transistor $Q_{261}$ of the switching block $S_{m38}$.

A reference voltage $V_{343}$ [=(3/16)·$V_{REF}$] generated at the connection point between the resistance elements $R_{313}$ and $R_{314}$ is supplied to the base of the transistor $Q_{261}$ of the switching block $S_{m47}$.

A reference voltage $V_{344}$ [=(2/16)·$V_{REF}$] generated at the connection point between the resistance elements $R_{314}$ and $R_{315}$ is supplied to the base of the transistor $Q_{261}$ of the switching block $S_{m45}$.

A reference voltage $V_{345}$ [=(1/16)·$V_{REF}$] generated at the connection point between the resistance elements $R_{315}$ and $R_{316}$ is supplied to the base of the transistor $Q_{261}$ of the switching block $S_{m43}$.

Upper data comparators 331 and 332 respectively are provided with comparators $CU_{171}$ and $CU_{172}$, complementary-type output amplifiers $CA_{171}$ to $CA_{173}$ and AND gates $AU_{171}$ and $AU_{172}$.

An analog signal $V_{IN}$ is supplied to one input of the comparator $CU_{171}$ of the upper data comparator 331, and a reference voltage $V_{351}$ [=$V_{336}$=(10/16)·$V_{REF}$] obtained by dividing the reference potentials $V_{RT}$ to $V_{RB}$ by rough quantization is supplied to the other input.

The analog signal $V_{IN}$ is supplied to one input of the comparator $CU_{172}$ of the upper data comparator 332, and a reference voltage $V_{352}$ [=$V_{340}$=(6/16)·$V_{REF}$] obtained by dividing the reference potentials $V_{RT}$ to $V_{RB}$ by rough quantization is supplied to the other input.

The output of the comparator $CU_{171}$ of the upper data comparator 331 is connected to the input of the output amplifier $CA_{171}$, the positive output thereof is connected to both inputs of a 2-input AND gate $AU_{171}$, and the negative output is connected to one input of the 2-input AND gate $AU_{172}$ of the upper data comparator 332.

The output of the comparator $CU_{172}$ of the upper data comparator 332 is connected to the input of the output amplifier $CA_{172}$, the positive output thereof is connected to the other input of the 2-input AND gate $AU_{172}$, and the negative output is connected to one input of the 2-input AND gate $AU_{173}$.

The outputs of the respective comparators $CU_{171}$ and $CU_{172}$ of the upper data comparators 331 and 332 constituted in this way become the level of "H" or "L" corresponding to the level of the sampled analog signal $V_{IN}$, and only one among the respective AND gates $AU_{171}$ to $AU_{173}$ outputs the "1" level.

The output of the AND gate $AU_{171}$ of the upper data comparator 331 is connected via the buffer $BU_{171}$ to the inputs of the upper data encoder 333 and inverter 336, and the 2-input OR-gate $OR_{D1}$ on the lower significant side and, at the same time, connected to both inputs of the 2-input OR-gate $OR_{U171}$ and one input of the 2-input OR-gate $OR_{U172}$.

The output of the OR-gate $OR_{U171}$ is supplied as the control signal $x_{171}$ to the bases of the transistors $Q_{263}$ of the switching blocks $S_{m12}$, $S_{m14}$, $S_{m16}$, and $S_{m18}$, and the output of the OR-gate $OR_{U172}$ is supplied as the control signal $x_{172}$ to the bases of the transistors $Q_{263}$ of the switching blocks $S_{m21}$, $S_{m23}$, $S_{m25}$ and $S_{m27}$.

Accordingly, where the output of the AND gate $AU_{171}$ of the upper data comparator 331 becomes the "1" level ($V_{251}<V_{IN}<V_{RT}$), the switching blocks $S_{m21}$, $S_{m23}$, $S_{m25}$ and $S_{m27}$ of the third row from the bottom and the switching blocks $S_{m12}$, $S_{m14}$, $S_{m16}$ and $S_{m18}$ of the fourth row are activated.

The output of the AND gate $AU_{172}$ of the upper data comparator 332 is connected via the buffer $BU_{172}$ to the inputs of the upper data encoder 333 and, at the same time, connected to the other input of the 2-input OR-gate $OR_{U172}$ and one input of the 2-input OR-gate $OR_{U173}$.

The output of the OR-gate $OR_{U172}$ is supplied as the control signal $x_{172}$ to the bases of the transistors $Q_{263}$ of the switching blocks $S_{m21}$, $S_{m23}$, $S_{m25}$ and $S_{m27}$ as mentioned above, and the output of the OR-gate $OR_{U173}$ is supplied as the control signal $x_{173}$ to the bases of the transistors $Q_{263}$ of the switching blocks $S_{m32}$, $S_{m34}$, $S_{m36}$ and $S_{m38}$.

Accordingly, where the output of the AND gate $AU_{172}$ of the upper data comparator 332 becomes the "1" level ($V_{352}<V_{IN}<V_{351}$), the switching blocks $S_{m21}$, $S_{m23}$, $S_{m25}$ and $S_{m27}$ of the third row from the bottom and the switching blocks $S_{m32}$, $S_{m34}$, $S_{m36}$ and $S_{m38}$ of the second row are activated.

The output of the AND gate $AU_{173}$ is connected via the buffer $BU_{173}$ to the inputs of the upper data encoder 333 and inverter 336, and the 2-input OR-gate $OR_{D1}$ on the lower data side and, at the same time, connected to the other input of the 2-input OR-gate $OR_{U173}$ and both inputs of the 2-input OR-gate $OR_{U174}$.

The output of the OR-gate $OR_{U173}$ is supplied as the control signal $x_{173}$ to the bases of the transistors $Q_{263}$ of the switching blocks $S_{m32}$, $S_{m34}$, $S_{m36}$ and $S_{m38}$ as mentioned above, and the output of the OR-gate $OR_{U174}$ is supplied as the control signal $x_{174}$ to the bases of the transistors $Q_{263}$ of the switching blocks $S_{m41}$, $S_{m42}$, $S_{m43}$ and $S_{m44}$.

Accordingly, where the output of the AND gate $AU_{173}$ becomes the "1" level ($V_{RB}<V_{IN}<V_{252}$), the switching blocks $S_{m32}$, $S_{m34}$, $S_{m36}$ and $S_{m38}$ at the second row from the bottom and the switching blocks $S_{m41}$, $S_{m43}$, $S_{m45}$ and $S_{m47}$ are activated.

The upper data encoder 333 is constituted by an encoder line $LN_{271}$ generating the data for the first mode, and an encoder line $LN_{272}$ generating the data for the second mode.

Namely, in the upper data encoder 333, respective encoder lines $LN_{271}$ and $LN_{272}$ are set in correspondence with a first group comprising switching block columns constituting odd number columns and a second group comprising switching block columns constituting even number columns among switching blocks $S_{m12}$, $S_{m14}$, $S_{m16}$, $S_{m18}$, $S_{m21}$, $S_{m23}$, $S_{m25}$, $S_{m27}$, $S_{m32}$, $S_{m34}$, $S_{m36}$, $S_{m38}$, and $S_{m41}$, $S_{m43}$, $S_{m45}$, $S_{m47}$ arranged in the matrix circuit 330.

FIG. 35 shows the correspondence between the outputs of the respective AND gates $AU_{171}$, $AU_{172}$ and $AU_{173}$ of the upper data comparators 331 and 332 and the set output data code pattern of the respective encoder lines $LN_{271}$ and $LN_{272}$ of the upper data encoder 333.

The setting of the data is basically determined by the data arrangement of FIG. 36 mentioned later, and the value of the set data is set so that, by using the generation position of the reference potential $V_{RB}$, reference voltages $V_{332}$ and $V_{340}$ as the reference, in accordance with whether the direction of transition of the reference voltage level by the respective reference resistance elements, concretely an orientation (hereinafter referred to as a direction) of transition of the reference voltage from the low potential side to the high potential side is the right direction or left direction, so that the data of the first mode<the data of the second mode and the data of the first mode<the data of the second mode stand.

Accordingly, the data setting level in the case where the AND gates $AU_{173}$ and $AU_{171}$ are at the "1" level when $V_{RB}<V_{IN}<V_{340}$ ($V_{352}$) and $V_{336}$ ($V_{351}$)$<V_{IN}<V_{RT}$ is set so that the data of the first mode<the data of the second mode stands.

Contrary to this, the data setting level in the case where the AND gate $AU_{172}$ is at the "1" level when $V_{340}$ ($V_{352}$)$<V_{IN}<V_{336}$ ($V_{351}$) is set so that the data of the first mode<the data of the second mode stands.

The lower data comparators 341 to 348 respectively are provided with comparators $CD_{181}$ to $CD_{188}$, complementary-type output amplifiers $CA_{181\ to\ 188}$ and AND gates $AD_{181}$ to $AD_{188}$.

To one input of the comparator $CD_{181}$ of the lower data comparator 341 is supplied the collector outputs of the transistors $Q_{261}$ of the switching blocks $S_{m21}$ and $S_{m41}$ of the first column of the matrix circuit 330, while to the other input is supplied the collector outputs of the transistors $Q_{262}$ of the switching blocks $S_{m21}$ and $S_{m41}$.

To one input of the comparator $CD_{182}$ of the lower data comparator 342 is supplied the collector outputs of the transistors $Q_{261}$ of the switching blocks $S_{m12}$ and $S_{m32}$ of the second column of the matrix circuit 330, while to the other input is supplied the collector outputs of the transistors $Q_{262}$ of the switching blocks $S_{m12}$ and $S_{m32}$.

To one input of the comparator $CD_{183}$ of the lower data comparator 343 is supplied the collector outputs of the transistors $Q_{261}$ of the switching blocks $S_{m23}$ and $S_{m43}$ of the third column of the matrix circuit 330, while to the other input is supplied the collector outputs of the transistors $Q_{262}$ of the switching blocks $S_{m23}$ and $S_{m43}$.

To one input of the comparator $CD_{184}$ of the lower data comparator 344 is supplied the collector outputs of the transistors $Q_{261}$ of the switching blocks $S_{m14}$ and $S_{m34}$ of the fourth column of the matrix circuit 330, while to the other input is supplied the collector outputs of the transistors $Q_{262}$ of the switching blocks $S_{m14}$ and $S_{m34}$.

To one input of the comparator $CD_{185}$ of the lower data comparator 345 is supplied the collector outputs of the transistors $Q_{261}$ of the switching blocks $S_{m25}$ and $S_{m45}$ of the fifth column of the matrix circuit 330, while to the other input is supplied the collector outputs of the transistors $Q_{262}$ of the switching blocks $S_{m25}$ and $S_{m45}$.

To one input of the comparator $CD_{186}$ of the lower data comparator 346 is supplied the collector outputs of the transistors $Q_{261}$ of the switching blocks $S_{m16}$ and $S_{m36}$ at the sixth column of the matrix circuit 330, and to the other input is supplied the collector outputs of the transistors $Q_{262}$ of the switching blocks $S_{m16}$ and $S_{m36}$.

To one input of the comparator $CD_{187}$ of the lower data comparator 347 is supplied the collector outputs of the transistors $Q_{261}$ of the switching blocks $S_{m27}$ and $S_{m47}$ at the seventh column of the matrix circuit 330, and to the other input is supplied the collector outputs of the transistors $Q_{262}$ of the switching blocks $S_{m27}$ and $S_{m47}$.

To one input of the comparator $CD_{188}$ of the lower data comparator 348 is supplied the collector outputs of the transistors $Q_{261}$ of the switching blocks $S_{m18}$ and $S_{m38}$ at the eighth column of the matrix circuit 330, and to the other input is supplied the collector outputs of the transistors $Q_{262}$ of the switching blocks $S_{m18}$ and $S_{m38}$.

The output of the comparator $CD_{181}$ of the lower data comparator 341 is connected to the input of the output amplifier $CA_{181}$, the positive output thereof is connected to one input of the 2-input AND gate $AD_{181}$, and the negative output is connected to one input of the 2-input OR gate $OR_{D1}$.

The outputs of the buffers $BU_{181}$ and $BU_{183}$ receiving the outputs of the AND gates $AU_{181}$ and $AU_{183}$ on the upper data side are connected to the other input of the OR-gate $OR_{D1}$, and the output of the OR-gate $OR_{D1}$ is connected to one input of the AND gate $AD_{182}$ of the lower data comparator 342.

The output of the comparator $CD_{182}$ of the lower data comparator 342 is connected to the input of the output amplifier $CA_{182}$, the positive output thereof is connected to the other input of the 2-input AND gate $AD_{182}$, and the negative output is connected to one input of the 2-input AND gate $AD_{184}$ of the lower data comparator 344.

The output of the comparator $CD_{183}$ of the lower data comparator 343 is connected to the input of the output amplifier $CA_{183}$, the positive output thereof is connected to one input of the 2-input AND gate $AD_{183}$, and the negative output is connected to the other input of the 2-input AND gate $AD_{181}$ of the lower data comparator 341.

The output of the comparator $CD_{184}$ of the lower data comparator 344 is connected to the input of the output amplifier $CA_{184}$, the positive output thereof is connected to the other input of the 2-input AND gate $AD_{184}$, and the negative output is connected to one input of the 2-input AND gate $AD_{186}$ of the lower data comparator 346.

The output of the comparator $CD_{185}$ of the lower data comparator 345 is connected to the input of the output amplifier $CA_{185}$, the positive output thereof is connected to one input of the 2-input AND gate $AD_{185}$, and the negative output is connected to the other input of the 2-input AND gate $AD_{183}$ of the lower data comparator 343.

The output of the comparator $CD_{186}$ of the lower data comparator 346 is connected to the input of the output amplifier $CA_{186}$, the positive output thereof is connected to one input of the 2-input AND gate $AD_{186}$, and the negative output is connected to one input of the 2-input AND gate $AD_{188}$ of the lower data comparator 348.

The output of the comparator $CD_{187}$ of the lower data comparator 347 is connected to the input of the output amplifier $CA_{187}$, the positive output thereof is connected to one input of the 2-input AND gate $AD_{187}$, and the negative output is connected to the other input of the 2-input AND gate $AD_{185}$ of the lower data comparator 345.

The output of the comparator $CD_{188}$ of the lower data comparator 348 is connected to the input of the output amplifier $CA_{188}$, the positive output thereof is connected to the other input of the 2-input AND gate $AD_{188}$, and the negative output is connected to one input of the 2-input OR gate $OR_{D2}$.

The output of the inverter 336 inverting the output levels of the buffers $BU_{171}$ and $BU_{173}$ receiving the outputs of the AND gates $AU_{171}$ and $AU_{173}$ on the upper data side is connected to the other input of the OR-gate $OR_{D2}$, and the output of the OR-gate $OR_{D2}$ is connected to the other input of the AND gate $AD_{187}$ of the lower data comparator 347.

A so-called ring comparator is constituted by the lower data comparators 341 to 348 constituted in this way, the outputs of the respective comparators $CD_{181}$ to $CD_{188}$ become the level of "H" or "L" corresponding to the level of 2 inputs, and only one of the respective AND gates $AD_{181}$ to $AD_{188}$ outputs the active "1" level.

The outputs of the AND gates $AD_{181}$ to $AD_{188}$ of the lower data comparators 341 to 348 are connected via the buffers $B_{D1}$ to $B_{D8}$ to the lower data encoder 334.

The lower data encoder 334 is constituted by a data line $LN_{273}$ generating lower significant data $D_3$ and $D_4$; a selection line $LN_{274}$ generating the selection signal $SEL_{171}$ indicating that one of the outputs of the AND gates $AD_{181}$, $AD_{183}$, $AD_{185}$, and $AD_{187}$ of the lower data comparators 341, 343, 345 and 347 becomes "1"; and a selection line $LN_{275}$ generating the selection signal $SEL_{172}$ indicating that one of the outputs of the AND gates $AD_{182}$, $AD_{184}$, $AD_{186}$ and $AD_{188}$ of the lower data comparators 342, 344, 346 and 348 becomes "1".

FIG. 36 shows the correspondence between the outputs of the AND gates $AU_{181}$ to $AU_{183}$ on the upper data side and the outputs of the AND gates $AD_{181}$ to $AD_{188}$ on the lower data side and the output conversion code data.

As shown in FIG. 36, the upper data code is determined according to the row in the correspondence table.

Namely, in the table, it becomes [00], [01], [10] and [11] in sequence from the lowermost bit row.

Contrary to this, the lower bit codes are classified into two types, i.e., [0000] to [0011] and [0100] to [0111] in accordance with the row.

From above, the upper data code can be selected from two conditions that which among the upper data side AND gates $AU_{181}$ to $AU_{183}$ output "1" and which group of AND gate in the first group comprising the odd number of AND gates $AD_{181}$, $AD_{183}$, $AD_{185}$ and $AD_{187}$ and the second group comprising the even number of AND gates $AD_{182}$, $AD_{184}$, $AD_{186}$ and $AD_{188}$ among the respective AND gates $AD_{181}$ to $AD_{188}$ of the lower data comparators 341 to 348 output "1".

For example, where the upper data side AND gate $AU_{171}$ outputs "1", if there is one among the AND gates of the first group of the lower data comparator which outputs "1", [00] is selected as the upper data code, while if there is one among the AND gates of the second group which outputs "1", [01] is selected as the upper data code, This selection of the upper data code is carried out at the selection gate 335.

The selection gate 335 is constituted by AND gates $A_{181}$ to $A_{184}$, selects one side upper significant data from among the respective upper significant data of the first mode and second mode output from the upper data encoder 333 using the selection signals $SEL_{171}$ and $SEL_{172}$ output from the lower data encoder 334, and outputs the same via the OR-gates $OR_{301}$ and $OR_{302}$ as the conversion codes $D_1$ and $D_2$.

Concretely, one input terminal of the AND gate $A_{181}$ is connected to one line (upper data side) of the encoder line $LN_{271}$ generating the data for the first mode of the upper data encoder 333, and the other input terminal is connected to the selection line $LN_{274}$ outputting the selection signal $SEL_{171}$ of the lower data encoder 334.

One input terminal of the AND gate $A_{182}$ is connected to one line (upper data side) of the encoder line $LN_{272}$ generating the data for the second mode of the upper data encoder 333, and the other input terminal is connected to the selection line $LN_{275}$ outputting the selection signal $SEL_{172}$ of the lower data encoder 334.

The outputs of these AND gates $A_{181}$ and $A_{182}$ connected to the respective input terminals of the 2-input OR-gate $OR_{301}$.

One input terminal of the AND gate $A_{183}$ is connected to the other line (lower data side) of the encoder line $LN_{271}$ generating the data for the first mode of the upper data encoder 333, and the other input terminal is connected to the selection line $LN_{172}$ outputting the selection signal $SEL_{171}$ of the lower data encoder 334.

One input terminal of the AND gate $A_{184}$ is connected to the other line (lower data side) of the encoder line $LN_{272}$ generating the data for the second mode of the upper data encoder 333, and the other input terminal is connected to the selection line $LN_{275}$ outputting the selection signal $SEL_{172}$ of the lower data encoder 334.

The outputs of these AND gates $A_{183}$ and $A_{184}$ are connected to the respective input terminals of the 2-input OR-gate $OR_{302}$.

Next, an explanation will be made of the operation by the above-described structure.

For example, when the sampling voltage $V_S$ of the sampled analog signal is represented as $V_{RB} < V_S < V_{352}$ ($=V_{340}$), the outputs of the comparators $CU_{171}$ and $CU_{172}$ of the upper data comparators 331 and 332 become ("L"), so that the digital signals are output, i.e., "0" is output from the AND gates $AU_{171}$ and $AU_{172}$, and "1" is output from the AND gate $AU_{173}$, respectively.

As a result, a digital signal such as [001] is input to the upper data encoder 333 via the buffers $BU_{171}$ to $BU_{173}$. At the upper data encoder 133, using a so-called wired-OR circuit, the upper significant data [00] are generated in two columns of encoder lines [$LN_{271}$] generating the data for the first mode, and the upper significant data [01] are generated in two columns of encoder lines [$LN_{272}$] generating the data for the second mode, respectively, which are output to the selection gate 335.

Also, if the sampling voltage $V_S$ is represented as $V_{352} < V_S < V_{351}$ ($=V_{336}$), the output of the comparator $CU_{171}$ of the upper data comparator 331 becomes "L", and the output of the comparator $CU_{172}$ of the upper data comparator 332 becomes "H", so that the digital signals are output, i.e., "0" is output from the AND gates $AU_{171}$ and $AU_{173}$ of the upper data comparator 331, and "1" is output from the AND gate $AU_{172}$ of the upper data comparator 332, respectively.

As a result, a digital signal such as [010] is input to the upper data encoder 333 via the buffers $BU_{171}$ to $BU_{173}$. At the upper data encoder 333, using a so-called wired-OR circuit, the upper significant data are generated, i.e., [10] is generated in two columns of encoder lines $[LN_{271}]$ generating the data for the first mode, and [01] is generated in two columns of encoder lines $[LN_{272}]$ generating the data for the second mode, respectively, which are output to the selection gate 335.

Also, if the sampling voltage $V_S$ is represented as $V_{351} < V_S < V_{RT}$, the output of the comparator $CU_{171}$ of the upper data comparator 331 becomes "H", and the output of the comparator $CU_{172}$ of the upper data comparator 332 becomes "L", so that the digital signals are output, i.e., "1" is output from the AND gate $AU_{171}$ of the upper data comparator 331, and "0" is output from the AND gates $AU_{172}$ and $AU_{173}$ of the upper data comparator 332, respectively.

As a result, a digital signal such as [100] is input to the upper data encoder 333 via the buffers $BU_{171}$ to $BU_{173}$. At the upper data encoder 333, using a so-called wired-OR circuit, the upper significant data are generated, i.e. [10] is generated in two columns of encoder lines $[LN_{271}]$ generating the data for the first mode, and [11] is generated in two columns of encoder lines $[LN_{272}]$ generating the data for the second mode, respectively, which are output to the selection gate 335.

In parallel with this, the transistors $Q_{263}$ of the respective switching blocks of the matrix circuit 330 connected to the control lines $(x_{171}, x_{172}, x_{173}, x_{174})$ at which the digital output signal has become "1" among the respective AND gates $AU_{(171, 172, 173)}$ are controlled to turn ON in units of rows and further a fine digitization of the quantization level is executed.

For example, when only the output of the AND gate $AU_{173}$ becomes the "1" level, the respective transistors $Q_{263}$ of the switching blocks $S_{m41}, S_{m43}, S_{m45}$ and $S_{m47}$ at the first row from the bottom in the diagram constituting the first group and the switching blocks $S_{m32}, S_{m34}, S_{m36}$ and $S_{m38}$ at the second row constituting the second group adjoining to them become ON, the reference voltages $V_{339}$ to $V_{345}$ divided by the reference resistances $R_{309}$ to $R_{316}$ and the sampling voltage $V_S$ are differentially amplified at the respective switching blocks $S_{m41}, S_{m43}, S_{m45}$ and $S_{m47}$, and $S_{m32}, S_{m34}, S_{m36}$ and $S_{m38}$, and they are compared by the lower data comparators 341 to 348.

Similarly, when the output of the AND gate $AU_{172}$ is the "1" level, the switching blocks $S_{m32}, S_{m34}, S_{m36}$ and $S_{m38}$ at the second row and the switching blocks $S_{m21}, S_{m23}, S_{m25}$ and $S_{m27}$ at the third row adjoining to them are activated, so that the differential amplification operation is performed, and the comparison by the lower data comparators 341 to 348 is carried out.

For example, when the output of the AND gate $AU_{172}$ is the "1" level, the lower data conversion code is detected by the switching blocks $S_{m21}, S_{m23}, S_{m32}$ and $S_{m34}$, and the redundant bit of the lower significant data conversion code is detected by the switching blocks $S_{m25}, S_{m27}, S_{m36}$ and $S_{m38}$.

In this way, in the lower data conversion codes, the sampled voltage $V_S$ and the reference voltage divided by the reference resistance elements are compared by the activated switching blocks, so that the digital signal in accordance with the result of comparison will be output from the AND gates $AD_{181}$ to $AD_{187}$ and $AD_{188}$ of the lower data comparators 341 to 348.

At this time, where the signal of the "1" level is output from one AND gate among the AND gates $AD_{181}, AD_{183}, AD_{185}$ and $AD_{187}$ of the lower data comparators 341, 343, 345 and 347 constituting the first group to the lower data encoder 334, at the lower data encoder 334, the selection line $LN_{274}$ becomes "1".

As a result, the selection signal $SEL_{171}$ is input to the selection gate 335 as the "1" level, and the selection signal $SEL_{172}$ is input to the selection gate 335 as the "0" level.

In the selection gate 335, along with the fact that only the selection signal $SEL_{171}$ is input as the "1" level, only the AND gates $A_{181}$ and $A_{183}$ are activated.

To these AND gates $A_{181}$ and $A_{183}$, the bit data on the upper data side and lower data side of the upper significant data for the first mode generated in the line $LN_{271}$ of the upper data encoder 333 are respectively supplied.

Accordingly, in the selection gate 335, the respective bits of the upper significant data at the time of the first mode are selected, and as a result, they are output as the upper significant data conversion codes $D_1$ and $D_2$ via the OR gates $OR_{301}$ and $OR_{302}$.

Concretely, when the sampling voltage $V_S$ of the analog signal $V_{IN}$ is defined as $V_{RB} < V_S < V_{352}$, the upper data conversion codes $[D_1, D_2]$ are output as [00]; when $V_{352} < V_S < V_{351}$ stands, the upper significant data conversion codes $[D_1, D_2]$ are output as [10]; and when $V_{351} < V_S < V_{RT}$ stands, the upper significant data conversion codes $[D_1, D_2]$ are output as [10].

Also, in the lower data encoder 334, when the output of the AND gate $AD_{181}$ of the lower data comparator 341 is "1", the lower data conversion codes $D_3$ and $D_4$ are generated as [00]; when the output of the AND gate $AD_{183}$ of the lower data comparator 343 is "1", the lower data conversion codes $D_3$ and $D_4$ are generated as [01]; when the output of the AND gate $AD_{185}$ of the lower data comparator 345 is "1", the lower data conversion codes $D_3$ and $D_4$ are generated as [10]; and when the output of the AND gate $AD_{187}$ of the lower data comparator 347 is "1", the lower data conversion codes $D_3$ and $D_4$ are generated as [11], which are output.

Where the signal of the "1" level is output from one AND gate among the AND gates $AD_{182}, AD_{184}, AD_{186}$ and $AD_{188}$ of the lower data comparators 342, 344, 346 and 348 constituting the second group to the lower data encoder 334, at the lower data encoder 334, the selection line $LN_{275}$ becomes "1".

As a result, the selection signal $SEL_{172}$ is input to the selection gate 335 as the "1" level, and the selection signal $SEL_{171}$ is input to the selection gate 335 as the "0" level.

In the selection gate 335, along with the fact that only the selection signal $SEL_{171}$ is input as the "1" level, only the AND gates $A_{182}$ and $A_{184}$ are activated.

To these AND gates $A_{182}$ and $A_{184}$, the bit data on the upper data side and lower data side of the upper significant data for the second mode generated in the line $LN_{272}$ of the upper data encoder 333 are respectively supplied.

Accordingly, in the selection gate 335, the respective bits of the upper significant data at the time of the second mode are selected, and as a result, they are output as the upper significant data conversion codes $D_1$ and $D_2$ via the OR gates $OR_{301}$ and $OR_{302}$.

Concretely, when the sampling voltage $V_S$ of the analog signal $V_{IN}$ is defined as $V_{RB} < V_S < V_{352}$, the upper data conversion codes $[D_1, D_2]$ are output as [01]; when $V_{352} < V_S < V_{351}$ stands, the upper significant data conversion codes $[D_1, D_2]$ are output as [01]; and when $V_{351} < V_S < V_{RT}$ stands, the upper significant data conversion codes $[D_1, D_2]$ are output as [11].

Also, in the lower data encoder 334, when the output of the AND gate $AD_{182}$ of the lower data comparator 342 is "1", the lower data conversion codes $D_3$ and $D_4$ are generated as [11]; when the output of the AND gate $AD_{184}$ of the lower data comparator 344 is "1", the lower data conversion codes $D_3$ and $D_4$ are generated as [10]; when the output of the AND gate $A_{D6}$ of the lower data comparator 346 is "1", the lower data conversion codes $D_3$ and $D_4$ are generated as [01]; and when the output of the AND gate $AD_{188}$ of the lower data comparator 348 is "1", the lower data conversion codes $D_3$ and $D_4$ are generated as [00], which are output.

As explained above, according to the present embodiment, the reference voltages $V_{336}$ ($=V_{351}$) and $V_{340}$ ($=V_{352}$) supplied to the switching block positioned intermediate in the row direction between the second row and third row among the switching blocks arranged in the form of a matrix comprising 4 rows and 8 columns are supplied to the upper data comparators 331 and 332, respectively, the lower significant codes are divided to two groups, signals $SEL_{171}$ and $SEL_{172}$ for selecting the first mode data and second mode data are output from the lower data encoder 334 obtaining this group of conversion code, so that the first mode data and second mode data output from the upper data encoder 333 are selected, thereby obtaining the upper data conversion codes $D_1$ and $D_2$, and therefore it is possible to use the selection signal directly for the selection of the upper significant data without the use of the inverted gate and inhibit gate as in the conventional circuit.

Accordingly, the input of the selection signal to the selection gate 335 is not delayed relative to the output of the upper data encoder 333, and thus the increase of speed of conversion processing can be achieved.

Also, in addition to the fact that the inverted gate and inhibit gate become unnecessary, an increase of the number of the reference resistance columns can be prevented and, at the same time, the number of selection signals can be reduced to two. Also, the number of the upper significant code to be selected and the number of the input gate of the selection gate can be reduced to two, and further a reduction of the number of the switching blocks can be achieved.

Accordingly, there is an advantage that an A/D converter circuit with which the reduction of the surface area of the chip and the reduction of power consumption can be achieved can be realized.

Figure 37A:
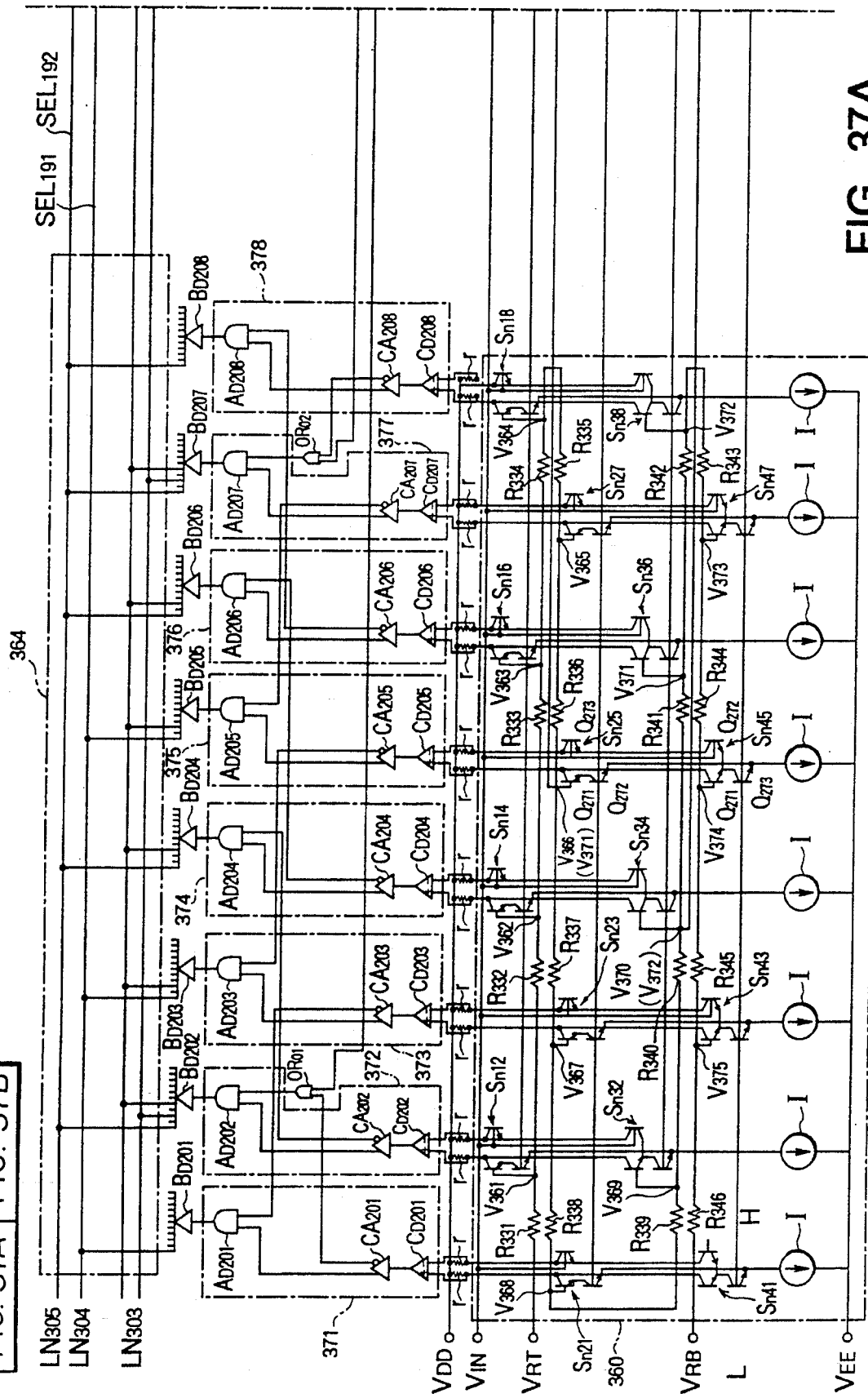

FIG. 37 is a circuit diagram showing a 14th embodiment of the A/D converter circuit according to the present invention.

The point of difference of the 14th embodiment from the above-mentioned 13th embodiment resides in the constitution wherein, in the upper data encoder 363, in both of the first mode and second mode, the lower data side bit (minimum bit) $D_2$ of the upper data code is not generated, only the upper data side bit $D_1$ is generated, and the lower data side bit (minimum bit) $D_2$ is output as the upper significant data conversion code $D_2$ using the selection signal $SEL_{192}$ generated in the lower data encoder 364 as it is.

As seen from FIG. 36, as the upper least significant bit (the second bit from the highest bit of the 4-bit data in FIG. 36), "0" and "1" are alternately repeated for every row. This is similar to the selection signal $SEL_{192}$ corresponding to the second group.

Accordingly, even if the constitution is made so that the selection signal $SEL_{192}$ generated in the lower data encoder 364 is used as it is and output as the upper data conversion code $D_2$, it has the same function as that in the case of the above-mentioned 13th embodiment. Not only can similar effects be obtained, but also the reduction of the number of the upper data codes to be selected and the reduction of the OR-gates in the selection gate 366 can be achieved. Thus, there is an advantage that the reduction of the chip area and the reduction of the power consumption can be achieved.

Figure 38A:
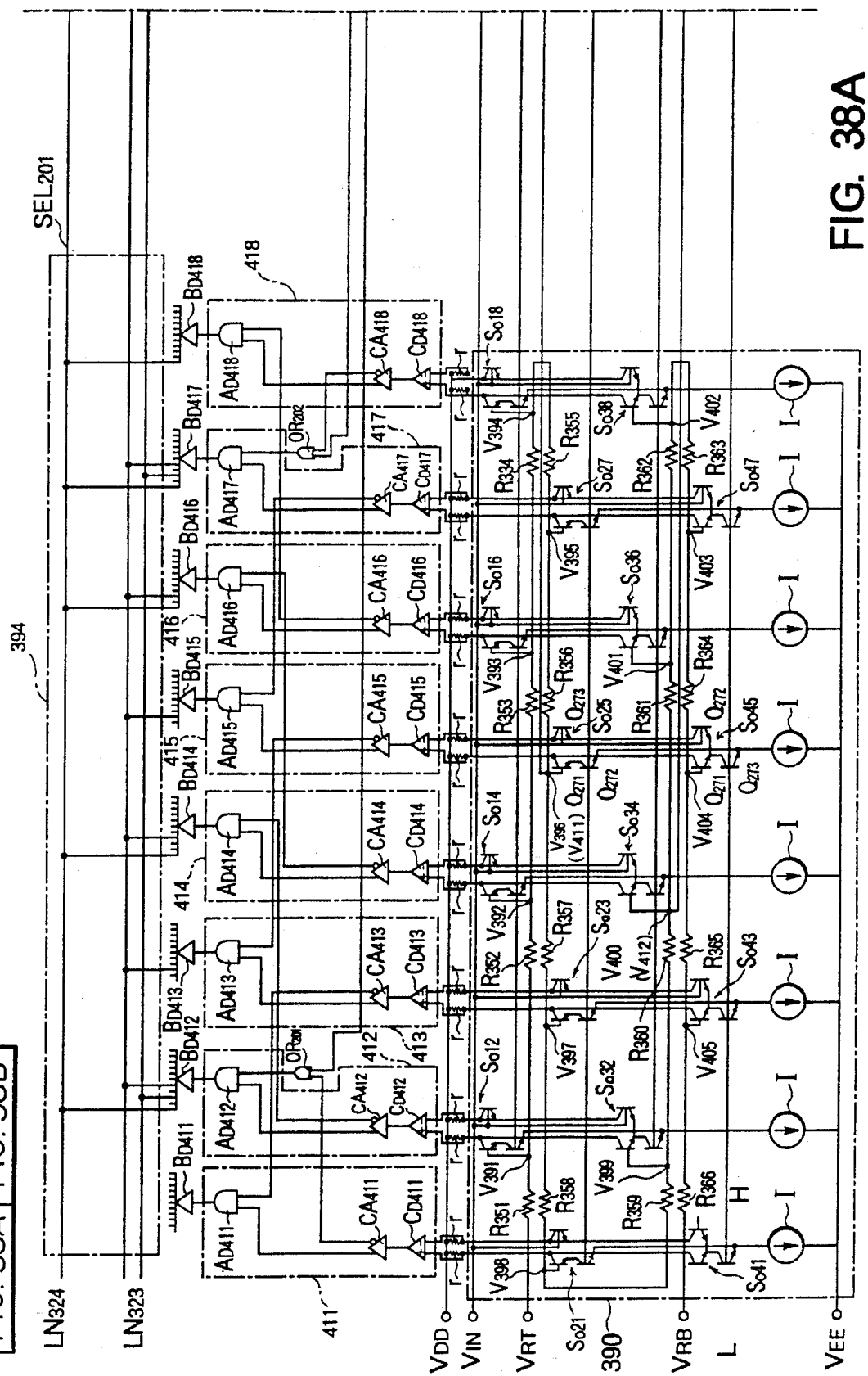
FIGS. 38A and 38B are a block diagram of a serial/parallel A/D converter of a 15th embodiment of the present invention.
Figure 38B:
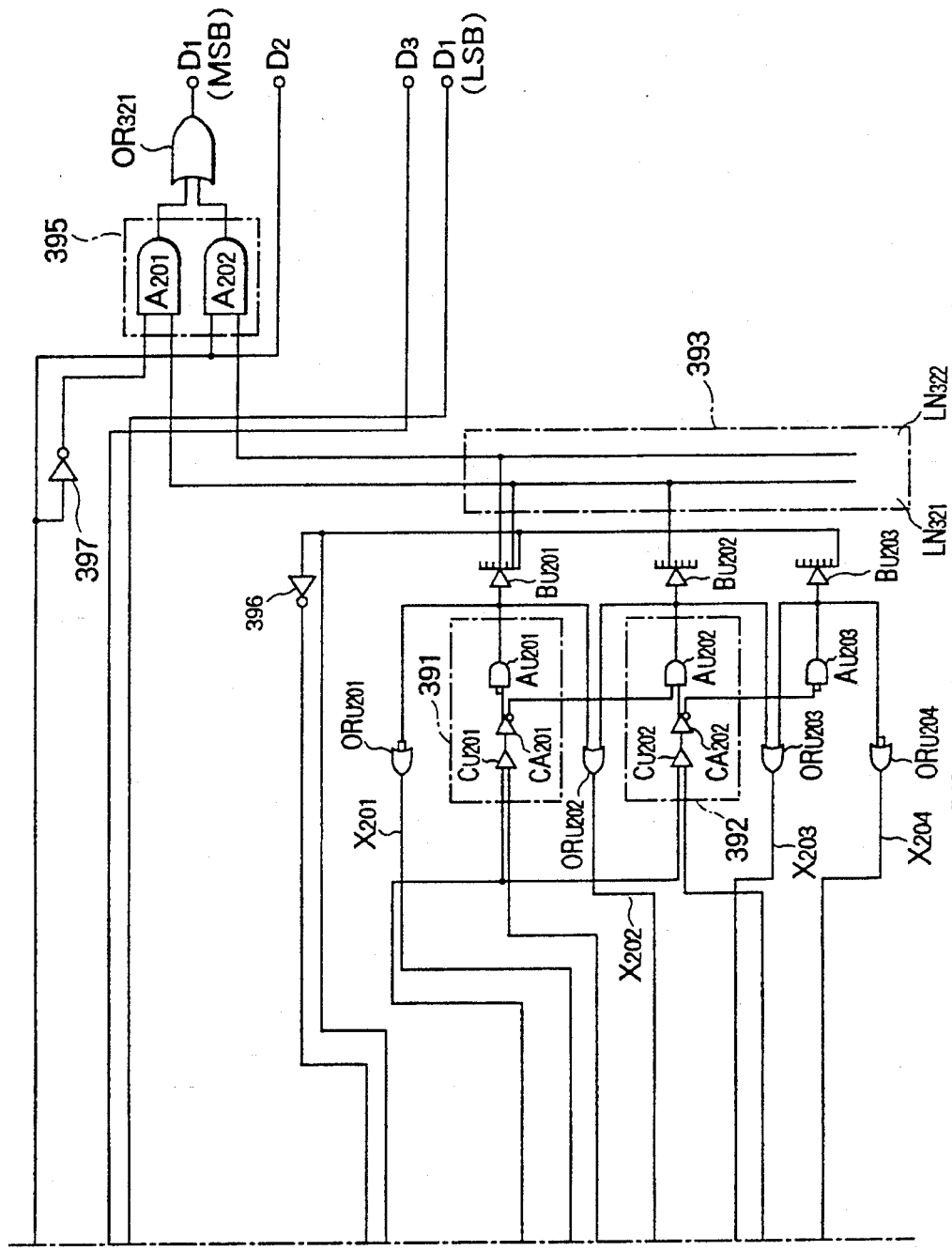

FIG. 38 is a circuit diagram showing a 15th embodiment of the A/D converter circuit according to the present invention.

The point of difference of the 15th embodiment from the above-mentioned 15th embodiment resides in the constitution whereby the number of the selection lines of the lower data encoder 394 is reduced to only one line, i.e., $LN_{323}$, to generate only one selection signal $SEL_{201}$ as the selection signal, and a signal obtained by inverting the level of the selection signal $SEL_{201}$ at the inverter 397 is supplied as the signal in place of the selection signal $SEL_{191}$ to one input of the AND gate $A_{201}$ of the selection gate 395.

Namely, in the present 15th embodiment, the upper least significant data is produced at the lower data encoder 394, and that data is added to the selection terminal of a demultiplexer comprising the inverter 397 and the selection gate 395, whereby the selection of the upper significant data is carried out. In appearance, the selection signal is omitted.

According to the present 15th embodiment, similar effects to those obtained in the above-described 14th embodiment can be obtained.

Note that, in the above-mentioned 13th, 14th and 15th embodiments, an explanation was made taking as an example an A/D converter circuit for four bits, but needless to say the present invention can be applied to an A/D converter circuit for more bits as well.

Also, in the above-mentioned 13th, 14th and 15th embodiments, the structure in which the other output pin buffers are arranged on the input side of the upper data encoder and the lower data encoder was indicated, but these other output pin buffers are provided so as to reliably drive the upper data encoder and the lower data encoder, and it is necessary to provide the same according to a certain capacitance of the upper data encoder and the lower data encoder acting as a load.

As explained above, according to the present invention, the inverted gate and inhibit gate which have been conventionally necessary become unnecessary, and the increase of speed of conversion processing can be achieved.

Also, in addition to the fact that the inverted gate and inhibit gate become unnecessary, the increase of number of the resistance element columns can be prevented. At the same time, the number of the selection signals can be reduced, the number of the upper data codes to be selected and the number of the input gates of selection gates can be reduced, and further the number of the switching blocks can be reduced to the minimum level, and thus there is an advantage that the reduction of the chip area and the reduction of the power consumption can be achieved.

What is claimed is:

1. An analog/digital converter circuit comprising:

a plurality of reference resistance elements connected in series between two reference potentials;

a plurality of switching blocks, arranged in the form of a matrix and activated by an upper data conversion output signal in units of rows, comparing the respective reference voltages divided by said reference resistance elements with an input signal to be converted, and detecting the presence/absence of lower significant bit data and redundant bit data, thereby providing a differential output;

an upper data encoder comparing said reference voltage supplied to a switching block of said switching block matrix with said input signal to be converted, and providing a plurality of conversion codes of the upper significant bits in accordance with the result of said comparison:

a lower data comparator circuit including first and second comparators with weights of outputs set to N and which provide a complementary output; a third comparator with a weight of output set to $n_1$ and which provides a complementary output; a fourth comparator with a weight of output set to $n_2$ (note, $n_1+n_2=N$) and which provides a complementary output; a first adder which adds one output of said third comparator and one output of said fourth comparator; and a second adder which adds the other output of said third comparator and the other output of said fourth comparator, wherein a differential output of one row of the switching block being connected to the inputs of said first comparator and said third comparator, and the differential output of the other row of said switching block being connected to the inputs of said second comparator and said fourth comparator;

a lower data encoder, providing a predetermined lower data conversion code for the complementary outputs of the respective comparators of said lower data comparator in accordance with the presence/absence of the lower significant bit data and redundant bit data, and generating a selection signal for selecting one conversion code from among the conversion codes of the upper significant bits of said upper data encoder; and a selection gate selectively outputting one conversion code from among a plurality of conversion codes of the upper significant bits output from said upper data encoder based on the selection signal output from said lower data encoder.

2. An analog/digital converter circuit according to claim 1, wherein said lower data comparator circuit includes a ring comparator comprising a plurality of comparator circuit, each including a first comparator or second comparator and a third comparator and fourth comparator corresponding to respective row of said switching blocks, inputs of the respective comparators being connected to the differential outputs of said switching blocks of the corresponding row and the outputs of said third and fourth comparators of each comparator circuit being connected to the output of said third comparator or fourth comparator of the other comparator circuit, and wherein said lower data comparator circuit includes a suppression circuit which cuts a predetermined position of said ring comparator in accordance with the upper data conversion output signal, and suppresses the unnecessary input of the output of the comparator to the lower data comparator.

3. An analog/digital converter circuit according to claim 1, wherein the weights of outputs of said third and fourth comparators are set as $n_1=n_2=N/2$.

4. An analog/digital converter circuit comprising:

a plurality of switching blocks, arranged in the form of a matrix, comparing respective reference voltages provided by dividing a reference potential by a serially connected a plurality of resistance elements with an input signal to be converted;

an upper data comparator comparing said reference voltage applied to the specific position of switching block in the row direction with an input signal to be converted, thereby providing the conversion code of the upper significant bit;

a determining circuit determining whether the number of said switching blocks obtaining a comparison result that the level of said input signal to be converted is larger than the reference voltage level is even or odd; and a lower data encoder providing the conversion code of a lower significant bit in accordance with the result of determination of said determining circuit.

5. An analog/digital converter circuit according to 4, wherein said plurality of switching blocks are simultaneously driven.

6. An analog/digital converter circuit according to claim 4, wherein said respective switching blocks are constituted by differential type amplifiers, each having a pair of transistors the base of which being supplied with said input signal to be converted and said divided reference voltage; and wherein said determining circuit is constituted in that the transistor output to which said input signal is supplied and the transistor output to which said reference voltage is supplied are alternately connected for each row and are connected to a load element.

7. An analog/digital converter circuit according to claim 4, wherein said determining circuit includes a means which performs the exclusive-OR of the adjoining switching blocks for each row and outputs the total sum thereof to said lower data encoder.

8. An analog/digital converter circuit according to claim 7, wherein said determining circuit has a plurality of exclusive-OR gates performing the exclusive-OR of the outputs of the adjoining switching blocks and constituted so that the outputs of said respective exclusive-OR gates are connected.

9. An analog/digital converter circuit according to claim 4, wherein said plurality of resistance elements are arranged in a plurality of rows by folding-back so that the direction of application of said reference voltage becomes reverse for each predetermined number of reference resistance elements, and wherein provision is made of an inverted gate which inverts, when a direction of application of voltage of a predetermined row is used as a reference, said obtained significant data conversion code obtained based on said reference voltage by said reference resistance elements of the row in the direction of application which is reverse to the former and outputs the same.

10. An analog/digital converter circuit comprising:

a plurality of reference resistance elements connected in series between two reference potentials;

a plurality of switching blocks, arranged in the form of a matrix and activated by an upper data conversion output signal for each row, comparing respective reference voltages divided by said reference resistance elements with an input signal to be converted, and detecting the presence/absence of the lower significant bit data and redundant bit data for each predetermined row;

an upper data encoder, comparing said reference voltage at a specific portion in the row direction of said switching block with said input signal to be converted, and providing the conversion code of said upper significant bit in accordance with a redundant mode or non-redundant mode which are set in advance;

a lower data encoder, providing the conversion code of the lower significant bit and the conversion code of the redundant bit out of the conversion range specified by said upper encoder from the outputs of said respective switching blocks in accordance with the presence/absence of the lower significant bit data and the redundant bit data, and generating a selection signal in accordance with the redundant mode or non-redundant mode in accordance with the presence/absence of the redundant bit data; and a selection gate selectively outputting the conversion code of the upper significant bit in accordance with said redundant mode or non-redundant mode from among the conversion codes of the upper significant bit in accordance with said redundant mode or said non-redundant mode output from said upper data encoder based on said selection signal in accordance with the mode output from said lower data encoder.

11. An analog/digital converter circuit according to claim 10, wherein said reference resistance elements are arranged by folding-back so as to extend over a predetermined number of rows so as to correspond to the matrix arrangement of said switching blocks; and wherein the output conversion code value of said redundant mode or non-redundant mode in said upper data encoder is set in accordance with the transition direction of the reference voltage level for each row.

12. An analog/digital converter circuit according to claim 10, wherein said switching block rows detecting the redundant bit data, among the switching blocks arranged in the form of a matrix, are positioned on both sides of the switching block row detecting the lower significant bit data, and one switching block column and the other switching block column detect different redundant mode data;

wherein said upper data encoder outputs the conversion code of the upper significant bit in accordance with said redundant mode or said non-redundant mode; and wherein the output conversion code values of said upper data encoder are set so as to have a difference of magnitude in an order of one redundant mode, and said non-redundant mode, and the other redundant mode.

13. An analog/digital converter circuit comprising:

a plurality of reference resistance elements connected in series between two reference potentials;

a plurality of switching blocks, arranged in the form of a matrix and activated by an upper data conversion output signal for each row, comparing the respective reference voltages divided by said reference resistance elements with an input signal to be converted, and detecting the presence/absence of lower significant bit data and redundant bit data;

at least one data change point detection circuit comparing the reference voltage generated between mutually adjoining rows excluding at least the uppermost row or lowermost row of switching block matrix with said input signal to be converted, and detecting the change point of data;

an upper data encoder providing the conversion code of the upper significant bit in accordance with 2 modes set in advance in accordance with the result of detection of said data change point detection circuit;

a lower data encoder dividing the outputs of said respective switching blocks in units of rows into two groups in accordance with said 2 modes, providing the predetermined lower data conversion code in accordance with the presence/absence of the lower significant bit data and redundant bit data for each of the respective divided groups, and generating a selection signal for selecting one selection code from among the two upper significant bits of conversion codes of said upper data encoder; and a selection gate selectively outputting one conversion code selected from among two upper significant bits of conversion codes output from said upper data encoder based on the selection signal output from said lower data encoder.

14. An analog/digital converter circuit according to claim 13, wherein said reference resistance elements are arranged by folding-back so as to extend over a predetermined number of rows so as to correspond to the matrix arrangement of said switching blocks, and the row of the resistance elements generating the reference voltage of the highest value and the row of the resistance elements generating the reference voltage of the lowest value are arranged with a deviation of a predetermined cycle relative to the row of the other resistance elements; and wherein the output conversion code value of said upper data encoder is set in accordance with the transition direction of the reference voltage level for each row.

15. An analog/digital converter circuit according to claim 14, wherein said predetermined cycle is a half cycle.

16. An analog/digital converter circuit according to claim 13, wherein the constitution is made so that the switching block columns arranged in the form of a matrix are divided into two column groups with a predetermined column as the reference and outputs of these column groups correspond to two groups of said lower data encoder; and wherein the values of the output conversion codes of said upper data encoder have a difference of magnitude in an order of one mode and the other mode.

17. An analog/digital converter circuit according to claim 13, wherein said two groups are divided with the switching point of the upper significant bit in the output conversion code as the reference.

18. An analog/digital converter circuit according to claim 13, wherein the above-described lower data encoder is constituted so as to generate two selection signals in accordance with two divided groups.

19. An analog/digital converter circuit according to claim 13, wherein said lower data encoder is constituted so as to generate one selection signal in accordance with one group among two divided groups.

20. An analog/digital converter circuit comprising:

a plurality of reference resistance elements connected in series between two reference potentials;

a plurality of switching blocks, arranged in the form of a matrix and activated by an upper data conversion output signal for each row, comparing the respective reference voltages divided by said reference resistance elements with an input signal to be converted, and detecting the presence/absence of lower significant bit data and redundant bit data;

an upper data encoder, comparing said reference voltage applied to the specific position of said switching block in the row direction with said input signal to be converted, and providing the two conversion codes of the upper significant bit excluding the predetermined bits among the upper significant bits in accordance with 2 modes set in advance;

a lower data encoder, dividing the outputs of said respective switching blocks in units of columns into two groups in accordance with said 2 modes, providing the predetermined lower data conversion code in accordance with the lower significant bit data and the presence/absence of the redundant bit data for each of divided groups, and generating the selection signal for selecting one conversion code from among 2 upper significant bits of conversion codes of said upper data encoder; and a selection gate selectively outputting one conversion code selected from among 2 upper significant bits of conversion codes output from said upper data encoder based on the selection signal output from said lower data encoder, said selection signal being output as the predetermined bit of the upper significant conversion code excluded at the upper data encoder.

21. An analog/digital converter circuit according to claim 20, wherein the bit excluded at said upper data encoder is the least significant bit of the upper significant bits; and wherein said selection signal is output as the conversion code of the least significant bit in the upper significant bits.

22. An analog/digital converter circuit according to claim 20, wherein said reference resistance elements are arranged by folding-back so as to extend over a predetermined number of rows so as to correspond to the matrix arrangement of said switching blocks, and the row of the resistance elements generating the reference voltage of the highest value and the row of said resistance elements generating the reference voltage of the lowest value are arranged with a deviation of a predetermined cycle relative to the row of the other resistance elements.

23. An analog/digital converter circuit according to claim 20, wherein said predetermined cycle is a half cycle.

24. An analog/digital converter circuit according to claim 20, wherein the constitution is made so that the switching block columns arranged in the form of a matrix are divided into two column groups with a predetermined column as the reference, and outputs of these column groups correspond to two groups of said lower data encoder.

25. An analog/digital converter circuit according to claim 20, wherein said two groups are divided with the switching point of the upper significant bit in the output conversion code as the reference.

26. An analog/digital converter circuit according to claim 20, wherein said lower data encoder is constituted so as to generate two selection signals in accordance with two divided groups, and wherein one selection signal selected from among two selection signals is output as the upper data conversion code of a predetermined bit excluded at the upper data encoder.

27. An analog/digital converter circuit according to claim 20, wherein said upper data encoder is constituted so as to generate one selection signal in accordance with one block among two divided groups; and wherein said analog/digital converter circuit includes a means which inverts the level of the generated selection signal and outputs the same as the upper data conversion code of the predetermined bit excluded at the upper data encoder.

28. An analog/digital converter circuit comprising:

a plurality of reference resistance elements connected in series between two reference potentials;

a plurality of switching blocks, arranged in the form of a matrix and activated by the upper data conversion output signal for each sow, comparing the respective reference voltages divided by said reference resistance elements with an input signal to be converted, and detecting the presence/absence of lower significant bit data and redundant bit data;

an upper data encoder, comparing the reference voltage applied to the specific position of switching block in the row direction with said input signal to be converted, and providing the conversion code of the upper significant bit in accordance with 2 modes set in advance;

a lower data encoder dividing the outputs of said respective switching blocks in units of columns into two groups in accordance with said 2 modes, providing the predetermined lower data conversion code in accordance with the lower significant bit data and the presence/absence of the redundant bit data for each of divided groups, and generating the selection signal for selecting one conversion code from among 2 upper significant bits of conversion codes of said upper data encoder; and a selection gate selectively outputting one conversion code selected from among 2 upper significant bits of conversion codes output from said upper data encoder based on the selection signal output from said lower data encoder.

29. An analog/digital converter circuit according to claim 28, wherein said reference resistance elements are arranged by folding-back so as to extend over a predetermined number of rows so as to correspond to the matrix arrangement of said switching blocks, and the row of the resistance elements generating the reference voltage of the highest value and the row of the resistance elements generating the reference voltage of the lowest value are arranged with a deviation of a predetermined cycle relative to the row of the other resistance elements; and wherein the output conversion code value of said upper data encoder is set in accordance with the transition direction of the reference voltage level for each row.

30. An analog/digital converter circuit according to claim 29, wherein said predetermined cycle is a half cycle.

31. An analog/digital converter circuit according to claim 28, wherein the constitution is made so that the switching block rows arranged in the form of a matrix are divided into two row groups with a predetermined column as the reference, and outputs of these column groups correspond to two groups of said lower data encoder; and wherein the output conversion code value of said upper data encoder is set so as to have a difference of magnitude in an order of one mode and the other mode.

32. An analog/digital converter circuit according to claim 28, wherein said two groups are divided with the switching point of the upper significant bit in the output conversion code as a reference.

33. An analog/digital converter circuit according to claim 28, wherein said lower data encoder is constituted so as to generate two selection signals in accordance with two divided groups.

34. An analog/digital converter circuit according to claim 28, wherein said upper data encoder is constituted so as to generate one selection signal in accordance with one block among two divided groups.

35. An analog/digital converter circuit comprising:

a plurality of reference resistance elements connected in series between two reference potentials;

a plurality of switching blocks, arranged in the form of a matrix and activated by the upper data conversion output signal for each row, comparing the respective reference voltages divided by said reference resistance elements with an input signal to be converted, and detecting the presence/absence of lower significant bit data and redundant bit data;

an upper data encoder comparing the reference voltage supplied to the switching block positioned intermediate in the rows excluding at least the uppermost row or lowermost row with said input signal to be converted, and providing the conversion code of the upper significant bit in accordance with 2 modes set in advance;

lower data encoder dividing the outputs of said respective switching blocks in units of columns into two groups in accordance with said 2 modes, providing the predetermined lower data conversion code in accordance with the lower significant bit data and the presence/absence of the redundant bit data for each of divided groups, and generating the selection signal for selecting one conversion code from among 2 upper significant bits of conversion codes of said upper data encoder; and a selection gate selectively outputting one conversion code selected from among 2 upper significant bits of conversion codes output from said upper data encoder based on the selection signal output from said lower data encoder.

36. An analog/digital converter circuit according to claim 35, wherein said reference resistance elements are arranged by folding-back so as to extend over a predetermined number of rows so as to correspond to the matrix arrangement of said switching blocks;

wherein it is constituted so that the switching block columns arranged in the form of a matrix are divided into two groups of the odd number columns and even number columns, and the outputs of these column groups correspond to two groups of said lower data encoder; and wherein said lower data encoder is constituted by a ring comparator which has a plurality of outputs, receives the outputs of the switching block columns, and makes only predetermined one output active and a lower significant code line and a selection line wired-connected so as to output the respective outputs of said ring comparator and the binary signal in accordance with the divided groups and said ring comparator.

37. An analog/digital converter circuit according to claim 35, wherein said lower data encoder is constituted so as to generate two selection signals in accordance with two divided groups.

38. An analog/digital converter circuit according to claim 35, wherein said lower data encoder is constituted so as to generate one selection signal in accordance with one group among the two divided groups.

39. An analog/digital converter circuit according to claim 35, wherein said upper data encoder is constituted so as to obtain two conversion codes comprising upper significant bits excluding the least significant bit; and wherein the predetermined selection signal is output as the conversion code of the least significant bit in the upper significant bits.

* * * * *